United States Patent
Yamazaki et al.

(10) Patent No.: US 11,056,491 B2
(45) Date of Patent: Jul. 6, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Daisuke Matsubayashi, Yokohama (JP); Tatsuya Onuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/623,648

(22) PCT Filed: Jun. 19, 2018

(86) PCT No.: PCT/IB2018/054487
§ 371 (c)(1),
(2) Date: Dec. 17, 2019

(87) PCT Pub. No.: WO2019/003047
PCT Pub. Date: Jan. 3, 2019

(65) Prior Publication Data
US 2020/0185386 A1    Jun. 11, 2020

(30) Foreign Application Priority Data

Jun. 27, 2017 (JP) .............................. JP2017-125578
Jun. 27, 2017 (JP) .............................. JP2017-125608
Feb. 27, 2018 (JP) .............................. JP2018-032992

(51) Int. Cl.
*H01L 27/105* (2006.01)
*H01L 27/12* (2006.01)
(Continued)

(52) U.S. Cl.
CPC .... *H01L 27/1052* (2013.01); *H01L 21/02565* (2013.01); *H01L 21/477* (2013.01);
(Continued)

(58) Field of Classification Search
CPC ............. H01L 27/1052; H01L 27/1207; H01L 27/1225; H01L 27/124; H01L 27/1255;
(Continued)

(56) References Cited

U.S. PATENT DOCUMENTS 8,547,771 B2   10/2013   Koyama
8,995,174 B2    3/2015   Koyama
(Continued)

FOREIGN PATENT DOCUMENTS

CN    107980178 A    5/2018
JP    2011-228622 A   11/2011
(Continued)

OTHER PUBLICATIONS

Matsuda.S et al., "Channel length dependence of field-effect mobility of c-axis-aligned crystalline In—Ga—Zn—O field-effect transistors", Jpn. J. Appl. Phys. (Japanese Journal of Applied Physics), 2015, vol. 54, pp. 041103-1-041103-4.
(Continued)

*Primary Examiner* — Tong-Ho Kim
(74) *Attorney, Agent, or Firm* — Robinson Intellectual Property Law Office; Eric J. Robinson

(57) ABSTRACT

A semiconductor device that can be highly integrated is provided. The semiconductor device includes a transistor, an interlayer film, and a first conductor. The transistor includes an oxide over a first insulator; a second conductor over the oxide; a second insulator provided between the oxide and the second conductor and in contact with a side surface of the second conductor; and a third insulator provided for the side surface of the second conductor with the second insu-
(Continued)

lator therebetween. The oxide includes a first region, a second region, and a third region. The first region overlaps with the second conductor. The second region is provided between the first region and the third region. The third region has a lower resistance than the second region. The second region has a lower resistance than the first region. The interlayer film is provided over the first insulator and the oxide. The first conductor is electrically connected to the third region. The third region overlaps with one of the third insulator, the first conductor, and the interlayer film. A top surface of the third insulator is level with a top surface of the interlayer film.

31 Claims, 57 Drawing Sheets

(51) Int. Cl.
    *H01L 29/786* (2006.01)
    *H01L 21/02* (2006.01)
    *H01L 21/4757* (2006.01)
    *H01L 29/24* (2006.01)
    *H01L 29/66* (2006.01)
    *H01L 21/477* (2006.01)

(52) U.S. Cl.
    CPC ...... *H01L 21/47573* (2013.01); *H01L 27/124* (2013.01); *H01L 27/127* (2013.01); *H01L 27/1207* (2013.01); *H01L 27/1225* (2013.01); *H01L 27/1255* (2013.01); *H01L 29/24* (2013.01); *H01L 29/66969* (2013.01); *H01L 29/7869* (2013.01); *H01L 29/78696* (2013.01)

(58) Field of Classification Search
    CPC .............. H01L 27/127; H01L 21/02565; H01L 21/47573; H01L 21/477; H01L 29/24; H01L 29/66969; H01L 29/7869; H01L 29/78696
    USPC ........................................................ 257/43
    See application file for complete search history.

(56) References Cited

U.S. PATENT DOCUMENTS

| | | |
|---|---|---|
| 9,287,407 B2 | 3/2016 | Koezuka et al. |
| 9,704,562 B2 | 7/2017 | Onuki et al. |
| 9,773,919 B2 | 9/2017 | Sasagawa et al. |
| 9,837,545 B2 | 12/2017 | Koezuka et al. |
| 9,935,203 B2 | 4/2018 | Sasagawa et al. |
| 10,164,120 B2 | 12/2018 | Kurata et al. |
| 10,181,531 B2 | 1/2019 | Sasagawa et al. |
| 10,424,676 B2 | 9/2019 | Sasagawa et al. |
| 10,490,258 B2 | 11/2019 | Onuki et al. |
| 2011/0240998 A1 | 10/2011 | Morosawa et al. |
| 2015/0280691 A1 | 10/2015 | Koyama |
| 2017/0012139 A1* | 1/2017 | Sasagawa ......... H01L 29/78696 |
| 2017/0062619 A1 | 3/2017 | Sasagawa et al. |
| 2018/0076330 A1 | 3/2018 | Morosawa et al. |
| 2018/0145180 A1 | 5/2018 | Koezuka et al. |
| 2018/0151742 A1 | 5/2018 | Kurata et al. |
| 2018/0375498 A1 | 12/2018 | Koyama |

FOREIGN PATENT DOCUMENTS

| | | |
|---|---|---|
| JP | 2012-257187 A | 12/2012 |
| JP | 2013-016782 A | 1/2013 |
| JP | 2016-167591 A | 9/2016 |
| JP | 2017-028237 A | 2/2017 |
| JP | 2017-045989 A | 3/2017 |
| JP | 2017-050530 A | 3/2017 |
| JP | 2018-073994 A | 5/2018 |
| JP | 2018-201011 A | 12/2018 |
| KR | 2018-0025942 A | 3/2018 |
| KR | 2018-0042280 A | 4/2018 |
| TW | 201709348 | 3/2017 |
| TW | 201724515 | 7/2017 |
| WO | WO-2016/189425 | 12/2016 |
| WO | WO-2017/006207 | 1/2017 |
| WO | WO-2017/033102 | 3/2017 |

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and Its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Sympbsium Digest of Technical Papers, May 23, 2010, vol. 41, No. 1, pp. 626-629.

Mistry.K, "Transistor Scaling: The Age of Innovation", https://nanohub.org/resources/20880, Apr. 30, 2014, pp. 1-51.

International Search Report (Application No. PCT/IB2018/054487) dated Oct. 9, 2018.

Written Opinion (Application No. PCT/IB2018/054487) dated Oct. 9, 2018.

\* cited by examiner

FIG. 10A
FIG. 10C
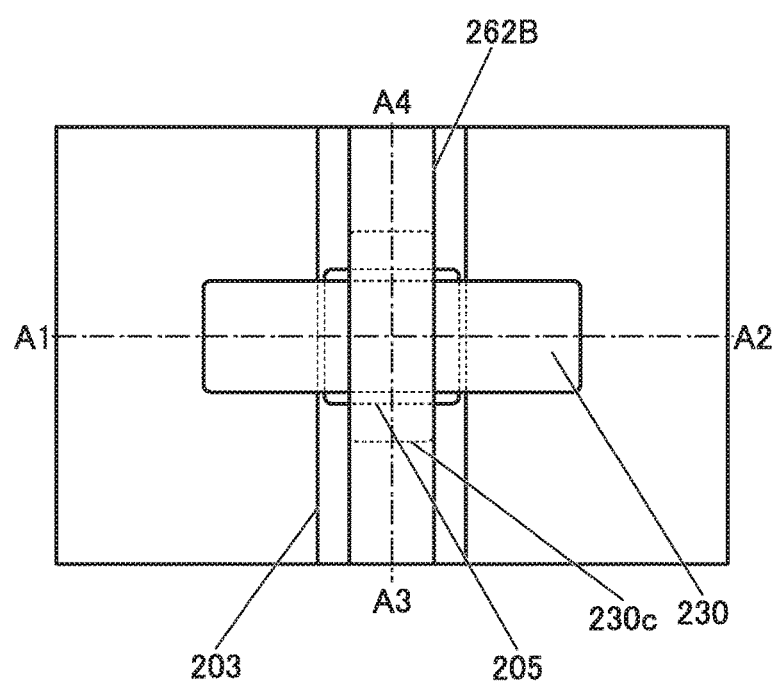
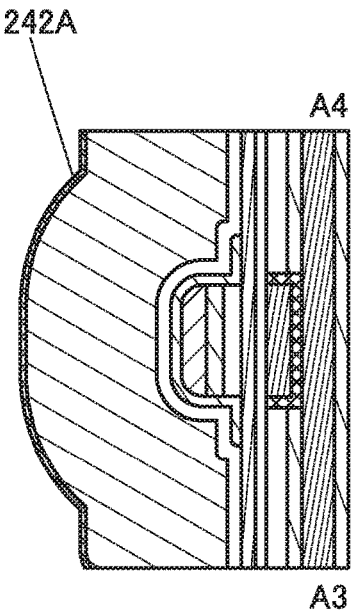
FIG. 10B
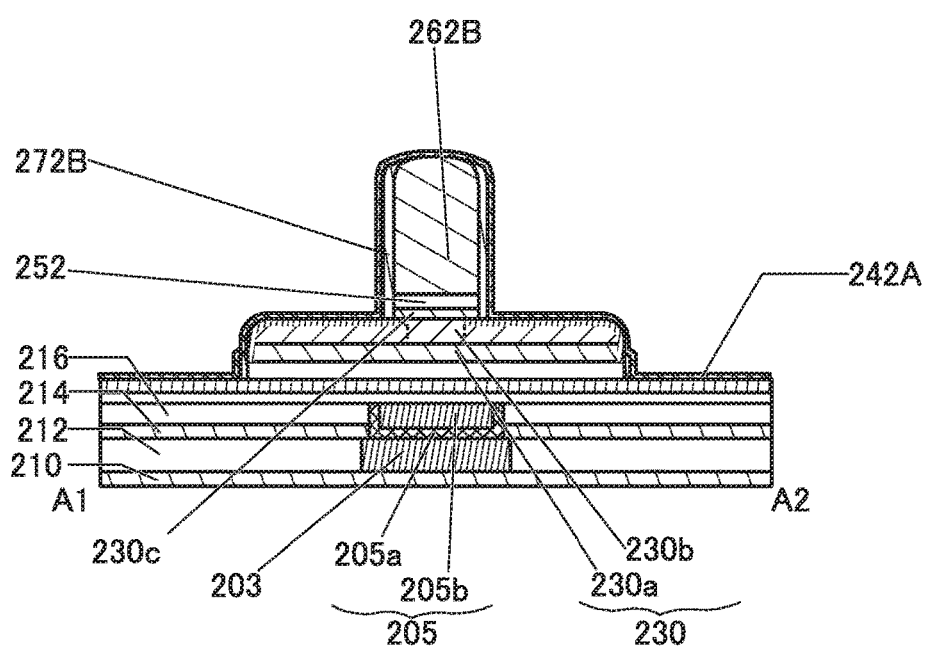

FIG. 13A
FIG. 13C
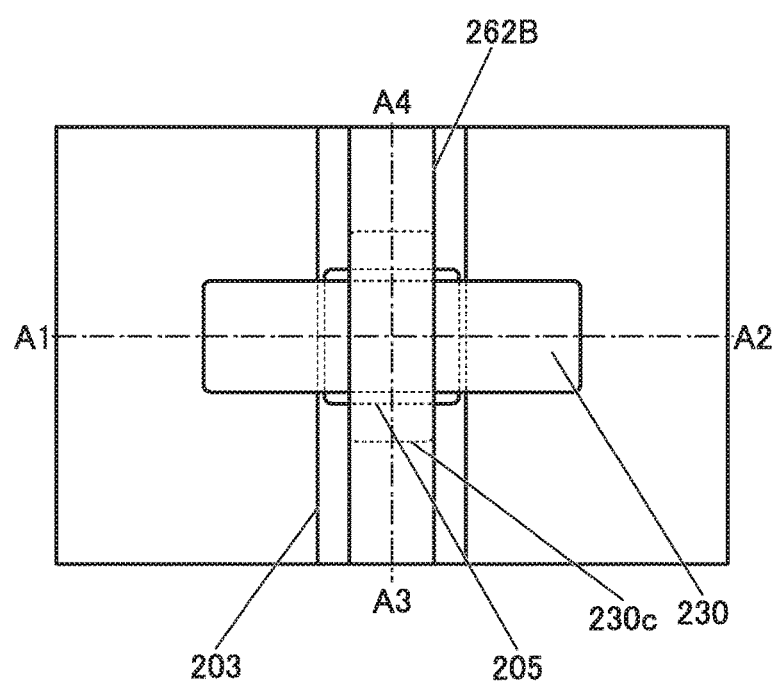
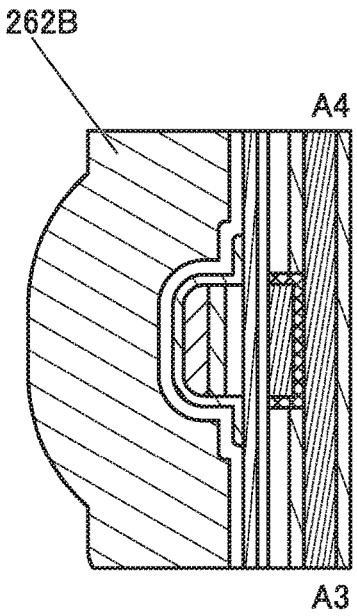
FIG. 13B
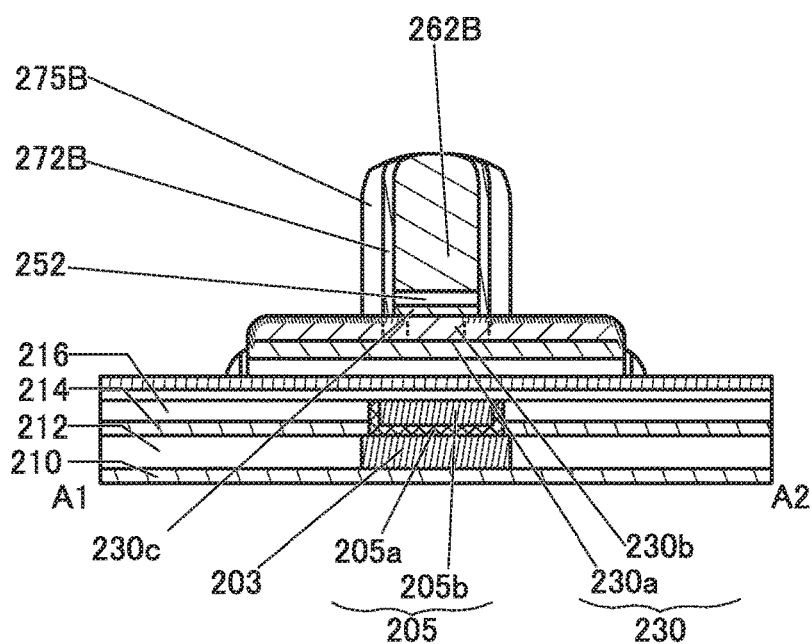

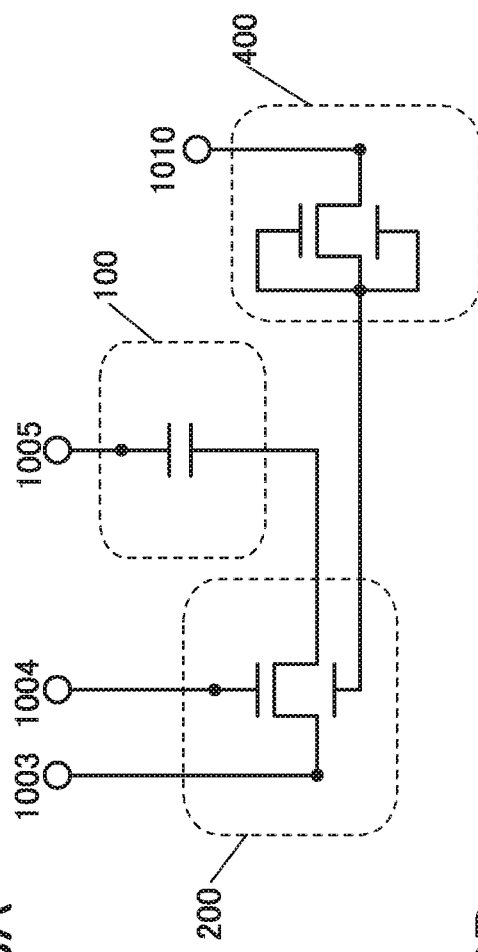
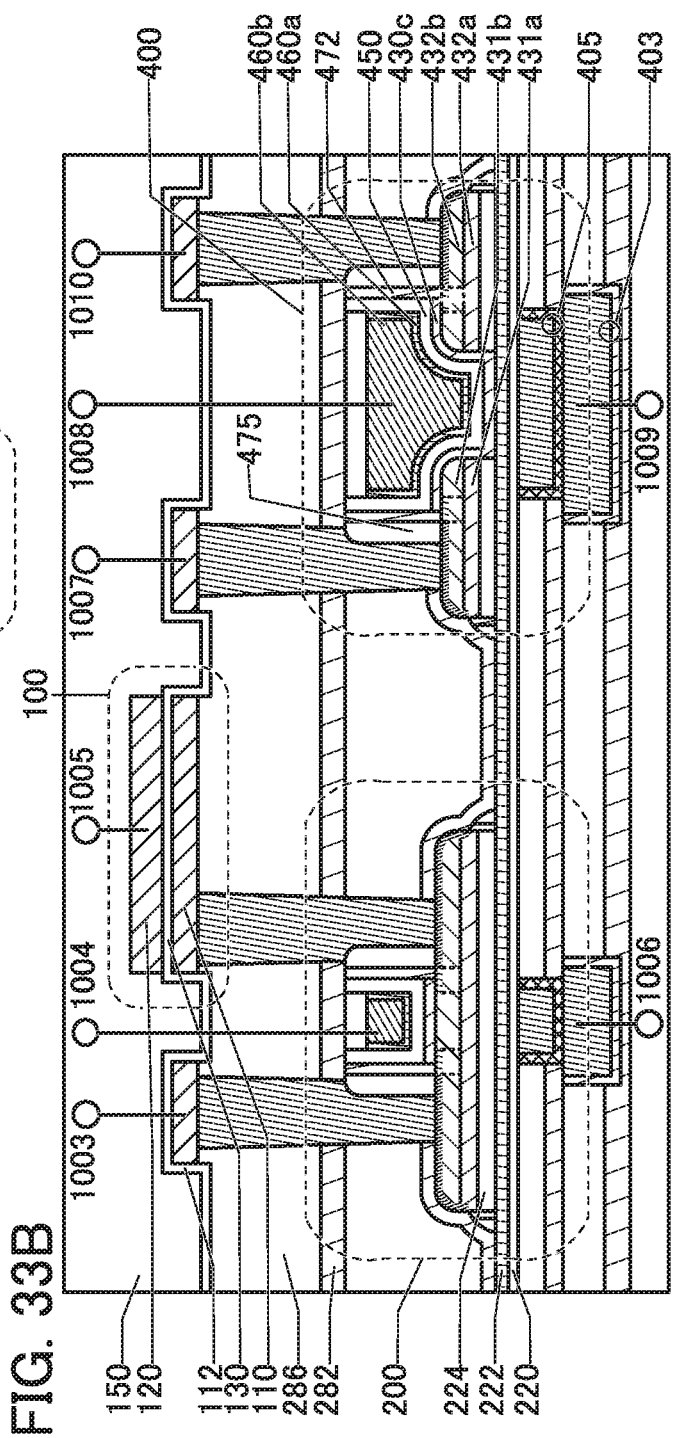
FIG. 33A
FIG. 33B

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another one embodiment of the present invention relates to a process, a machine, manufacture, or a composition of matter.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

A transistor with a self-aligned structure has been proposed as the transistor using an oxide semiconductor. A method for manufacturing the transistor with a self-aligned structure in which a metal film is formed over a source region and a drain region and heat treatment is performed on the metal film so that the resistance of the metal film is increased and the resistance of the source region and the drain region is reduced is disclosed (see Patent Document 2).

As a method for manufacturing the transistor using an oxide semiconductor, a method in which a metal film is formed over a source region and a drain region, heat treatment is performed, and a dopant is introduced through the metal film so that the resistance of the source region and the drain region is reduced is disclosed (see Patent Document 3).

In addition, a transistor using IGZO for an active layer has an extremely low off-state current (see Non-Patent Document 6), and an LSI and a display utilizing the characteristics have been reported (see Patent Document 1, Patent Document 4, Non-Patent Document 7, and Non-Patent Document 8).

REFERENCES

Patent Documents

[Patent Document 1] Japanese Published Patent Application No. 2012-257187
[Patent Document 2] Japanese Published Patent Application No. 2011-228622
[Patent Document 3] Japanese Published Patent Application No. 2013-016782
[Patent Document 4] Japanese Published Patent Application No. 2017-28237

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.
[Non-Patent Document 9] S. Matsuda et al., Jpn. J. Appl. Phys. 54, 041103 (2015).

SUMMARY OF THE INVENTION

Problems to be Solved by the Invention

In Patent Document 2, when the resistance of a source region and a drain region is reduced, a metal film is formed over the source region and the drain region and heat treatment is performed on the metal film in an oxygen atmosphere. By performing the heat treatment, a constituent element of the metal film enters the source region and the drain region of an oxide semiconductor film as a dopant, whereby the resistance is reduced. By performing the heat treatment in an oxygen atmosphere, the conductive film is oxidized, whereby the resistance of the conductive film is increased. Note that since the heat treatment is performed in an oxygen atmosphere, the metal film has a weak effect of extracting oxygen from the oxide semiconductor film.

Patent Document 2 discloses the oxygen concentration in a channel formation region, and does not refer to the concentration of impurities such as water or hydrogen. That is, purification of the channel formation region (a reduction in impurities such as water or hydrogen, typically, dehydration or dehydrogenation) is not performed; thus, there is a problem in that a transistor tends to have normally-on characteristics. Note that normally-on characteristics of a transistor means a state where a channel exists and a current flows through the transistor without application of a voltage to a gate. In contrast, normally-off characteristics of a transistor means a state where a current does not flow through the transistor without application of a voltage to a gate.

In view of the above problems, an object of one embodiment of the present invention is to provide a semiconductor device having favorable electrical characteristics by stably reducing the resistance of a source region and a drain region of a transistor and purifying a channel formation region.

Another object of one embodiment of the present invention is to provide a semiconductor device that can be miniaturized or highly integrated. An object of one embodiment of the present invention is to provide a semiconductor device having favorable electrical characteristics. An object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device in which power consumption can be reduced. An object of one embodiment of the present invention is to provide a novel semiconductor device.

Note that the descriptions of these objects do not disturb the existence of other objects. In one embodiment of the present invention, there is no need to achieve all the objects. Objects other than these will be apparent from the descriptions of the specification, the drawings, the claims, and the like, and can be derived from the descriptions of the specification, the drawings, the claims, and the like.

One embodiment of the present invention is a semiconductor device including an oxide in a channel formation region; the semiconductor device includes a transistor, an interlayer film, and a first conductor; the transistor includes the oxide over a first insulator, a second conductor over the oxide, a second insulator provided between the oxide and the second conductor and in contact with a side surface of the second conductor, and a third insulator provided for the side surface of the second conductor with the second insulator therebetween; the oxide includes a first region, a second region, and a third region; the first region overlaps with the second conductor; the second region is provided between the first region and the third region; the third region has a lower resistance than the second region; the second region has a lower resistance than the first region; the interlayer film is provided over the first insulator and the oxide; the first conductor is electrically connected to the third region; the third region overlaps with one of the third insulator, the first conductor, and the interlayer film; and a top surface of the third insulator is substantially level with a top surface of the interlayer film.

One embodiment of the present invention is a semiconductor device including an oxide in a channel formation region. It is preferable that the semiconductor device include a transistor, a capacitor, an interlayer film, and a first conductor; the transistor include the oxide over a first insulator, a second conductor over the oxide, a second insulator provided between the oxide and the second conductor and in contact with a side surface of the second conductor, and a third insulator provided for the side surface of the second conductor with the second insulator therebetween; the oxide include a first region, a pair of second regions, and a pair of third regions; the first region overlap with the second conductor; the first region be provided between the pair of second regions; the first region and the pair of second regions be provided between the pair of third regions; the third regions have a lower resistance than the second regions; the second regions have a lower resistance than the first region; the interlayer film be provided over the first insulator and the oxide; the first conductor be electrically connected to one of the pair of third regions; the capacitor be electrically connected to the other of the pair of third regions; and a top surface of the third insulator be substantially level with a top surface of the interlayer film.

In the above, the other of the pair of third regions preferably functions as one electrode of the capacitor.

In the above, it is preferable that the interlayer film include an opening exposing at least part of the other of the pair of third regions; the capacitor include a fourth insulator over the other of the pair of third regions and a third conductor over the fourth insulator in the opening; the other of the pair of third regions function as one electrode of the capacitor; the fourth insulator function as a dielectric of the capacitor; and the third conductor function as the other electrode of the capacitor.

In the above, the third conductor is preferably formed to be embedded in the opening.

In the above, the oxide preferably contains In, an element M (M is Al, Ga, Y, or Sn), and Zn.

In the above, the oxide preferably contains In more than the element M in terms of atomic ratio.

In the above, it is preferable that the third region have a higher carrier density than the second region, and that the second region have a higher carrier density than the first region.

In the above, the third region preferably contains at least one of aluminum, ruthenium, titanium, tantalum, chromium, and tungsten.

In the above, the third region preferably further contains nitrogen.

In the above, the second region preferably has a higher argon concentration than the first region.

In the above, the first region preferably has a lower hydrogen concentration than the second region.

In the above, the first region preferably has a lower hydrogen concentration than the second region and the third region.

In the above, the transistor is preferably of a normally-off type.

One embodiment of the present invention is a method for manufacturing a semiconductor device, in which a first insulator is formed over a substrate; an oxide layer is formed over the first insulator; a first insulating film and a dummy gate film are sequentially deposited over the oxide layer; a second insulator and a dummy gate layer are formed by processing the first insulating film and the dummy gate film; a first film containing a metal is formed in contact with at least the oxide layer; heat treatment is performed on the first film and the oxide layer in an atmosphere containing nitrogen; the first film is removed; a second insulating film is deposited to cover the first insulator, the oxide layer, the second insulator, and the dummy gate layer; a third insulator is formed on a side surface of the second insulator and a side surface of the dummy gate layer by processing the second insulating film; a third insulating film is deposited to cover the first insulator, the oxide layer, the dummy gate layer, and the third insulator; a fourth insulator is formed by performing first CMP treatment to remove part of the third insulating film until part of the dummy gate layer is exposed; the second insulator is exposed by etching the dummy gate layer; the oxide layer is exposed by etching the second insulator; a fourth insulating film is deposited in contact with the oxide and a side surface of the third insulator; a conductor film is deposited over the fourth insulating film; a first conductor layer and a fifth insulator covering a side surface and a bottom surface of the first conductor layer are formed by performing second CMP treatment to remove part of the conductor film and part of the fourth insulating film until the fourth insulator is exposed; an opening is formed in the fourth insulator; and a second conductor is formed to be embedded in the opening.

In the above, the first film is preferably formed by a sputtering method using one or a plurality of gases selected from argon, nitrogen, and oxygen.

In the above, the first film preferably contains at least one of aluminum, ruthenium, titanium, tantalum, chromium, and tungsten.

In the above, the first film preferably contains aluminum and titanium.

In the above, the first film preferably further contains one or both of nitrogen and oxygen.

In the above, the first film is preferably more than or equal to 0.5 nm and less than 5 nm.

In the above, it is preferable that oxygen contained in the oxide layer in the vicinity of an interface between the oxide layer and the first film be extracted by the first film by performing the heat treatment.

In the above, the opening is preferably formed so that part of a top surface of the oxide layer and part of a side surface of the oxide layer are exposed.

In the above, the second insulating film is preferably processed by anisotropic etching using a dry etching method.

In the above, it is preferable that an impurity be added to part of the oxide overlapping with the dummy gate layer after formation of the dummy gate layer.

In the above, the impurity is preferably argon or nitrogen.

According to one embodiment of the present invention, a semiconductor device having favorable electrical characteristics can be provided. According to one embodiment of the present invention, a semiconductor device that can be miniaturized or highly integrated can be provided. According to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device in which power consumption can be reduced can be provided. Alternatively, a novel semiconductor device can be provided.

Note that the descriptions of these effects do not disturb the existence of other effects. Note that one embodiment of the present invention does not necessarily have all of these effects. Effects other than these will be apparent from the descriptions of the specification, the drawings, the claims, and the like, and can be derived from the descriptions of the specification, the drawings, the claims, and the like.

BRIEF DESCRIPTION OF THE DRAWINGS

FIG. 10 A top view and cross-sectional views illustrating a method for manufacturing a semiconductor device of one embodiment of the present invention.

FIG. 13 A top view and cross-sectional views illustrating a method for manufacturing a semiconductor device of one embodiment of the present invention.

FIG. 33 A circuit diagram and a cross-sectional view of a memory device of one embodiment of the present invention.

MODE FOR CARRYING OUT THE INVENTION

Figure 1A:
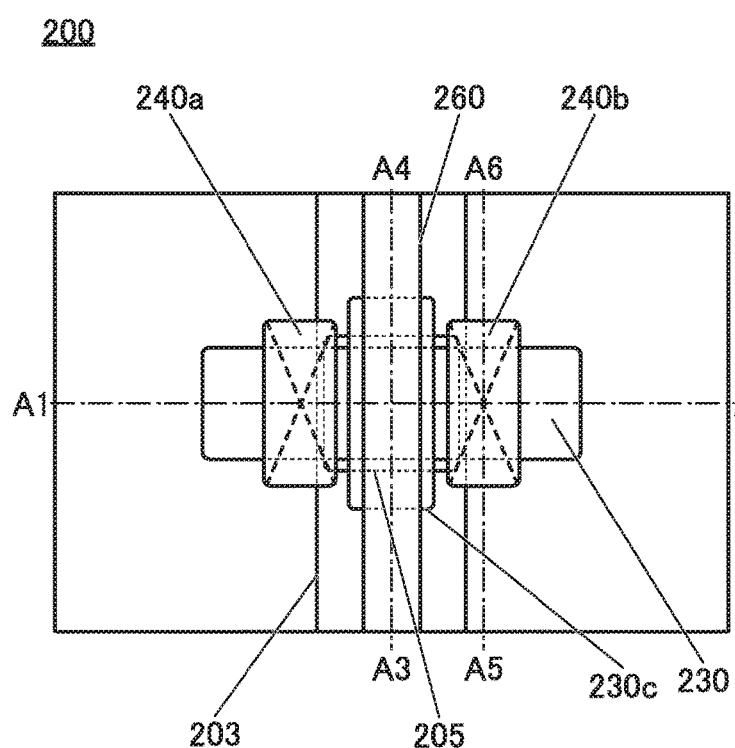
FIG. 1 A top view and cross-sectional views of a semiconductor device of one embodiment of the present invention.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. Note that in the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is included in the drawings or the texts.

Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, one or more elements that allow electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being in a conduction state (on state) or non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. Note that even if another circuit is sandwiched between X and Y, for example, X and Y are regarded as being functionally connected when a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can be used interchangeably in this specification and the like in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a region where a channel is formed in a direction perpendicular to a channel length direction in a region where a semiconductor (or a portion where current flows in a semiconductor when a transistor is in an on state) and a gate electrode overlap with each other or a region where a channel is formed in a top view of the transistor. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that values of a channel length, a channel width, an effective channel width, an apparent channel width, a surrounded channel width, and the like can be determined, for example, by analyzing a cross-sectional TEM image and the like.

Note that an impurity in a semiconductor refers to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed by entry of impurities, for example. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, "silicon oxynitride film" is a film in which oxygen content is higher than nitrogen content in its composition. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, "silicon nitride oxide film" is a film in which nitrogen content is higher than oxygen content in its composition. A silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Furthermore, unless otherwise specified, transistors described in this specification and the like are field-effect transistors. Furthermore, unless otherwise specified, transistors described in this specification and the like are n-channel transistors. Thus, unless otherwise specified, the threshold voltage (also referred to as "$V_{th}$") is higher than 0 V.

In this specification and the like, "parallel" indicates a state where the angle formed between two straight lines is greater than or equal to −10° and less than or equal to 10°. Thus, the case where the angle is greater than or equal to −5° and less than or equal to 5° is also included. Furthermore, the term "substantially parallel" indicates a state where the angle formed between two straight lines is greater than or equal to −30° and less than or equal to 30°. Moreover, "perpendicular" indicates a state where the angle formed between two straight lines is greater than or equal to 80° and less than or equal to 100°. Thus, the case where the angle is greater than or equal to 85° and less than or equal to 95° is also included. In addition, "substantially perpendicular" indicates a state where the angle formed between two straight lines is greater than or equal to 60° and less than or equal to 120°.

Furthermore, in this specification, in the case where a crystal is a trigonal crystal or a rhombohedral crystal, the crystal is regarded as a hexagonal crystal system.

Note that in this specification, a barrier film means a film having a function of inhibiting the passage of oxygen and impurities such as hydrogen, and the barrier film having conductivity is referred to as a conductive barrier film in some cases.

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. That is, in the case where an OS FET is stated, it can also be referred to as a transistor including an oxide or an oxide semiconductor.

In this specification and the like, "normally off" means that current per micrometer of channel width flowing in a transistor when a voltage is not applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

An example of a semiconductor device including a transistor 200 of one embodiment of the present invention will be described below.

<Structure Example 1 of Semiconductor Device>

FIG. 1 includes a top view and cross-sectional views of the transistor 200 of one embodiment of the present invention and the periphery of the transistor 200.

Figure 1C:
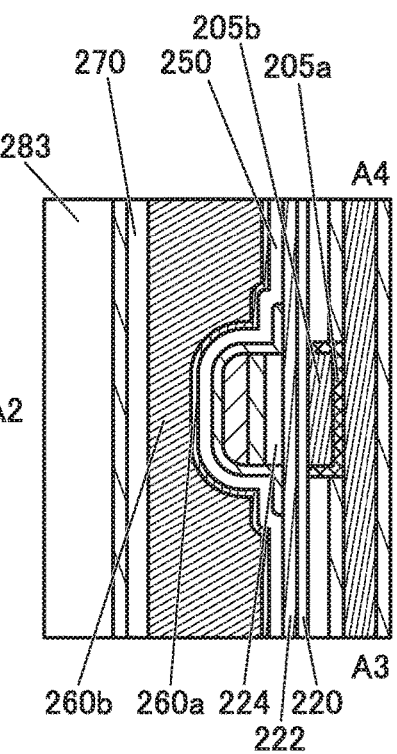
Figure 1B:
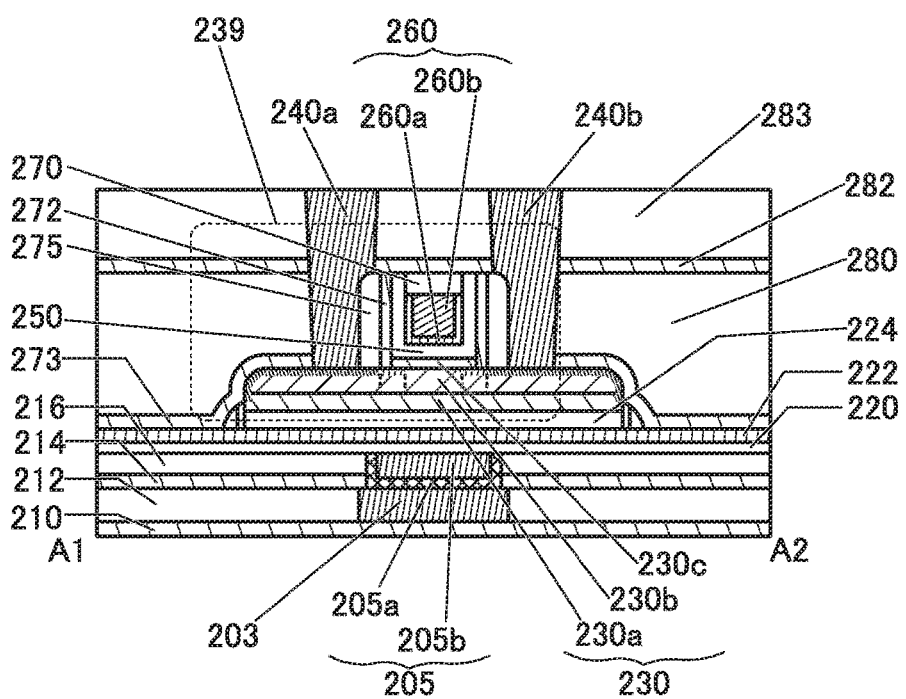

FIG. 1(A) is a top view of the semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. FIG. 1(C) is a cross-sectional view of a portion indicated by a dashed-dotted line A3-A4 in FIG. 1(A), and is a cross-sectional view in the channel width direction of the transistor 200. For clarity of the drawing, some components are not illustrated in the top view of FIG. 1(A).

The semiconductor device of one embodiment of the present invention includes the transistor 200, and an insulator 210, an insulator 212, an insulator 280, an insulator 282, and an insulator 283 functioning as interlayer films. The semiconductor device also includes a conductor 203 functioning as a wiring and a conductor 240 (a conductor 240a and a conductor 240b) functioning as a plug, which are electrically connected to the transistor 200.

Note that the conductor 203 is formed to be embedded in the insulator 212. The level of a top surface of the conductor 203 and the level of a top surface of the insulator 212 can be substantially the same. Note that although a structure in which the conductor 203 is a single layer is illustrated, the present invention is not limited thereto. For example, the conductor 203 may have a multilayer structure of two or more layers. Note that in the case where a structure body has a stacked-layer structure, the layers may be distinguished by ordinal numbers corresponding to the formation order.

The conductor 240 is formed in contact with an inner wall of an opening in an insulator 273, the insulator 280, the insulator 282, and the insulator 283. Here, the level of a top surface of the conductor 240 and the level of a top surface of the insulator 283 can be substantially the same. Although a structure in which the conductor 240 of the transistor 200 is a single layer is illustrated, the present invention is not limited thereto. For example, the conductor 240 may have a stacked-layer structure of two or more layers. An insulator 270 and the insulator 280 are arranged so that the levels of top surfaces thereof are substantially the same.

[Transistor 200]

As illustrated in FIG. 1, the transistor 200 includes an insulator 214, an insulator 216, a conductor 205 (a conductor 205a and a conductor 205b), an insulator 220, an insulator 222, an insulator 224, an oxide 230 (an oxide 230a and an oxide 230b) provided over the insulator 224, an oxide 230c, an insulator 250, a conductor 260 (a conductor 260a and a conductor 260b), the insulator 270, an insulator 272, and an insulator 275.

Specifically, the insulator 214 is provided over a substrate (not illustrated), the insulator 216 is provided over the insulator 214, and the conductor 205 (the conductor 205a and the conductor 205b) is provided to be embedded in the insulator 214 and the insulator 216. The insulator 220, the insulator 222, and the insulator 224 are sequentially stacked over the insulator 216 and the conductor 205. The oxide 230 (the oxide 230a and the oxide 230b) is provided over the insulator 224, and the oxide 230c is provided over the oxide 230.

The conductor 260 includes the conductor 260a and the conductor 260b, and the conductor 260a is provided to cover a bottom surface and side surfaces of the conductor 260b. The insulator 270 is provided over the conductor 260. The insulator 250 is provided over the oxide 230c to cover a bottom surface and side surfaces of the conductor 260 and side surfaces of the insulator 270.

The insulator 272 is provided on a side surface of the oxide 230c and a side surface of the insulator 250. The insulator 273 is provided on a side surface of the insulator 272.

In order to provide the above structure, a dummy layer may be used, for example. The dummy layer is a layer that is to be processed and used as an interim structure body. The insulator 272 that is in contact with a side surface of the dummy layer, the insulator 275 that is in contact with the side surface of the insulator 272, and the insulator 280 that is in contact with a side surface of the insulator 275 are formed. Then, the insulator 250 functioning as a gate insulating film, the conductor 260 functioning as a gate electrode, and the insulator 270 are provided in an opening formed by removing the dummy layer, so that the structure illustrated in FIG. 1 can be provided.

That is, the insulator 250 and the conductor 260 are provided to be embedded in the opening formed to have the same width as that of the dummy layer. At this time, the width of the dummy layer is the minimum feature size, whereby the conductor 260 that is smaller than the minimum feature size can be provided.

Although the transistor 200 has a structure in which three layers of the oxide 230a, the oxide 230b, and the oxide 230c are stacked, the present invention is not limited thereto. For example, a structure may be employed in which a single layer of the oxide 230b, a two-layer structure of the oxide 230b and the oxide 230a, a two-layer structure of the oxide 230b and the oxide 230c, or a stacked-layer structure of four or more layers is provided. Similarly, although the transistor 200 has a structure in which the conductor 260a and the conductor 260b are stacked, the present invention is not limited thereto.

In the transistor 200, a metal oxide functioning as an oxide semiconductor (hereinafter also referred to as an oxide semiconductor) is preferably used for the oxide 230 (the oxide 230a and the oxide 230b), which includes a region where a channel is formed (hereinafter also referred to as a channel formation region), and the oxide 230c.

The transistor 200 using an oxide semiconductor in its channel formation region has an extremely low leakage current in a non-conduction state; thus, a semiconductor device with low power consumption can be provided. An oxide semiconductor can be deposited by a sputtering method or the like, and thus can be used for the transistor 200 constituting a highly integrated semiconductor device.

For the oxide 230, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, for the oxide 230, an In—Ga oxide or an In—Zn oxide may be used.

Here, when a metal element such as aluminum, ruthenium, titanium, tantalum, chromium, or tungsten is added to the oxide semiconductor in addition to the constituent element of the oxide semiconductor, the oxide semiconductor becomes a metal compound to have reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is preferably provided over the oxide semiconductor. By providing such a film, some oxygen in the interface between the film and the oxide semiconductor or in the oxide semiconductor in the vicinity of the interface is absorbed by the film or the like and an oxygen vacancy is formed, so that the resistance of the oxide semiconductor in the vicinity of the interface is reduced in some cases.

The periphery of an oxygen vacancy formed in the vicinity of the interface has a distortion. When the above film is deposited by a sputtering method with a sputtering gas containing a rare gas, the rare gas might enter the oxide semiconductor during the deposition of the film. When the rare gas enters the oxide semiconductor, a distortion or a structural disorder is caused in the vicinity of the interface and around the rare gas. The rare gas is, for example, He or Ar. Owing to its larger atomic radius, Ar is preferable to He. When Ar enters the oxide semiconductor, a distortion or a structural disorder is appropriately caused. In a region with such a distortion or a structural disorder, the number of metal atoms bonded to a small number of oxygen probably increases. When the number of metal atoms bonded to a small number of oxygen increases, the resistance in the vicinity of the interface and around the rare gas is reduced in some cases.

In the case where a crystalline oxide semiconductor is used as the oxide semiconductor, a region with the distortion or the structural disorder has a broken crystallinity and seems like an amorphous oxide semiconductor in some cases.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element is diffused from the metal film into the oxide semiconductor; thus, the metal element can be added to the oxide semiconductor.

In the case where hydrogen in the oxide semiconductor diffuses into a low-resistance region of the oxide semiconductor and enters an oxygen vacancy in the low-resistance region, the hydrogen is brought into a relatively stable state. It is known that hydrogen in the oxygen vacancy in the oxide semiconductor is released from the oxygen vacancy by heat treatment at 250° C. or higher, is diffused into a low-resistance region of the oxide semiconductor, enters an oxygen vacancy in the low-resistance region, and is brought into a relatively stable state. Thus, by the heat treatment, the resistance of the low-resistance region of the oxide semiconductor tends to be further reduced, and the oxide semiconductor whose resistance is not reduced tends to be highly purified (a reduction in impurities such as water or hydrogen) and the resistance tends to be increased.

The carrier density of the oxide semiconductor is increased when an impurity element such as hydrogen or nitrogen exists. Hydrogen in the oxide semiconductor reacts with oxygen, which is bonded to a metal atom, to be water, and thus forms an oxygen vacancy in some cases. Entry of hydrogen into the oxygen vacancy increases carrier density. Furthermore, in some cases, part of hydrogen is bonded to oxygen, which is bonded to a metal atom, whereby an electron serving as a carrier is generated. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be formed in the oxide semiconductor. In other words, when the resistance of the oxide 230 is selectively reduced, a region functioning as a semiconductor having a low carrier density and a low-resistance region functioning as a source region or a drain region can be formed in the oxide 230 processed into an island shape.

Here, FIG. 3 shows enlarged views each illustrating a region 239 including the oxide 230b whose resistance is selectively reduced, which is surrounded by a dashed line in FIG. 1(B).

Figure 3A:
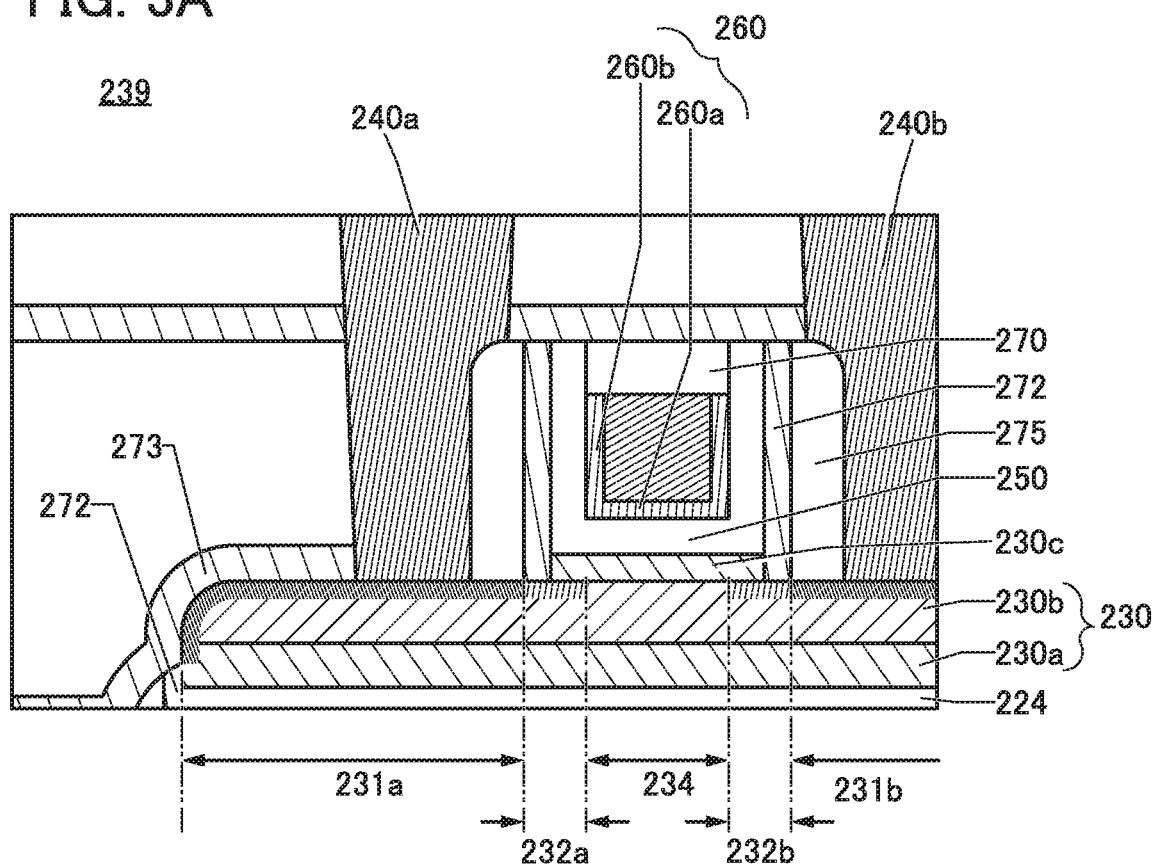
FIG. 3 Cross-sectional views of semiconductor devices of embodiments of the present invention.

As illustrated in FIG. 3(A), the oxide 230 includes a region 234 functioning as a channel formation region of the transistor, a region 231 (a region 231a and a region 231b) functioning as a source region or a drain region, and a region 232 (a region 232a and a region 232b) provided between the region 234 and the region 231.

The region 231 functioning as the source region or the drain region is a region having a low oxygen concentration, a low carrier density, and a reduced resistance. The region 234 functioning as the channel formation region is a high-resistance region having a higher oxygen concentration and a lower carrier density than the region 231 functioning as the source region or the drain region. The region 232 is a region having a higher oxygen concentration and a lower carrier density than the region 231 functioning as the source region or the drain region and having a lower oxygen concentration and a higher carrier density than the region 234 functioning as the channel formation region.

Note that the concentration of at least one of a metal element, a rare gas, and an impurity element such as hydrogen and nitrogen in the region 231 is preferably higher than that in each of the region 232 and the region 234.

For example, in addition to the oxide 230, the region 231 preferably contains one or a plurality of metal elements selected from aluminum, ruthenium, titanium, tantalum, tungsten, chromium, and the like. When the metal element is added to the oxide 230, the resistance of the region 231 can be reduced. The region 231 may include a region where the metal element in the oxide 230 is alloyed with the added metal element.

The region 232 includes a region overlapping with the insulator 250 and the insulator 272. The concentration of at least one of metal elements such as aluminum, ruthenium, titanium, tantalum, tungsten, and chromium and impurity elements such as hydrogen and nitrogen in the region 232 is preferably higher than that in the region 234. In order to form the region 232, for example, a metal film, an oxide film containing a metal element, or a nitride film containing a metal element is provided in contact with the region 231 of the oxide 230. In that case, the metal element in the film is added to the oxide semiconductor and a metal compound is formed in the oxide semiconductor in some cases. The metal compound attracts hydrogen contained in the oxide 230 in some cases. Thus, the hydrogen concentration in the region 232 in the vicinity of the region 231 may be increased.

One or both of the region 232a and the region 232b may include a region overlapping with the conductor 260. With such a structure, the conductor 260 can overlap with the region 232a and the region 232b.

When the region 232 is provided in the transistor 200, a high-resistance region is not formed between the region 231 functioning as the source region and the drain region and the region 234 where a channel is formed, so that the on-state current and the mobility of the transistor can be increased. Moreover, since the gate electrode does not overlap with the source region and the drain region in the channel length direction owing to the region 232, formation of unnecessary capacitance can be inhibited. A leakage current in a non-conduction state can be reduced owing to the region 232.

Although the region 234, the region 231, and the region 232 are formed in the oxide 230b in FIG. 1 and FIG. 3(A), it is not limited thereto. These regions may also be formed in the oxide 230a and the oxide 230c, for example. Although boundaries between the regions are illustrated as being perpendicular to a top surface of the oxide 230 in FIG. 1 and FIG. 3(A), this embodiment is not limited thereto. For example, in some cases, the region 232 projects to the conductor 260 side in the vicinity of a surface of the oxide 230b, and recedes to the conductor 240a side or the conductor 240b side in the vicinity of a bottom surface of the oxide 230b.

In the oxide 230, the boundaries between the regions are difficult to clearly observe in some cases. The concentration of a metal element and an impurity element such as hydrogen and nitrogen, which is detected in each region, may be not only gradually changed between the regions, but also continuously changed (also referred to as gradation) in each region. That is, the region closer to the channel formation region preferably has a lower concentration of a metal element and an impurity element such as hydrogen and nitrogen.

In order to selectively reduce the resistance of the oxide 230, at least one of metal elements that increase conductivity, such as aluminum, ruthenium, titanium, tantalum, tungsten, chromium, and indium, and an impurity is added to a desired region, for example. As the impurity, an element that forms an oxygen vacancy, an element trapped by an oxygen vacancy, or the like may be used. Examples of the element include hydrogen, boron, carbon, nitrogen, fluorine, phosphorus, sulfur, chlorine, titanium, and a rare gas. Typical examples of the rare gas element are helium, neon, argon, krypton, and xenon.

Thus, when the content of the metal element that increases conductivity, the element that forms an oxygen vacancy, or the element trapped by an oxygen vacancy in the region 231 is increased, the carrier density can be increased and the resistance can be reduced.

To reduce the resistance of the region 231, for example, an impurity such as a rare gas is mixed to the region 231 using reverse sputtering treatment, an ion doping method, or the like with the dummy layer as a mask; thus, the resistance of the oxide semiconductor can be reduced.

Note that in this specification and the like, the reverse sputtering treatment refers to treatment in which a voltage is applied to the substrate side with the use of an RF (Radio Frequency) power source and plasma is generated in the vicinity of the substrate to modify the surface. The reverse sputtering treatment is preferably performed in such a manner that an inert gas (e.g., a rare gas such as argon or helium, or nitrogen) is introduced into a treatment chamber.

As a method for adding an impurity such as a rare gas, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be employed. Note that the impurity and the metal element to be added may be referred to as an element, a dopant, an ion, a donor, an acceptor, or the like.

In order to reduce the resistance of the region 231, for example, a metal film, an oxide film containing a metal element, a nitride film containing a metal element, or the like may be deposited in contact with the region 231 of the oxide 230. Specifically, it is preferable that the metal film, the oxide film containing the metal element, or the nitride film containing the metal element be provided over at least the oxide 230 with the dummy layer therebetween.

When the metal film, the oxide film containing the metal element, or the nitride film containing the metal element is provided in contact with the region 231 of the oxide 230, the metal element is diffused from the film into the region 231 of the oxide 230 and a metal compound is formed in the region 231, whereby the resistance is reduced. Furthermore, in some cases, some oxygen in the oxide 230 at an interface between the region 231 and the metal film, the oxide film containing the metal element, or the nitride film containing the metal element or in the vicinity of the interface is absorbed by the film and an oxygen vacancy is formed in the region 231, so that the resistance is reduced. An example of the low-resistance region of the oxide 230 is marked with diagonal lines in FIG. 3. Note that in this specification and the like, the area marked with diagonal lines is not limited to the areas illustrated in FIG. 3. For example, the low-resistance region (or area) is formed in a region in the vicinity of the interface between the oxide 230 and the conductor 240, or in a region from the top surface of the oxide 230 to the bottom surface of the oxide 230 in the region 231 in some cases. The same applies to the other drawings.

Heat treatment is preferably performed in an atmosphere containing nitrogen in a state where the region 231 is in contact with the metal film, the nitride film containing the metal element, or the oxide film containing the metal element. By the heat treatment, the metal element is diffused from the metal film into the region 231 of the oxide 230; thus, the metal element can be added to the region 231. Note that the region 231 of the oxide 230 may be alloyed with the metal element. When the region 231 of the oxide 230 is alloyed with the metal element, the metal element added to the oxide semiconductor is brought into a relatively stable state; therefore, a highly reliable semiconductor device can be provided.

In the case where hydrogen in the oxide 230 is diffused into the region 231 and enters an oxygen vacancy in the region 231, the hydrogen is brought into a relatively stable state. Hydrogen in an oxygen vacancy in the region 234 is released from the oxygen vacancy by heat treatment at 250° C. or higher, is diffused into the region 231, enters an oxygen vacancy in the region 231, and is brought into a relatively stable state. Thus, by the heat treatment, the resistance of the region 231 is further reduced, and the region 234 is highly purified (a reduction in impurities such as water or hydrogen) and the resistance is further increased.

In contrast, since the conductor 260, the insulator 250, and the insulator 272 are provided between the regions (the region 234 and the region 232) of the oxide 230 overlapping with the conductor 260, the insulator 250, and the insulator 272 and the metal film, the oxide film containing the metal element, or the nitride film containing the metal element, addition of the metal element is inhibited. Furthermore, absorption of oxygen atoms in the oxide 230 by the metal film, the nitride film containing the metal element, or the oxide film containing the metal element is inhibited in the region 234 and the region 232 of the oxide 230.

Here, in order to reduce the resistance of the region 232, an impurity such as a rare gas is mixed into the region 232 by an ion doping method or the like, whereby the resistance of the oxide semiconductor can be reduced.

For example, an impurity such as a rare gas is preferably added by a method in which the moving direction of a dopant and the normal direction of a substrate are different from each other. For example, an impurity such as a rare gas is added with the dummy layer as a mask and the substrate tilted, whereby the region 232 can be provided in a region of the oxide 230 overlapping with the insulator 250. Alternatively, a low-resistance region may be formed in such a manner that an element that can increase the carrier density of the oxide 230 and reduce the resistance is added as a dopant.

As the dopant, an element that forms an oxygen vacancy, an element bonded to an oxygen vacancy, or the like may be used. Typical examples of such an element are boron and phosphorus. Moreover, hydrogen, carbon, nitrogen, fluorine, sulfur, chlorine, titanium, a rare gas, or the like may be used. Typical examples of the rare gas element include helium, neon, argon, krypton, and xenon. Furthermore, one or a plurality of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like may be added. Among the above elements, boron or phosphorus is preferable as a dopant. In the case where boron or phosphorus is used as a dopant, manufacturing line apparatuses for amorphous silicon or low-temperature polysilicon can be used; thus, capital investment can be reduced. The concentration of the above element is measured by secondary ion mass spectrometry (SIMS) or the like.

It is particularly preferable to use an element that easily forms an oxide as an element added to the region whose resistance is to be reduced. Typical examples of the element are boron, phosphorus, aluminum, and magnesium. The element added to the region whose resistance is to be reduced is likely to deprive the oxide 230 of oxygen to form an oxide. Consequently, a large number of oxygen vacancies are generated in the region whose resistance is to be reduced. When the oxygen vacancy and hydrogen in the oxide 230 are bonded to each other, carriers are generated and the region has an extremely low resistance. Furthermore, since the element added to the region whose resistance is to be reduced exists in a state of a stable oxide in the region whose resistance is to be reduced, the element is not easily released from the region whose resistance is to be reduced even when treatment at a high temperature is performed in a later step. That is, when an element that easily forms an oxide is used as the element added to the region whose resistance is to be reduced, a region whose resistance is not easily increased even through a high-temperature process can be formed in the oxide 230.

In the case where the low-resistance region is formed by addition of a dopant, the dopant is added using the insulator 272, the conductor 260, the insulator 250, and the oxide 230c as masks, for example. Thus, the low-resistance region containing the above element can be formed in a region of the oxide 230 not overlapping with the masks. A dummy gate may be formed to be used as a mask instead of using the insulator 272, the conductor 260, the insulator 250, and the oxide 230c as masks. In that case, the insulator 272, the conductor 260, the insulator 250, and the oxide 230c are formed after the addition of the dopant.

As other methods for adding a dopant, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, a donor, an acceptor, an impurity, an element, or the like.

Here, in the case where the metal film, the oxide film containing the metal element, or the nitride film containing the metal element has a property of absorbing hydrogen, hydrogen in the oxide 230 is absorbed by the film. Thus, hydrogen, which is an impurity in the oxide 230, can be reduced. In a later step, the metal film, the oxide film containing the metal element, or the nitride film containing the metal element may be removed together with hydrogen absorbed from the oxide 230.

Note that the metal film, the oxide film containing the metal element, or the nitride film containing the metal element is not necessarily removed. When the metal film, the oxide film containing the metal element, or the nitride film containing the metal element is oxidized by oxygen absorbed from the oxide 230 to be a high-resistance insulator, for example, the film may be left. In this case, the film may function as an interlayer film.

In the case where a region having conductivity is left in the metal film, the oxide film containing the metal element, or the nitride film containing the metal element, for example, the region having conductivity is oxidized by heat treatment, so that the region becomes a high-resistance insulator. The heat treatment is preferably performed in an oxidation atmosphere, for example. In the case where a structure body containing oxygen is provided in the vicinity of the metal film, the oxide film containing the metal element, or the nitride film containing the metal element, by heat treatment, the metal film, the oxide film containing the metal element, or the nitride film containing the metal element may be reacted with oxygen contained in the structure body and oxidized.

For example, the metal film, the oxide film containing the metal element, or the nitride film containing the metal element is preferably provided to have a thickness of greater than or equal to 0.5 nm and less than or equal to 5 nm, further preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in the above oxidation atmosphere, such heat treatment is preferably performed after carrying out, in an atmosphere containing nitrogen, another heat treatment which is performed in a state where the oxide 230 is in contact with the metal film, the oxide film containing the metal element, or the nitride film containing the metal element. When the heat treatment is performed in an atmosphere containing nitrogen once, oxygen in the oxide 230 is easily diffused into the metal film, the oxide film containing the metal element, or the nitride film containing the metal element.

Here, a transistor using an oxide semiconductor is likely to have its electrical characteristics changed by impurities and oxygen vacancies in a region of the oxide semiconductor where a channel is formed; accordingly, the reliability is decreased in some cases. Moreover, if the region of the oxide semiconductor where a channel is formed includes oxygen vacancies, the transistor tends to have normally-on characteristics. Thus, oxygen vacancies in the region 234 where a channel is formed are preferably reduced as much as possible.

For the insulator 273, an oxide is preferably deposited by a sputtering method. When a sputtering method is used in deposition of an oxide, an insulator containing few impurities such as water or hydrogen can be deposited. In the case of using a sputtering method, deposition is preferably performed using a facing-target sputtering apparatus, for example. The facing-target sputtering apparatus is preferable because deposition can be performed without exposing a deposition surface to a high electric field region between facing targets; the deposition surface is not easily damaged due to plasma; thus, deposition damage on the oxide 230 during the deposition of an insulator to be the insulator 275 can be small. A deposition method using the facing-target sputtering apparatus can be referred to as VDSP (Vapor Deposition SP) (a registered trademark).

During the deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The relationship between the potentials is $E_2 > E_1 > E_0$.

The ions in plasma are accelerated by a potential difference $E_2 - E_0$ and collide with the target, whereby the sputtered particles are ejected from the target. These sputtered particles are attached on a deposition surface and deposited thereover; as a result, a film is deposited. Some ions recoil by the target and might pass through the deposited film as recoil ions, and be taken into the insulator 272 in contact with the deposition surface. The ions in the plasma are accelerated by a potential difference $E_2 - E_1$ and collide with the deposition surface. At this time, some ions reach the inside of the insulator 272. The ions are taken into the insulator 272, so that a region into which the ions are taken is formed in the insulator 272. That is, an excess-oxygen region is formed in the insulator 272 in the case where the ions contain oxygen. Therefore, aluminum oxide deposited by a sputtering method is preferably used for the insulator 273.

As illustrated in FIG. 1 and FIG. 3(A), the insulator 273 is in contact with the insulator 272 and the insulator 272 includes a region in contact with the insulator 224, the insulator 250, and the oxide 230c. As described above, the insulator 272 containing oxygen at a higher proportion than oxygen in the stoichiometric composition (also referred to as excess oxygen) can be provided. That is, excess oxygen contained in the insulator 272 is diffused into the region 234 of the oxide 230, whereby oxygen vacancies in the region 234 of the oxide 230 can be reduced.

When heat treatment is performed in a state where aluminum oxide is in contact with the oxide 230, hydrogen in the oxide 230 is extracted in some cases. Thus, the hydrogen concentration in the oxide 230 can be lowered.

When the impurity is added with a combination of the above structures or the above steps, the region 231, the region 232, and the region 234 can be provided in a self-aligned manner even in a miniaturized transistor whose channel length is approximately 10 nm to 30 nm.

Accordingly, the dummy layer is used as a mask, whereby the resistance of the oxide 230 is reduced in a self-aligned manner. Therefore, when the plurality of transistors 200 are formed simultaneously, variations in electrical characteristics of the transistors can be reduced. The channel length of the transistor 200 is determined by the width of the dummy layer. In other words, the width of the dummy layer is set to the minimum feature size and the low-resistance region in the oxide 230 is formed with the use of the dummy layer as a mask, whereby the transistor 200 that is more minute than the minimum feature size can be manufactured.

Thus, by appropriately selecting the areas of the regions, a transistor having electrical characteristics that meet the demand for the circuit design can be easily provided.

An oxide semiconductor can be deposited by a sputtering method or the like, and thus can be used for a transistor constituting a highly integrated semiconductor device. The transistor using an oxide semiconductor in its channel formation region has an extremely low leakage current (off-state current) in a non-conduction state; thus, a semiconductor device with low power consumption can be provided.

Accordingly, a semiconductor device including a transistor having a high on-state current can be provided. Alternatively, a semiconductor device including a transistor having a low off-state current can be provided. Alternatively, a semiconductor device that has small variation in electrical characteristics, stable electrical characteristics, and high reliability can be provided.

The structure of the semiconductor device including the transistor 200 of one embodiment of the present invention will be described in detail below.

The conductor 203 extends in the channel width direction as illustrated in FIG. 1(A) and FIG. 1(C) and functions as a wiring that applies a potential to the conductor 205. Note that the conductor 203 is preferably provided to be embedded in the insulator 212.

The conductor 205 is positioned to overlap with the oxide 230 and the conductor 260. Moreover, the conductor 205 is preferably provided over and in contact with the conductor 203. Furthermore, the conductor 205 is preferably provided to be embedded in the insulator 214 and the insulator 216.

Here, the conductor 260 sometimes functions as a first gate (also referred to as a top gate) electrode. The conductor 205 sometimes functions as a second gate (also referred to as a bottom gate) electrode. In that case, the threshold voltage of the transistor 200 can be controlled by changing a potential applied to the conductor 205 not in synchronization with but independently of a potential applied to the conductor 260. In particular, the threshold voltage of the transistor 200 can be higher than 0 V and the off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

When the conductor 205 is provided over the conductor 203, the distance between the conductor 203 and the conductor 260 functioning as the first gate electrode and the wiring can be designed as appropriate. That is, the insulator 214, the insulator 216, and the like are provided between the conductor 203 and the conductor 260, whereby a parasitic capacitance between the conductor 203 and the conductor 260 can be reduced, and the withstand voltage between the conductor 203 and the conductor 260 can be increased.

Moreover, the reduction in the parasitic capacitance between the conductor 203 and the conductor 260 can improve the switching speed of the transistor 200, so that the transistor 200 can have high frequency characteristics. The increase in the withstand voltage between the conductor 203 and the conductor 260 can improve the reliability of the transistor 200. Therefore, the film thicknesses of the insulator 214 and the insulator 216 are preferably large. Note that the extending direction of the conductor 203 is not limited to this; for example, the conductor 203 may extend in the channel length direction of the transistor 200.

Note that as illustrated in FIG. 1(A), the conductor 205 is positioned to overlap with the oxide 230 and the conductor 260. The conductor 205 is preferably larger than the region 234 of the oxide 230. As illustrated in FIG. 1(C), it is particularly preferable that the conductor 205 extend to a region outside an end portion of the region 234 of the oxide 230 that intersects with the channel width direction. That is, the conductor 205 and the conductor 260 preferably overlap with each other with the insulator therebetween in the side surface of the oxide 230 in the channel width direction.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure.

In the conductor 205, a first conductor is formed in contact with an inner wall of an opening in the insulator 214 and the insulator 216, and a second conductor is formed on the inner side. Here, the levels of top surfaces of the first conductor and the second conductor can be substantially the same as the level of a top surface of the insulator 216. Although the first conductor and the second conductor are stacked in the transistor 200, the present invention is not limited thereto. For example, the conductor 205 may have a single-layer structure or a stacked-layer structure of three or more layers.

The first conductor of the conductor 205 or the conductor 203 is preferably formed using a conductive material which has a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (through which the above impurity does not easily pass). Alternatively, it is preferable to use a conductive material which has a function of inhibiting diffusion of oxygen (e.g., at least one of oxygen atoms, oxygen molecules, and the like) (through which the above oxygen does not easily pass). Note that in this specification, a function of inhibiting diffusion of impurities or oxygen means a function of inhibiting diffusion of any one or all of the above impurities and the above oxygen.

When the first conductor of the conductor 205 or the conductor 203 has a function of inhibiting diffusion of oxygen, the conductivity of the first conductor of the conductor 205 or the conductor 203 can be prevented from being lowered because of oxidization. As a conductive material having a function of inhibiting diffusion of oxygen, for example, tantalum, tantalum nitride, ruthenium, or ruthenium oxide is preferably used. Thus, the first conductor of the conductor 205 or the conductor 203 may be a single layer or a stacked layer of the above conductive materials. Thus, impurities such as water or hydrogen can be inhibited from being diffused into the transistor 200 side through the conductor 203 and the conductor 205.

A conductive material containing tungsten, copper, or aluminum as its main component is preferably used for the second conductor of the conductor 205. Note that the second conductor of the conductor 205 is a single layer in the drawing but may have a stacked-layer structure; for example, a stacked layer of any of the above conductive materials and titanium or titanium nitride may be employed.

The second conductor of the conductor 203 functions as a wiring and thus is preferably a conductor having higher conductivity than the second conductor of the conductor 205. For example, a conductive material containing copper or aluminum as its main component can be used. The second conductor of the conductor 203 may have a stacked-layer structure; for example, a stacked layer of any of the above conductive materials and titanium or titanium nitride may be employed.

It is particularly preferable to use copper for the conductor 203. Copper is preferably used for a wiring and the like because of its small resistance. However, copper is easily diffused, and thus may deteriorate the electrical characteristics of the transistor 200 when diffused into the oxide 230. In view of the above, for example, a material through which copper is less likely to pass, such as aluminum oxide or hafnium oxide, is used for the insulator 214, whereby diffusion of copper can be inhibited.

The conductor 205, the insulator 214, and the insulator 216 are not necessarily provided. In this case, part of the conductor 203 can function as the second gate electrode.

The insulator 210 and the insulator 214 preferably function as a barrier insulating film that prevents impurities such as water or hydrogen from entering the transistor 200 from the substrate side. Thus, the insulator 210 and the insulator 214 are preferably formed using an insulating material which has a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (through which the above impurity does not easily pass). Alternatively, it is preferable to use an insulating material which has a function of inhibiting diffusion of oxygen (e.g., at least one of oxygen atoms, oxygen molecules, and the like) (through which the above oxygen does not easily pass).

For example, it is preferable that aluminum oxide or the like be used for the insulator 210 and that silicon nitride or the like be used for the insulator 214. Through this, impurities such as hydrogen or water can be inhibited from being diffused into the transistor 200 side from the substrate side of the insulator 210 and the insulator 214. Alternatively, oxygen contained in the insulator 224 or the like can be inhibited from being diffused to the substrate side of the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used for the second conductor of the conductor 203, silicon nitride or the like provided as the insulator 214 can inhibit diffusion of the metal into a layer positioned above the insulator 214.

The permittivity of each of the insulator 212, the insulator 216, and the insulator 280 functioning as interlayer films is preferably lower than that of the insulator 210 or the insulator 214. When a material with a low permittivity is used for an interlayer film, the parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$(BST) can be used as the insulator 212, the insulator 216, and the insulator 280. Alternatively, to the insulator of these, aluminum oxide, bismuth oxide, germanium oxide, niobium oxide, silicon oxide, titanium oxide, tungsten oxide, yttrium oxide, or zirconium oxide may be added, for example. Alternatively, the insulator of these may be subjected to nitriding treatment. Silicon oxide, silicon oxynitride, or silicon nitride may be stacked over the insulator.

The insulator 220, the insulator 222, and the insulator 224 each have a function of a gate insulator.

Here, for the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced and the reliability of the transistor 200 can be improved.

As the insulator including an excess-oxygen region, specifically, an oxide material that releases part of oxygen by heating is preferably used. An oxide that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 224 includes an excess-oxygen region, it is preferable that the insulator 222 have a function of inhibiting diffusion of oxygen (e.g., at least one of oxygen atoms, oxygen molecules, and the like) (that the insulator 222 do not easily transmit the above oxygen).

When the insulator 222 has a function of inhibiting diffusion of oxygen, oxygen in the excess-oxygen region included the insulator 224 is not diffused to the insulator 220 side and thus can be supplied to the oxide 230 efficiently. Furthermore, the conductor 205 can be inhibited from reacting with oxygen from the excess-oxygen region included in the insulator 224.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$(BST) is preferably used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

In particular, an insulator containing an oxide of one or both of aluminum and hafnium, which is an insulating material which has a function of inhibiting diffusion of impurities, oxygen, and the like (through which the above oxygen does not easily pass) is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to the insulator of these, aluminum oxide, bismuth oxide, germanium oxide, niobium oxide, silicon oxide, titanium oxide, tungsten oxide, yttrium oxide, or zirconium oxide may be added, for example. Alternatively, the insulator of these may be subjected to nitriding treatment. Silicon oxide, silicon oxynitride, or silicon nitride may be stacked over the insulator.

It is preferable that the insulator 220 be thermally stable. For example, as silicon oxide and silicon oxynitride have thermal stability, a combination of an insulator with a high-k material and the insulator 222 allows the stacked-layer structure to be thermally stable and have a high dielectric constant.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed.

The oxide 230 includes the oxide 230a and the oxide 230b over the oxide 230a, and further includes the oxide 230c over the oxide 230. When the oxide 230a is provided below the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

In addition, the oxide 230 preferably has a stacked-layer structure of oxides which differ in the atomic ratio of metal elements. Specifically, the atomic ratio of the element M to constituent elements in the metal oxide used for the oxide 230a is preferably greater than the atomic ratio of the element M to constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at a junction portion of the oxide 230a, the oxide 230b, and the oxide 230c. In other words, the energy level of the conduction band minimum at a junction portion of each of the oxide 230a, the oxide 230b, and the oxide 230c continuously changes or is continuously connected. To obtain this, the density of defect states in a mixed layer formed at an interface between the oxide 230a and the oxide 230b, and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used for the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

Figure 25:
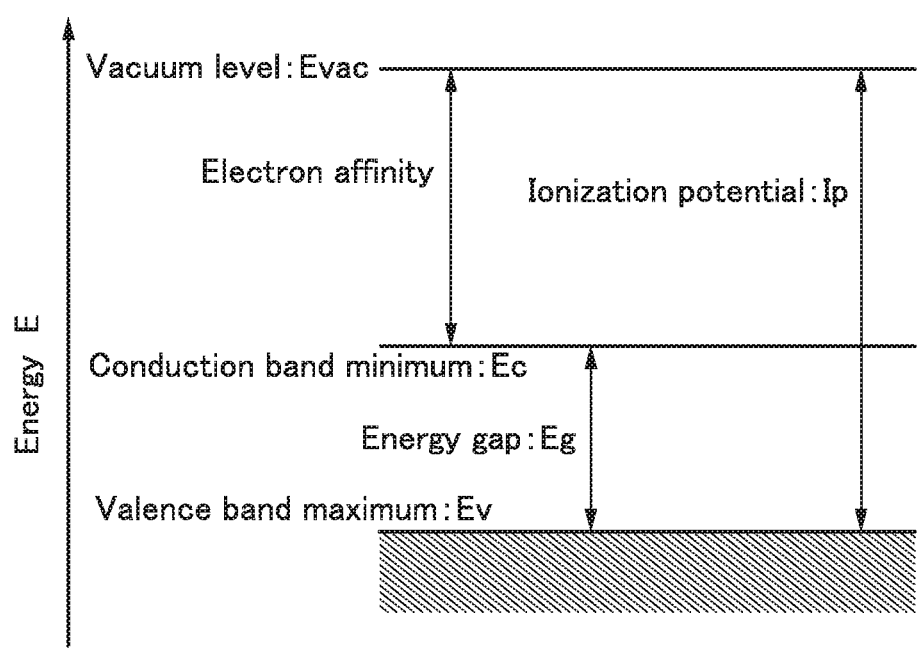
FIG. 25 A diagram showing an energy band structure of an oxide semiconductor.

The electron affinity or the energy level Ec of the conduction band minimum can be obtained from a band gap Eg and an ionization potential Ip, which is a difference between the vacuum level and the energy Ev of the valence band maximum, as shown in FIG. 25. The ionization potential Ip can be measured using, for example, an ultraviolet photoelectron spectroscopy (UPS) apparatus. The energy gap Eg can be measured using, for example, a spectroscopic ellipsometer.

The oxide 230 includes the region 231, the region 232, and the region 234. Note that at least part of the region 231 includes a region in contact with the insulator 273. The region 232 includes a region overlapping with at least the insulator 250 and the insulator 272.

Thus, when the transistor 200 is turned on, the region 231a or the region 231b functions as the source region or the drain region. At least part of the region 234 functions as the region where a channel is formed. When the region 232 is provided between the region 231 and the region 234, the transistor 200 can have a high on-state current and a low leakage current (off-state current) in a non-conduction state.

When the region 232 is provided in the transistor 200, a high-resistance region is not formed between the region 231 functioning as the source region and the drain region and the region 234 where a channel is formed, so that the on-state current and the mobility of the transistor can be increased. Since the first gate electrode (the conductor 260) does not overlap with the source region and the drain region in the channel length direction owing to the region 232, formation of unnecessary capacitance between them can be inhibited. Furthermore, a leakage current in a non-conduction state can be reduced owing to the region 232.

In other words, by appropriately selecting the areas of the regions, a transistor having electrical characteristics that meet the demand for the circuit design can be easily provided.

For the oxide 230, a metal oxide functioning as an oxide semiconductor (hereinafter also referred to as an oxide semiconductor) is preferably used. For example, as the metal oxide to be the region 234, it is preferable to use one having a band gap of 2 eV or more, preferably 2.5 eV or more. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. Moreover, an oxide semiconductor can be deposited by a sputtering method or the like, and thus can be used for a transistor included in a highly integrated semiconductor device.

The insulator 250 functions as a gate insulator. The insulator 250 is preferably positioned in contact with a top surface of the oxide 230c and the side surface of the insulator 272. The insulator 250 is preferably formed using an insulator that releases oxygen by heating. An example is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably $2.0 \times 10^{19}$ molecules/cm$^3$ or $3.0 \times 10^{20}$ molecules/cm$^3$ in thermal desorption spectroscopy analysis (TDS analysis). Note that the temperature of the film surface in the TDS analysis is preferably higher than or equal to 100° C. and lower than or equal to 700° C.

Specifically, silicon oxide containing excess oxygen, silicon oxynitride containing excess oxygen, silicon nitride oxide containing excess oxygen, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator that releases oxygen by heating is provided for the insulator 250 in contact with the top surface of the oxide 230c, oxygen can be efficiently supplied to the region 234 of the oxide 230b from the insulator 250. Furthermore, as in the insulator 224, the concentration of an impurity such as water or hydrogen in the insulator 250 is preferably reduced. The film thickness of the insulator 250 is preferably greater than or equal to 1 nm and less than or equal to 20 nm.

Furthermore, in order to supply excess oxygen contained in the insulator 250 to the oxide 230 efficiently, a metal oxide may be provided over the insulator 250. In that case, the metal oxide preferably inhibits diffusion of oxygen from the insulator 250. Provision of the metal oxide that inhibits diffusion of oxygen inhibits diffusion of excess oxygen from the insulator 250 to the conductor 260. That is, a reduction in the amount of excess oxygen supplied to the oxide 230 can be inhibited. Moreover, oxidization of the conductor 260 due to excess oxygen can be suppressed.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. Such a stacked-layer structure can be thermally stable and can have a high dielectric constant. Thus, a gate potential that is applied during operation of the transistor can be reduced while the physical thickness of the gate insulator is kept. In addition, the equivalent oxide thickness (EOT) of the insulator functioning as the gate insulator can be reduced.

The metal oxide may function as part of the first gate electrode. For example, an oxide semiconductor that can be used for the oxide 230 can be used as the metal oxide. In this case, when the conductor 260 is deposited by a sputtering method, the metal oxide can have a reduced electric resistance to be a conductor. This can be called an OC (Oxide Conductor) electrode. With the metal oxide, the on-state current of the transistor 200 can be increased without a reduction in the influence of the electric field from the conductor 260.

Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

Specifically, as the metal oxide, a metal oxide containing one or more kinds selected from hafnium, aluminum, gallium, yttrium, zirconium, tungsten, titanium, tantalum, nickel, germanium, magnesium, and the like can be used. Furthermore, the oxide semiconductor that can be used for the oxide 230 can also be used for the metal oxide when the resistance thereof is reduced.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process.

The conductor 260 functioning as the first gate electrode includes the conductor 260a and the conductor 260b. Like the first conductor of the conductor 205, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization due to excess oxygen contained in the insulator 250 and the metal oxide. As a conductive material having a function of inhibiting diffusion of oxygen, for example, tantalum, tantalum nitride, ruthenium, ruthenium oxide, or the like is preferably used.

Furthermore, the conductor 260b is preferably formed using a conductive material containing tungsten, copper, or aluminum as its main component. The conductor 260 functions as a wiring and thus is preferably formed using a conductor having high conductivity. For example, a conductive material containing tungsten, copper, or aluminum as its main component can be used. The conductor 260b may have a stacked-layer structure, for example, a stacked layer of any of the above conductive materials and titanium or titanium nitride.

In the case where the conductor 205 extends to a region outside an end portion of the oxide 230 that intersects with the channel width direction as illustrated in FIG. 1(C), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 functioning as the first gate electrode and the electric field of the conductor 205 functioning as the second gate electrode.

Furthermore, the insulator 270 functioning as a buffer layer may be positioned over the conductor 260. Parasitic capacitance generated between the conductor 240 and the conductor 260 can be reduced with the insulator 270 even in the case where the conductor 240 functioning as a plug for supplying a potential to the source region or the drain region overlaps with the conductor 260 functioning as the first gate electrode, for example. Parasitic capacitance generated between the conductor 240 and the conductor 260 is reduced, whereby the transistor 200 can operate at high speed.

Therefore, a material having a low dielectric constant is preferably used for the insulator 270. For example, the dielectric constant of the insulator 270 is preferably lower than 4, further preferably lower than 3. For the insulator 270, silicon oxide or silicon oxynitride can be used, for example.

The insulator 272 functioning as a barrier film and a buffer layer is provided in contact with the side surface of the oxide 230c and the side surface of the insulator 250.

For example, the insulator 272 is preferably deposited by an ALD method. With the use of an ALD method, a dense thin film can be deposited.

The insulator 272 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be formed easily in a later step, are preferable. For example, when aluminum oxide is deposited for an insulating film to be the insulator 273 by a sputtering method after formation of the insulator 272, an excess-oxygen region can be formed easily in the insulator 272.

Alternatively, an insulating material that has a function of inhibiting the passage of oxygen and impurities such as water and hydrogen may be used for the insulator 272. For example, aluminum oxide or hafnium oxide is preferably used. In this manner, oxygen in the insulator 250 and the metal oxide can be prevented from being diffused to the outside. In addition, impurities such as hydrogen and water can be prevented from entering the oxide 230 through end portions of the insulator 250 and the metal oxide. Thus, formation of oxygen vacancies at an interface between the oxide 230 and the insulator 250 can be inhibited, leading to an improvement in the reliability of the transistor 200.

By provision of the insulator 272, the side surface of the insulator 250 can be covered with the insulator that has a function of inhibiting the passage of oxygen and impurities such as water and hydrogen. Accordingly, entry of impurities such as water and hydrogen from above the transistor 200 into the oxide 230 through the insulator 250 and the conductor 260 can be suppressed. Thus, the insulator 272 has a function of a side barrier for protecting side surfaces of the gate electrode and the gate insulator.

When aluminum oxide is formed by an ALD method for the insulator 272, the insulator 272 preferably has a thickness of greater than or equal to 0.5 nm and less than or equal to 3.0 nm. With this structure, oxidization of the conductor 260 can be prevented and excess oxygen contained in the insulator 275 can be supplied to the insulator 250.

The insulator 275 functioning as an etching stopper layer in formation of the buffer layer and the conductor 240 may be provided on the side surface of the insulator 272. The parasitic capacitance generated between the conductor 240 and the conductor 260 is reduced by increasing the thickness of the insulator placed between the conductor 260 and the conductor 240 in the channel length direction.

The parasitic capacitance can be reduced by providing the insulator 275 as well as the insulator 272 in the transistor 200. The sum of the thickness of the insulator 275 in the channel length direction and the thickness of the insulator 272 in the channel length direction, which is converted into the thickness of a silicon oxide film (EOT: Equivalent Oxide Thickness), is set to 10 nm or more and 50 nm or less, preferably 15 nm or more and 30 nm or less. Moreover, aluminum oxide, silicon oxide, silicon oxynitride, silicon nitride oxide, or silicon nitride can be used for the insulator 275, for example. The reduction in the parasitic capacitance leads to high-speed operation of the transistor 200.

The insulator 273 is provided for the side surfaces of the oxide 230c, the insulator 250, and the conductor 260 with the insulator 272 and the insulator 275 positioned therebetween. When the insulator to be the insulator 273 is deposited in the above manner, the insulator 272 preferably includes an excess-oxygen region. In the case where the insulator 224 is processed into an island shape, a structure may be employed in which the insulator 224 and the insulator 272 are in contact with each other on the outer surface of the insulator 224. With this structure, excess oxygen in the insulator 272 can be supplied to the oxide 230 through the insulator 224.

The insulator 280 functioning as an interlayer film is preferably provided to cover the oxide 230 and the insulator 273. As in the insulator 224 or the like, the concentration of impurities such as water and hydrogen in the film of the insulator 280 is preferably lowered.

Note that the insulator 282 may be provided over the insulator 280. The insulator 282 can be provided in a manner similar to that of the insulator 210. When the insulator 282 is deposited by a sputtering method, impurities in the insulator 280 can be reduced.

Note that the insulator 282 functioning as a barrier film is preferably provided in contact with a top surface of the insulator 272. The insulator 282 is preferably formed using an insulating material having a function of inhibiting the passage of oxygen and impurities such as water and hydrogen. For example, aluminum oxide or hafnium oxide is preferably used. Thus, oxidization of the conductor 260 due to oxygen from above the insulator 282 can be inhibited. Moreover, entry of impurities such as water and hydrogen from above the insulator 282 into the oxide 230 through the conductor 260 and the insulator 250 can be inhibited.

Furthermore, the insulator 283 similar to the insulator 280 may be provided over the insulator 282.

The conductor 240a and the conductor 240b are provided in the openings formed in the insulator 283, the insulator 282, the insulator 280, and the insulator 273. The conductor 240a and the conductor 240b are positioned to face each other with the conductor 260 sandwiched therebetween. Note that the top surfaces of the conductor 240a and the conductor 240b may be on the same surface as the top surface of the insulator 283.

The conductor 240a is in contact with the region 231a functioning as one of the source region and the drain region of the transistor 200, and the conductor 240b is in contact with the region 231b functioning as the other of the source region and the drain region of the transistor 200. Thus, the conductor 240a can function as one of a source electrode and a drain electrode, and the conductor 240b can function as the other of the source electrode and the drain electrode.

Note that the conductor 240a is formed in contact with the inner wall of the opening in the insulator 283, the insulator 282, the insulator 280, and the insulator 273. The region 231a of the oxide 230 is positioned on at least part of a bottom of the opening, and thus the conductor 240a is in contact with the region 231a. Similarly, the conductor 240b is formed in contact with the inner wall of the opening in the insulator 280 and the insulator 273. The region 231b of the oxide 230 is positioned on at least part of a bottom of the opening, and thus the conductor 240b is in contact with the region 231b.

Here, as illustrated in FIG. 1, the opening in the insulator 283, the insulator 282, and the insulator 280 is preferably formed so that an inner wall of the insulator 280 is in contact with the side surface of the insulator 275. In order to form such an opening, it is preferable that the etching rate of the insulator 275 be extremely lower than the etching rate of the insulator 280 at the time of forming the opening in the insulator 282 and the insulator 280. When the etching rate of the insulator 275 is set to 1, the etching rate of the insulator 280 is preferably set to 5 or more, further preferably 10 or more. By formation of the opening in this manner, the opening can be formed in a self-aligned manner, a margin for alignment of the opening and the gate electrode can be increased, and the distance between the opening and the gate electrode can be designed to be small; thus, the semiconductor device can be highly integrated.

In the structure of the transistor 200 which is one embodiment of the present invention, for example, it is possible to prevent an electrical short circuit between the conductor 260 and the conductor 240a or the conductor 240b even in the case where the opening is shifted to overlap with a top surface of the insulator 270 at the time of forming the opening. That is, the etching rate of the insulator 270 is preferably extremely lower than the etching rate of the insulator 280, similarly to that of the insulator 275, at the time of forming the opening. Thus, a material similar to that for the insulator 275 can be used for the insulator 270.

Here, the conductor 240a and the conductor 240b are provided in the openings formed in the insulator 283, the insulator 282, and the insulator 280. The conductor 240a and the conductor 240b are positioned to face each other with the conductor 260 sandwiched therebetween. Note that the top surfaces of the conductor 240a and the conductor 240b may be on the same surface as the top surface of the insulator 282.

The conductor 240a is in contact with the region 231a functioning as one of the source region and the drain region of the transistor 200, and the conductor 240b is in contact with the region 231b functioning as the other of the source region and the drain region of the transistor 200. Thus, the conductor 240a can function as one of the source electrode and the drain electrode, and the conductor 240b can function as the other of the source electrode and the drain electrode.

Note that the conductor 240a is formed in contact with the inner wall of the opening in the insulator 283, the insulator 282, the insulator 280, and the insulator 273. The region 231a of the oxide 230 is positioned on at least part of the bottom of the opening, and thus the conductor 240a is in contact with the region 231a. Similarly, the conductor 240b is formed in contact with the inner wall of the opening in the insulator 283, the insulator 282, the insulator 280, and the insulator 273. The region 231b of the oxide 230 is positioned on at least part of the bottom of the opening, and thus the conductor 240b is in contact with the region 231b.

FIG. 2 is a cross-sectional view of a portion indicated by a dashed-dotted line A5-A6 in FIG. 1(A) and is a cross-sectional view of a region in the channel width direction of the transistor 200, where the conductor 240b is in contact with the oxide 230. Note that a region where the conductor 240a is in contact with the oxide 230 has a similar structure.

Figure 2A:
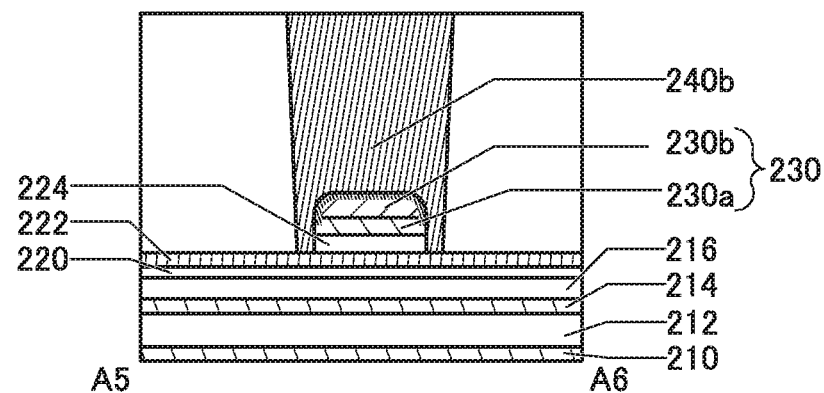
FIG. 2 Cross-sectional views of semiconductor devices of embodiments of the present invention.
Figure 2B:
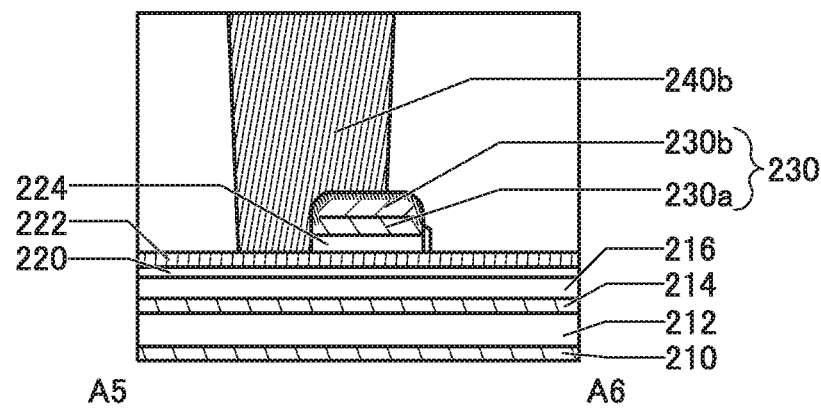
Figure 2C:
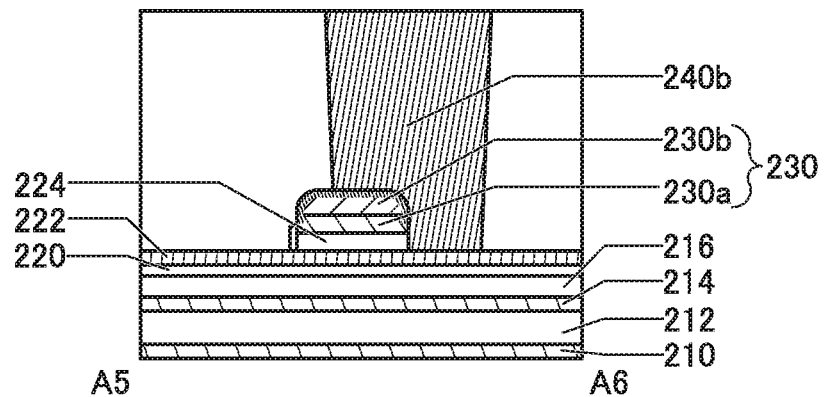

In FIG. 2(A), the conductor 240a and the conductor 240b are in contact with at least the top surface of the oxide 230, and preferably further in contact with the side surface of the oxide 230. It is particularly preferable that the conductor 240a and the conductor 240b be in contact with one or both of the side surface of the oxide 230 on the A5 side and the side surface of the oxide 230 on the A6 side, which intersect with the channel width direction of the oxide 230. In other words, the region where the oxide 230 is in contact with the conductor 240a and the conductor 240b has a cross-sectional shape like a saddle (such a structure can be referred to as a saddle-surface contact). Alternatively, a structure may be employed in which the conductor 240a and the conductor 240b are in contact with one or both of the side surface of the oxide 230 on the A1 side and the side surface of the oxide 230 on the A2 side, which intersect with the channel length direction of the oxide 230. The region where the oxide 230 is in contact with the conductor 240a and the conductor 240b is not limited to the example of FIG. 2(A); for example, as shown in FIG. 2(B), a region in contact with the top surface of the oxide 230 and the side surface of the oxide 230 may be included. Alternatively, a structure may be employed in which the conductor 240a and the conductor 240b are in contact with one or both of the side surface of the oxide 230 on the A1 side and the side surface of the oxide 230 on the A2 side, which intersect with the channel length direction of the oxide 230. Although FIG. 2(B) illustrates, as an example, a region where the conductor 240a and the conductor 240b are in contact with the side surface of the oxide 230 on the A5 side, a region where the conductor 240a and the conductor 240b are in contact with the side surface of the oxide 230 on the A6 side may be included, as illustrated in FIG. 2(C). With such a structure, the area of the region where the oxide 230 is in contact with the conductor 240a and the conductor 240b can be increased and the contact resistance between the oxide 230 and the conductor 240a and the conductor 240b can be reduced, which is preferable. Thus, miniaturization of the source electrode and the drain electrode of the transistor can be achieved and, in addition, the on-state current can be increased. The conductor 240a and the conductor 240b are preferably formed using a conductive material containing tungsten, copper, or aluminum as its main component. The conductor 240a and the conductor 240b may have a stacked-layer structure.

Figure 3B:
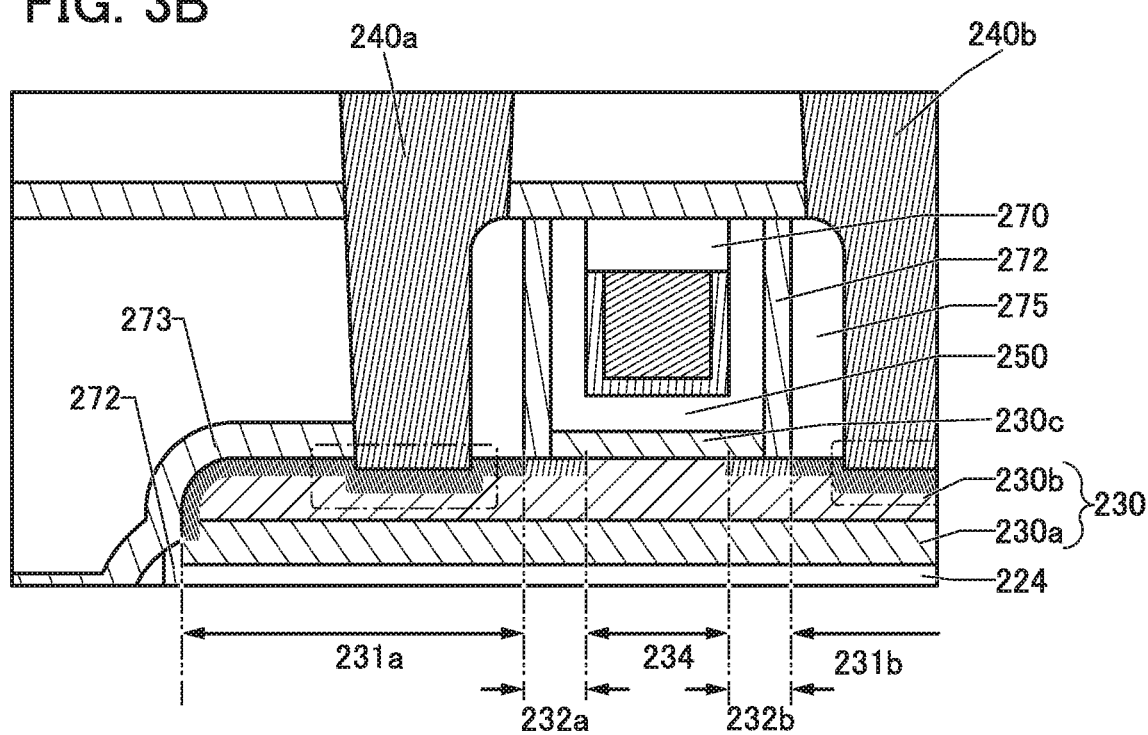

When the opening is formed in the insulator 280, for example, the low-resistance region of the region 231 of the oxide 230 may be removed as illustrated in FIG. 3(B). In this case, a conductor used for the conductor 240 is preferably formed using a metal film, a nitride film containing a metal element, or an oxide film containing a metal element. That is, the oxide 230 and the conductor 240 are in contact with each other, whereby another low-resistance region is formed in the oxide 230. Owing to formation of the low-resistance region, the contact resistance between the oxide 230 and the conductor 240 can be reduced. The conductor 240 preferably contains a metal element such as aluminum, ruthenium, titanium, tantalum, or tungsten, for example. In FIG. 3(B), the vicinity of another low-resistance region is surrounded by a dashed-dotted outline.

In the case where the conductor 240 has a stacked-layer structure, a conductive material having a function of inhibiting the passage of impurities such as water and hydrogen is preferably used for a conductor in contact with the insulator 283, the insulator 282, the insulator 280, and the insulator 273, like the first conductor of the conductor 205, for example. For example, tantalum, tantalum nitride, titanium, titanium nitride, ruthenium, ruthenium oxide, or the like is preferably used. The conductive material having a function of inhibiting the passage of impurities such as water and hydrogen may be a single layer or a stacked layer. With the use of the conductive material, impurities such as hydrogen and water can be inhibited from entering the oxide 230 through the conductor 240a and the conductor 240b from a layer above the insulator 283.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that like the conductor 203 or the like, the conductor may be formed to be embedded in an opening provided in an insulator.

<Constituent Materials for Semiconductor Device>

Constituent materials that can be used for a semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then the transistor is separated from the non-flexible substrate and transferred to a substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. Note that as the substrate, a sheet, a film, a foil, or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, for example, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material having a low dielectric constant is used for the insulator functioning as an interlayer film, the parasitic capacitance generated between wirings can be reduced. Thus, a material is preferably selected depending on the function of the insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure which is thermally stable and has a low dielectric constant can be obtained by combination with a resin, for example. Examples of the resin include polyester, polyolefin, polyamide (nylon, aramid, or the like), polyimide, polycarbonate, and acrylic. Furthermore, combining silicon oxide and silicon oxynitride with an insulator having a high dielectric constant enables a stacked-layer structure to have thermal stability and a high dielectric constant.

In addition, when a transistor using an oxide semiconductor is surrounded by an insulator having a function of inhibiting the passage of oxygen and impurities such as hydrogen, the transistor can have stable electrical characteristics.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds selected from hafnium, aluminum, gallium, yttrium, zirconium, tungsten, titanium, tantalum, nickel, germanium, magnesium, and the like can be used for the insulator 275 and the insulator 276.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has a lower barrier property than aluminum oxide, hafnium oxide having a large thickness can have a high barrier property. Therefore, the amount of added hydrogen and nitrogen can be adjusted appropriately by adjusting the thickness of hafnium oxide.

For example, the insulator 224 and the insulator 250 functioning as part of the gate insulator are each preferably an insulator including an excess-oxygen region. When a structure is employed in which silicon oxide or silicon oxynitride including an excess-oxygen region is in contact with the oxide 230, oxygen vacancies included in the oxide 230 can be compensated.

For example, an insulator containing an oxide of one or a plurality of kinds of aluminum, hafnium, and gallium can be used for the insulator 222 functioning as part of the gate insulator. In particular, it is preferable to use aluminum oxide, hafnium oxide, an oxide containing aluminum and hafnium (hafnium aluminate), or the like as the insulator containing an oxide of one or both of aluminum and hafnium.

For example, silicon oxide or silicon oxynitride, which is thermally stable, is preferably used for the insulator 220. When the gate insulator has a stacked-layer structure of a thermally stable film and a film having a high dielectric constant, the equivalent oxide thickness (EOT) of the gate insulator can be reduced while the physical thickness thereof is kept.

With the above stacked-layer structure, the on-state current can be increased without a reduction in the influence of the electric field from the gate electrode. Since the distance between the gate electrode and the region where a channel is formed is kept by the physical thickness of the gate insulator, a leakage current between the gate electrode and the channel formation region can be inhibited.

The insulator 212, the insulator 216, the insulator 272, the insulator 273, the insulator 280, and the insulator 283 each preferably include an insulator having a low dielectric constant. For example, the insulator 212, the insulator 216, the insulator 272, the insulator 273, the insulator 280, and the insulator 283 each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 212, the insulator 216, the insulator 272, the insulator 273, the insulator 280, and the insulator 283 each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (nylon, aramid, or the like), polyimide, polycarbonate, and acrylic.

For the insulator 210, the insulator 214, the insulator 222, the insulator 270, and the insulator 282, an insulator having a function of inhibiting the passage of oxygen and impurities such as hydrogen may be used. For the insulator 210, the insulator 214, the insulator 222, the insulator 270, and the insulator 282, a metal oxide such as aluminum oxide, hafnium oxide, magnesium oxide, gallium oxide, germanium oxide, yttrium oxide, zirconium oxide, lanthanum oxide, neodymium oxide, or tantalum oxide, silicon nitride oxide, silicon nitride, or the like may be used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure in which a material containing the above metal element and a conductive material containing oxygen are combined may be employed. Furthermore, a stacked-layer structure in which a material containing the above metal element and a conductive material containing nitrogen are combined may be employed. Furthermore, a stacked-layer structure in which a material containing the above metal element, a conductive material containing oxygen, and a conductive material containing nitrogen are combined may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

For the conductor 260, the conductor 203, the conductor 205, and the conductor 240, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

<<Metal Oxide>>

For the oxide 230, a metal oxide functioning as an oxide semiconductor (hereinafter also referred to as an oxide semiconductor) is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, a reduction in the electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including the CAAC-OS is physically stable. Therefore, the metal oxide including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

Note that indium-gallium-zinc oxide (hereinafter, IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used for a channel formation region of a transistor will be described.

Note that when the above metal oxide is used for a channel formation region of a transistor, the transistor having high field-effect mobility can be achieved. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using an oxide semiconductor has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of a low leakage current of the transistor using an oxide semiconductor is disclosed (see Non-Patent Document 7).

Furthermore, application of a transistor using an oxide semiconductor to a display device that utilizes the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of a low leakage current of the transistor have been studied.

[Impurities]

Here, the influence of each impurity in the metal oxide will be described.

When silicon or carbon that is a Group 14 element is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS) are set to lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set to lower than or equal to $1 \times 10^{18}$ atoms/cm$^3$, preferably lower than or equal to $2 \times 10^{16}$ atoms/cm$^3$.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region in the metal oxide is preferably reduced as much as possible. For example, the nitrogen concentration in the metal oxide is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$ in SIMS.

Furthermore, hydrogen contained in the metal oxide reacts with oxygen, which is bonded to a metal atom, to be water, and thus forms an oxygen vacancy in some cases. Entry of hydrogen into the oxygen vacancy generates an electron serving as a carrier in some cases. Furthermore, in some cases, part of hydrogen is bonded to oxygen, which is bonded to a metal atom, whereby an electron serving as a carrier is generated. Thus, a transistor using a metal oxide containing hydrogen is likely to have normally-on characteristics.

Hydrogen contained in a metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amount of hydrogen contained in the region. That is, the high-density region is a region that contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition containing indium, gallium, and zinc, the high-density region contains indium, gallium, and zinc and the low-density region contains indium and zinc, in some cases. In other words, the proportion of gallium in the low-density region is lower than that in the high-density region in some cases.

Note that such shallow defect states probably result from oxygen vacancies. When the oxygen vacancies in the metal oxide increase, deep defect states (dDOS: deep level Density of States) as well as shallow defect states probably increase. This is probably because deep defect states also result from oxygen vacancies. Note that deep defect states refer to defect states that are located around the center of the band gap.

Therefore, a reduction in the number of oxygen vacancies in the metal oxide can lead to a reduction in both shallow defect states and deep defect states. Furthermore, shallow defect states can probably be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby shallow defect states can be reduced.

Sallow defect states in a metal oxide affect the electrical characteristics of a transistor using the metal oxide as a semiconductor. In other words, owing to shallow defect states, the drain current $I_d$ changes gently with respect to the gate voltage $V_g$ in the drain current-gate voltage ($I_d$-$V_g$) characteristics of the transistor, worsening the S value (also referred to as Subthreshold Swing or SS), which is one of criteria for judging the rising characteristics of a transistor from an off state to an on state. This is probably because of trapping of electrons by shallow defect states.

Therefore, hydrogen in the metal oxide is preferably reduced as much as possible. Specifically, the hydrogen concentration in the metal oxide, which is measured by SIMS, is set to lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide whose impurities are sufficiently reduced is used for a channel formation region of a transistor, stable electrical characteristics can be provided.

<Manufacturing Method of Semiconductor Device>

Next, a method for manufacturing a semiconductor device including the transistor 200 of the present invention, which is illustrated in FIG. 1, will be described with reference to FIG. 4 to FIG. 24. In FIG. 4 to FIG. 24, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawings, some components are not illustrated in the top view of (A) of each drawing.

First, a substrate (not illustrated) is prepared, and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By a plasma enhanced CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, such plasma damage is not caused in the case of using a thermal CVD method that does not use plasma, and thus the yield of a semiconductor device can be increased. In addition, a thermal CVD method does not cause plasma damage during deposition, so that a film with few defects can be obtained.

An ALD method is also a deposition method which enables less plasma damage to an object. An ALD method also does not cause plasma damage during deposition, so that a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike in a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening with a high aspect ratio, for example. On the other hand, an ALD method has a relatively low deposition rate, and thus is preferably used in combination with another deposition method with a high deposition rate such as a CVD method, in some cases.

A CVD method or an ALD method enables control of composition of a film to be obtained with a flow rate ratio of the source gases. For example, by a CVD method or an ALD method, a film with a desired composition can be deposited by adjusting the flow rate ratio of the source gases. Moreover, for example, by a CVD method or an ALD method, by changing the flow rate ratio of the source gases during the deposition, a film whose composition is continuously changed can be deposited. In the case of depositing a film while changing the flow rate ratio of the source gases, as compared with the case of depositing a film with the use of a plurality of deposition chambers, time taken for the deposition can be shortened because time taken for transfer and pressure adjustment is omitted. Thus, productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, a conductive film to be the conductor 203 is deposited over the insulator 210. The conductive film to be the conductor 203 can be deposited by a sputtering method, a CVD method, an MBE method, a PLD method, an ALD method, or the like. The conductive film to be the conductor 203 can be a multilayer film. In this embodiment, tungsten is deposited as the conductive film to be the conductor 203.

Next, the conductive film to be the conductor 203 is processed by a lithography method, so that the conductor 203 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film that is a material of the hard mask over the conductive film to be the conductor 203, forming a resist mask thereover, and then etching the hard mask material. The etching of the conductive film to be the conductor 203 may be performed after removal of the resist mask or with the resist mask remaining. In the latter case, the resist mask may be removed during the etching. The hard mask may be removed by etching after the etching of the conductive film to be the conductor 203. Meanwhile, the hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is deposited over the insulator 210 and the conductor 203. The insulator to be the insulator 212 can be deposited by a sputtering method, a CVD method, an MBE method, a PLD method, an ALD method, or the like. In this embodiment, as the insulating film to be the insulator 212, silicon oxide is deposited by a CVD method.

Here, the thickness of the insulating film to be the insulator 212 is preferably greater than or equal to the thickness of the conductor 203. For example, when the thickness of the conductor 203 is 1, the thickness of the insulating film to be the insulator 212 is greater than or equal to 1 and less than or equal to 3. In this embodiment, the thickness of the thickness of the conductor 203 is 150 nm and the thickness of the insulating film to be the insulator 212 is 350 nm.

Next, CMP (Chemical Mechanical Polishing) treatment is performed on the insulating film to be the insulator 212, so that part of the insulating film to be the insulator 212 is removed and a surface of the conductor 203 is exposed. Thus, the conductor 203 and the insulator 212 whose top surfaces are flat can be formed (see FIG. 4).

Here, a method for forming the conductor 203 that is different from the above is described below.

The insulator 212 is deposited over the insulator 210. The insulator 212 can be deposited by a sputtering method, a CVD method, an MBE method, a PLD method, an ALD method, or the like.

Then, an opening is formed in the insulator 212 to reach the insulator 210. Examples of the opening include a groove and a slit. A region where the opening is formed may be referred to as an opening portion. The opening can be formed by wet etching; however, dry etching is preferably used for microfabrication. As the insulator 210, it is preferable to select an insulator that functions as an etching stopper film used in forming the groove by etching the insulator 212. For example, in the case where a silicon oxide film is used as the insulator 212 in which the groove is to be formed, a silicon nitride film, an aluminum oxide film, or a hafnium oxide film is preferably used as the insulator 210.

After the formation of the opening, a conductive film to be the conductor 203 is deposited. The conductive film desirably include a conductor that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 203 can be deposited by a sputtering method, a CVD method, an MBE method, a PLD method, an ALD method, or the like.

In this embodiment, the conductive film to be the conductor 203 has a multilayer structure. First, tantalum nitride or a stacked film in which titanium nitride is stacked over tantalum nitride is deposited by a sputtering method. With the use of such metal nitride for a lower layer of the conductive film to be the conductor 203, a metal that is easily diffused, such as copper, can be prevented from diffusing to the outside from the conductor 203 even when the metal is used for an upper layer of the conductive film to be the conductor 203 that is described below.

Next, a conductive film of the upper layer of the conductive film to be the conductor 203 is deposited. The conductive film can be deposited by a plating method, a sputtering method, a CVD method, an MBE method, a PLD method, an ALD method, or the like. In this embodiment, for the conductive film of the upper layer of the conductive film to be the conductor 203, a low-resistance conductive material such as copper is deposited.

Next, CMP treatment is performed to remove parts of the upper layer of the conductive film to be the conductor 203 and the lower layer of the conductive film to be the conductor 203, so that the insulator 212 is exposed. As a result, the conductive film to be the conductor 203 remains only in the opening portion. Thus, the conductor 203 whose top surface is flat can be formed. Note that the insulator 212 is partly removed by the CMP treatment in some cases. The above is the different method for forming the conductor 203.

Next, the insulator 214 is deposited over the insulator 212 and the conductor 203. The insulator 214 can be deposited by a sputtering method, a CVD method, an MBE method, a PLD method, an ALD method, or the like. In this embodiment, for the insulator 214, silicon nitride is deposited by a CVD method. As described here, an insulator through which copper is less likely to pass, such as silicon nitride, is used for the insulator 214; accordingly, even when a metal that is easily diffused, such as copper, is used for the second conductor of the conductor 203, the metal can be prevented from being diffused into layers above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method.

Next, an opening reaching the conductor 203 is formed in the insulator 214 and the insulator 216. The opening may be formed by wet etching; however, dry etching is preferably used for microfabrication.

After the formation of the opening, a conductive film to be the conductor 205a is deposited. The conductive film to be the conductor 205a preferably includes a conductive material that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, for the conductive film to be the conductor 205b, titanium nitride is deposited by a CVD method and tungsten is deposited by a CVD method over the titanium nitride.

Next, CMP treatment is performed to remove parts of the conductive film to be the conductor 205a and the conductive film to be the conductor 205b, so that the insulator 216 is exposed. As a result, the conductive film to be the conductor 205a and the conductive film to be the conductor 205b remain only in the opening portion. Thus, the conductor 205 including the conductor 205a and the conductor 205b, which has a flat top surface, can be formed (see FIG. 4). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method.

Next, the insulator 222 is deposited over the insulator 220. An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are prevented from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film 224A is deposited over the insulator 222. The insulating film 224A can be deposited by a sputtering method, a CVD method, an MBE method, a PLD method, an ALD method, or the like (see FIG. 4). In this embodiment, for the insulator film 224A, silicon oxide is deposited by a CVD method.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, heat treatment is performed at 400° C. in a nitrogen atmosphere for one hour after the deposition of the insulating film 224A. By the heat treatment, impurities such as hydrogen and water contained in the insulating film 224A can be removed, for example.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

Here, in order to form an excess-oxygen region in the insulating film 224A, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment containing an inert gas is performed with this apparatus, plasma treatment containing oxygen may be performed to compensate for released oxygen. Note that impurities such as water and hydrogen contained in the insulating film 224A can be removed by selecting the conditions for the plasma treatment appropriately. In that case, the heat treatment is not necessarily performed.

Figure 4A:
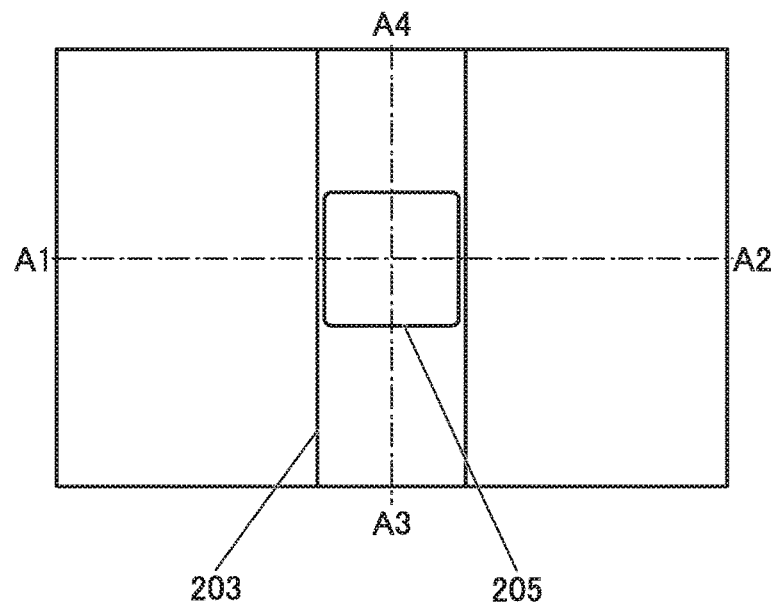
FIG. 4 A top view and cross-sectional views illustrating a method for manufacturing a semiconductor device of one embodiment of the present invention.
Figure 4C:
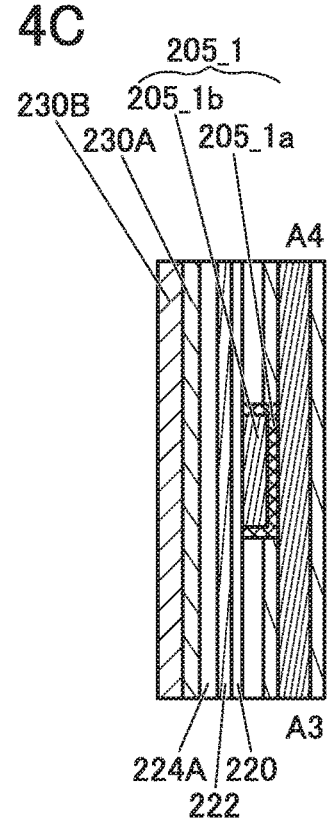
Figure 4B:
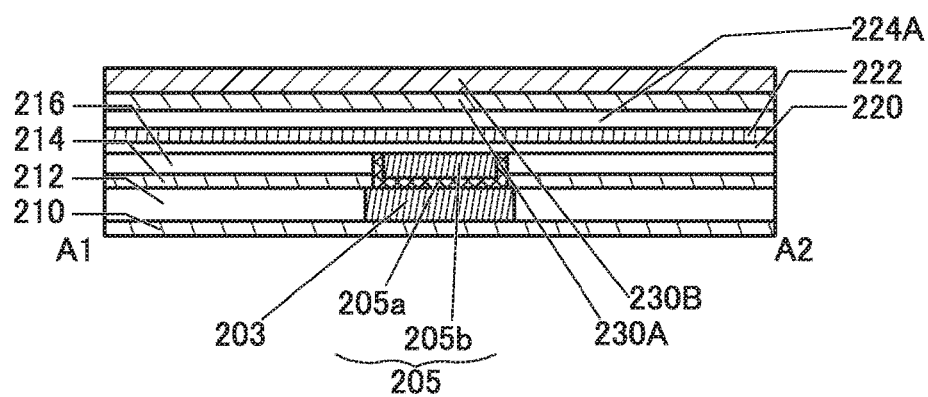
Figure 5A:
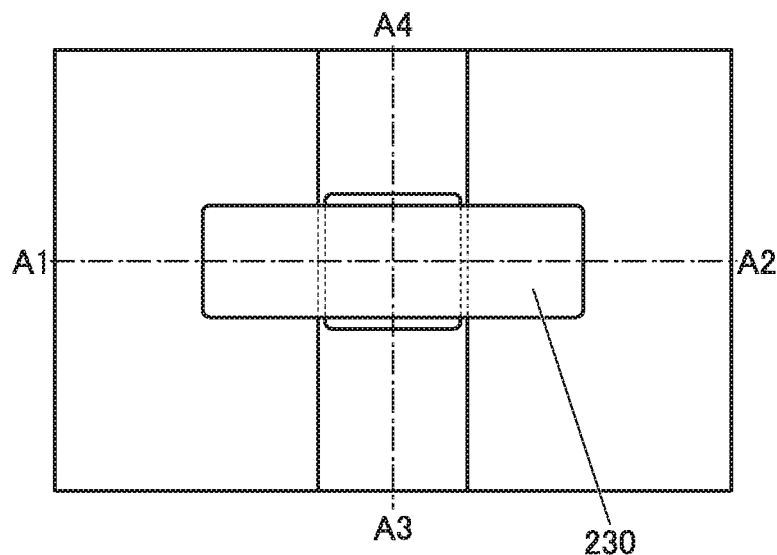
FIG. 5 A top view and cross-sectional views illustrating a method for manufacturing a semiconductor device of one embodiment of the present invention.
Figure 5C:
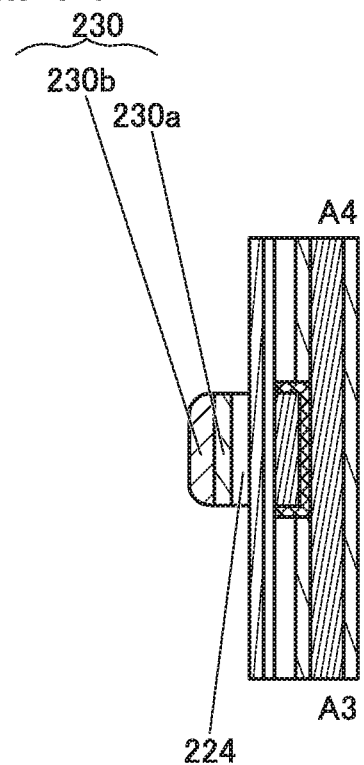
Figure 5B:
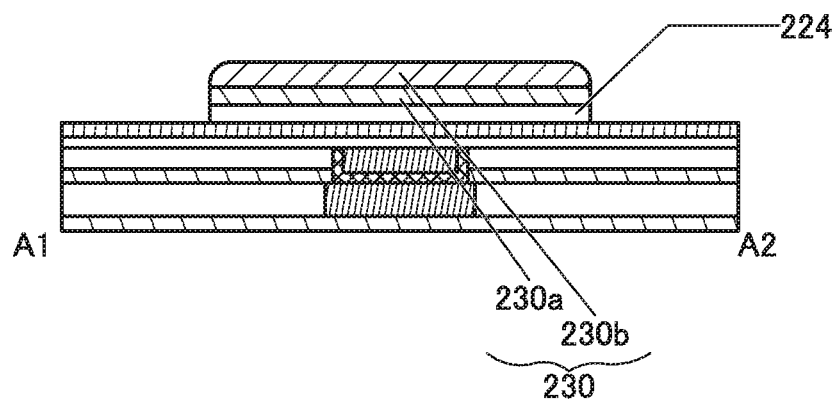

Next, an oxide film 230A to be the oxide 230a and an oxide film 230B to be the oxide 230b are deposited in this order over the insulating film 224A (see FIG. 4). Note that the oxide films are preferably deposited successively without exposure to an air atmosphere. By the deposition without exposure to the air, impurities or moisture from the air atmosphere can be prevented from being attached to the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, the amount of excess oxygen in the oxide films to be deposited can be increased. In the case where the above oxide films are deposited by a sputtering method, the above In-M-Zn oxide target can be used.

In particular, when the oxide film 230A is deposited, part of oxygen contained in the sputtering gas is supplied to the insulating film 224A in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is 1% or higher and 30% or lower, preferably 5% or higher and 20% or lower during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230A is deposited by a sputtering method using a target with In:Ga:Zn=1:3:4 [atomic ratio]. The oxide film 230B is deposited by a sputtering method using a target with In:Ga:Zn=4:2:4.1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, the oxide film 230A and the oxide film 230B are processed into island shapes to form the oxide 230a and the oxide 230b. Note that in this step, the insulating film 224A may be processed into an island shape to form the insulator 224. In that case, the insulator 222 can be used as an etching stopper film (see FIG. 5).

Here, the oxide 230a and the oxide 230b are formed to at least partly overlap with the conductor 205. It is preferable that the side surfaces of the oxide 230a and the oxide 230b be substantially perpendicular to a top surface of the insulator 222. When the side surfaces of the oxide 230a and the oxide 230b are substantially perpendicular to the top surface of the insulator 222, the plurality of transistors 200 can be provided in a smaller area and at a higher density. Alternatively, a structure may be employed in which an angle formed by the side surfaces of the oxide 230a and the oxide 230b and the top surface of the insulator 222 is an acute angle. In that case, the angle formed by the side surfaces of the oxide 230a and the oxide 230b and the top surface of the insulator 222 is preferably greater than or equal to 60° and less than 70°. With such a shape, it is possible that the insulator 272 is not formed on the side surfaces of the oxide 230a and the oxide 230b in a later step.

There is a curved surface between the side surfaces of the oxide 230a and the oxide 230b and the top surface of the oxide 230b. That is, an end portion of the side surface and an end portion of the top surface are preferably curved (hereinafter such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide films, a lithography method can be employed. For the processing, a dry etching method or a wet etching method can be employed. The processing by a dry etching method is suitable for microfabrication.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities, cleaning is performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, a hydrofluoric acid, or the like with pure water or carbonated water. Alternatively, ultrasonic cleaning using pure water or carbonated water may be performed. In this embodiment, the ultrasonic cleaning using pure water or carbonated water is performed.

Sequentially, heat treatment may be performed. For the conditions of the heat treatment, the conditions for the above-described heat treatment can be used.

Figure 6A:
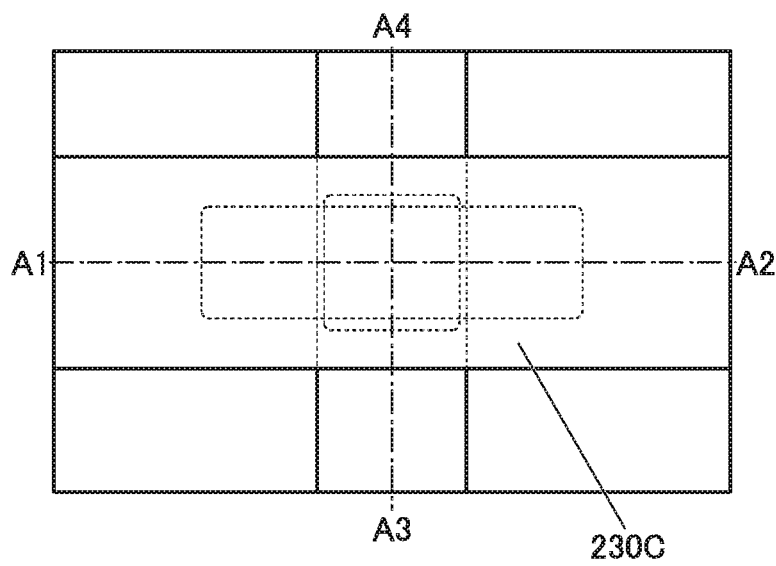
FIG. 6 A top view and cross-sectional views illustrating a method for manufacturing a semiconductor device of one embodiment of the present invention.
Figure 6C:
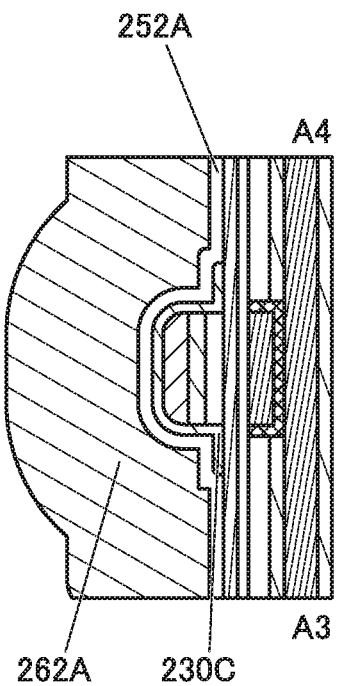
Figure 6B:
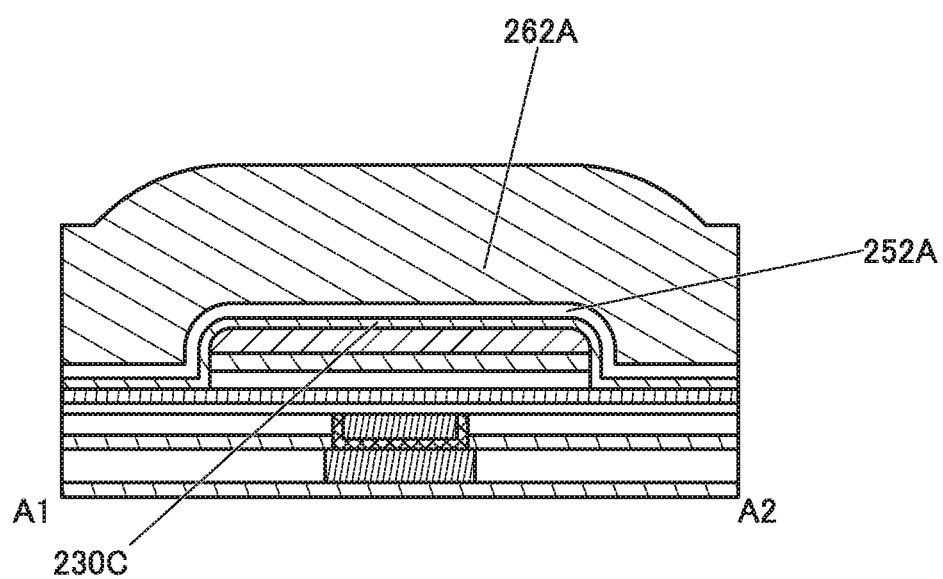

Next, an oxide film 230C is deposited over the insulating film 224, the oxide 230a, and the oxide 230b (see FIG. 6).

The oxide film 230C can be deposited by a sputtering method, a CVD method, an MBE method, a PLD method, an ALD method, or the like. The oxide film 230C may be deposited by a method similar to that for the oxide film 230A or the oxide film 230B in accordance with characteristics required for the oxide 230c. In this embodiment, the oxide film 230C is deposited by a sputtering method using a target with In:Ga:Zn=1:3:4 [atomic ratio].

Then, a dummy gate insulating film 252A and a dummy gate film 262A are deposited in this order over the oxide film 230C (see FIG. 6).

First, the dummy gate insulating film 252A is deposited. The dummy gate insulating film 252A is processed to be used as a dummy gate insulator. The dummy gate insulator is an interim gate insulator. That is, the dummy gate insulating film 252A is processed to form an interim gate insulator, the dummy gate insulator is removed in a later step, and a gate insulator is formed. Thus, a film that is easily processed minutely and easily removed is preferably used as the dummy gate insulating film 252A. Furthermore, the dummy gate insulating film 252A is provided in contact with a region to be the channel formation region in the oxide 230. Therefore, an insulator including few impurities or including an excess-oxygen region is preferably used.

The dummy gate insulating film 252A can be deposited by a sputtering method, a CVD method, an MBE method, a PLD method, an ALD method, or the like. For example, for the dummy gate insulating film 252A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the dummy gate insulating film 252A is deposited at 400° C., an insulator including few impurities can be deposited.

Note that oxygen is excited by microwaves to generate high-density oxygen plasma, and the dummy gate insulating film 252A is exposed to the oxygen plasma, whereby oxygen can be introduced into the dummy gate insulating film 252A.

Furthermore, heat treatment may be performed. For the heat treatment, the conditions for the above-described heat treatment can be used. The heat treatment can reduce the moisture concentration and the hydrogen concentration in the dummy gate insulating film 252A.

Next, the dummy gate film 262A is deposited. The dummy gate film 262A is processed to be used as a dummy gate. The dummy gate is an interim gate electrode. That is, the dummy gate film 262A is processed to form an interim gate electrode, the dummy gate is removed in a later step, and a gate electrode is formed using a conductive film or the like instead. Thus, a film that is easily processed minutely and easily removed is preferably used as the dummy gate film 262A.

The dummy gate film 262A can be deposited by a sputtering method, a CVD method, an MBE method, a PLD method, an ALD method, or the like. An insulator, a semiconductor, or a conductor can be used, for example. Specifically, silicon such as polysilicon or amorphous silicon or a metal film of aluminum, titanium, tungsten, or the like is used, for example. Alternatively, a resin film may be formed by a coating method. For example, a photoresist, polyester, polyolefin, polyamide (nylon, aramid, or the like), polyimide, polycarbonate, acrylic, or the like can be given. When the resin film is formed by a coating method, a surface of the dummy gate film 262A can be flat. In this manner, when having a flat surface, the dummy gate film 262A can be easily processed minutely and easily removed.

The dummy gate film 262A can be a multilayer film using different kinds of films. For example, the dummy gate film 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end of the CMP treatment can be detected in some cases, so that processing variation can be reduced in some cases.

Figure 7A:
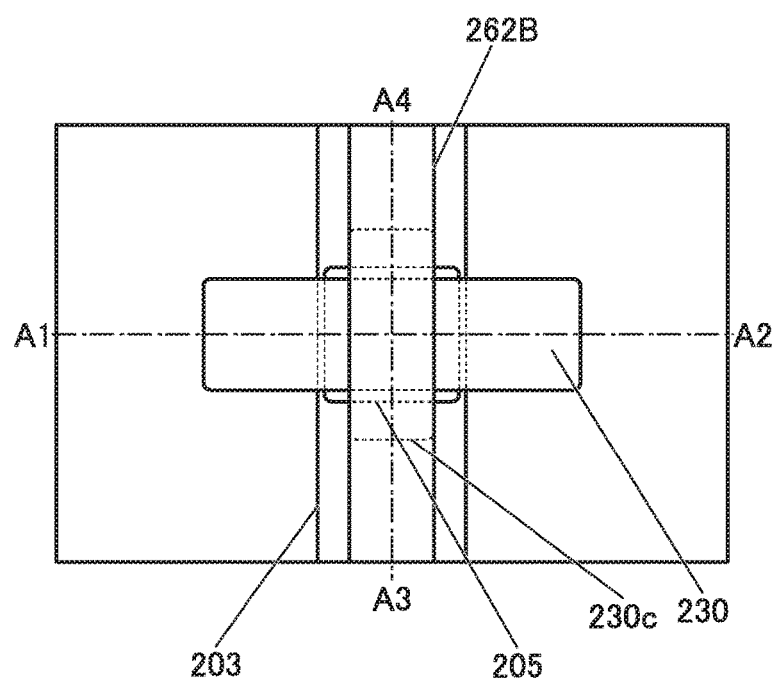
FIG. 7 A top view and cross-sectional views illustrating a method for manufacturing a semiconductor device of one embodiment of the present invention.
Figure 7C:
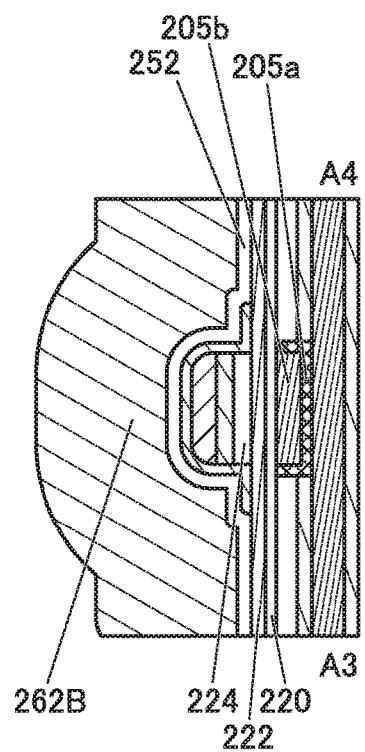
Figure 7B:
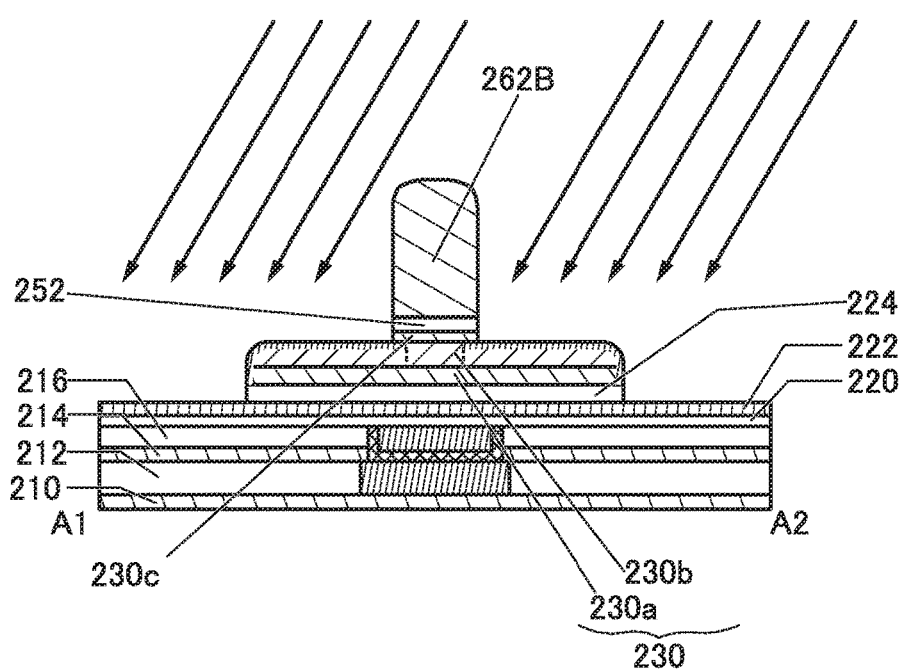

Next, the oxide film 230C, the dummy gate insulating film 252A, and the dummy gate film 262A are etched by a lithography method to form the oxide 230c, the dummy gate insulator 252, and a dummy gate layer 262B (see FIG. 7). The oxide 230c, the dummy gate insulator 252, and the dummy gate layer 262B are formed to at least partly overlap with the conductor 205 and oxide 230.

Here, a dopant such as a rare gas is introduced into the oxide 230 with the use of the dummy gate insulator 252 and the dummy gate layer 262B as masks, so that the resistance of the oxide semiconductor is reduced. In this step, the resistance of a region including the region 232 in the oxide 230 is reduced. Therefore, in the oxide 230, a dopant such as a rare gas needs to be introduced into a region overlapping with the dummy gate insulator 252 and the dummy gate layer 262B.

Then, introduction of a dopant such as a rare gas is preferably performed by an ion doping method or the like. For example, in the oxide 230, the moving direction of the dopant is preferably different from a normal direction of the substrate so that the dopant is added to the region overlapping with the dummy gate insulator 252 and the dummy gate layer 262B. For example, an impurity such as a rare gas is added with the use of the dummy gate insulator 252 and the dummy gate layer 262B as masks while the substrate is inclined, whereby the region 232 can be provided in the region of the oxide 230 overlapping with the insulator 250 (see FIG. 7: arrows in the drawing indicate the moving direction of the dopant).

Specifically, the dopant is added while the substrate is inclined in such a manner that the normal direction of the substrate (not illustrated) is inclined by +θ (θ is greater than or equal to 1° and less than or equal to 60°, preferably greater than or equal to 3° and less than or equal to 45°, more preferably greater than or equal to 5° and less than or equal to 30°) from the moving direction of the dopant. At this time, the region 232a is formed also in the oxide 230b and the oxide 230a which overlap with the dummy gate insulator 252, the dummy gate layer 262B, and the oxide 230c.

On the other hand, with the conductor 260 and the like serving as masks, the metal element is not added to part of the oxide 230c, the oxide 230b, and the oxide 230a, which is positioned opposite to the region 232a with the dummy gate insulator 252, the dummy gate layer 262B, and the oxide 230c as axes.

Next, the metal element is added while the substrate is inclined in such a manner that the normal direction of the substrate is inclined by −θ (θ is greater than or equal to 1° and less than or equal to 60°, preferably greater than or equal to 3° and less than or equal to 45°, more preferably greater than or equal to 5° and less than or equal to 30° from the moving direction of the dopant. At this time, the region 232b is formed also in the oxide 230b and the oxide 230a which overlap with the dummy gate insulator 252, the dummy gate layer 262B, and the oxide 230c.

Thus, by adding the metal element while the moving direction of the dopant is different from the normal direction of the substrate, the region 232 can be formed in the oxide 230b and the oxide 230a which overlap with the dummy gate insulator 252, the dummy gate layer 262B, and the oxide 230c.

It is preferable that the side surface of the oxide 230c, a side surface of the dummy gate insulator 252, and a side surface of the dummy gate layer 262B be on the same plane.

The plane on which the side surface of the oxide 230c, the side surface of the dummy gate insulator 252, and the side surface of the dummy gate layer 262B are is preferably substantially perpendicular to a top surface of the substrate. That is, in a cross section, an angle of the oxide 230c, the dummy gate insulator 252, and the dummy gate layer 262B with respect to the top surface of the oxide 230 is preferably an acute angle that is as wide as possible. Note that in a cross section, an angle formed by the side surfaces of the oxide 230c, the dummy gate insulator 252, and the dummy gate layer 262B and the top surface of the oxide 230 may be an acute angle. In that case, the angle formed by the side surfaces of the oxide 230c, the dummy gate insulator 252, and the dummy gate layer 262B and the top surface of the oxide 230 is preferably as wide as possible.

Figure 8A:
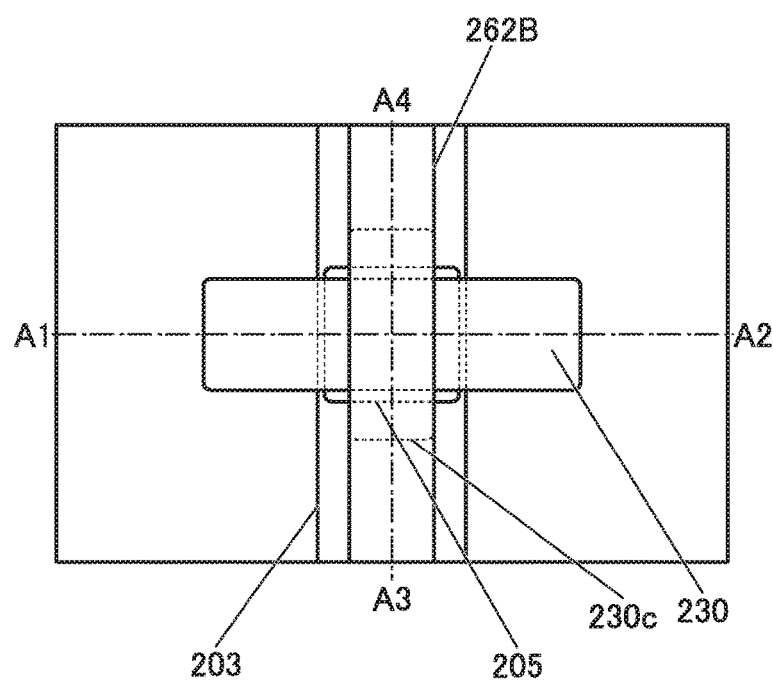
FIG. 8 A top view and cross-sectional views illustrating a method for manufacturing a semiconductor device of one embodiment of the present invention.
Figure 8C:
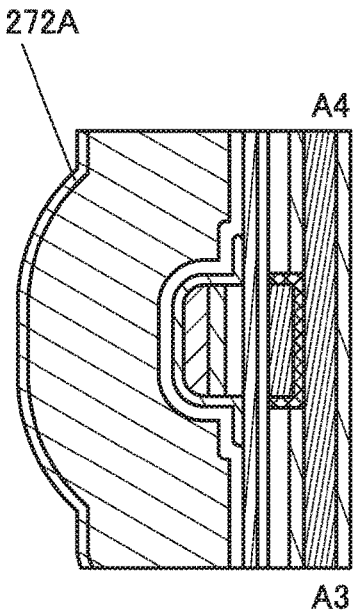
Figure 8B:
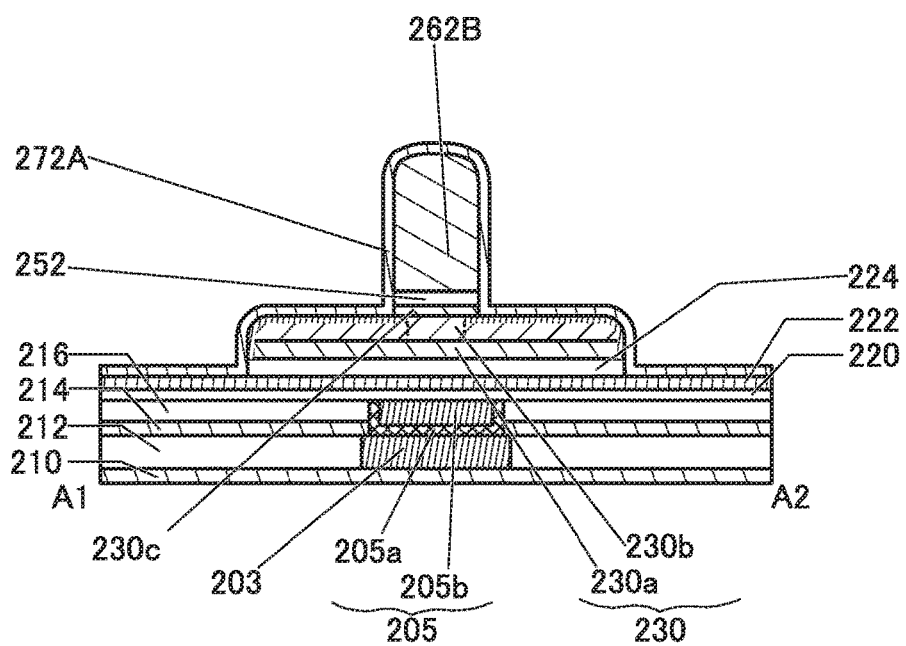

Next, an insulating film 272A is deposited to cover the oxide 230, the oxide 230c, the dummy gate insulator 252, and the dummy gate layer 262B (see FIG. 8). The insulating film 272A can be deposited by a sputtering method, a CVD method, an MBE method, a PLD method, an ALD method, or the like.

The insulating film 272A is preferably deposited by an ALD method which enables good coverage. With the use of an ALD method, the insulating film 272A having a uniform thickness can be formed on the side surfaces of the oxide 230c, the insulator 250, and the dummy gate layer 262B even at a step portion formed by the dummy gate layer 262B or the like. With the use of an ALD method, a dense thin film can be deposited.

The insulating film 272A preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be formed easily in a later step, are preferable.

Alternatively, aluminum oxide having a barrier property or the like may be provided for the insulating film 272A. In the case where the conductor 260 is a metal film that is easily oxidized, for example, an insulator having a barrier property can inhibit oxidization of the conductor 260 due to oxygen from the outside of the insulator 272. This can suppress an increase in the resistance value of the conductor 260.

When aluminum oxide is formed by an ALD method for the insulating film 272A, the insulating film 272A has a thickness of greater than or equal to 0.5 nm and less than or equal to 20 nm, preferably greater than or equal to 1 nm and less than or equal to 10 nm. With this structure, oxidization of the conductor 260 can be prevented while excess oxygen contained in the insulator 275 can be supplied to the insulator 250 in a later step.

Figure 9A:
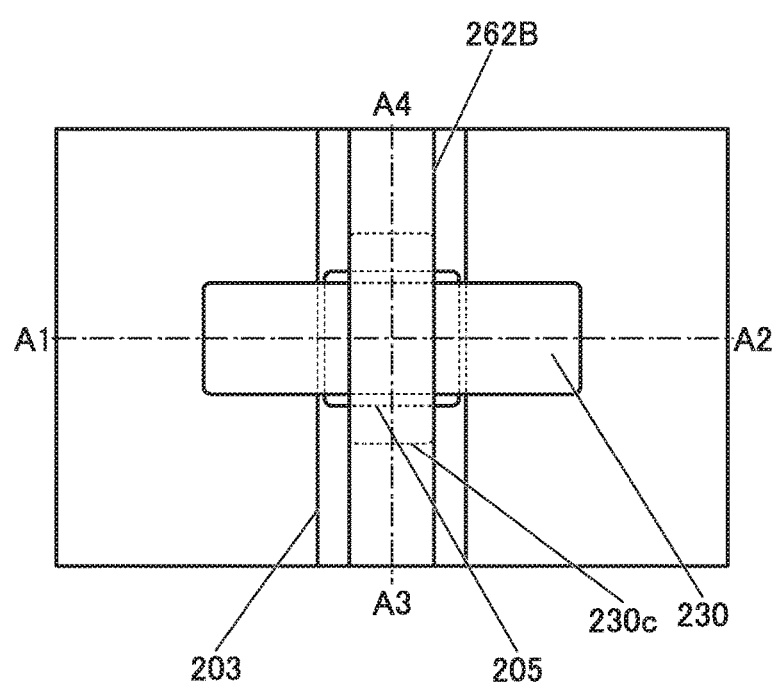
FIG. 9 A top view and cross-sectional views illustrating a method for manufacturing a semiconductor device of one embodiment of the present invention.
Figure 9C:
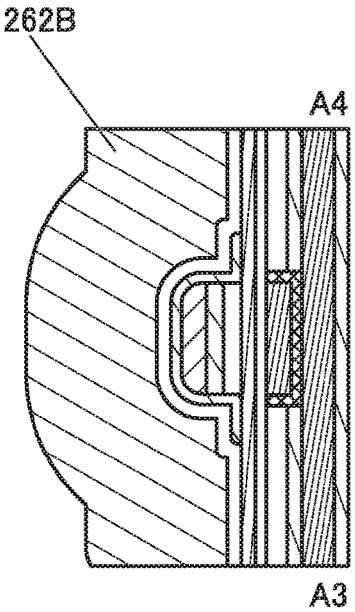
Figure 9B:
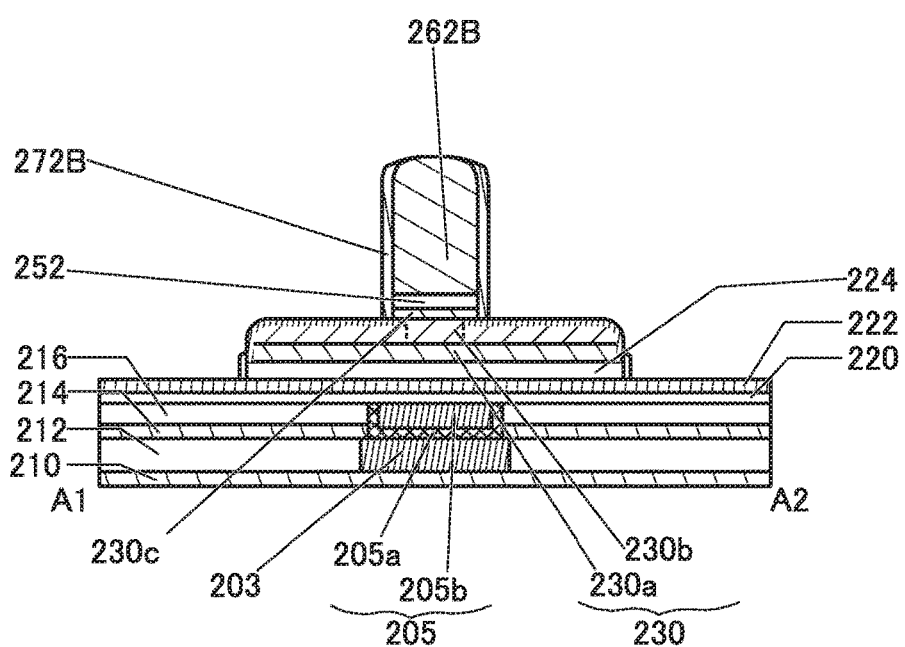

Next, the insulating film 272A is subjected to anisotropic etching treatment to form an insulator 272B (see FIG. 9).

Dry etching treatment is preferably performed as the above anisotropic etching treatment. In this manner, the insulating film deposited on a plane substantially parallel to the substrate surface can be removed, so that the insulator 272B can be formed in a self-aligned manner.

The insulator 272 may be formed in a state where the insulating film 272A remains in contact with the side surface of the oxide 230. When the insulator 272 is provided in contact with the side surface of the oxide 230, impurities such as water or hydrogen entering the oxide 230 can be reduced and outward diffusion of oxygen from the oxide 230 can be prevented, in some cases.

Next, a film 242A is deposited over the insulator 222, the insulator 224, and the oxide 230 with the oxide 230c, the insulator 252, the dummy gate layer 262B, and the insulator 272B therebetween (see FIG. 10). Note that the thickness of the film 242A is preferably greater than or equal to 0.5 nm and less than or equal to 5 nm, further preferably greater than or equal to 1 nm and less than or equal to 3 nm. As the film 242A, a metal film, a nitride film containing a metal element, or an oxide film containing a metal element is used. For example, the film 242A is a film containing a metal element such as aluminum, ruthenium, titanium, tantalum, tungsten, or chromium. Note that the film 242A can be deposited by a sputtering method, a CVD method, an MBE method, a PLD method, an ALD method, or the like.

Sequentially, heat treatment is performed. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. The heat treatment may be performed under a reduced pressure. For example, as the heat treatment, treatment is performed at 400° C. in a nitrogen atmosphere for one hour after the deposition of the film 242A.

By the heat treatment in the atmosphere containing nitrogen, the metal element is diffused from the film 242A into the oxide 230; thus, the metal element can be added to the oxide 230. Moreover, oxygen in the oxide 230 in the vicinity of the interface with the film 242A may be absorbed by the film 242A. As a result, the oxide 230 in the vicinity of the interface with the film 242A becomes a metal compound and the resistance thereof is reduced. Note that at this time, part of the oxide 230 may be alloyed with the above-described metal element. When part of the oxide 230 is alloyed with the metal element, the metal element added to the oxide 230 is brought into a relatively stable state; therefore, a highly reliable semiconductor device can be provided.

In the case where hydrogen in the oxide 230 diffuses into the region 231 and enters an oxygen vacancy in the region 231, the hydrogen is brought into a relatively stable state. Hydrogen in an oxygen vacancy in the region 234 is released from the oxygen vacancy by heat treatment at 250° C. or higher, diffuses into the region 231, enters an oxygen vacancy in the region 231, and is brought into a relatively stable state. Thus, by the heat treatment, the resistance of the region 231 is further reduced, and the region 234 is highly purified (a reduction in impurities such as water or hydrogen) and the resistance thereof is further increased.

Alternatively, heat treatment may be performed in a nitrogen atmosphere or an inert gas atmosphere, and then another heat treatment may be performed in an atmosphere containing an oxidizing gas at 10 ppm or more, 1% or more, or 10% or more. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C.

In the case where a region having conductivity remains in the film 242A, heat treatment in an oxidization atmosphere oxidizes the film 242A, whereby the film 242A becomes an insulator and the resistance thereof is increased. The film 242A that remains as an insulator can function as an interlayer film.

Through the above process, the region 231 and the region 232 of the oxide 230 become n-type and the resistance thereof is reduced.

Then, the film 242A is removed. The metal film, the oxide film containing the metal element, or the nitride film containing the metal element is not necessarily removed. When the metal film, the oxide film containing the metal element, or the nitride film containing the metal element is oxidized by oxygen absorbed from the oxide 230 to be a high-resistance insulator, for example, the film may remain. In this case, the film may function as an interlayer film. A dry etching method or a wet etching method can be used in this step. At the same time as the film 242A is removed, hydrogen absorbed by the film 242A from the oxide 230 can be removed. Thus, hydrogen, which is an impurity in the transistor 200, can be reduced. Note that the vicinity of the region of the oxide 230 with reduced resistance is indicated by diagonal lines (see FIG. 11).

Figure 11A:
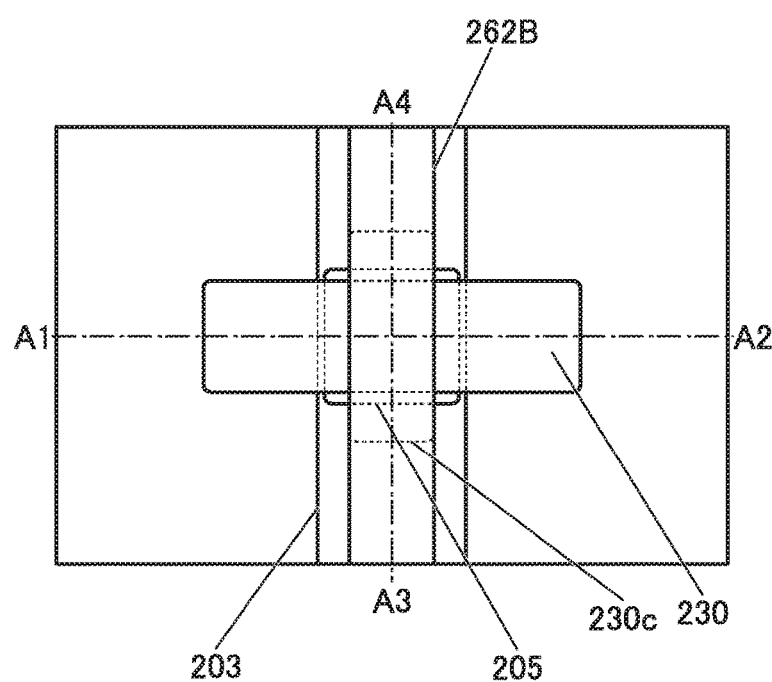
FIG. 11 A top view and cross-sectional views illustrating a method for manufacturing a semiconductor device of one embodiment of the present invention.
Figure 11C:
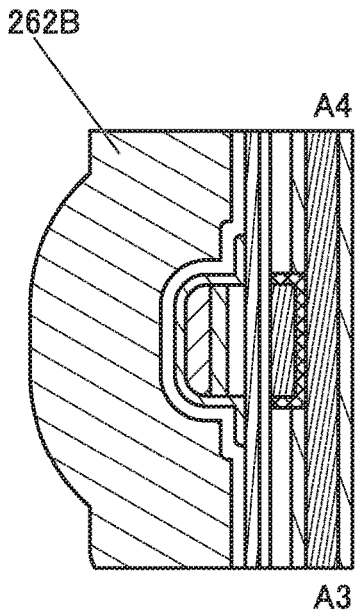
Figure 11B:
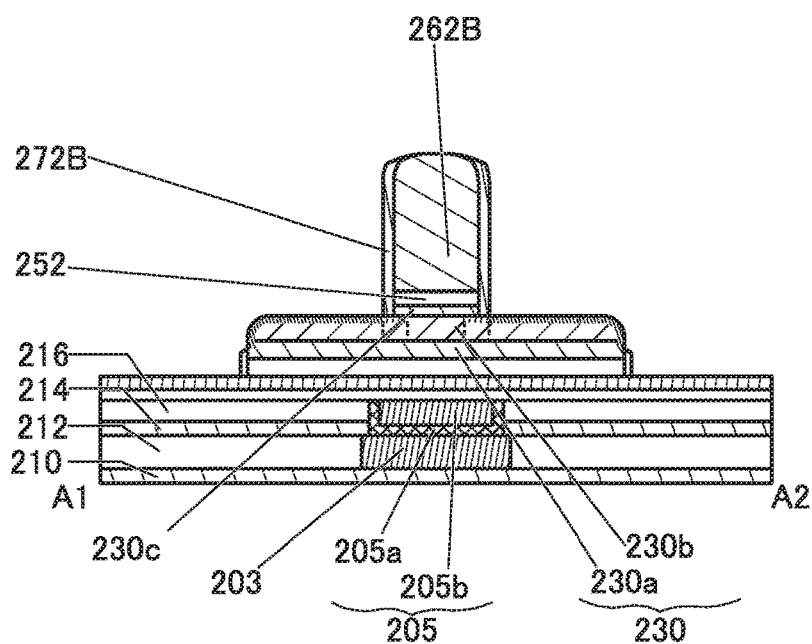
Figure 12A:
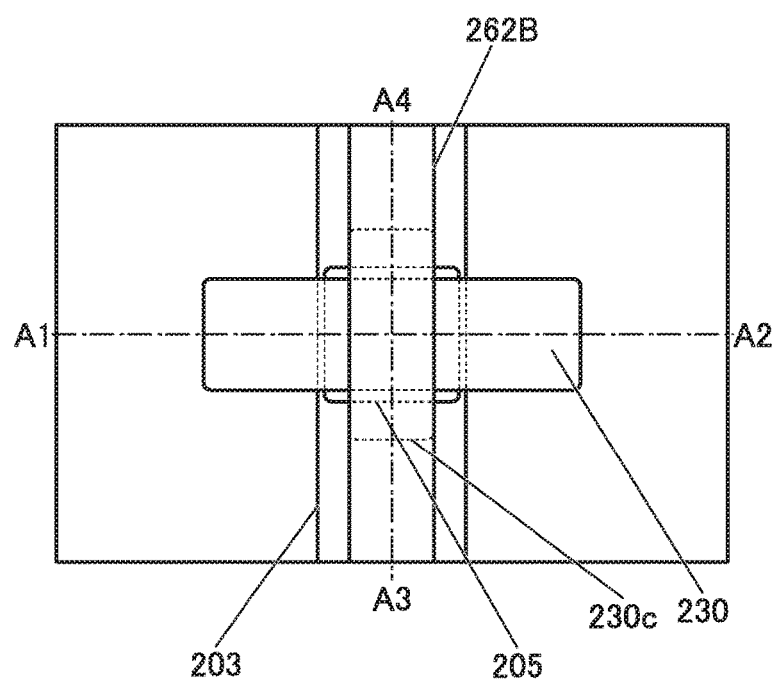
FIG. 12 A top view and cross-sectional views illustrating a method for manufacturing a semiconductor device of one embodiment of the present invention.
Figure 12C:
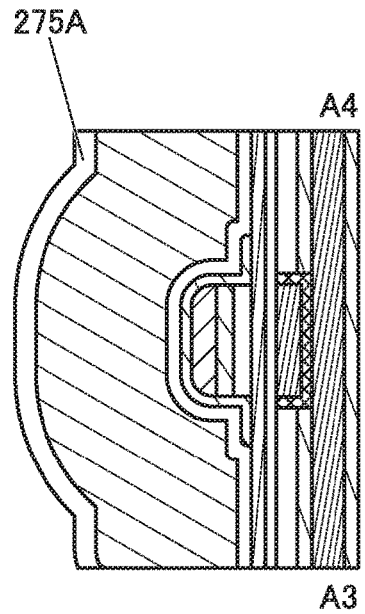
Figure 12B:
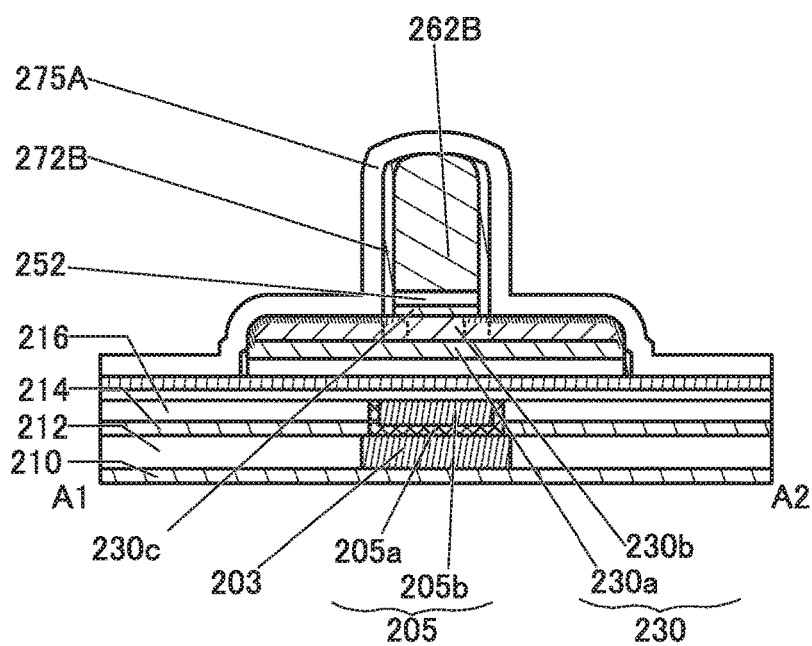

Note that the method is described in this embodiment, in which the film 242A illustrated in FIG. 10 and FIG. 11 is formed, heat treatment is performed, and then the film 242A is removed; however, it is not limited thereto. For example, in the case where the resistance of the oxide semiconductor is sufficiently reduced only by the step in which the dopant such as a rare gas is mixed into the oxide 230 to reduce the resistance of the oxide semiconductor, which is illustrated in FIG. 7, the steps illustrated in FIG. 10 and FIG. 11 may be omitted.

Next, an insulating film 275A is deposited to cover the insulator 222, the oxide 230, the insulator 272B, and the dummy gate layer 262B. The insulating film 275A can be deposited by a sputtering method, a CVD method, an MBE method, a PLD method, an ALD method, or the like (see FIG. 12).

Next, the insulating film 275A is subjected to anisotropic etching treatment to form an insulator 275B (see FIG. 13).

Dry etching treatment is preferably performed as the above anisotropic etching treatment. In this manner, the insulating film deposited on the plane substantially parallel to the substrate surface can be removed, so that the insulator 275B can be formed in a self-aligned manner.

Figure 14A:
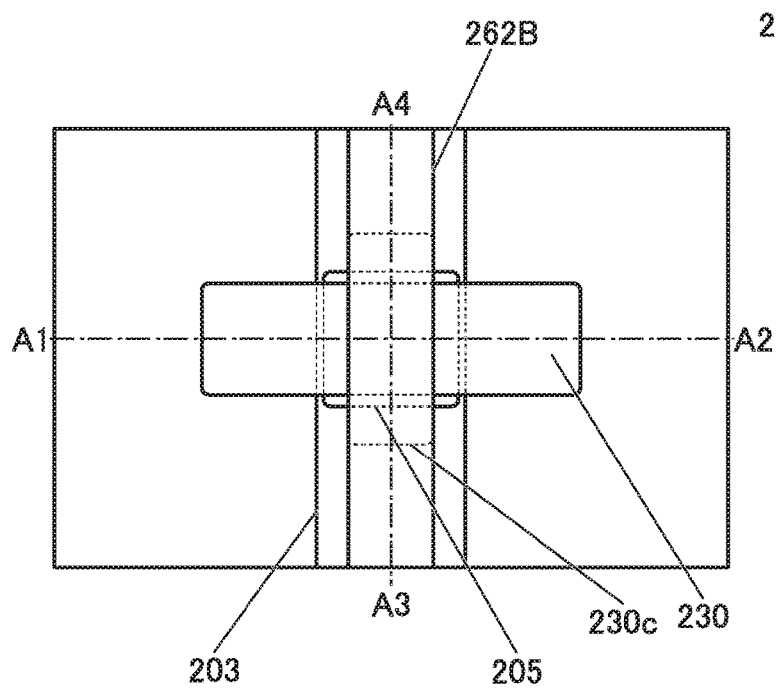
FIG. 14 A top view and cross-sectional views illustrating a method for manufacturing a semiconductor device of one embodiment of the present invention.
Figure 14C:
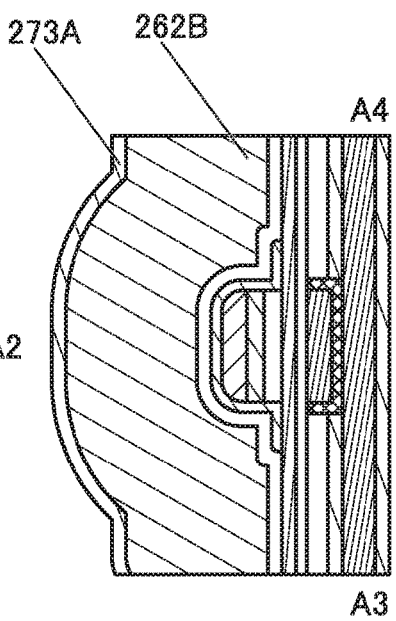
Figure 14B:
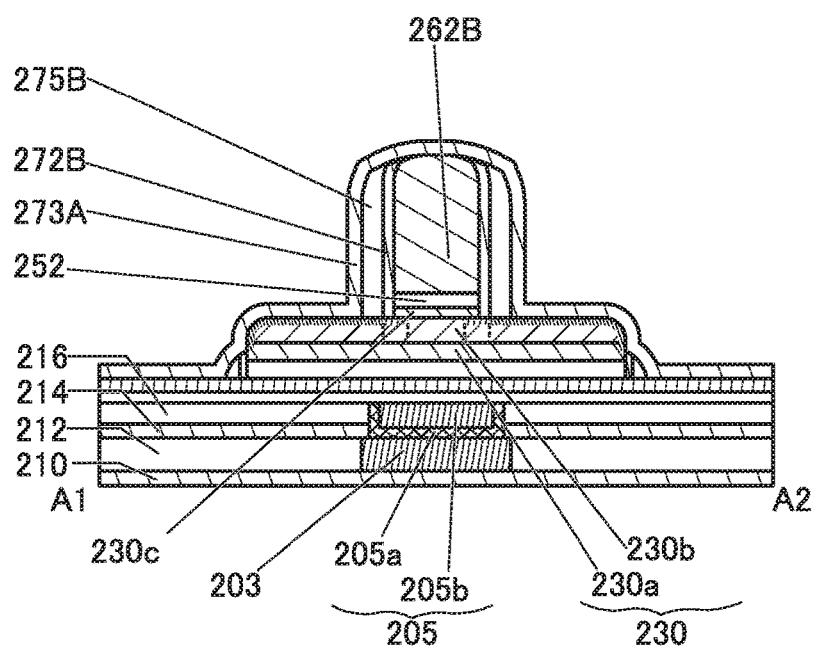

Next, an insulating film 273A is deposited to cover the insulator 222, the oxide 230, the insulator 275B, the insulator 272B, and the dummy gate layer 262B (see FIG. 14). The insulating film 273A can be deposited by a sputtering method, a CVD method, an MBE method, a PLD method, an ALD method, or the like. For example, it is preferable to deposit aluminum oxide by a sputtering method.

Next, an insulating film to be the insulator 280 is deposited to cover the insulating film 273A. The insulating film to be the insulator 280 can be deposited by a sputtering method, a CVD method, an MBE method, a PLD method, an ALD method, or the like.

Figure 15A:
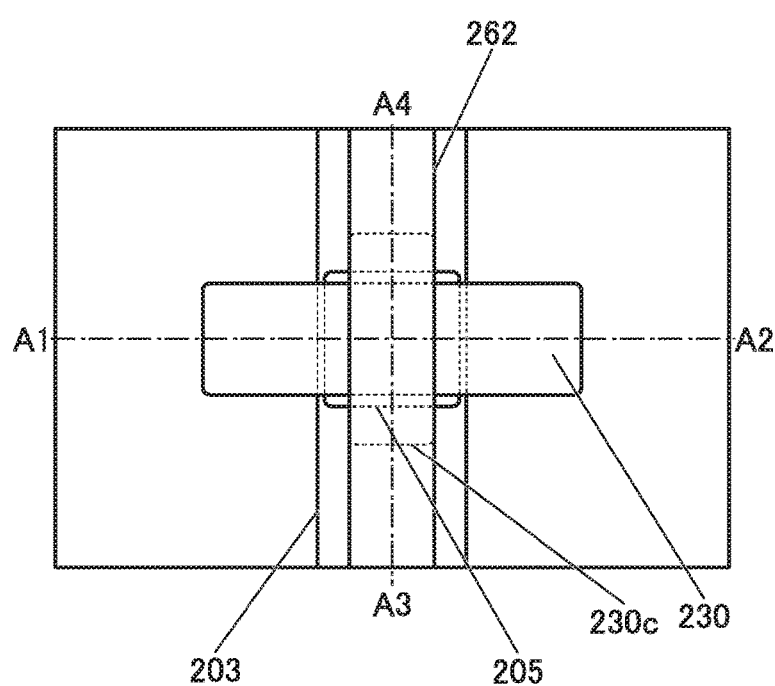
FIG. 15 A top view and cross-sectional views illustrating a method for manufacturing a semiconductor device of one embodiment of the present invention.
Figure 15C:
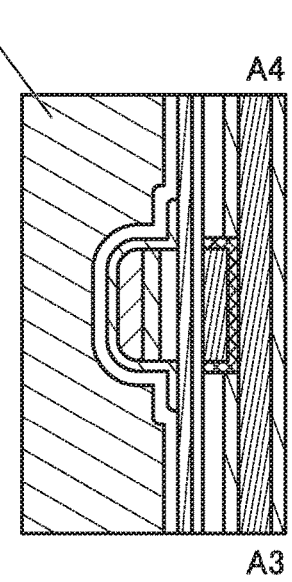
Figure 15B:
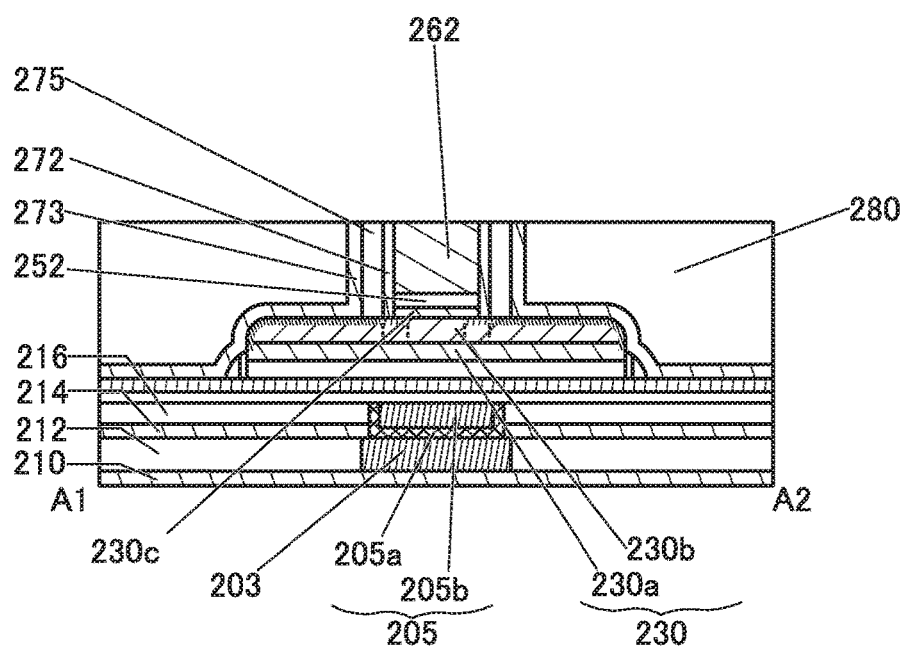
Figure 16A:
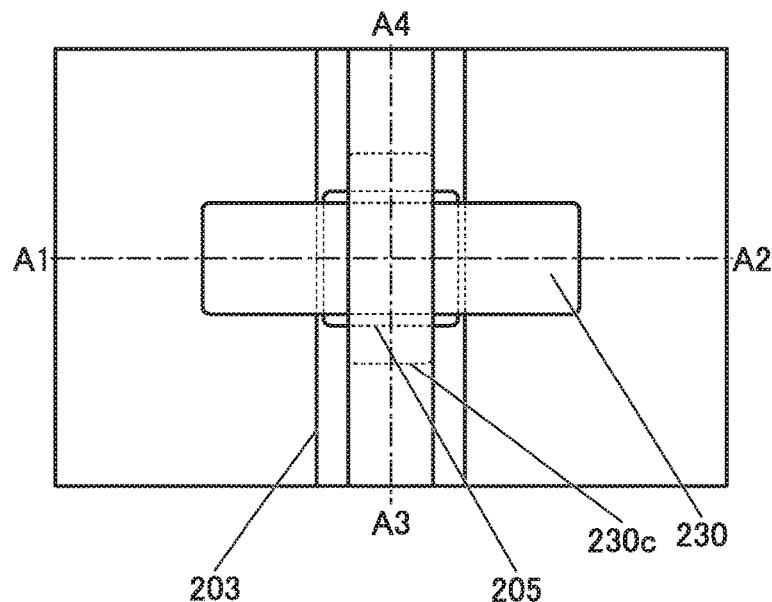
FIG. 16 A top view and cross-sectional views illustrating a method for manufacturing a semiconductor device of one embodiment of the present invention.
Figure 16C:
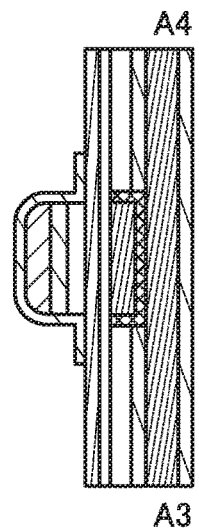
Figure 16B:
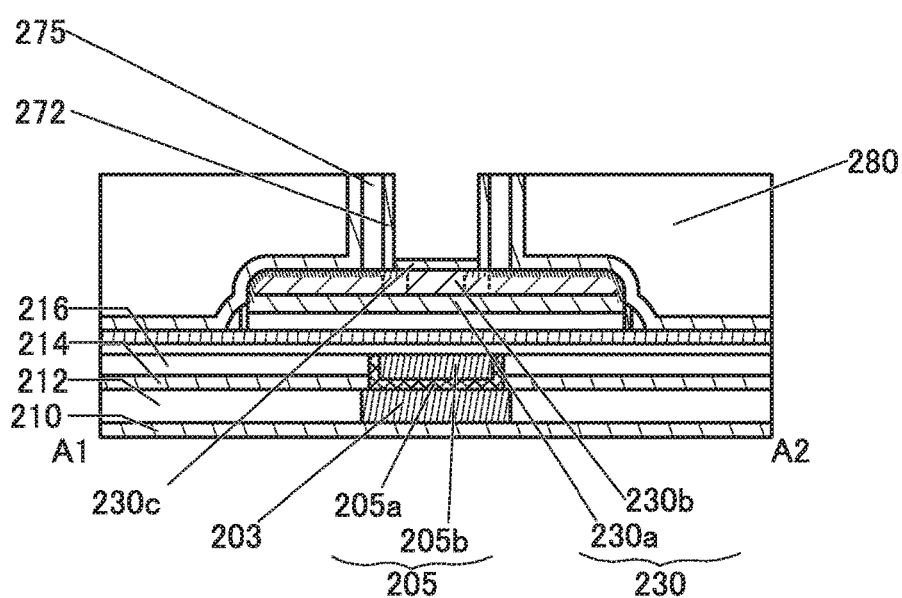

Next, the insulating film to be the insulator 280, the insulating film 273A, the dummy gate layer 262B, the insulator 272B, and the insulator 275B are partly removed until part of the dummy gate layer 262B is exposed, whereby the insulator 280, the insulator 273, a dummy gate 262, the insulator 272, and the insulator 275 are formed (see FIG. 15). CMP treatment is preferably employed for forming the insulator 280, the insulator 273, the dummy gate 262, the insulator 272, and the insulator 275.

As mentioned above, when the dummy gate film 262A has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 262 can be reduced in some cases. As illustrated in the drawing, a top surface of the dummy gate 262 is substantially aligned with top surfaces of the insulator 275, the insulator 272, the insulator 273, and the insulator 280.

Next, the dummy gate insulator 252 and the dummy gate 262 are removed. The dummy gate insulator 252 and the dummy gate 262 can be removed by wet etching, dry etching, ashing, or the like. Alternatively, a plurality of the above treatments may be used in combination as appropriate. For example, wet etching treatment may be performed after ashing treatment. The dummy gate insulator 252 and the dummy gate 262 are removed, so that the surface of the oxide 230c is exposed (see FIG. 16).

Figure 17A:
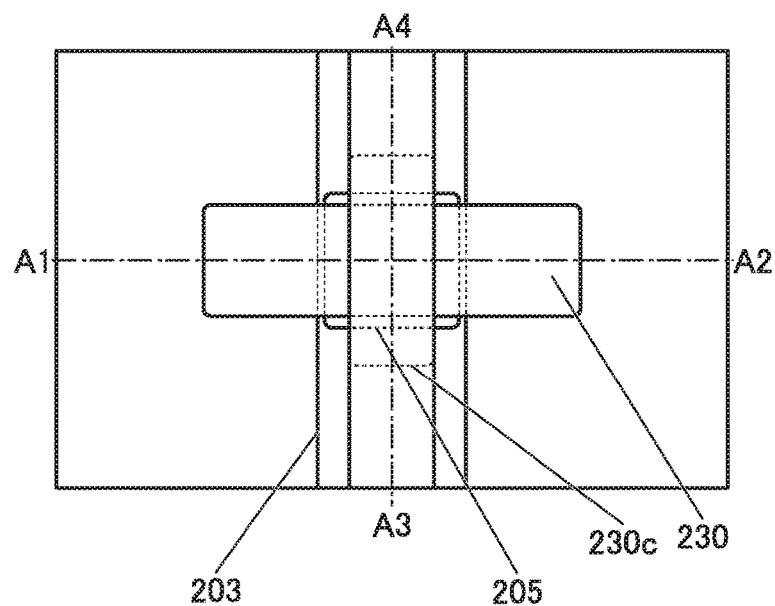
FIG. 17 A top view and cross-sectional views illustrating a method for manufacturing a semiconductor device of one embodiment of the present invention.
Figure 17C:
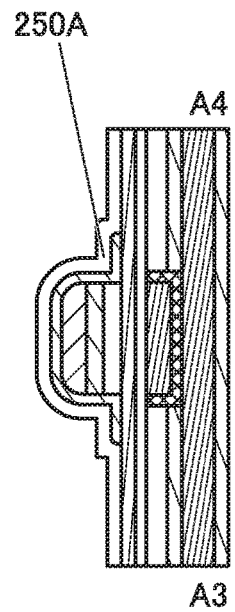
Figure 17B:
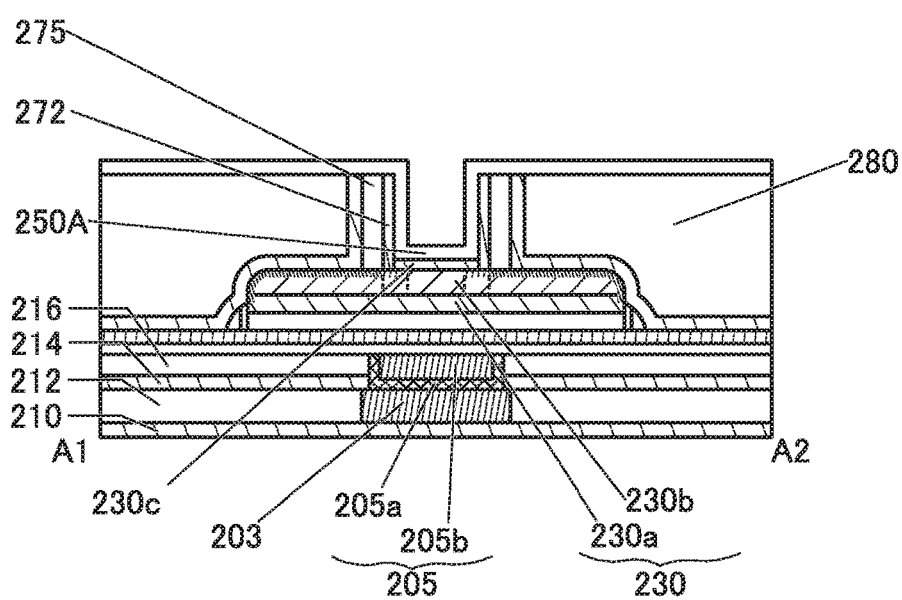
Figure 18A:
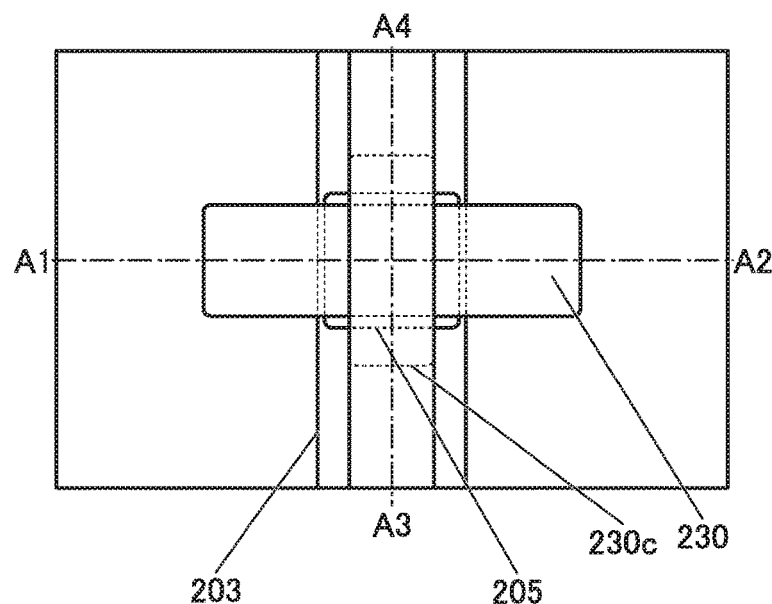
FIG. 18 A top view and cross-sectional views illustrating a method for manufacturing a semiconductor device of one embodiment of the present invention.
Figure 18C:
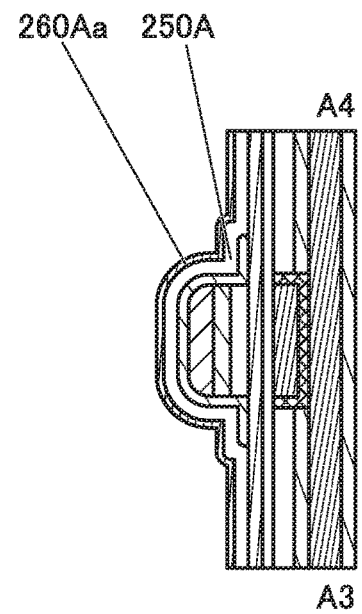
Figure 18B:
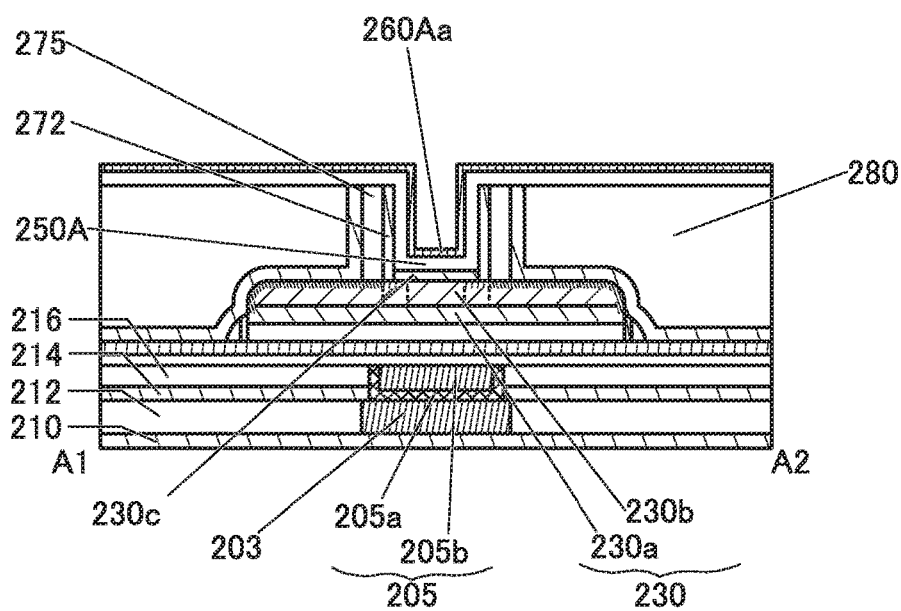
Figure 19A:
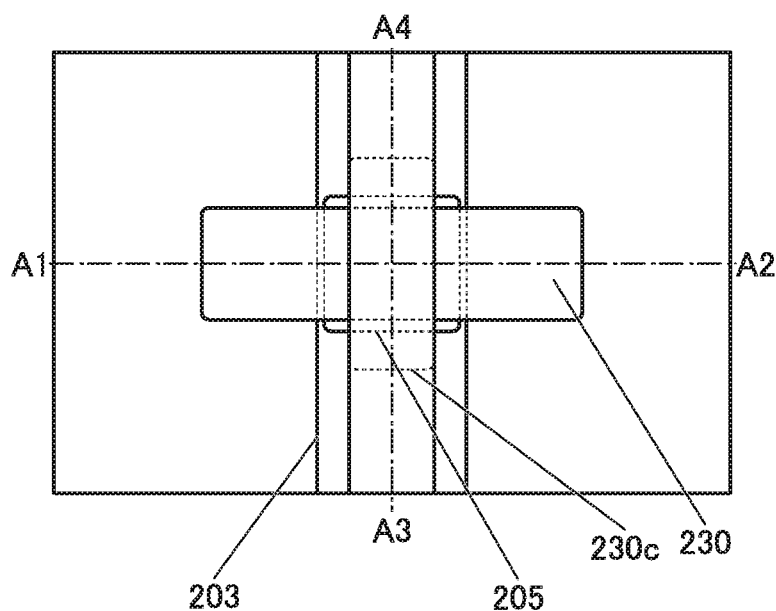
FIG. 19 A top view and cross-sectional views illustrating a method for manufacturing a semiconductor device of one embodiment of the present invention.
Figure 19C:
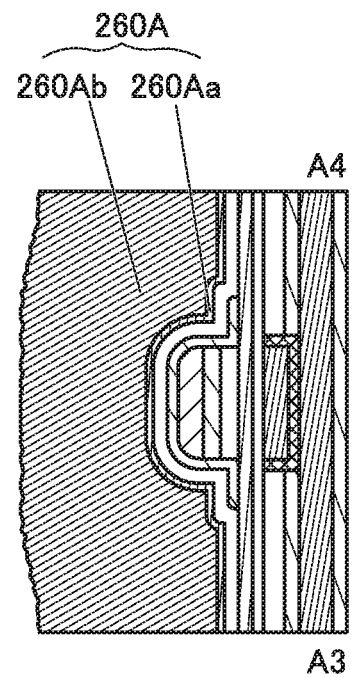
Figure 19B:
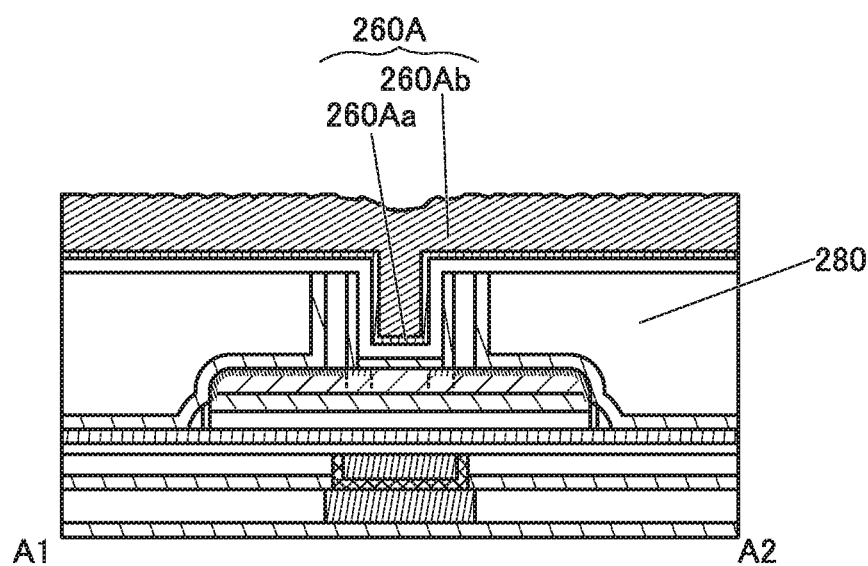

Then, the insulating film 250A is deposited (see FIG. 17). The insulating film 250A can be deposited by a sputtering method, a CVD method, an MBE method, a PLD method, an ALD method, or the like. It is preferable to deposit silicon oxynitride by a CVD method for the insulating film 250A. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Here, the insulating film 250A may be subjected to treatment for injecting oxygen. As the treatment for injecting oxygen, plasma treatment using a gas containing oxygen, treatment for injecting oxygen ions with an ion implantation apparatus, or the like can be given. Oxygen can be injected into the insulating film 250A by plasma irradiation using a gas containing oxygen with an apparatus including a high-density plasma source, for example. Alternatively, oxygen ions can be injected into the insulating film 250A with an ion implantation apparatus. In the above manner, oxygen can be added to the insulating film 250A and oxygen can be supplied to the oxide 230. Thus, oxygen vacancies in the region 234 of the oxide 230, which is illustrated in FIG. 3, can be reduced (see FIG. 17).

Furthermore, heat treatment may be performed. For the heat treatment, the conditions for the above-described heat treatment can be used. The heat treatment can reduce the moisture concentration and the hydrogen concentration in the insulating film 250A.

Alternatively, oxygen can be injected into the insulating film 250A by deposition of a conductive oxide. For example, the metal oxide that can be used for the oxide 230a or the oxide 230b can be used. In particular, an In-Ga—Zn-based oxide with a metal atomic ratio of [In]:[Ga]:[Zn]=4:2:3 to 4.1 or the vicinity thereof, which has high conductivity, is preferably used. When such a conductive oxide is deposited by a sputtering method, oxygen can be added to the insulating film 250A, so that the oxygen can be supplied to the oxide 230. Thus, oxygen vacancies in the region 234 of the oxide 230 can be reduced.

In this embodiment, oxygen is injected into the insulating film 250A by the deposition of the highly conductive metal oxide as described above. Since oxygen is injected into the insulating film 250A, oxygen vacancies can be eliminated immediately even when diffused from the region 231a or the region 231b functioning as the source region or the drain region to the region 234 including the channel formation region. Thus, a reduction in effective channel length can be inhibited. In other words, a transistor with favorable electrical characteristics that has a high on/off ratio even with an extremely short channel length can be manufactured.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 18 and FIG. 19).

Figure 20A:
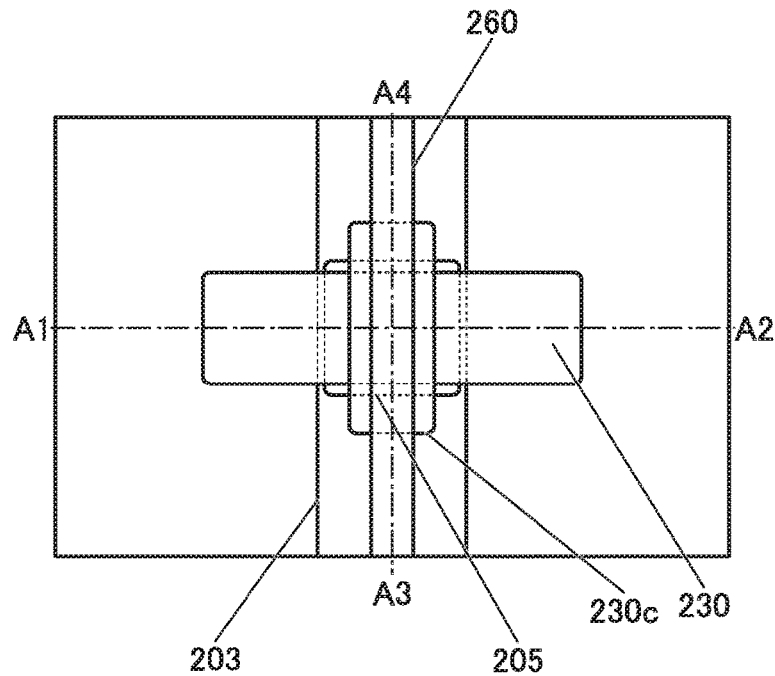
FIG. 20 A top view and cross-sectional views illustrating a method for manufacturing a semiconductor device of one embodiment of the present invention.
Figure 20C:
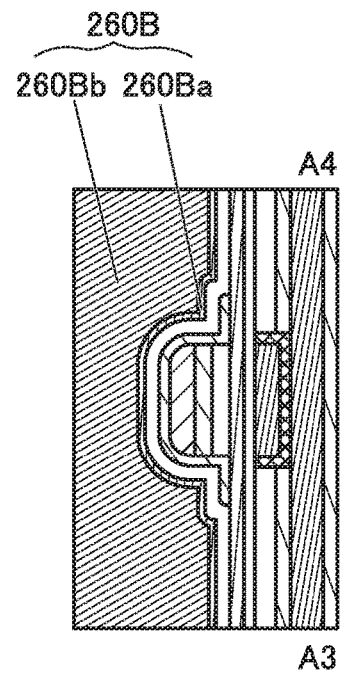
Figure 20B:
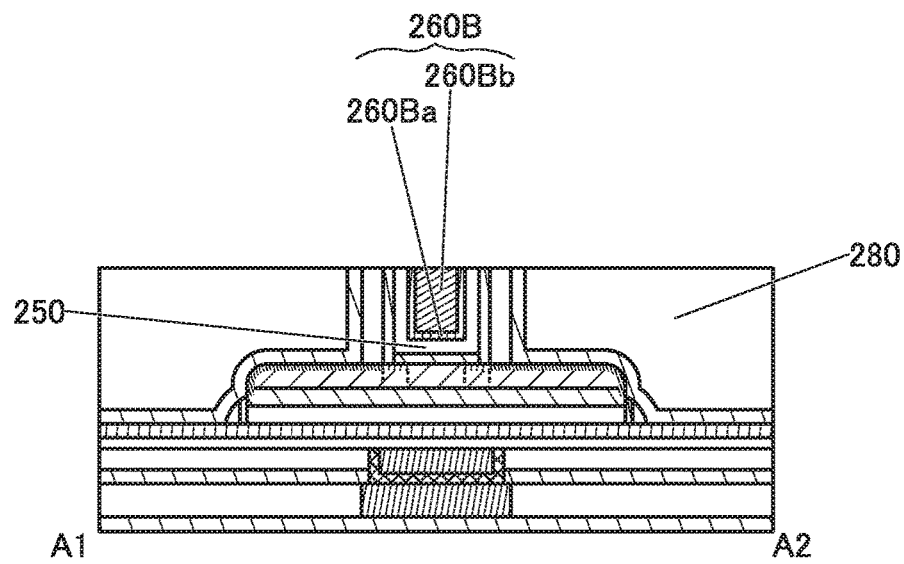
Figure 21A:
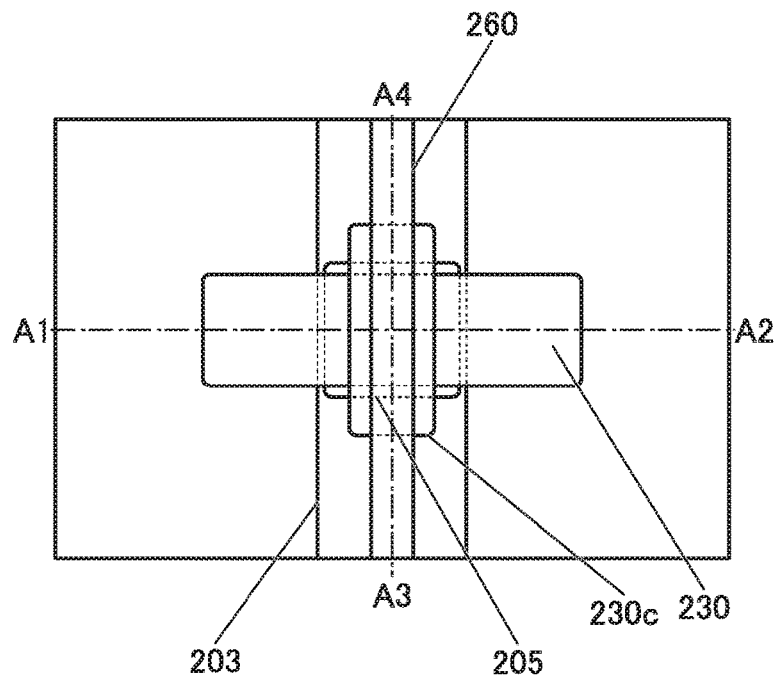
FIG. 21 A top view and cross-sectional views illustrating a method for manufacturing a semiconductor device of one embodiment of the present invention.
Figure 21C:
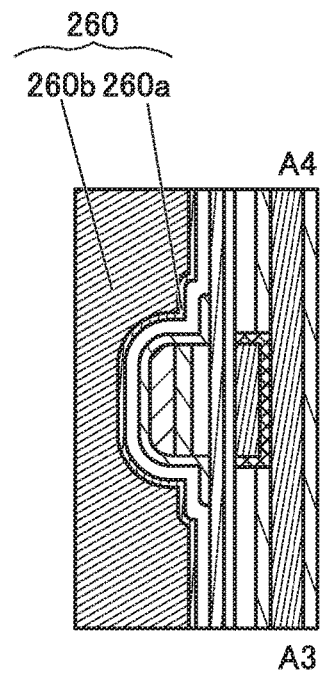
Figure 21B:
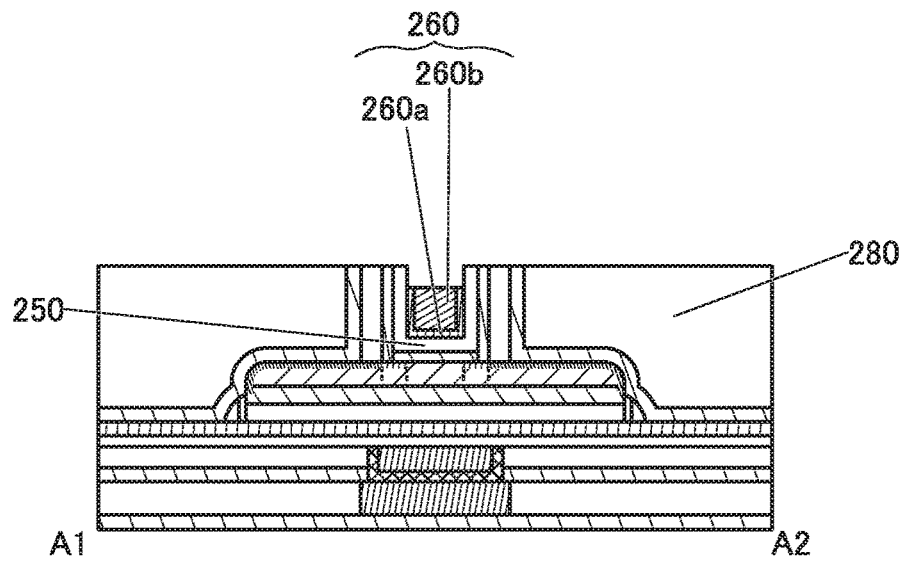

Then, the insulating film 250A, the conductive film 260Aa, and the conductive film 260Ab are polished by CMP treatment until the insulator 280 is exposed, whereby the insulator 250 and a conductor 260B including a conductor 260Ba and a conductor 260Bb are formed (see FIG. 20).

Next, the conductor 260Ba and the conductor 260Bb are partly removed, so that the thickness of the conductor 260B is reduced; thus, the conductor 260a and the conductor 260b are formed. For the reduction in thickness, wet etching or dry etching can be used. The amount of reduced thickness is preferably approximately one fourth of the thickness of the conductor 260B (see FIG. 21).

Here, in the case where the width of the dummy layer is the minimum feature size, the conductor 260 (the conductor 260a and the conductor 260b) formed in the opening has a width smaller than the minimum feature size, depending on the thickness of the insulator 250. Thus, the conductor 260 can be provided to have a size minuter than the minimum feature size. Specifically, the conductor 260 having a width smaller than the width of the dummy layer by twice the thickness of the insulator 250 can be provided.

Next, an insulating film to be the insulator 270 is deposited. The insulating film to be the insulator 270 can be deposited by a sputtering method, a CVD method, an MBE method, a PLD method, an ALD method, or the like. For example, a material similar to that of the insulator 275 is preferably used for the insulating film to be the insulator 270.

Figure 22A:
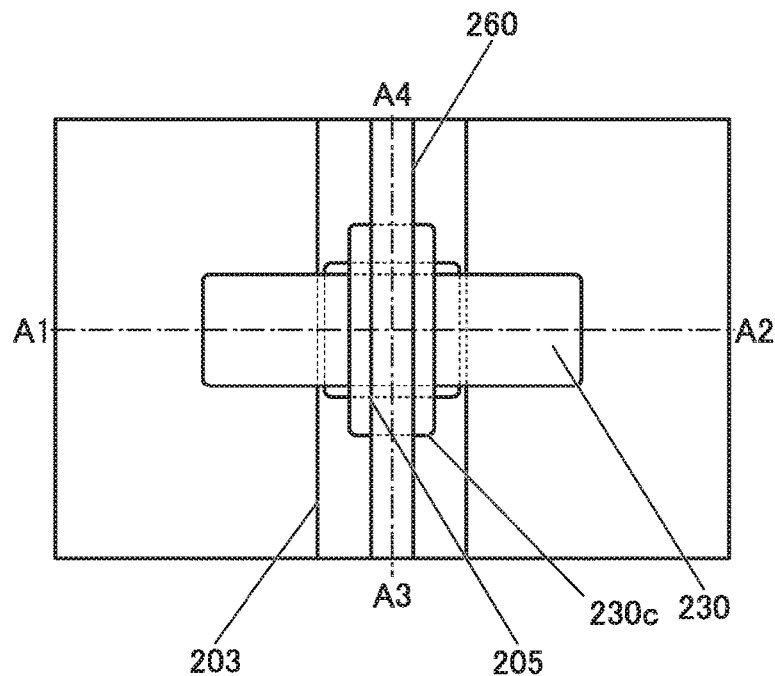
FIG. 22 A top view and cross-sectional views illustrating a method for manufacturing a semiconductor device of one embodiment of the present invention.
Figure 22C:
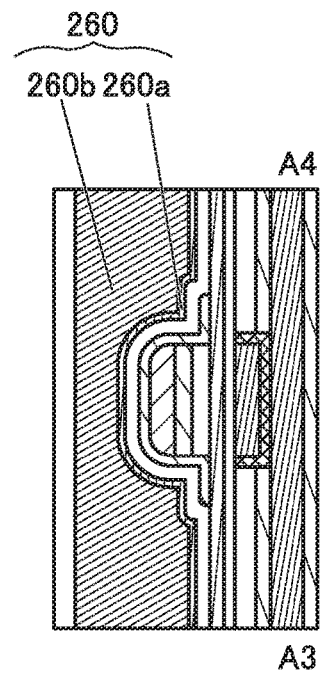
Figure 22B:
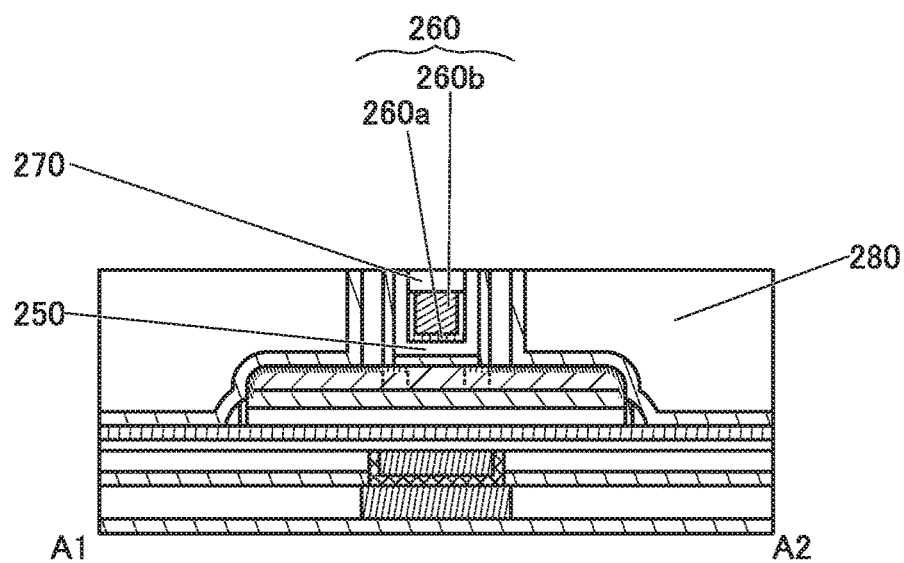

Next, the insulating film to be the insulator 270 is polished by CMP treatment until the insulator 280 is exposed, whereby the insulator 270 can be formed (see FIG. 22).

Next, an insulating film to be the insulator 282 may be formed over the insulator 270 and the insulator 280. The insulating film to be the insulator 282 can be deposited by a sputtering method, a CVD method, an MBE method, a PLD method, an ALD method, or the like. An aluminum oxide film is preferably deposited as the insulating film to be the insulator 282 by a sputtering method, for example. Next, an insulator to be the insulator 283 may be deposited over the insulator 282. The insulating film to be the insulator 283 can be deposited by a sputtering method, a CVD method, an MBE method, a PLD method, an ALD method, or the like.

Figure 23A:
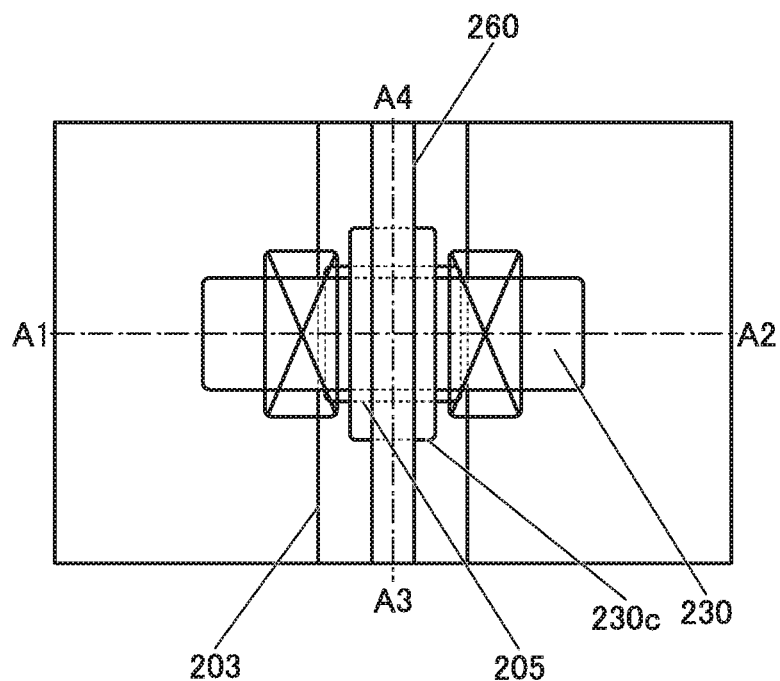
FIG. 23 A top view and cross-sectional views illustrating a method for manufacturing a semiconductor device of one embodiment of the present invention.
Figure 23C:
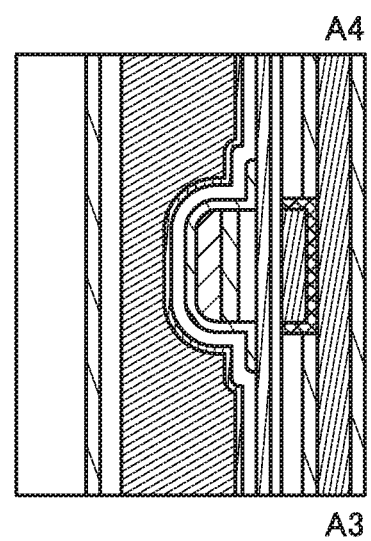
Figure 23B:
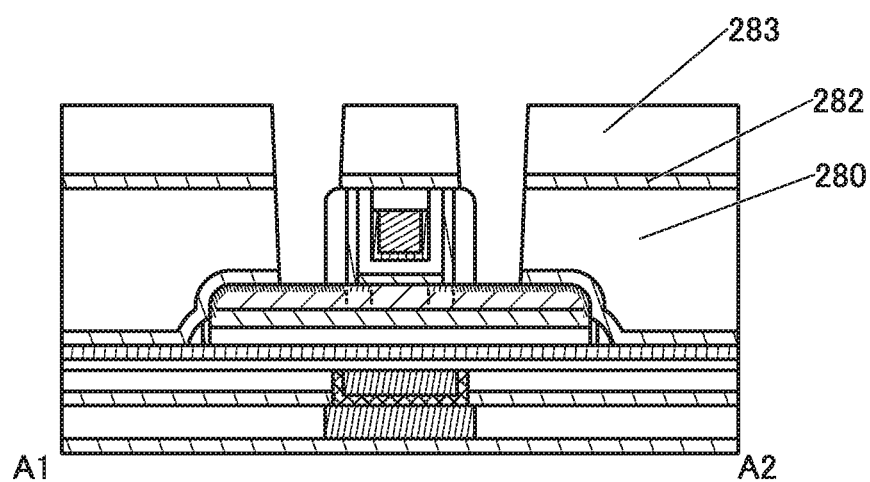
Figure 24A:
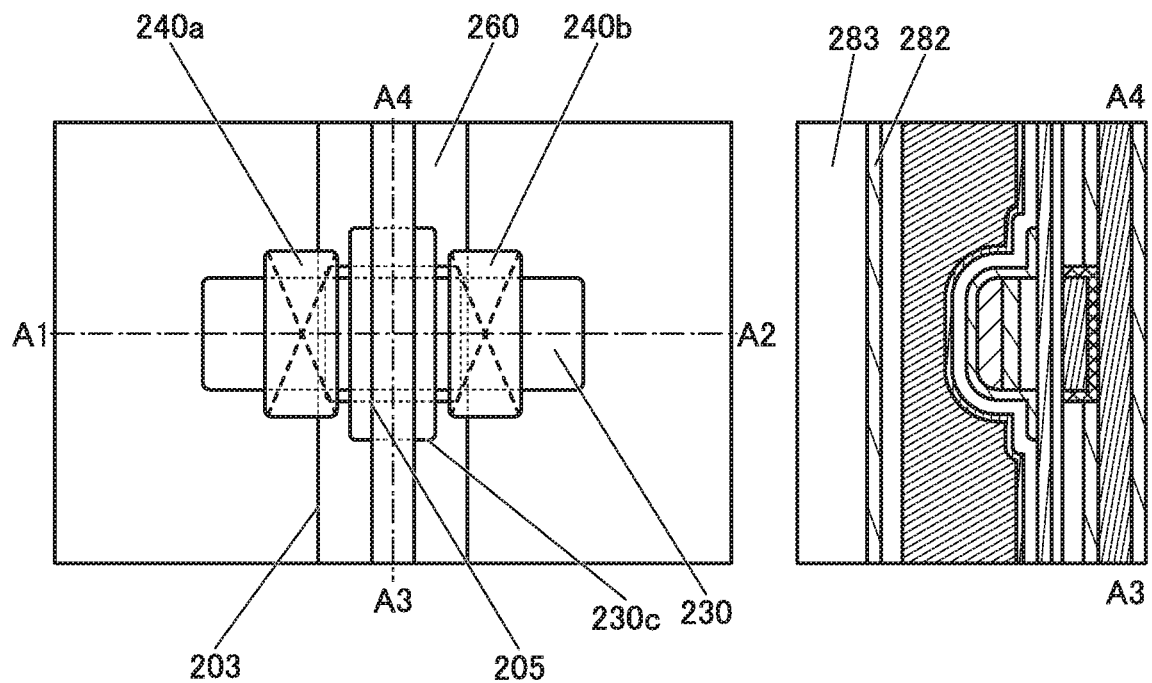
FIG. 24 A top view and cross-sectional views illustrating a method for manufacturing a semiconductor device of one embodiment of the present invention.
Figure 24B:
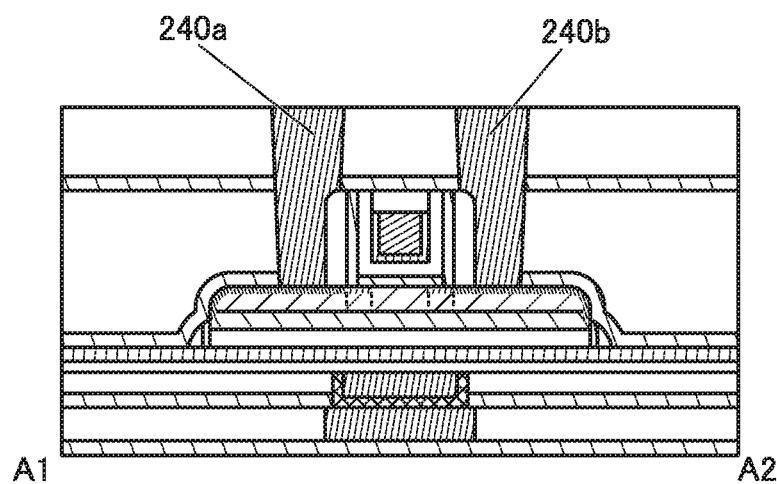

Next, an opening reaching the region 231 of the oxide 230 is formed in the insulator 280, the insulator 282, and the insulator 283 (see FIG. 23). The opening may be formed by a lithography method. Here, the opening is formed so that the conductor 240 is provided in contact with the side surface of the insulator 275. The opening is preferably formed under a condition where the insulator 275 is hardly etched, in other words, the etching rate of the insulator 280 is preferably higher than the etching rate of the insulator 275. When the etching rate of the insulator 275 is set to 1, the etching rate of the insulator 280 is preferably set to 5 or more, further preferably 10 or more. With such an opening condition, the opening portion can be positioned on the region 231 in a self-aligned manner; thus, a miniaturized transistor can be manufactured. For example, even in the case where the opening is misaligned to a position overlapping with the top surface of the insulator 270, the opening does not reach the conductor 260 when an opening condition is employed where the etching rate of the insulator 270, like that of the insulator 275, is much lower than the etching rate of the insulator 280. In other words, a short circuit between the conductor 260 and the conductor 240a or the conductor 240b can be prevented. Accordingly, tolerance for misalignment of the conductor 260 and the opening can be extended in a lithography process; thus, the yield should be increased.

Next, a conductive film to be the conductor 240a and the conductor 240b is deposited. The conductive film to be the conductor 240a and the conductor 240b desirably has a stacked-layer structure which includes a conductor having a function of inhibiting the passage of impurities such as water or hydrogen. For example, a stacked-layer structure of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Here, when the opening is formed in the insulator 280, the insulator 282, and the insulator 283, for example, the low-resistance region of the region 231 of the oxide 230 may be removed. When the conductive film to be the conductor 240a and the conductor 240b is deposited in such an opening, there is a region where the oxide 230 and the conductive film to be the conductor 240a and the conductor 240b are in contact with each other; accordingly, a metal compound or an oxygen vacancy is formed in the region, and thus the resistance of the contact region of the oxide 230 and the conductive film to be the conductor 240a and the conductor 240b can be reduced. When the resistance of the contact region is reduced, a sufficient ohmic contact between the oxide 230 and the conductor 240a and the conductor 240b can be made. Therefore, the conductive film to be the conductor 240a and the conductor 240b preferably contains a metal element such as aluminum, ruthenium, titanium, tantalum, tungsten, or chromium.

Next, CMP treatment is performed to remove part of the conductive film to be the conductor 240a and the conductor 240b, so that the insulator 282 is exposed. As a result, the conductive film remains only in the opening, so that the conductor 240a and the conductor 240b having flat top surfaces can be formed (see FIG. 24 and FIG. 1).

The conductor 240a and the conductor 240b may be formed after aluminum oxide is formed on a side wall portion of the opening. By forming aluminum oxide on the side wall portion of the opening, the passage of oxygen from the outside can be inhibited and oxidation of the conductor 240a and the conductor 240b can be prevented. Furthermore, impurities such as water or hydrogen can be prevented from being diffused from the conductor 240a and the conductor 240b to the outside. The aluminum oxide can be formed by depositing aluminum oxide in the opening by an ALD method or the like and then performing anisotropic etching.

Through the above process, the semiconductor device including the transistor 200 can be manufactured. As illustrated in FIG. 4 to FIG. 24, with the use of the method for manufacturing the semiconductor device described in this embodiment, the transistor 200 can be formed.

According to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a semiconductor device having a high on-state current can be provided. Alternatively, according to one embodiment of the present invention, a highly reliable semiconductor device can be provided. Alternatively, according to one embodiment of the present invention, a semiconductor device that can be miniaturized or highly integrated can be provided. Alternatively, according to one embodiment of the present invention, a semiconductor device with reduced power consumption can be provided. Alternatively, according to one embodiment of the present invention, a semiconductor device with high productivity can be provided.

The structure, method, and the like described above in this embodiment can be used in combination as appropriate with the structures, methods, and the like described in the other embodiments and the example.

Embodiment 2

An example of a semiconductor device including the transistor 200 of one embodiment of the present invention will be described below.

<Structure Example of Semiconductor Device>

Figure 26A:
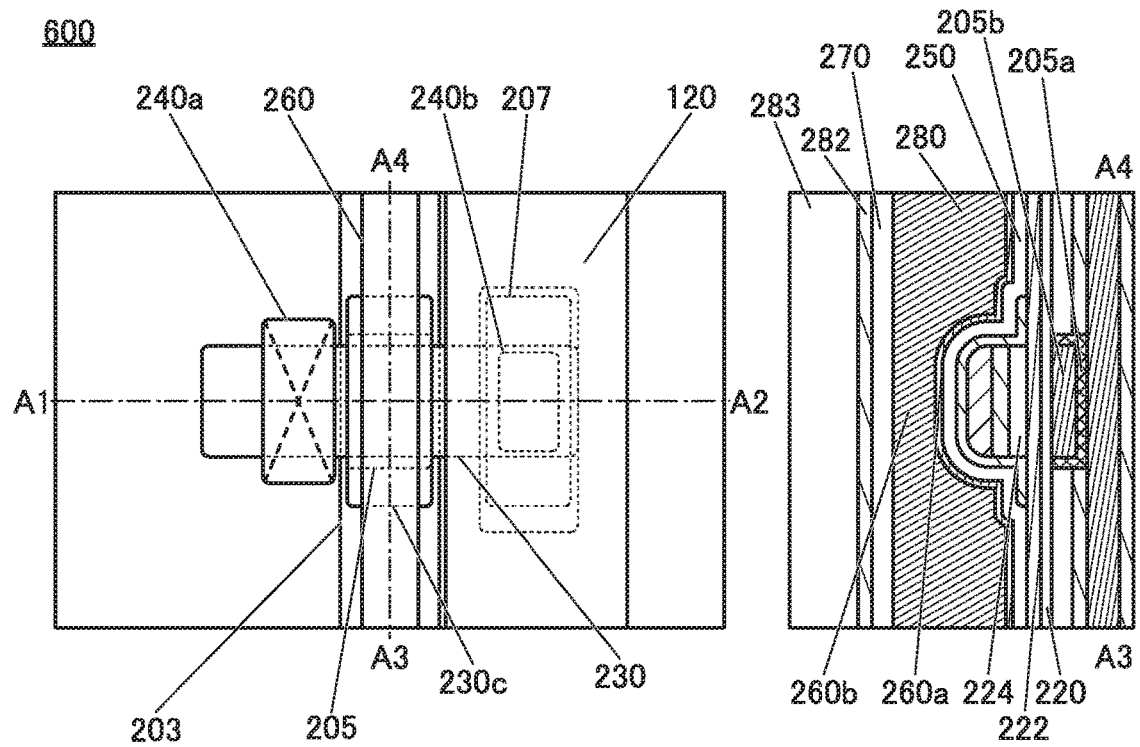
FIG. 26 A top view and cross-sectional views of a semiconductor device of one embodiment of the present invention.
Figure 26C:
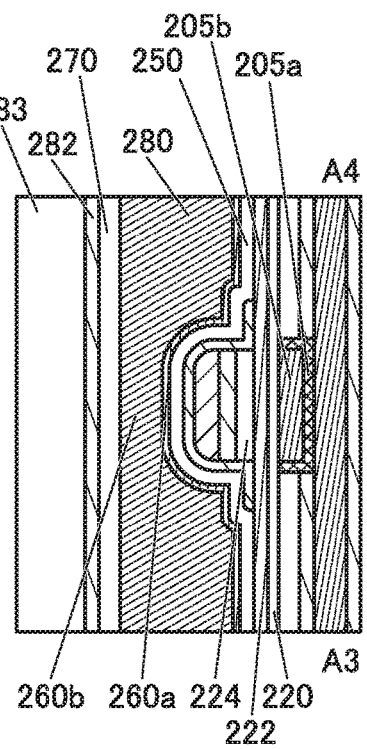
Figure 26B:
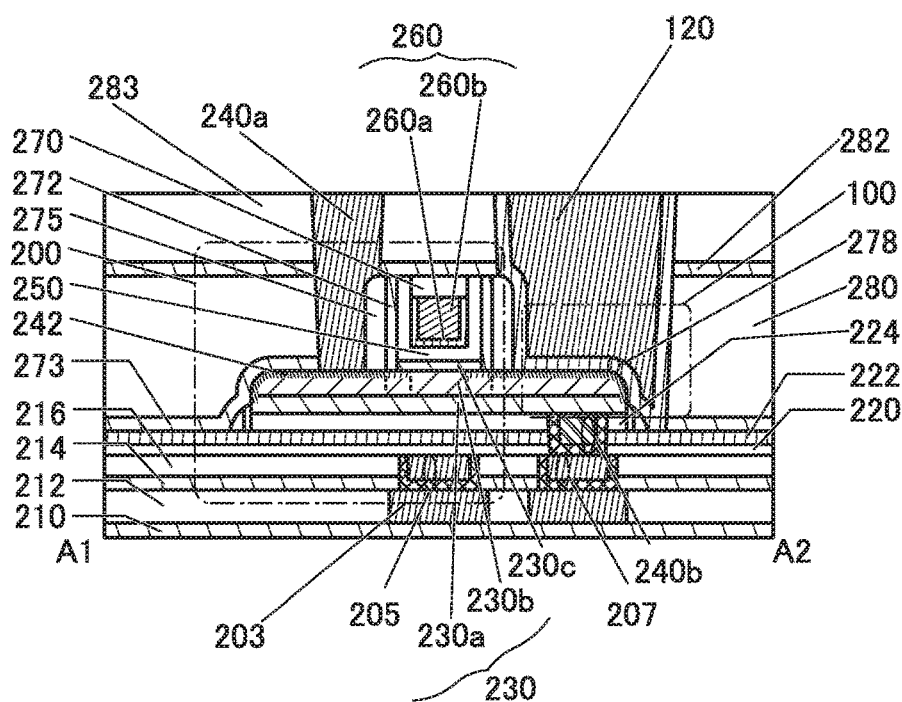

FIG. 26(A), FIG. 26(B), and FIG. 26(C) are a top view and cross-sectional views of the transistor 200, a capacitor 100, and the periphery of the transistor 200 of one embodiment of the present invention. Note that in this specification, a memory device including one capacitor and at least one transistor is referred to as a cell.

FIG. 26(A) is a top view of a cell 600 including the transistor 200 and the capacitor 100. FIG. 26(B) and FIG. 26(C) are cross-sectional views of the cell 600. Here, FIG. 26(B) is a cross-sectional view of a portion indicated by a dashed-dotted line A1-A2 in FIG. 26(A), and is a cross-sectional view in the channel length direction of the transistor 200. FIG. 26(C) is a cross-sectional view of a portion indicated by a dashed-dotted line A3-A4 in FIG. 26(A), and is a cross-sectional view in the channel width direction of the transistor 200. For clarity of the drawing, some components are not illustrated in the top view of FIG. 26(A).

[Cell 600]

The semiconductor device of one embodiment of the present invention includes the transistor 200, the capacitor 100, and the insulator 280, the insulator 282, and the insulator 283 functioning as interlayer films. The conductor 240 (the conductor 240a and the conductor 240b) functioning as a plug and being electrically connected to the transistor 200 is also included.

The transistor 200 and the capacitor 100 are provided in the same layer in the cell 600 illustrated in FIG. 26, whereby some of the components included in the transistor 200 and some of the components included in the capacitor 100 can be used in common. That is, some of the components of the transistor 200 function as part of the components of the capacitor 100 in some cases.

Furthermore, part or the whole of the capacitor 100 overlaps with the transistor 200, so that the total area of the projected area of the transistor 200 and the projected area of the capacitor 100 can be reduced.

Furthermore, the conductor 240b and a conductor 207 functioning as plugs or wirings electrically connected to the transistor 200 are provided below a region where the capacitor 100 and the transistor 200 overlap with each other, so that the cell 600 can be easily miniaturized or highly integrated. Moreover, since the conductor 207 can be formed in the same step as the conductor 205, which is a component of the transistor 200, the process can be shortened. As in the transistor 200, the conductor 203 functioning as a wiring may be provided in contact with the bottom surface of the conductor 207 in the capacitor 100.

Note that the layouts of the transistor 200 and the capacitor 100 can be designed as appropriate depending on the required capacitance value of the capacitor 100.

For example, the area of the capacitor 100 is determined depending on the area where the region 231b of the oxide 230 and a conductor 120 overlap with each other with an insulator 278 therebetween. Therefore, when the capacitance value needed for the cell 600 cannot be obtained by the capacitor 100 illustrated in FIG. 26(A) and FIG. 26(B), the width of the region 231b in the A3-A4 direction is made larger than the width of the region 234 in the A3-A4 direction, which can increase the capacitance value.

For example, the length of the region 231b in the A1-A2 direction may be longer than the length of the conductor 120 in the A1-A2 direction. In that case, the conductor 240b can be embedded in the insulator 280 and the insulator 282. That is, the region 231b and the conductor 240b may be provided in contact with each other in a region where the region 231b and the conductor 120 do not overlap with each other. Thus, by forming the conductor 240a and the conductor 240b in the same step, the process can be shortened.

With the above structure, miniaturization or high integration can be achieved. Moreover, the design flexibility can be increased. Furthermore, the transistor 200 and the capacitor 100 are formed through the same process. Accordingly, the process can be shortened, leading to an improvement in productivity.

[Transistor 200]

The structure of the transistor included in the semiconductor device described in the above embodiment can be used as the structure of the transistor 200. Note that the transistor 200 illustrated in FIG. 26 is an example and the structure is not limited thereto; an appropriate transistor is used in accordance with a circuit configuration or a driving method.

[Capacitor 100]

As illustrated in FIG. 26, the capacitor 100 has a structure including some components shared with the transistor 200. This embodiment describes an example of the capacitor 100 in which the region 231b provided in the oxide 230 of the transistor 200 functions as one electrode of the capacitor 100.

The capacitor 100 includes the region 231b of the oxide 230, the insulator 278 over the region 231b, and the conductor 120 over the insulator 278. The conductor 120 is preferably positioned over the insulator 278 to at least partly overlap with the region 231b of the oxide 230.

The region 231b of the oxide 230 functions as one electrode of the capacitor 100, and the conductor 120 functions as the other electrode of the capacitor 100. The insulator 278 functions as a dielectric of the capacitor 100. The region 231b of the oxide 230 has a reduced resistance and is a conductive oxide. Thus, the region 231b of the oxide 230 can function as one electrode of the capacitor 100.

An insulator with a high dielectric constant is preferably used for the insulator 278, and an insulator that can be used for the insulator 222 or the like may be used. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium. The insulator 278 may have a stacked-layer structure. For example, a stacked-layer structure including two or more layers selected from silicon oxide, silicon oxynitride, silicon nitride oxide, silicon nitride, aluminum oxide, hafnium oxide, an oxide containing aluminum and hafnium (hafnium aluminate), and the like may be employed. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 100 can have a large capacitance value and a low leakage current.

As illustrated in FIG. 26(B), the insulator 278 is provided to cover the bottom surface and side surfaces of the conductor 120. For the conductor 120, a conductive material containing tungsten, copper, or aluminum as its main component is preferably used. Although not illustrated, the conductor 120 may have a stacked-layer structure, for example, a stacked layer of any of the above conductive materials and titanium or titanium nitride.

<Structure of Cell Array>

Here, FIG. 27 and FIG. 28 each illustrate an example of a cell array of this embodiment. For example, the cells 600 each including the transistor 200 and the capacitor 100 illustrated in FIG. 26 are arranged in a matrix, whereby a cell array can be formed.

Figure 27A:
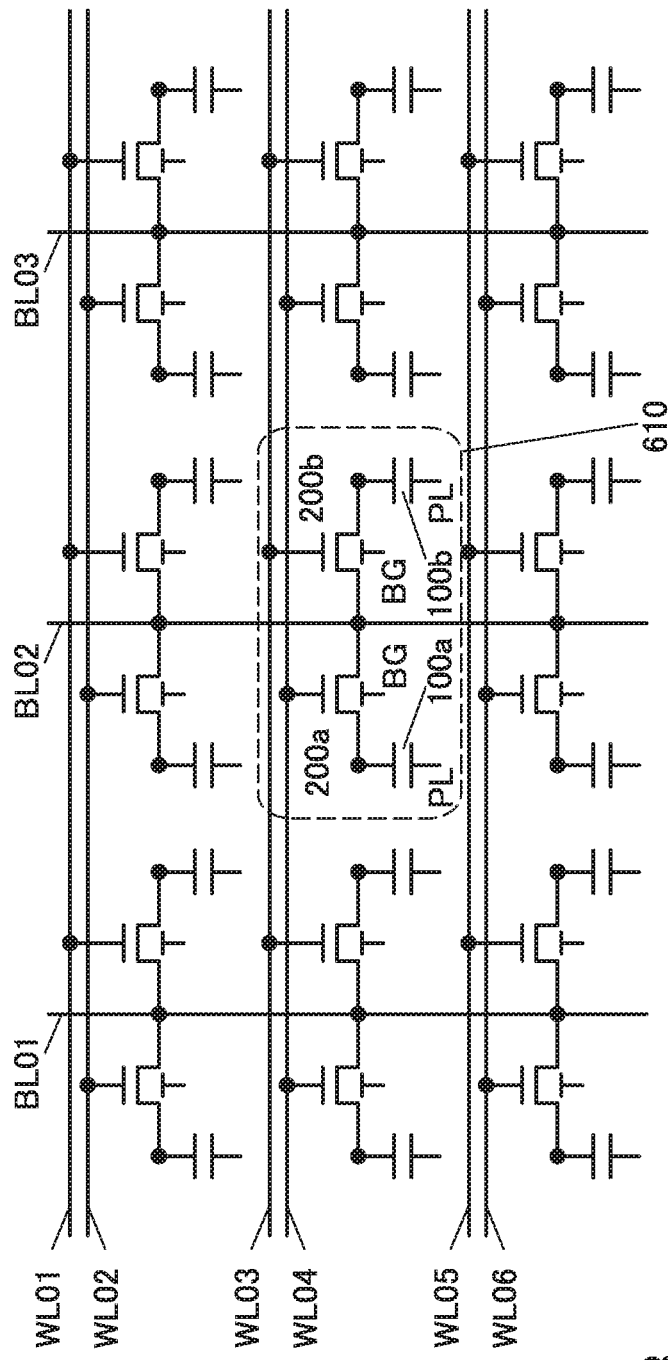
FIG. 27 A circuit diagram and a cross-sectional view of a semiconductor device of one embodiment of the present invention.

FIG. 27(A) is a circuit diagram showing an embodiment in which the cells 600 illustrated in FIG. 26 are arranged in a matrix. In FIG. 27(A), ones of the sources and the drains of the transistors included in the cells 600 which are adjacent in the row direction are electrically connected to a common BL (BL01, BL02, and BL03). Furthermore, the BL is also electrically connected to ones of the sources and the drains of the transistors included in the cells arranged in the column direction. In contrast, the first gates of the transistors included in the cells 600 which are adjacent in the row direction are electrically connected to different WLs (WL01 to WL06). In addition, the transistors included in the cells 600 may each be provided with a second gate BG. The threshold voltage of the transistor can be controlled by a potential applied to the BG. The first electrodes of the capacitors included in the cells 600 are electrically connected to the others of the sources and the drains of the transistors. At this time, the first electrodes of the capacitors are formed of part of components included in the transistors in some cases. In addition, the second electrodes of the capacitors included in the cells 600 are electrically connected to a PL.

Figure 27B:
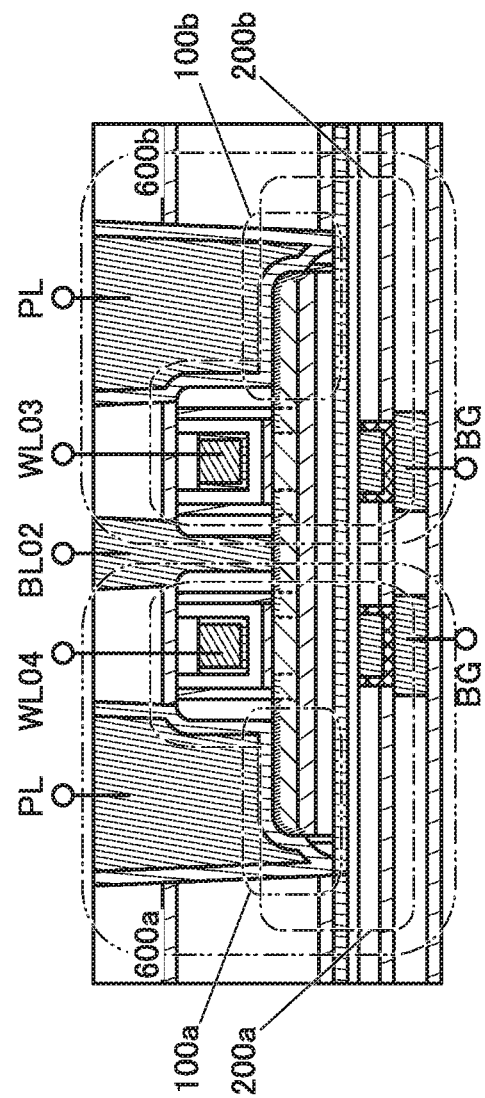

FIG. 27(B) is a cross-sectional view which illustrates an extracted part of the row including a circuit 610 including a cell 600a electrically connected to the WL04 and the BL02 and a cell 600b electrically connected to the WL03 and the BL02 in FIG. 27(A). FIG. 27(B) illustrates a cross-sectional view of the cell 600a and the cell 600b.

The cell 600a includes a transistor 200a and a capacitor 100a. The cell 600b includes a transistor 200b and a capacitor 100b.

One of a source and a drain of the transistor 200a and one of a source and a drain of the transistor 200b are both electrically connected to the BL02.

Sharing a wiring which is electrically connected to one of the source and the drain of each transistor as in the above structure can further reduce the area occupied by the cell array.

Figure 28A:
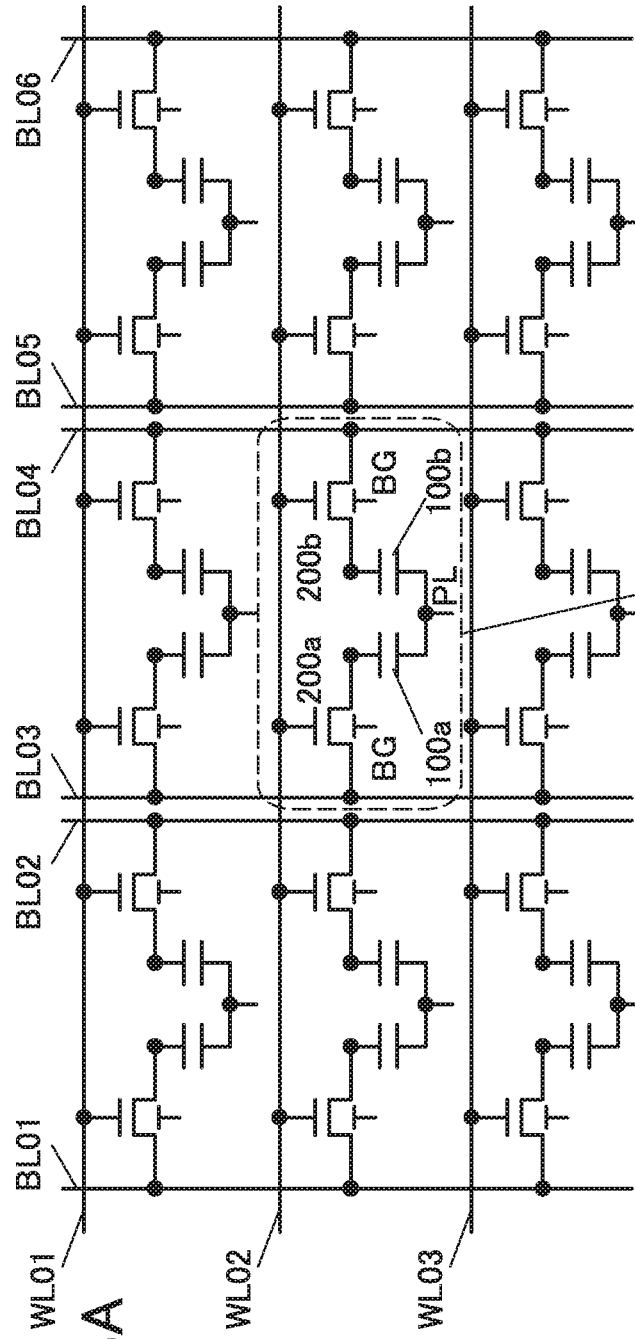
FIG. 28 A circuit diagram and a cross-sectional view of a semiconductor device of one embodiment of the present invention.
Figure 30:
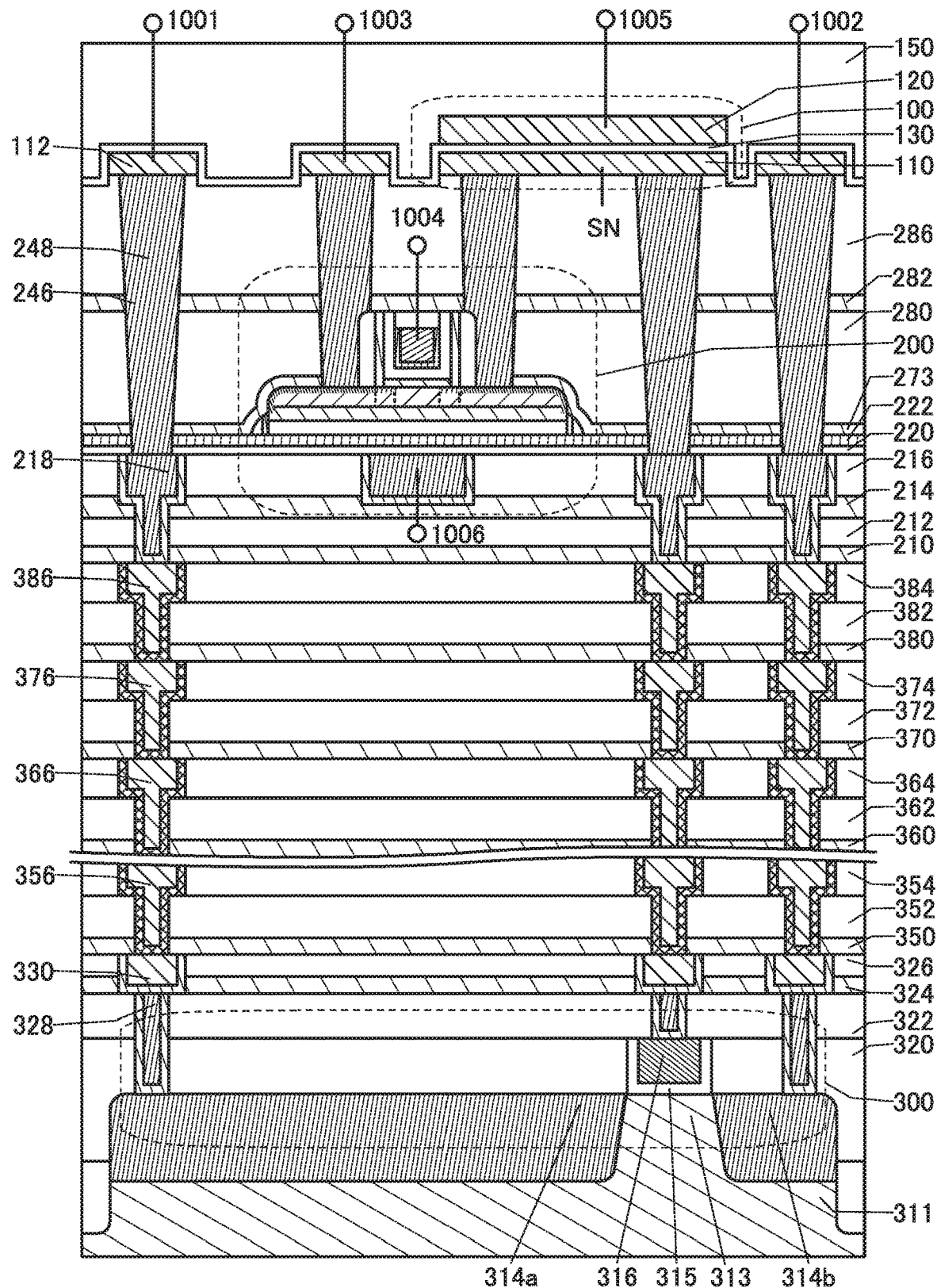
FIG. 30 A cross-sectional view illustrating a structure of a memory device of one embodiment of the present invention.

FIG. 28(A) is a circuit diagram showing an embodiment, which is different from that in FIG. 27(A), in which the cells 600 illustrated in FIG. 30 are arranged in a matrix. In FIG. 28(A), the first gates of the transistors included in the cells 600 arranged in the row direction are electrically connected to a common WL (WL01, WL02, and WL03). Furthermore, ones of the sources and the drains of the transistors included in the cells arranged in the column direction are electrically connected to a common BL (BL01 to BL06). In addition, the transistors included in the cells 600 may each be provided with the second gate BG. The threshold voltage of the transistor can be controlled by a potential applied to the BG. The first electrodes of the capacitors included in the cells 600 are electrically connected to the others of the sources and the drains of the transistors. At this time, the first electrodes of the capacitors are formed of part of components included in the transistors in some cases. In addition, the second electrodes of the capacitors included in the cells 600 are electrically connected to the PL. Here, as illustrated in FIG. 28(A), a second electrode of a capacitor of a cell 600 and a second electrode of a capacitor of a cell 600 adjacent to the cell 600 may be connected to the common PL.

Figure 28B:
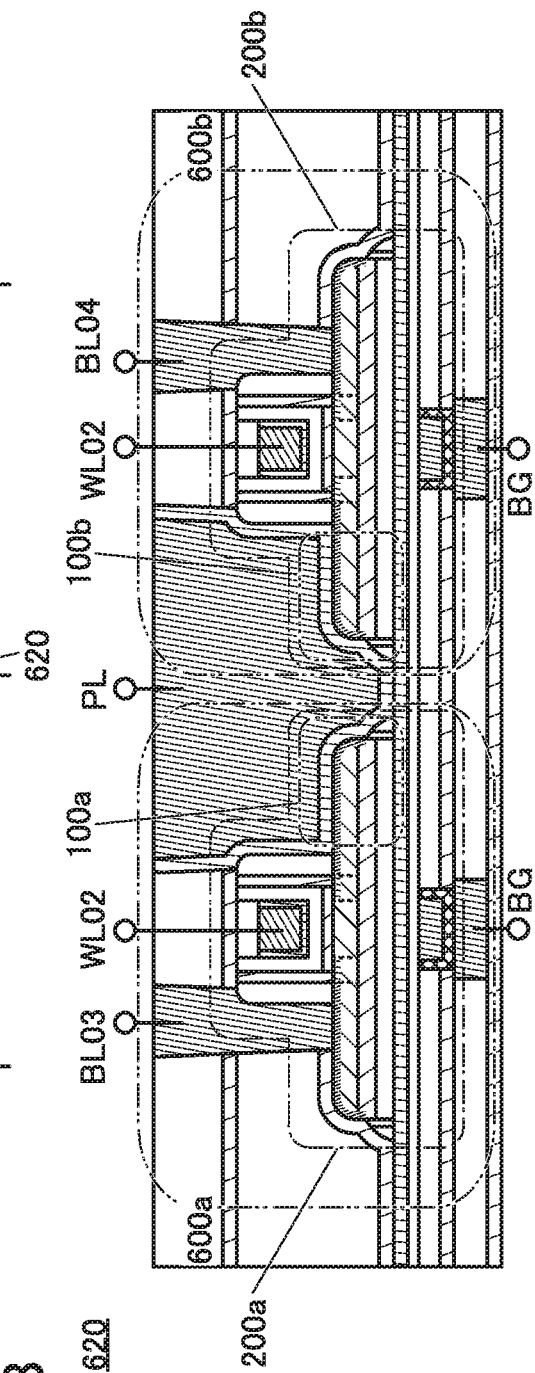

FIG. 28(B) is a cross-sectional view which illustrates an extracted part of the row including a circuit 620 including the cell 600a electrically connected to the WL02 and the BL03 and the cell 600b electrically connected to the WL02 and the BL04 in FIG. 28(A). FIG. 28(B) illustrates a cross-sectional view of the cell 600a and the cell 600b.

The cell 600a includes the transistor 200a and the capacitor 100a. The cell 600b includes the transistor 200b and the capacitor 100b.

The same conductor is used for the second electrode of the capacitor 100a and the second electrode of the capacitor 100b and the conductor is electrically connected to the PL.

Figure 29:
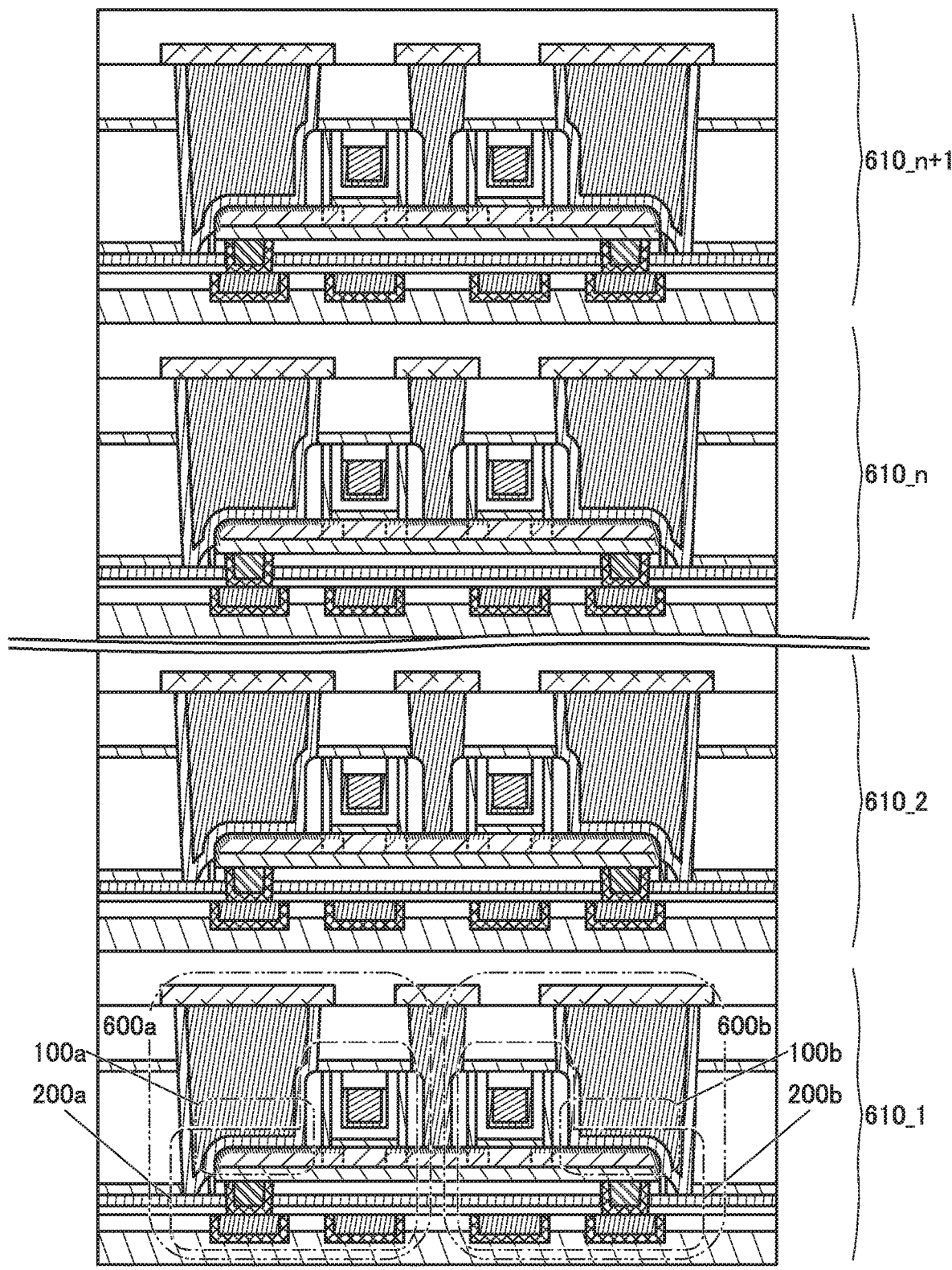
FIG. 29 A cross-sectional view illustrating a structure of a memory device of one embodiment of the present invention.

The cells 600 not only are arranged side by side but also may be stacked. FIG. 29 illustrates a cross-sectional view of a structure in which n+1 layers of cell arrays each including the circuit 610 are stacked. As illustrated in FIG. 29, by stacking a plurality of cell arrays, the cells can be integrated without an increase in the area occupied by the cell arrays. In other words, a 3D cell array can be formed.

The composition, structure, method, and the like described above in this embodiment can be used in combination as appropriate with the compositions, structures, methods, and the like described in the other embodiments and the example.

Embodiment 3

In this embodiment, one embodiment of a semiconductor device will be described with reference to FIG. 30 to FIG. 35.

<Memory Device 1>

Figure 31:
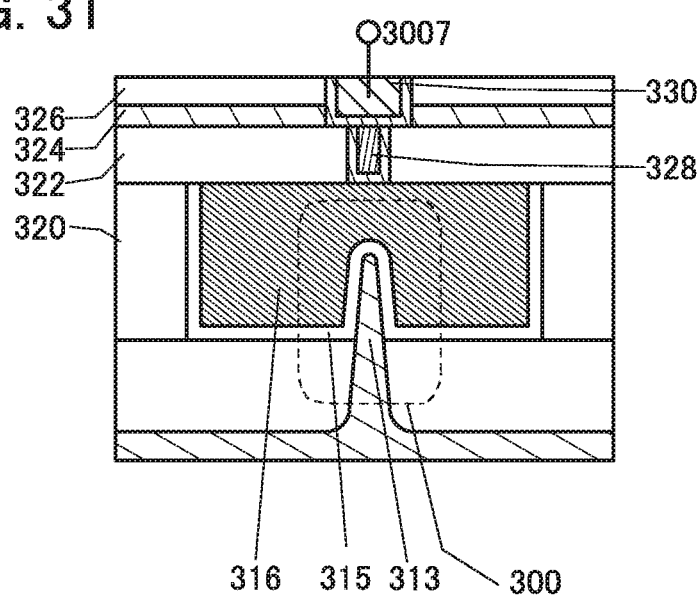
FIG. 31 A cross-sectional view illustrating a structure of a memory device of one embodiment of the present invention.
Figure 32:
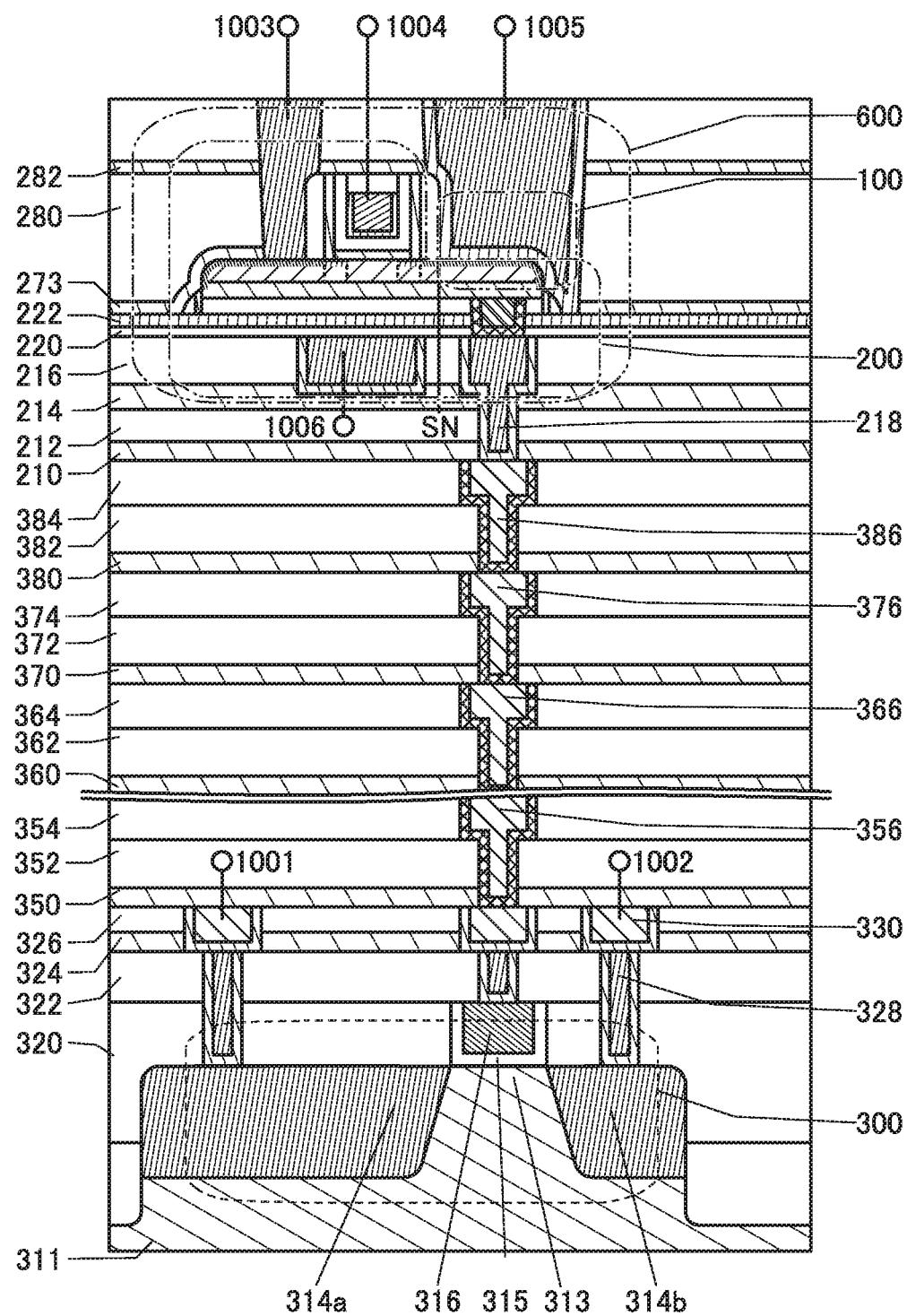
FIG. 32 A cross-sectional view illustrating a structure of a memory device of one embodiment of the present invention.

Memory devices illustrated in FIG. 30, FIG. 31, and FIG. 32 each include a transistor 300, the transistor 200, and the capacitor 100. FIG. 30 and FIG. 32 are cross-sectional views of the transistor 200 and the transistor 300 in the channel length direction. FIG. 31 illustrates a cross-sectional view of the transistor 300 and the vicinity of the transistor 300 in the channel width direction.

The transistor 200 is a transistor in which a channel is formed in a semiconductor layer including an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

In each of the memory devices illustrated in FIG. 30 and FIG. 32, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to a top gate of the transistor 200, and a wiring 1006 is electrically connected to a bottom gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory devices illustrated in FIG. 30 and FIG. 32 each have a feature that a potential of the gate of the transistor 300 can be retained and thus enable writing, retaining, and reading of data as follows.

Writing and retaining of data are described. First, the potential of the wiring 1004 is set to a potential at which the transistor 200 is brought into a conduction state, so that the transistor 200 is brought into a conduction state. Accordingly, the potential of the wiring 1003 is supplied to a node SN where the gate of the transistor 300 and one electrode of the capacitor 100 are electrically connected to each other. That is, a predetermined charge is supplied to the gate of the transistor 300 (writing). Here, one of two kinds of charges providing different potential levels (hereinafter referred to as a Low-level charge and a High-level charge) is supplied. After that, the potential of the wiring 1004 is set to a potential at which the transistor 200 is brought into a non-conduction state, so that the transistor 200 is brought into a non-conduction state. Thus, the charge is retained in the node SN (retaining).

In the case where the off-state current of the transistor 200 is low, the charge in the node SN is retained for a long time.

Next, reading of data is described. An appropriate potential (reading potential) is supplied to the wiring 1005 while a predetermined potential (constant potential) is supplied to the wiring 1001, whereby the wiring 1002 has a potential corresponding to the amount of charge retained in the node SN. This is because when the transistor 300 is of an n-channel type, an apparent threshold voltage $V_{th\_H}$ at the time when the High-level charge is supplied to the gate of the transistor 300 is lower than an apparent threshold voltage $V_{th\_L}$ at the time when the Low-level charge is supplied to the gate of the transistor 300. Here, an apparent threshold voltage refers to the potential of the wiring 1005 which is needed to bring the transistor 300 into a "conduction state". Thus, the potential of the wiring 1005 is set to a potential $V_0$ which is between $V_{th\_H}$ and $V_{th\_L}$, whereby the charge supplied to the node SN can be determined. For example, in the case where the High-level charge is supplied to the node SN in writing and the potential of the wiring 1005 is $V_0$ ($>V_{th\_H}$), the transistor 300 is brought into a "conduction state". Meanwhile, in the case where the Low-level charge is supplied to the node SN, the transistor 300 remains in a "non-conduction state" even when the potential of the wiring 1005 is $V_0$ ($<V_{th\_L}$). Thus, the data retained in the node SN can be read by determining the potential of the wiring 1002.

<Structure of Memory Device 1>

The memory device of one embodiment of the present invention includes the transistor 300, the transistor 200, and the capacitor 100 as illustrated in FIG. 30. The transistor 200 is provided above the transistor 300, and the capacitor 100 is provided above the transistor 300 and the transistor 200.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 31, in the transistor 300, a top surface and a side surface in the channel width direction of the semiconductor region 313 are covered with the conductor 316 with the insulator 315 therebetween. When the transistor 300 is such a Fin-type transistor, the effective channel width is increased, whereby the on-state characteristics of the transistor 300 can be improved. In addition, since contribution of an electric field of a gate electrode can be increased, the off-state characteristics of the transistor 300 can be improved.

The transistor 300 is either a p-channel transistor or an n-channel transistor.

It is preferable that a region of the semiconductor region 313 where a channel is formed, a region in the vicinity thereof, the low-resistance region 314a and the low-resistance region 314b functioning as the source region or the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

Note that the transistor 300 illustrated in FIG. 30 is only an example and the structure is not limited thereto; a transistor appropriate for a circuit configuration or a driving method can be used.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like underlying the insulator 322. For example, a top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 or less times the relative permittivity of the insulator 324, further preferably 0.6 or less times the relative permittivity of the insulator 324. When a material with a low permittivity is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material of each of the plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 30, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be provided using a material similar to those of the conductor 328 and the conductor 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening portion of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In that case, a structure is preferable in which the tantalum nitride layer having a barrier property against hydrogen is in contact with the insulator 350 having a barrier property against hydrogen.

A wiring layer may be provided over the insulator 350 and the conductor 356. For example, in FIG. 30, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be provided using a material similar to those of the conductor 328 and the conductor 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening portion of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 30, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those of the conductor 328 and the conductor 330.

Note that the insulator 370 is preferably formed using an insulator having a barrier property against hydrogen, as with the insulator 324, for example. Furthermore, the conductor 376 preferably contains a conductor having a barrier property against hydrogen. In particular, the conductor having a barrier property against hydrogen is formed in an opening portion of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 30, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those of the conductor 328 and the conductor 330.

Note that the insulator 380 is preferably formed using an insulator having a barrier property against hydrogen, as with the insulator 324, for example. Furthermore, the conductor 386 preferably contains a conductor having a barrier property against hydrogen. In particular, the conductor having a barrier property against hydrogen is formed in an opening portion of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

Although the wiring layer including the conductor 356, the wiring layer including the conductor 366, the wiring layer including the conductor 376, and the wiring layer including the conductor 386 are described above, the memory device of this embodiment is not limited thereto. Three or less wiring layers which are similar to the wiring layer including the conductor 356 may be provided, or five or more wiring layers which are similar to the wiring layer including the conductor 356 may be provided.

The insulator 210, the insulator 212, the insulator 214, and the insulator 216 are stacked sequentially over the insulator 384. A substance having a barrier property against oxygen or hydrogen is preferably used for one of the insulator 210, the insulator 212, the insulator 214, and the insulator 216.

For example, the insulator 210 and the insulator 214 are preferably formed using a film having a barrier property that prevents hydrogen or impurities from diffusing from the substrate 311, a region where the transistor 300 is provided, or the like to a region where the transistor 200 is provided. Therefore, a material similar to that of the insulator 324 can be used.

For the film having a barrier property against hydrogen, silicon nitride formed by a CVD method can be used, for example. The diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

For the film having a barrier property against hydrogen used as the insulator 210 and the insulator 214, for example, a metal oxide such as aluminum oxide, hafnium oxide, or tantalum oxide is preferably used.

In particular, aluminum oxide has an excellent blocking effect that inhibits the passage of both oxygen and impurities such as hydrogen and moisture which are factors of a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide included in the transistor 200 can be prevented. Therefore, aluminum oxide is suitably used for a protective film of the transistor 200.

The insulator 212 and the insulator 216 can be formed using a material similar to that of the insulator 320, for example. In the case where a material with a relatively low permittivity is used for an interlayer film, the parasitic capacitance generated between wirings can be reduced. A silicon oxide film, a silicon oxynitride film, or the like can be used as the insulator 212 and the insulator 216, for example.

A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. The conductor 218 can be provided using a material similar to those of the conductor 328 and the conductor 330.

In particular, the conductor 218 in a region in contact with the insulator 210 and the insulator 214 is preferably a conductor having a barrier property against oxygen, hydrogen, and water. In such a structure, the transistor 300 and the transistor 200 can be separated by a layer having a barrier property against oxygen, hydrogen, and water; thus, the diffusion of hydrogen from the transistor 300 to the transistor 200 can be prevented.

The transistor 200 is provided over the insulator 216. Note that the structure of the transistor included in the semiconductor device described in the above embodiment can be used as the structure of the transistor 200. Note that the transistor 200 illustrated in FIG. 30 is only an example and the structure is not limited thereto; a transistor appropriate for a circuit configuration or a driving method is used.

The insulator 280 is provided over the transistor 200.

The insulator 282 is provided over the insulator 280. A substance having a barrier property against oxygen or hydrogen is preferably used for the insulator 282. Thus, the insulator 282 can be formed using a material similar to that of the insulator 214. For the insulator 282, a metal oxide such as aluminum oxide, hafnium oxide, or tantalum oxide is preferably used, for example.

In particular, aluminum oxide has an excellent blocking effect that inhibits the passage of both oxygen and impurities such as hydrogen and moisture which are factors of a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide included in the transistor 200 can be prevented. Therefore, aluminum oxide is suitably used for a protective film of the transistor 200.

An insulator 286 is provided over the insulator 282. The insulator 286 can be formed using a material similar to that of the insulator 320. In the case where a material with a relatively low permittivity is used for an interlayer film, the parasitic capacitance generated between wirings can be reduced. For example, a silicon oxide film, a silicon oxynitride film, or the like can be used as the insulator 286.

A conductor 246, a conductor 248, and the like are embedded in the insulator 220, the insulator 222, the insulator 280, the insulator 282, and the insulator 286.

The conductor 246 and the conductor 248 function as plugs or wirings that are electrically connected to the capacitor 100, the transistor 200, or the transistor 300. The conductor 246 and the conductor 248 can be provided using a material similar to those of the conductor 328 and the conductor 330.

In addition, the capacitor 100 is provided above the transistor 200. The capacitor 100 includes a conductor 110, the conductor 120, and an insulator 130.

A conductor 112 may be provided over the conductor 246 and the conductor 248. The conductor 112 functions as a plug or a wiring that is electrically connected to the capacitor 100, the transistor 200, or the transistor 300. The conductor 110 functions as the electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 30; however, the structure is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductor 112 and the conductor 110. The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

A material with high dielectric strength, such as silicon oxynitride, is preferably used for the insulator 130, for example. In the capacitor 100 having such a structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material can be used.

An insulator 150 is provided over the conductor 120 and the insulator 130. The insulator 150 can be provided using a material similar to that of the insulator 320. The insulator 150 may function as a planarization film that covers an uneven shape thereunder.

With the use of the structure, a change in electrical characteristics can be prevented and reliability can be improved in a semiconductor device using a transistor including an oxide semiconductor. Alternatively, a transistor including an oxide semiconductor having a high on-state current can be provided. Alternatively, a transistor including an oxide semiconductor having a low off-state current can be provided. Alternatively, a semiconductor device with reduced power consumption can be provided.

<Modification Example of Memory Device 1>

An example of the memory device of one embodiment of the present invention will be described below with reference to FIG. 32.

FIG. 32 is a cross-sectional view of a memory device including the capacitor 100, the transistor 200, and the transistor 300. Note that in the memory device illustrated in FIG. 32, components having the same functions as the components in the semiconductor device and the memory device described in the above embodiments and <Structure of memory device 1> are denoted by the same reference numerals.

The memory device illustrated in FIG. 32 is different from the memory device in <Structure of memory device 1> in that the cell 600 described in the above embodiment is provided.

Specifically, as illustrated in FIG. 32, the cell 600 in which part of the components of the capacitor 100 and part of the components of the transistor 200 are common is included instead of the capacitor 100 and the transistor 200.

In the above structure, the cell 600 and the transistor 300 partly or entirely overlap with each other, so that the total area of the projected area of the memory device can be reduced. Accordingly, the cell 600 can be easily miniaturized or highly integrated. Furthermore, the process can be shortened.

<Memory Device 2>

A semiconductor device illustrated in FIG. 33 is a memory device including a transistor 400, the transistor 200, and the capacitor 100. One embodiment of the memory device is described below with reference to FIG. 33.

FIG. 33(A) is a circuit diagram showing an example of the connection relationship of the transistor 200, the transistor 400, and the capacitor 100 in the semiconductor device described in this embodiment. FIG. 33(B) is a cross-sectional view of the semiconductor device in which the wiring 1004 to the wiring 1010 and the like correspond to those in FIG. 33(A).

The transistor 200 and the transistor 400 which are formed over a substrate (not illustrated) have different structures. For example, the transistor 400 may have a structure in which a drain current is lower than that of the transistor 200 when a bottom gate voltage and a top gate voltage are 0 V. A structure is employed in which the transistor 400 is used as a switching element to control the potential of a bottom gate of the transistor 200. Thus, a charge at a node connected to the bottom gate of the transistor 200 can be inhibited from being lost by making the node connected to the bottom gate of the transistor 200 have a desired potential and then bringing the transistor 400 into an off state.

As illustrated in FIG. 33, in the transistor 200, the gate is electrically connected to the wiring 1004, one of the source and the drain is electrically connected to the wiring 1003, and the other of the source and the drain is electrically connected to one electrode of the capacitor 100. The other electrode of the capacitor 100 is electrically connected to the wiring 1005. A drain of the transistor 400 is electrically connected to the wiring 1010. As illustrated in FIG. 33(B), the bottom gate of the transistor 200 and a source, a top gate, and a bottom gate of the transistor 400 are electrically connected through the wiring 1006, the wiring 1007, the wiring 1008, and the wiring 1009.

The on state and off state of the transistor 200 can be controlled by application of a potential to the wiring 1004. When the transistor 200 is in an on state and a potential is applied to the wiring 1003, charges can be supplied to the capacitor 100 through the transistor 200. At this time, by bringing the transistor 200 into an off state, the charges supplied to the capacitor 100 can be held. By application of a given potential to the wiring 1005, the potential of a connection portion between the transistor 200 and the capacitor 100 can be controlled by capacitive coupling. For example, when a ground potential is applied to the wiring 1005, the charges are held easily. Furthermore, by application of a negative potential to the wiring 1010, the negative potential is applied to the bottom gate of the transistor 200 through the transistor 400, whereby the threshold voltage of the transistor 200 can be higher than 0 V, the off-state current can be reduced, and the drain current when the voltage applied to the top gate is 0 V can be reduced.

With a structure in which the top gate and the bottom gate of the transistor 400 are diode-connected to the source, and the source of the transistor 400 and the bottom gate of the transistor 200 are connected, the bottom gate voltage of the transistor 200 can be controlled by the wiring 1010. When the negative potential of the bottom gate of the transistor 200 is held, the voltage between the top gate and the source of the transistor 400 and the voltage between the bottom gate and the source are 0 V. Since the drain current of the transistor 400 when the voltage applied to the top gate is 0 V is extremely low and the threshold voltage is higher than that of the transistor 200, the structure allows the negative potential of the bottom gate of the transistor 200 to be held for a long time without power supply to the transistor 400.

Moreover, the negative potential of the bottom gate of the transistor 200 is held, in which case the drain current of the transistor 200 when the voltage applied to the top gate is 0 V can be noticeably reduced even without power supply to the transistor 200. In other words, the charges can be held in the capacitor 100 for a long time even without power supply to the transistor 200 and the transistor 400. For example, with the use of such a semiconductor device as a memory element, memory can be held for a long time without power supply. Therefore, a memory device with a low frequency of the refresh operation or a memory device that does not need refresh operation can be provided.

Note that the connection relationship of the transistor 200, the transistor 400, and the capacitor 100 is not limited to that illustrated in FIGS. 33(A) and 33(B). The connection relationship can be modified as appropriate in accordance with a necessary circuit configuration.

<Structure of Memory Device 2>

FIG. 33(B) is a cross-sectional view of the memory device including the capacitor 100, the transistor 200, and the transistor 400. Note that in the memory device illustrated in FIG. 33, components having the same functions as the components in the semiconductor device and the memory device described in the above embodiments and <Structure of memory device 1> are denoted by the same reference numerals.

The memory device of one embodiment of the present invention includes the transistor 200, the transistor 400, and the capacitor 100 as illustrated in FIG. 33. The transistor 200 and the transistor 400 are provided in the same layer, and the capacitor 100 is provided above the transistor 200 and the transistor 400.

Note that the capacitor and the transistor included in the semiconductor device and the memory device described in the above embodiments and with reference to FIG. 30 and FIG. 32 can be used as the capacitor 100 and the transistor 200. Note that the capacitor 100, the transistor 200, and the transistor 400 illustrated in FIG. 33 are only examples and the structures of those are not limited thereto; a transistor appropriate for a circuit configuration or a driving method may be used.

The transistor 400 and the transistor 200 are formed in the same layer and thus can be manufactured in parallel. The transistor 400 includes a conductor 460 (a conductor 460a and a conductor 460b) functioning as a top gate electrode; a conductor 405 functioning as a bottom gate electrode; an insulator 472 overlapping with the conductor 460; an insulator 475 in contact with the insulator 472; the insulator 220, the insulator 222, the insulator 224, and an insulator 450 functioning as gate insulating layers; an oxide 430c including a region where a channel is formed; an oxide 431a and an oxide 431b functioning as one of a source and a drain; and an oxide 432a and an oxide 432b functioning as the other of the source and the drain. The conductor 405 functioning as the bottom gate electrode is electrically connected to a conductor 403 functioning as a wiring.

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The oxide 430c is in the same layer as the oxide 230c. The insulator 450 is in the same layer as the insulator 250. The conductor 460 is in the same layer as the conductor 260. The insulator 470 is in the same layer as the insulator 270. The insulator 472 is in the same layer as the insulator 272.

In the oxide 430c functioning as an active layer of the transistor 400, oxygen vacancies are reduced and impurities such as water or hydrogen are reduced, as in the oxide 230 or the like. Accordingly, the threshold voltage of the transistor 400 can be higher than 0 V, the off-state current can be reduced, and the drain current when the bottom gate voltage and the top gate voltage are 0 V can be extremely low.

As described above, the oxide 431a and the oxide 432a are in the same layer as the oxide 230a, and the oxide 431b and the oxide 432b are in the same layer as the oxide 230b. Thus, low-resistance regions corresponding to the region 231a and the region 231b are formed in the oxide 431a, the oxide 432a, the oxide 431b, and the oxide 432b.

With the use of the structure, a change in electrical characteristics can be prevented and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. A miniaturized or highly integrated semiconductor device can be provided with high productivity.

<Memory Device 3>

Figure 34:
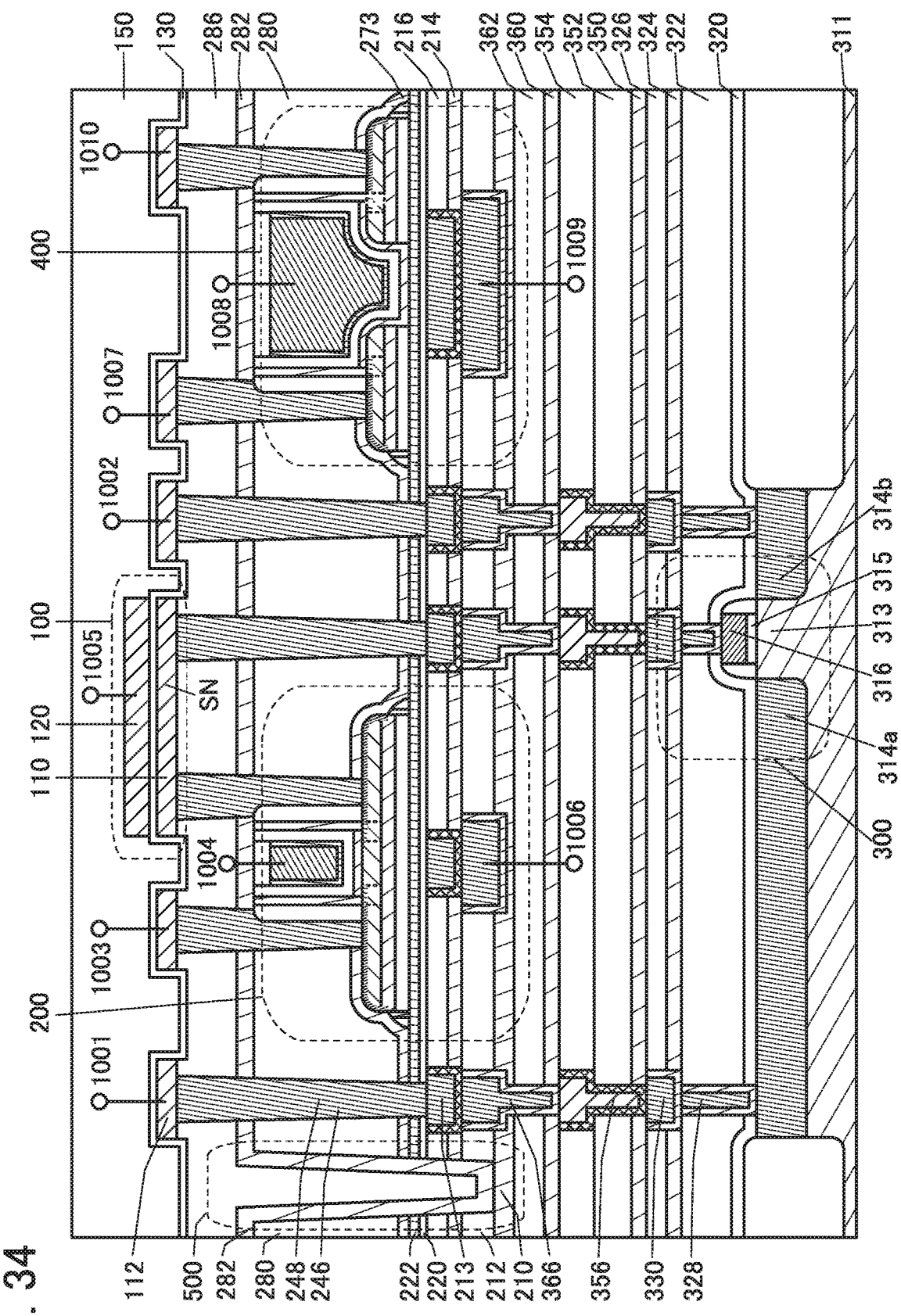
FIG. 34 A cross-sectional view illustrating a structure of a memory device of one embodiment of the present invention.

A semiconductor device illustrated in FIG. 34 is a memory device including the transistor 300, the transistor 200, the transistor 400, and the capacitor 100. One embodiment of the memory device is described below with reference to FIG. 34.

The transistor 200 is a transistor in which a channel is formed in a semiconductor layer including an oxide semiconductor, and can be the transistor described in the above embodiment. Since the transistor described in the above embodiment can be formed with high yield even when it is miniaturized, the transistor 200 can be miniaturized. The use of such a transistor in a memory device allows miniaturization or high integration of the memory device. Since the off-state current of the transistor described in the above embodiment is low, a memory device including the transistor can retain stored data for a long time. In other words, such a memory device does not require refresh operation or has an extremely low frequency of the refresh operation, which leads to a sufficient reduction in power consumption of the memory device.

In FIG. 34, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the top gate of the transistor 200, and the wiring 1006 is electrically connected to the back gate of the transistor 200. The gate of the transistor 300 and the other of the source and the drain of the transistor 200 are electrically connected to one electrode of the capacitor 100, and the wiring 1005 is electrically connected to the other electrode of the capacitor 100.

The wiring 1007 is electrically connected to the source of the transistor 400, the wiring 1008 is electrically connected to the top gate of the transistor 400, the wiring 1009 is electrically connected to the back gate of the transistor 400, and the wiring 1010 is electrically connected to the drain of the transistor 400. Here, the wiring 1006, the wiring 1007, the wiring 1008, and the wiring 1009 are electrically connected to each other.

The semiconductor device illustrated in FIG. 34 has a feature that the potential of the gate of the transistor 300 can be retained and thus enables writing, retaining, and reading of data as follows.

Writing and retaining of data are described. First, the potential of the fourth wiring 1004 is set to a potential at which the transistor 200 is brought into a conduction state, so that the transistor 200 is brought into a conduction state. Accordingly, the potential of the third wiring 1003 is supplied to the node SN where the gate of the transistor 300 and one electrode of the capacitor 100 are electrically connected to each other. That is, a predetermined charge is supplied to the gate of the transistor 300 (writing). Here, one of two kinds of charges providing different potential levels (hereinafter, referred to as a Low-level charge and a High-level charge) is supplied. After that, the potential of the fourth wiring 1004 is set to a potential at which the transistor 200 is brought into a non-conduction state, so that the transistor 200 is brought into a non-conduction state; thus, the charge is retained in the node SN (retaining).

In the case where the off-state current of the transistor 200 is low, the charge in the node SN is retained for a long time.

Next, reading of data is described. An appropriate potential (reading potential) is supplied to the fifth wiring 1005 while a predetermined potential (constant potential) is supplied to the first wiring 1001, whereby the second wiring 1002 has a potential corresponding to the amount of charge retained in the node SN. This is because when the transistor 300 is of an n-channel type, an apparent threshold voltage $V_{th\_H}$ at the time when the High-level charge is supplied to the gate of the transistor 300 is lower than an apparent threshold voltage $V_{th\_L}$ at the time when the Low-level charge is supplied to the gate of the transistor 300. Here, an apparent threshold voltage refers to the potential of the fifth wiring 1005 which is needed to bring the transistor 300 into a "conduction state". Thus, the potential of the fifth wiring 1005 is set to a potential $V_0$ which is between $V_{th\_H}$ and $V_{th\_L}$, whereby the charge supplied to the node SN can be determined. For example, in the case where the High-level charge is supplied to the node SN in writing and the potential of the fifth wiring 1005 is $V_0$ ($>V_{th\_H}$), the transistor 300 is brought into a "conduction state". Meanwhile, in the case where the Low-level charge is supplied to the node SN, the transistor 300 remains in a "non-conduction state" even when the potential of the fifth wiring 1005 is $V_0$ ($<V_{th\_L}$). Thus, the data retained in the node SN can be read by determining the potential of the second wiring 1002.

<Structure of Memory Device 3>

FIG. 34 is a cross-sectional view of a memory device including the capacitor 100, the transistor 200, the transistor 300, and the transistor 400. Note that in the memory device illustrated in FIG. 34, components having the same functions as the components in the semiconductor device and the memory device described in the above embodiments, <Structure of memory device 1>, and <Structure of memory device 2> are denoted by the same reference numerals.

The memory device of one embodiment of the present invention includes the transistor 300, the transistor 200, the transistor 400, and the capacitor 100 as illustrated in FIG. 34. The transistor 200 and the transistor 400 are provided above the transistor 300, and the capacitor 100 is provided above the transistor 300, the transistor 200, and the transistor 400.

Note that the capacitor and the transistor included in the semiconductor device and the memory device described in the above embodiments and with reference to FIG. 30 to FIG. 33 can be used as the capacitor 100, the transistor 200, the transistor 300, and the transistor 400. Note that the capacitor 100, the transistor 300, the transistor 200, and the transistor 400 illustrated in FIG. 34 are only examples and the structures of those are not limited thereto; a transistor appropriate for a circuit configuration or a driving method may be used.

The memory device illustrated in FIG. 34 is an example in which an opening portion 500 is provided in the insulator 212, the insulator 214, the insulator 216, the insulator 220, the insulator 222, the insulator 273, and the insulator 280 and the insulator 210 and the insulator 282 are connected to each other. With such a structure, the transistor 200 and the transistor 400 are surrounded by the insulator 210 and the insulator 282, and thus are less likely to be affected by impurities such as water or hydrogen. In addition, release of oxygen in the oxide or the insulator to the outside is reduced. The memory device with such a structure is preferable because the reliability is improved. Note that the opening portion 500 is not necessarily provided.

With the use of the structure, a change in electrical characteristics can be prevented and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. A miniaturized or highly integrated semiconductor device can be provided with high productivity.

<Structure of Memory Cell Array>

Figure 35:
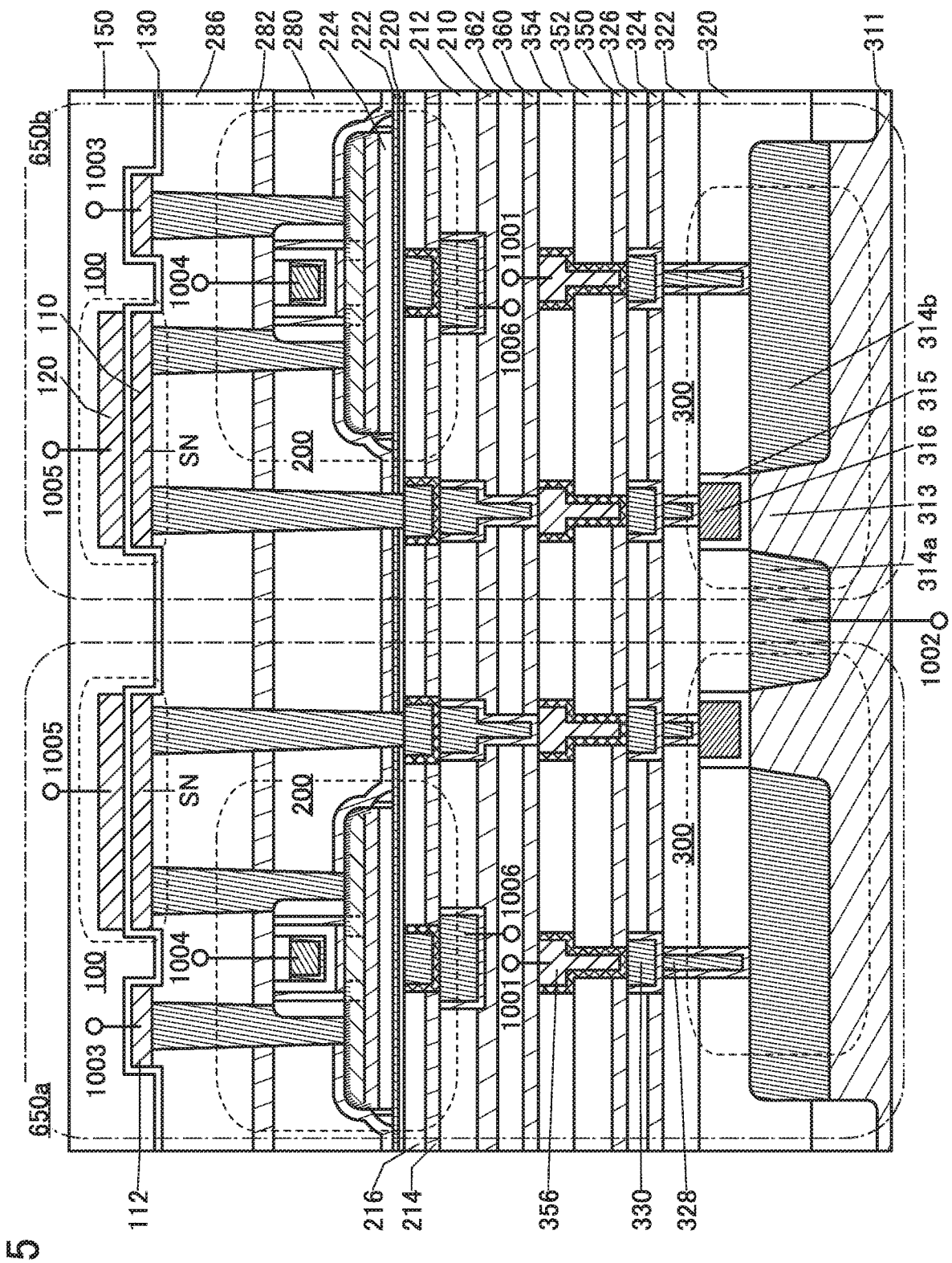
FIG. 35 A cross-sectional view illustrating a structure of a memory device of one embodiment of the present invention.

FIG. 35 illustrates an example of a memory cell array of this embodiment. When the transistors 200 are arranged as memory cells in a matrix, a memory cell array can be formed.

The memory device illustrated in FIG. 35 is a semiconductor device constituting a memory cell array in which the memory devices illustrated in FIG. 30 and FIG. 34 are arranged in a matrix. Note that one transistor 400 can control the back-gate voltages of the plurality of transistors 200. For this reason, the number of provided transistors 400 is preferably smaller than the number of transistors 200.

Accordingly, in FIG. 35, the transistor 400 illustrated in FIG. 34 is omitted. FIG. 35 is a cross-sectional view that illustrates part of a row in which the memory devices illustrated in FIG. 30 and FIG. 34 are arranged in a matrix.

The structure of the transistor 300 is different from that in FIG. 34. In the transistor 300 illustrated in FIG. 35, the semiconductor region 313 (part of the substrate 311) in which the channel is formed has a protruding shape. Furthermore, the conductor 316 is provided so as to cover a side surface and top surface of the semiconductor region 313 with the insulator 315 positioned therebetween. Note that the conductor 316 may be formed using a material for adjusting the work function. The transistor 300 is also referred to as a FIN-type transistor because it utilizes a protruding portion of the semiconductor substrate. An insulator functioning as a mask for forming the protruding portion may be provided in contact with a top portion of the protruding portion. Although the case where the protruding portion is formed by processing part of the semiconductor substrate is described here, a semiconductor film having a protruding shape may be formed by processing an SOI substrate.

In the memory device illustrated in FIG. 35, a memory cell 650a and a memory cell 650b are arranged adjacent to each other. The transistor 300, the transistor 200, and the capacitor 100 are included and electrically connected to the wiring 1001, the wiring 1002, the wiring 1003, the wiring 1004, the wiring 1005, and the wiring 1006 in the memory cell 650a and the memory cell 650b. Also in the memory cells 650a and 650b, a node where the gate of the transistor 300 and one electrode of the capacitor 100 are electrically connected to each other is referred to as the node SN. Note that the wiring 1002 is a common wiring for the memory cell 650a and the memory cell 650b adjacent to each other.

In the case where memory cells are arranged in an array, data of a desired memory cell needs to be read at the time of reading. For example, in the case where a memory cell array has a NOR-type structure, only data of a desired memory cell can be read by bringing the transistors 300 of memory cells from which data is not read into a non-conduction state. In that case, a potential at which the transistor 300 is brought into a "non-conduction state" regardless of the charge supplied to the node SN, that is, a potential lower than $V_{th\_H}$ is supplied to the wiring 1005 connected to the memory cells from which data is not read. Alternatively, in the case where a memory cell array has a NAND-type structure, for example, only data of a desired memory cell can be read by bringing the transistors 300 of memory cells from which data is not read into a conduction state. In that case, a potential at which the transistor 300 is brought into a "conduction state" regardless of the charge supplied to the node SN, that is, a potential higher than $V_{th\_L}$ is supplied to the wiring 1005 connected to the memory cells from which data is not read.

With the use of the structure, a change in electrical characteristics can be prevented and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. A miniaturized or highly integrated semiconductor device can be provided with high productivity.

The composition, structure, method, and the like described above in this embodiment can be used in combination as appropriate with the compositions, structures, methods, and the like described in the other embodiments and the example.

Embodiment 4

In this embodiment, an inverter circuit including the semiconductor device described in the above embodiment is described. Note that in this specification, a high power supply voltage and a low power supply voltage are sometimes referred to as an H level (or VDD) and an L level (or GND), respectively.

<Structure Example of Inverter Circuit>

Figure 36A:
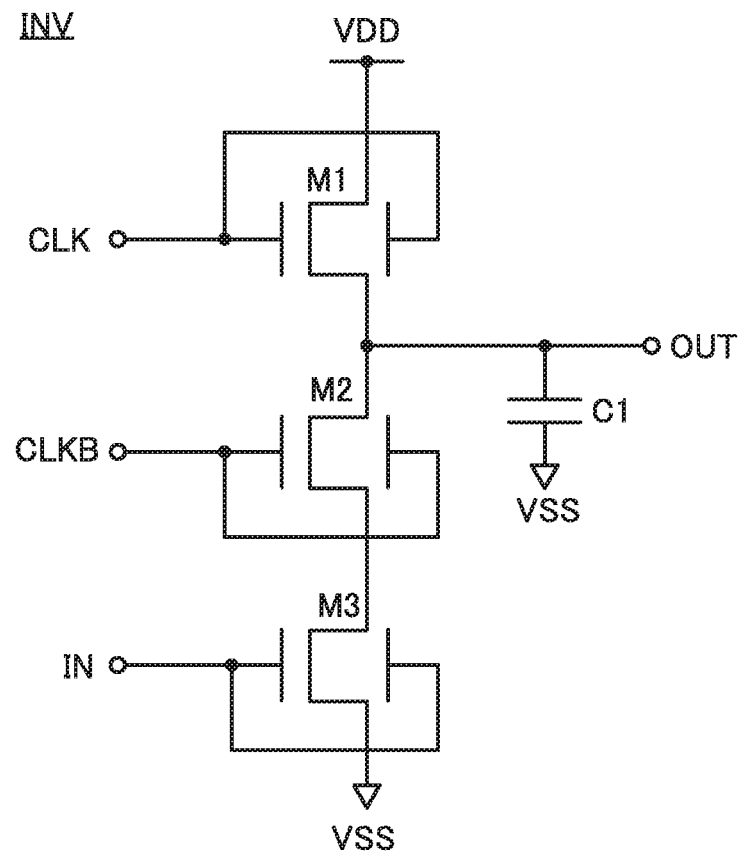
FIG. 36 A circuit diagram illustrating a structure example of an inverter circuit and a timing chart showing its operation example.

A circuit INV illustrated in FIG. 36(A) includes a capacitor C1, and a transistor M1, a transistor M2, and a transistor M3 that are connected in series. The circuit INV functions as an inverter circuit.

The transistors M1 to M3 are n-channel transistors. Since the circuit INV includes only n-channel transistors, the manufacturing cost can be reduced as compared to that of an inverter circuit including CMOS transistors.

It is preferable to use, as the transistors M1 to M3, the transistor 200 or the like included in the semiconductor device described in the above embodiment.

The transistor M1 includes a first gate and a second gate that are electrically connected to each other. The first gate and the second gate overlap with each other with a semiconductor layer positioned therebetween. The same applies to the transistors M2 and M3. Note that the first gate and the second gate may be referred to as a front gate and a back gate, respectively.

The circuit INV includes a terminal IN, a terminal OUT, a terminal CLK, and a terminal CLKB. The terminal IN functions as an input terminal, and the terminal OUT functions as an output terminal. A clock signal is input to the terminal CLK, and an inverted signal of the clock signal input to the terminal CLK is input to the terminal CLKB.

The circuit INV is supplied with VDD and VSS as power supply voltages. VDD, which is a high power supply voltage, is input to a drain of the transistor M1. VSS, which is a low power supply voltage, is input to a source of the transistor M3.

In the transistor M1, the front gate and the back gate are electrically connected to the terminal CLK, and a source is electrically connected to a drain of the transistor M2.

In the transistor M2, the front gate and the back gate are electrically connected to the terminal CLKB, and a source is electrically connected to a drain of the transistor M3.

In the transistor M3, the front gate and the back gate are electrically connected to the terminal IN.

A first terminal of the capacitor C1 is electrically connected to the source of the transistor M1. VSS is input to a second terminal of the capacitor C1.

The terminal OUT is electrically connected to the source of the transistor M1, the drain of the transistor M2, and the first terminal of the capacitor C1.

Note that the capacitor C1 may be replaced with parasitic capacitance of a wiring or gate capacitance of a transistor. In that case, the area occupied by the semiconductor device can be reduced.

Next, the operation of the circuit INV is described.

Figure 36B:
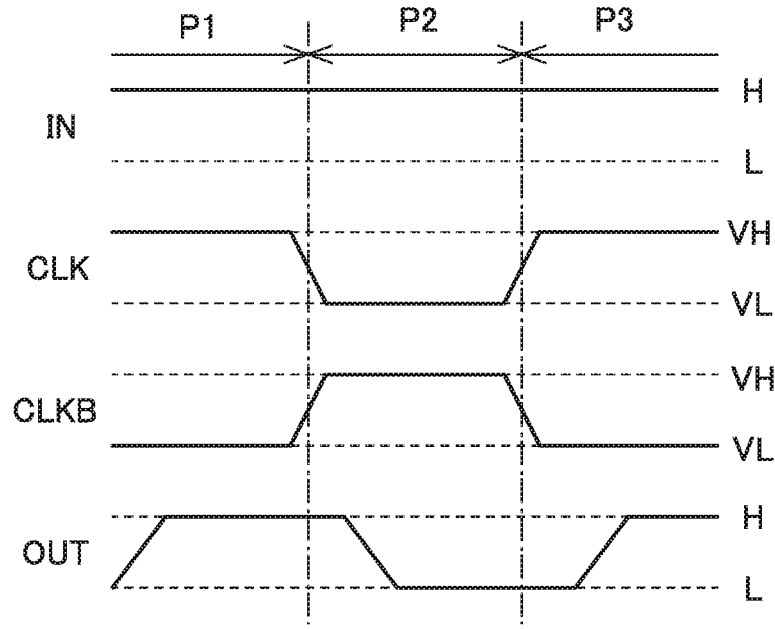

FIG. 36(B) is a timing chart for explaining the operation of the circuit INV. Changes in potentials of the terminals IN, CLK, CLKB, and OUT are shown. In FIG. 36(B), a period is classified into three periods P1, P2, and P3.

The H level is supplied to the terminal IN during the periods P1 to P3. That is, the transistor M3 is on during the periods P1 to P3.

In the period P1, a potential VH is input to the terminal CLK and a potential VL is input to the terminal CLKB. The transistor M1 is turned on and the transistor M2 is turned off. At this time, VDD is supplied to the capacitor C1 and the capacitor C1 starts to be charged (precharged).

Note that VH is preferably higher than or equal to the total voltage of VDD and the threshold voltage ($V_{th}$) of the transistor M1 (VDD+$V_{th}$). Thus, VDD can be accurately transmitted to the terminal OUT. VL may be a low power supply voltage (or GND). Note that VH and VL are sometimes referred to as a high potential and a low potential, respectively.

In the period P2, VL is input to the terminal CLK and VH is input to the terminal CLKB. The transistor M1 is turned off and the transistor M2 is turned on. At this time, the transistor M3 is on; thus, electrical continuity is established between the first terminal of the capacitor C1 and the source of the transistor M3, so that the capacitor C1 starts to be discharged. Finally, the terminal OUT outputs an L level. That is, the terminal OUT outputs an inverted signal of the signal input to the terminal IN.

In the period P3, VH is input to the terminal CLK and VL is input to the terminal CLKB. The transistor M1 is turned on and the transistor M2 is turned off. As in the period P1, the capacitor C1 starts to be precharged.

In the case where an input of the terminal IN is set to an L level during the periods P1 to P3, the terminal OUT outputs an H level in the period P2. That is, the terminal OUT outputs an inverted signal of the signal input to the terminal IN.

From the above, it is found that the circuit INV performs a precharge of the capacitor C1 when the terminal CLK is at VH and functions as an inverter circuit when the terminal CLK is at VL.

In addition, it is found that the circuit INV functions as a dynamic logic circuit that operates by repeating charge and discharge of the capacitor C1. The transistor M1 functions as a precharge transistor for charging the capacitor C1, and the transistor M2 functions as a discharge transistor for discharging charges accumulated in the capacitor C1.

A transistor with a low off-state current is preferably used as each of the transistors M1 to M3. Examples of the transistor with a low off-state current include a transistor using a metal oxide or an oxide semiconductor for a channel formation region (hereinafter also referred to as an OS transistor). Note that a low off-state current means that the off-state current of a transistor is preferably lower than or equal to $10^{-18}$ A/μm, further preferably lower than or equal to $10^{-21}$ A/μm, still further preferably lower than or equal to $10^{-24}$ A/μm.

With the use of an OS transistor as each of the transistors M1 to M3, a shoot-through current of the circuit INV can be reduced. As a result, the power consumption of the circuit INV can be reduced.

With the use of an OS transistor as each of the transistors M1 to M3, charges precharged in the capacitor C1 can avoid being lost due to a leakage current. As a result, the circuit INV can transmit data more accurately.

The front gate and the back gate of the transistor M1 are electrically connected to each other, whereby the gate voltage can be applied to the semiconductor layer from the front gate and the back gate at the same time and thus the on-state current can be increased. The same applies to the transistor M2 and the transistor M3. Consequently, the circuit INV can achieve an inverter circuit with a high operation frequency.

In the circuit INV, the terminal IN may be electrically connected to the front gate and the back gate of the transistor M2 and the terminal CLKB may be electrically connected to the front gate and the back gate of the transistor M3.

The back gates of the transistors M1 to M3 may each be supplied with a potential different from that supplied to their top gates. For example, a common fixed potential may be supplied to the back gates of the transistors M1 to M3. Thus, the threshold voltages of the transistors M1 to M3 in the circuit INV can be controlled.

In addition, all of the back gates of the transistors M1 to M3 in the circuit INV may be omitted depending on the case. In that case, the manufacturing process of the circuit INV can be simplified.

As described above, the circuit INV can provide an inverter circuit that has low power consumption and is configured with transistors having the same polarity type. In addition, an inverter circuit that has a high operation frequency and is configured with transistors having the same polarity type can be provided.

The composition, structure, method, and the like described above in this embodiment can be used in combination as appropriate with the compositions, structures, methods, and the like described in the other embodiments and the example.

Embodiment 5

In this embodiment, with reference to FIG. 37 to FIG. 39, a NOSRAM will be described as an example of a memory device, which is one embodiment of the present invention, including a transistor in which an oxide is used for a semiconductor (hereinafter referred to as an OS transistor) and a capacitor. A NOSRAM (registered trademark) is an abbreviation of "Nonvolatile Oxide Semiconductor RAM", which indicates a RAM including a gain cell (2 T or 3 T) memory cell. Note that hereinafter, a memory device including an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charge and discharge of the capacitor. Since the OS transistor is a transistor with an extremely low off-state current, the OS memory has excellent retention characteristics and thus can function as a nonvolatile memory.

<<NOSRAM>>

Figure 37:
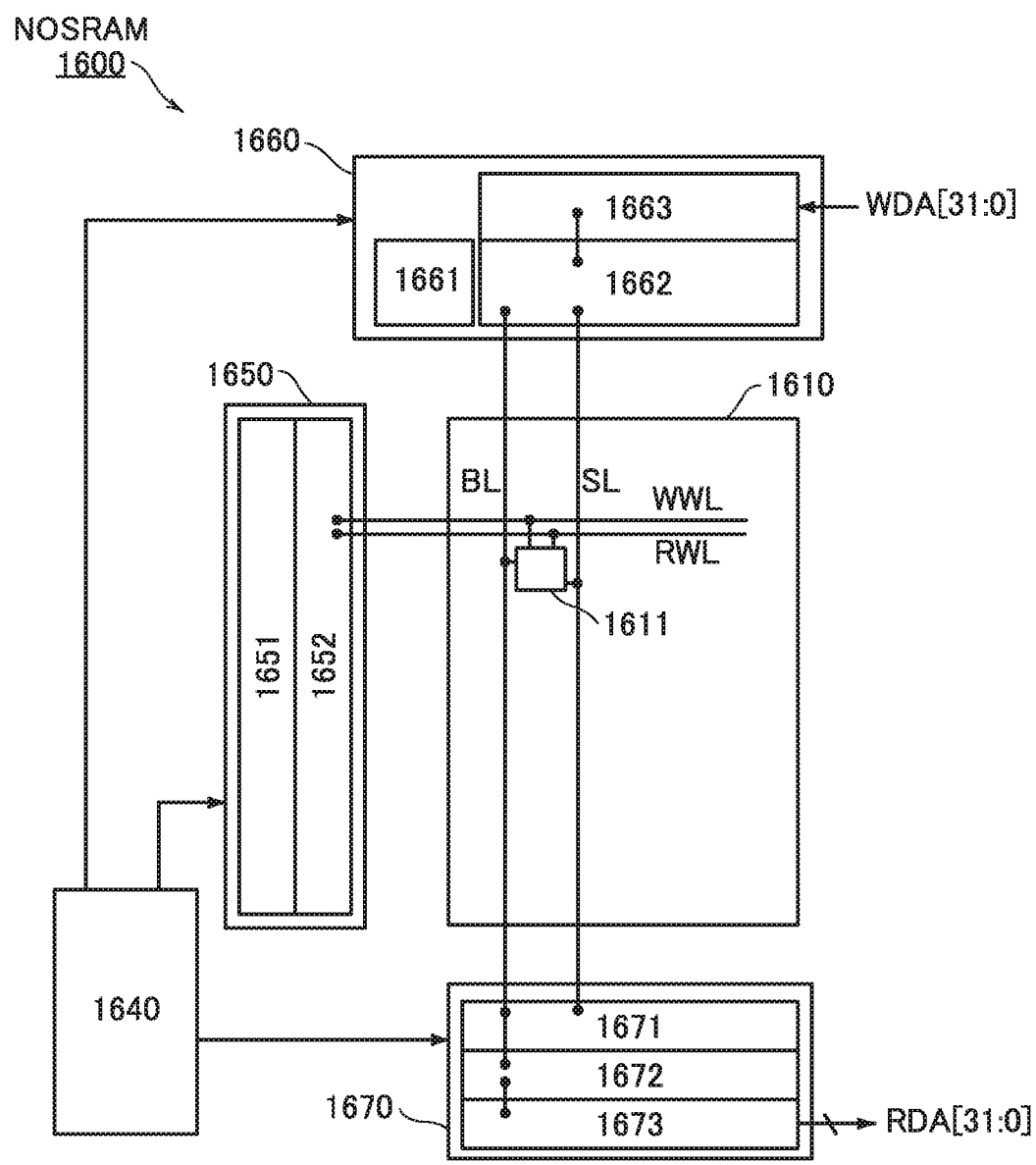
FIG. 37 A block diagram illustrating a structure example of a memory device of one embodiment of the present invention.

FIG. 37 illustrates a configuration example of a NOSRAM. A NOSRAM 1600 illustrated in FIG. 37 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL and RWL, bit lines BL, and source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole, and writes data WDA[31:0] and reads out data RDA[31:0]. The controller 1640 processes command signals from the outside (for example, a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the voltage of the selected source line SL to the ADC 1672. The ADC 1672 has a function of converting an analog voltage into 3-bit digital data. The voltage of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, a structure may be employed in which the DAC 1663 and the ADC 1672 are not provided.

<Memory Cell>

Figure 38A:
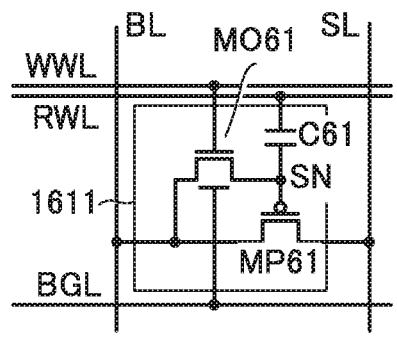
FIG. 38 Circuit diagrams illustrating structure examples of a memory device of one embodiment of the present invention.

FIG. 38(A) is a circuit diagram showing a configuration example of the memory cell 1611. The memory cell 1611 is a 2 T gain cell and the memory cell 1611 is electrically connected to the word lines WWL and RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the voltage of the node SN. The node SN is a data storage node and corresponds to a gate of the transistor MP61 here.

The write transistor of the memory cell 1611 is formed using the OS transistor MO61; thus, the NOSRAM 1600 can retain data for a long time.

Figure 38B:
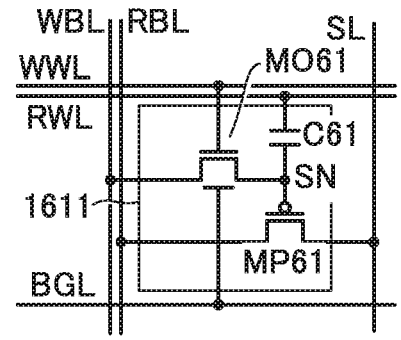

In the example of FIG. 38(A), write and read bit lines are a common bit line; however, as illustrated in FIG. 38(B), a bit line WBL functioning as a write bit line and a bit line RBL functioning as a read bit line may be provided.

Figure 38C:
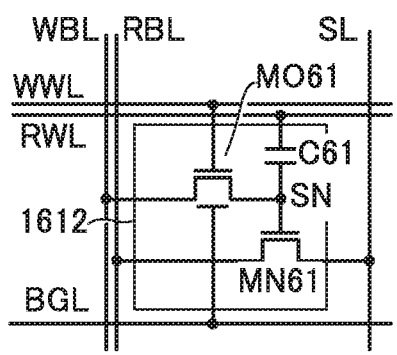
Figure 38D:
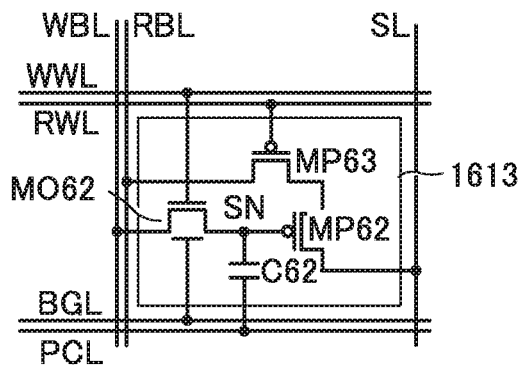
Figure 38E:
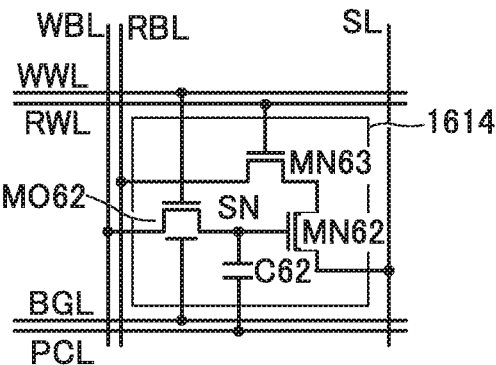

FIG. 38(C) to FIG. 38(E) show other configuration examples of the memory cell. FIG. 38(C) to FIG. 38(E) show examples where the write bit line WBL and the read bit line RBL are provided; however, as in FIG. 38(A), a bit line shared in writing and reading may be provided.

A memory cell 1612 illustrated in FIG. 38(C) is a modification example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no back gate.

A memory cell 1613 illustrated in FIG. 38(D) is a 3 T gain cell and is electrically connected to the word lines WWL and RWL, the bit lines WBL and RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 38(E) is a modification example of the memory cell 1613 where the read transistor and the selection transistor are changed into n-channel transistors (MN62 and MN63). The transistors MN62 and MN63 may be OS transistors or Si transistors.

The OS transistors provided in the memory cells 1611 to 1614 may each be a transistor with no back gate or a transistor with a back gate.

What is called a NOR memory device in which the memory cells 1611 or the like are connected in parallel is described above, but the memory device of this embodiment is not limited thereto. For example, what is called a NAND memory device in which memory cells 1615 described below are connected in series may be provided.

Figure 39:
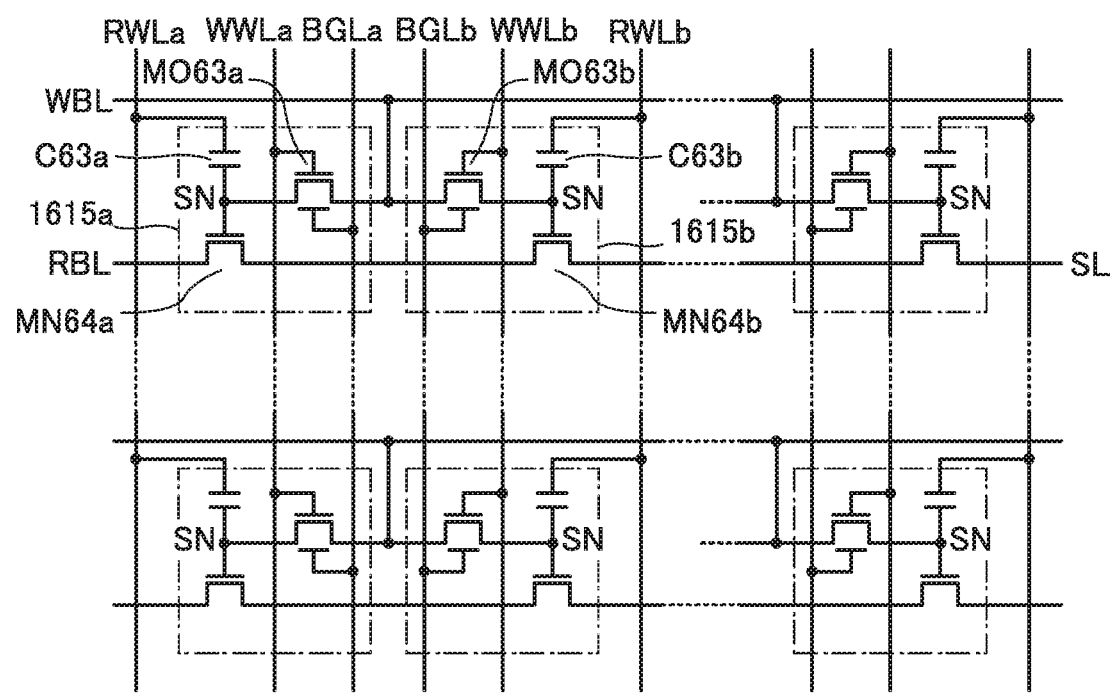
FIG. 39 A circuit diagram illustrating a structure example of a memory device of one embodiment of the present invention.

FIG. 39 is a circuit diagram showing a configuration example of the NAND memory cell array 1610. The memory cell array 1610 illustrated in FIG. 39 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example. The transistor MN64 is not limited thereto and may be a p-channel Si transistor or an OS transistor.

A memory cell 1615*a* and a memory cell 1615*b*, which are illustrated in FIG. 39, are described below as examples. Here, the character "a" or "b" is added to the reference numerals of the wirings and circuit elements connected to the memory cell 1615*a* or the memory cell 1615*b*.

In the memory cell 1615*a*, a gate of a transistor MN64*a*, one of a source and a drain of a transistor MO63*a*, and one electrode of a capacitor C63*a* are electrically connected to each other. The bit line WBL and the other of the source and the drain of the transistor MO63*a* are electrically connected to each other. A word line WWLa and a gate of the transistor MO63*a* are electrically connected to each other. A wiring BGLa and a back gate of the transistor MO63*a* are electrically connected to each other. A word line RWLa and the other electrode of the capacitor C63*a* are electrically connected to each other.

The memory cell 1615*b* can be provided to be symmetric to the memory cell 1615*a* with the use of a contact portion with the bit line WBL as a symmetry axis. Therefore, circuit elements included in the memory cell 1615*b* are connected to wirings as in the memory cell 1615*a*.

A source of the transistor MN64*a* of the memory cell 1615*a* is electrically connected to a drain of a transistor MN64*b* of the memory cell 1615*b*. A drain of the transistor MN64*a* of the memory cell 1615*a* is electrically connected to the bit line RBL. A source of the transistor MN64*b* of the memory cell 1615*b* is electrically connected to the source line SL through the transistors MN64 of the plurality of memory cells 1615. As described here, the plurality of transistors MN64 are connected in series between the bit line RBL and the source line SL in the NAND memory cell array 1610.

In a memory device including the memory cell array 1610 illustrated in FIG. 39, writing operation and reading operation are performed for a plurality of memory cells (hereinafter referred to as a memory cell column) connected to the same word line WWL (or word line RWL). For example, the writing operation can be performed as follows. A potential at which the OS transistor MO63 is brought into an on state is supplied to the word line WWL connected to a memory cell column on which writing is performed so that the OS transistors MO63 in the memory cell column on which writing is performed are brought into an on state. Accordingly, the potential of the bit line WBL is applied to the gates of the transistors MN64 and ones of electrodes of the capacitors C63 in the specified memory cell column, whereby a predetermined charge is supplied to the gates. After that, turning off the OS transistors MO63 in the memory cell column allows the predetermined charge to be retained in the gates. Thus, data can be written to the memory cells 1615 in the specified memory cell column.

For example, the reading operation can be performed as follows. First, a potential at which the transistor MN64 is brought into an on state is supplied to the word lines RWL not connected to a memory cell column on which reading is to be performed regardless of a charge supplied to the gates of the transistors MN64, so that the transistors MN64 in memory cell columns other than the memory cell column on which reading is to be performed are brought into an on state. Then, a potential (reading potential) at which an on state or an off state of the transistor MN64 is selected is supplied to the word line RWL connected to the memory cell column on which reading is to be performed in accordance with a charge of the gates of the transistors MN64. After that, a constant potential is supplied to the source line SL and a reading circuit connected to the bit line RBL is brought into an operation state. Here, the plurality of transistors MN64 between the source line SL and the bit line RBL are in an on state except the transistor MN64 in the memory cell column on which reading is to be performed; therefore, the conductance between the source line SL and the bit line RBL depends on the state (an on state or an off state) of the transistor MN64 in the memory cell column on which reading is to be performed. Since the conductance of the transistor varies depending on the charge of the gate of the transistor MN64 in the memory cell column on which reading is to be performed, the potential of the bit line RBL varies accordingly. By reading the potential of the bit line RBL with the reading circuit, data can be read from the memory cell 1615 in the selected memory cell column.

There is theoretically no limitation on the number of rewriting operations of the NOSRAM 1600 because data is rewritten by charging and discharging the capacitor C61, the capacitor C62, or the capacitor C63; and writing and reading of data can be performed with low energy. Furthermore, since data can be retained for a long time, the refresh rate can be reduced.

In the case where the semiconductor device described in the above embodiment is used for the memory cells 1611, 1612, 1613, 1614, and 1615, the transistors 200 can be used as the OS transistors MO61, MO62, and MO63, the capacitors 100 can be used as the capacitors C61, C62, and C63, and the transistors 300 can be used as the transistors MP61, MP62, MP63, MN61, MN62, MN63, and MN64. Thus, the area occupied by one set consisting of a transistor and a capacitor in the top view can be reduced, so that the memory device of this embodiment can be further highly integrated. As a result, storage capacity per unit area of the memory device of this embodiment can be increased.

The composition, structure, method, and the like described above in this embodiment can be used in combination as appropriate with the compositions, structures, methods, and the like described in the other embodiments and the example.

Embodiment 6

In this embodiment, a DOSRAM will be described as an example of the memory device of one embodiment of the present invention that includes an OS transistor and a capacitor, with reference to FIG. 40 to FIG. 46. As in the NOSRAM, an OS memory is used in the DOSRAM.

<<DOSRAM 1400>>

Figure 40:
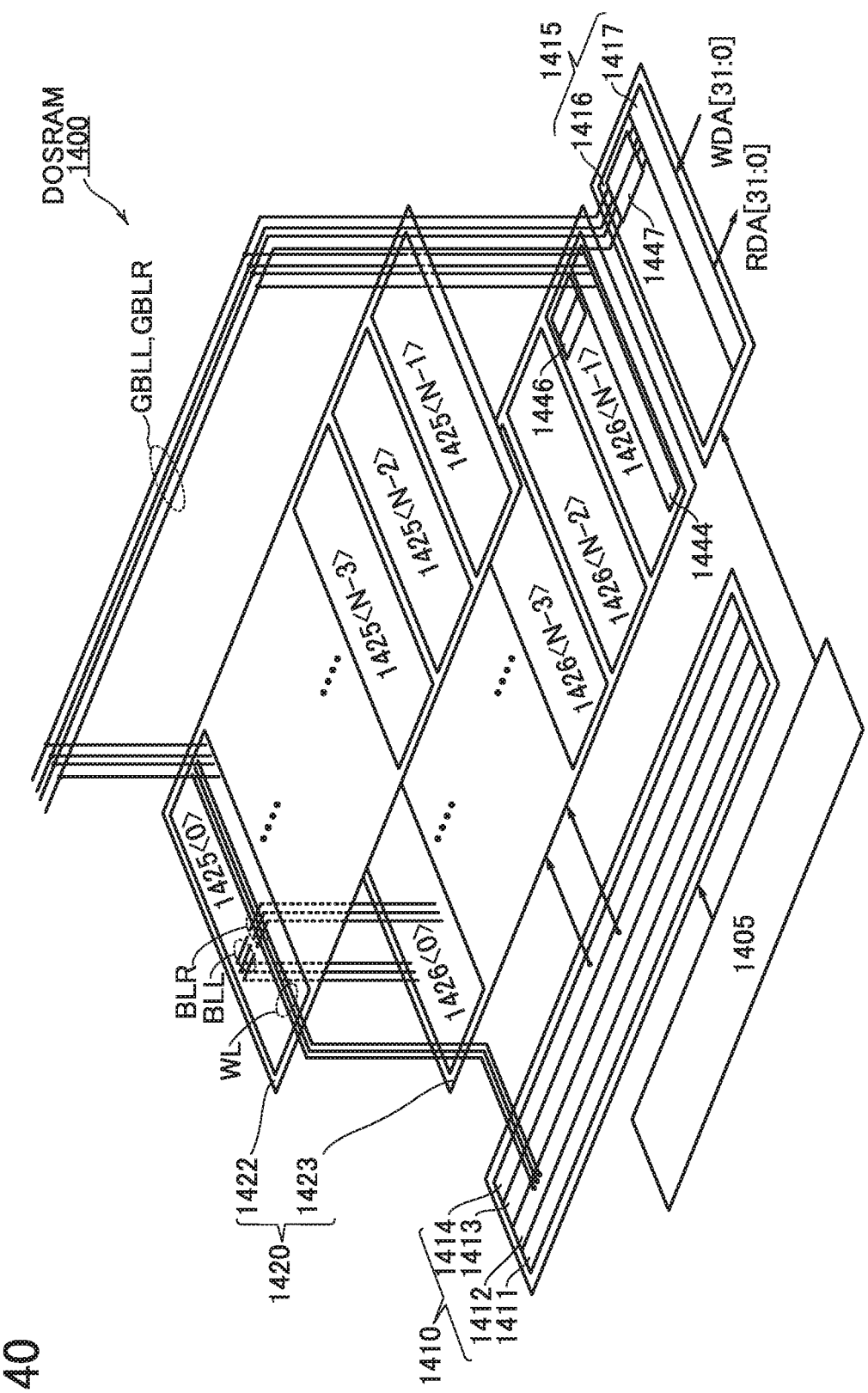
FIG. 40 A block diagram illustrating a structure example of a memory device of one embodiment of the present invention.

FIG. 40 illustrates a configuration example of the DOSRAM. As illustrated in FIG. 40, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts, as the bit-line structure, a hierarchical bit line structure hierarchized with local bit lines and global bit lines.

Figure 41A:
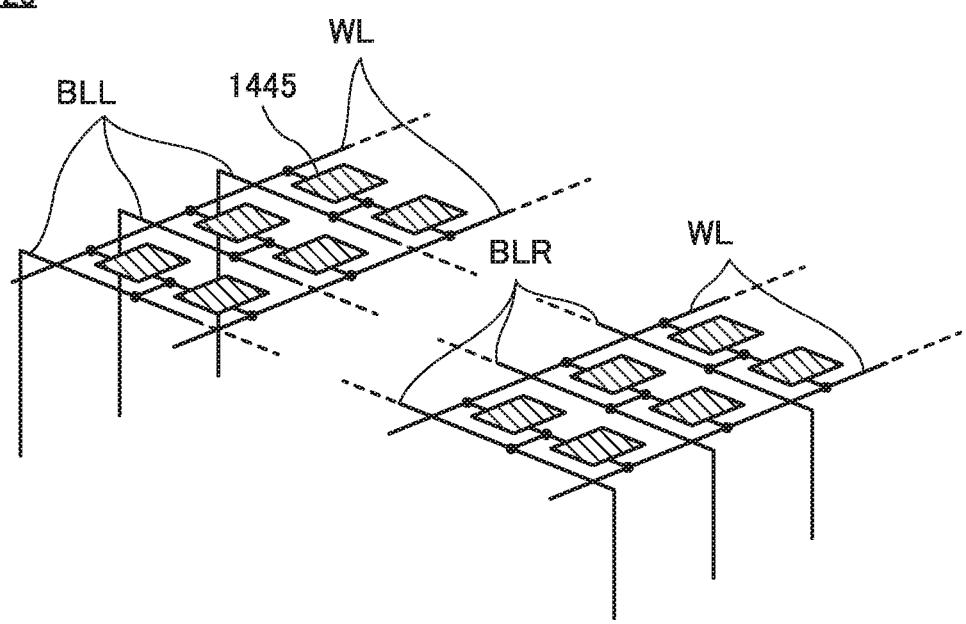
FIG. 41 A block diagram and a circuit diagram illustrating a structure example of a memory device of one embodiment of the present invention.

The memory cell array 1422 includes N local memory cell arrays 1425<0> to 1425<N−1> (N is an integer greater than or equal to 2). FIG. 41(A) illustrates a configuration example of the local memory cell array 1425. The local memory cell array 1425 includes a plurality of memory cells 1445, a plurality of word lines WL, and a plurality of bit lines BLL and BLR. In the example in FIG. 41(A), the local memory cell array 1425 has an open bit-line architecture but may have a folded bit-line architecture.

Figure 41B:
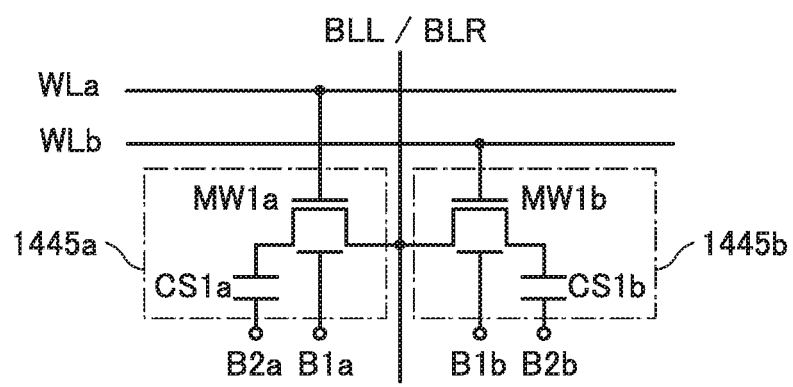

FIG. 41(B) illustrates a circuit configuration example of a pair of a memory cell 1445a and a memory cell 1445b connected to the same bit line BLL (BLR). The memory cell 1445a includes a transistor MW1a, a capacitor CS1a, and terminals B1a and B2a, and is connected to a word line WLa and the bit line BLL (BLR). The memory cell 1445b includes a transistor MW1b, a capacitor CS1b, and terminals B1b and B2b, and is connected to a word line WLb and the bit line BLL (BLR). Hereinafter, in the case where the description is not limited to the memory cell 1445a or the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b. In this way, the bit line BLL (BLR) is shared by the first terminal of the transistor MW1a and the first terminal of the transistor MW1b The transistor MW1 has a function of controlling the charging and discharging of the capacitor CS1. A second terminal of the capacitor CS1 is electrically connected to the terminal B2. A constant voltage (e.g., low power supply voltage) is input to the terminal B2.

In the case where the semiconductor device described in the above embodiment is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. In that case, the area occupied by one set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage of the terminal B1. For example, the voltage of the terminal B1 may be a fixed voltage (e.g., a negative constant voltage); alternatively, the voltage of the terminal B1 may be changed in response to the operation of the DOSRAM 1400.

The back gate of the transistor MW1 may be electrically connected to the gate, the source, or the drain of the transistor MW1. Alternatively, the transistor MW1 does not necessarily include the back gate.

Figure 42:
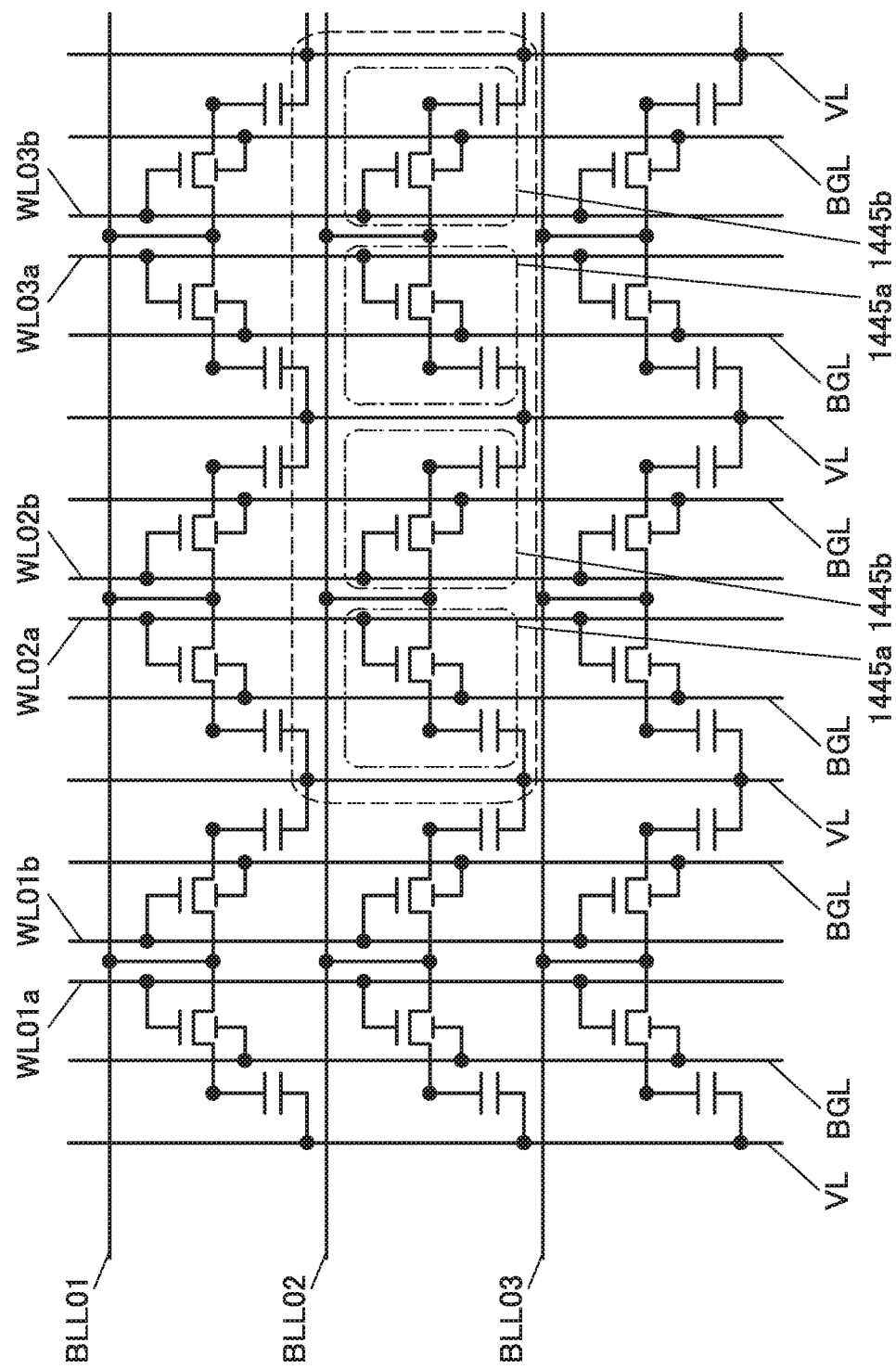
FIG. 42 A circuit diagram of a semiconductor device of one embodiment of the present invention.

FIG. 42 is a circuit diagram illustrating part of a configuration example of the local memory cell array 1425. In the circuit illustrated in FIG. 42, 3×6 memory cells 1445, and bit lines BLL (BLL01, BLL02, and BLL03), word lines WL (WL01a, WL01b, WL02a, WL02b, WL03a, and WL03b,), wirings VL, and wirings BGL connected to the memory cells 1445 are provided.

As illustrated in FIG. 42, the bit line BLL and the word line WL are provided to be perpendicular to each other. The word line WL is connected to the gate of the transistor MW1. The bit line BLL is connected to the first terminal of the transistor MW1a and the first terminal of the transistor MW1b. Here, the first terminal of the transistor MW and the first terminal of the transistor MW1b, which are included in a pair of memory cells 1445, use the bit line BLL in common.

The wiring VL and the wiring BGL are provided to extend in the same direction as the word line WL. In other words, the wiring VL and the wiring BGL are provided to be perpendicular to the bit line BLL. The wiring VL is connected to the terminal B2a and the terminal B2b. Here, the terminal B2a of the capacitor CS1a and the terminal B2b of the capacitor CS1b, which are included in a pair of adjacent memory cells 1445, use the wiring VL in common. The wiring BGL is connected to the terminal B1a and the terminal B1b.

Figure 43:
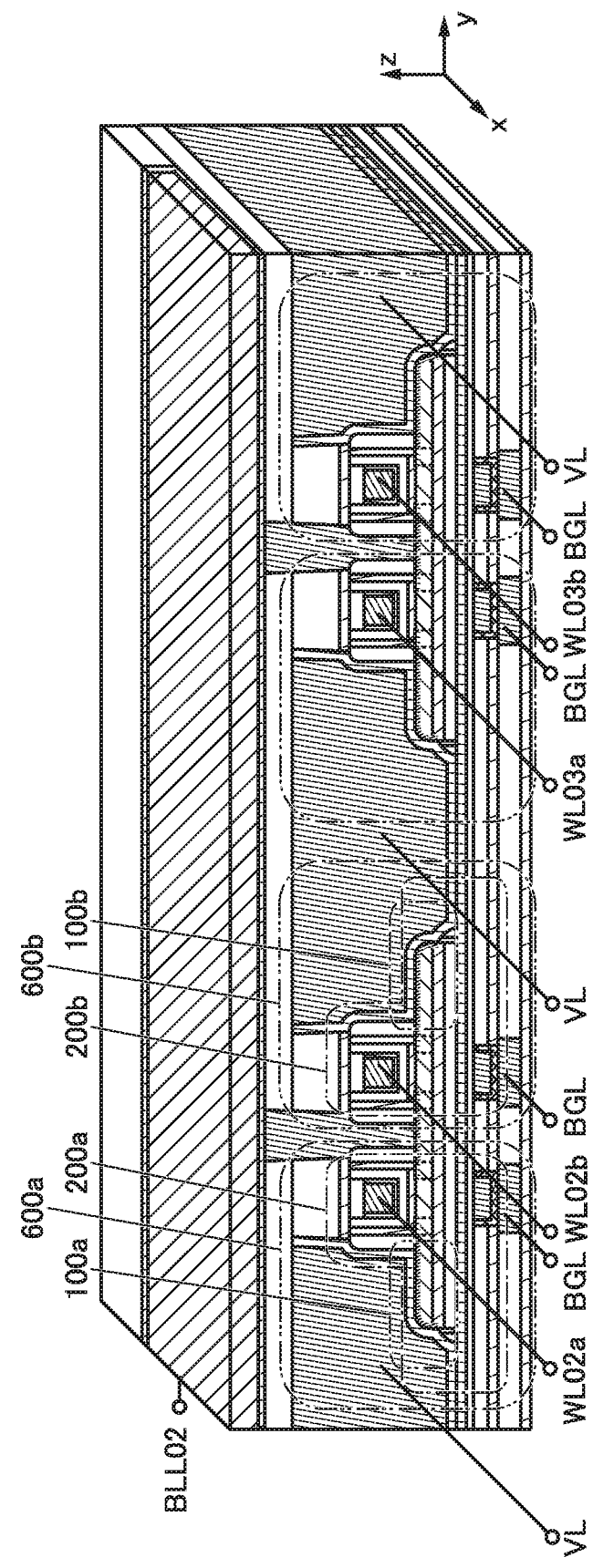
FIG. 43 A cross-sectional view illustrating a structure example of a semiconductor device of one embodiment of the present invention.

FIG. 43 is a cross-sectional view of the cell 600 described in the above embodiment, which corresponds to a portion indicated by a dotted line in the circuit diagram in FIG. 42. As described above, the memory cell 1445a, the transistor MW1a, and the capacitor CS1a correspond to the cell 600a, the transistor 200a, and the capacitor 100a, respectively. The same applies to the memory cell 1445b.

As illustrated in FIG. 43, the bit line BLL02 can be provided to be perpendicular to the word line WL02a, the word line WL02b, the word line WL03a, and the word line WL03b (in the x direction and the y direction in the drawing). As illustrated in FIG. 43, the wiring VL and the wiring BGL can be provided to extend in the direction in which the word line WL02a and the like extend (in the x direction in the drawing). In this case, the wiring BLL02 is perpendicular to the wiring VL and the wiring BGL. The wiring VL is provided to be shared between adjacent memory cells.

The sense amplifier array 1423 includes N local sense amplifier arrays 1426<0> to 1426<N−1>. The local sense amplifier array 1426 includes one switch array 1444 and a plurality of sense amplifiers 1446. The sense amplifier 1446 is electrically connected to a bit line pair. The sense amplifier 1446 has a function of precharging the bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address, the data of the global bit line pair is written to the bit line pair of a target column. The local sense amplifier array 1426 amplifies the written data, and then retains the amplified data. In the specified local memory cell array 1425, the word line WL of the target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a target row is selected, and data of the memory cell 1445 is written to the bit line. The local sense amplifier array 1426 detects a voltage difference of the bit line pair of each column as data, and retains the data. The switch array 1444 writes the data of a column specified by the address to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitation on the number of rewrites in principle and data can be read and written with low energy consumption, because data is rewritten by charging and discharging the capacitor CS1. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

(Writing Speed of DOSRAM)

By using the OS transistor in the memory cell of the DOSRAM described above, the capacitance of the capacitor used in the memory cell can be reduced, and the DOSRAM can perform writing of data at high speed. This will be described below with an example.

Figure 44A:
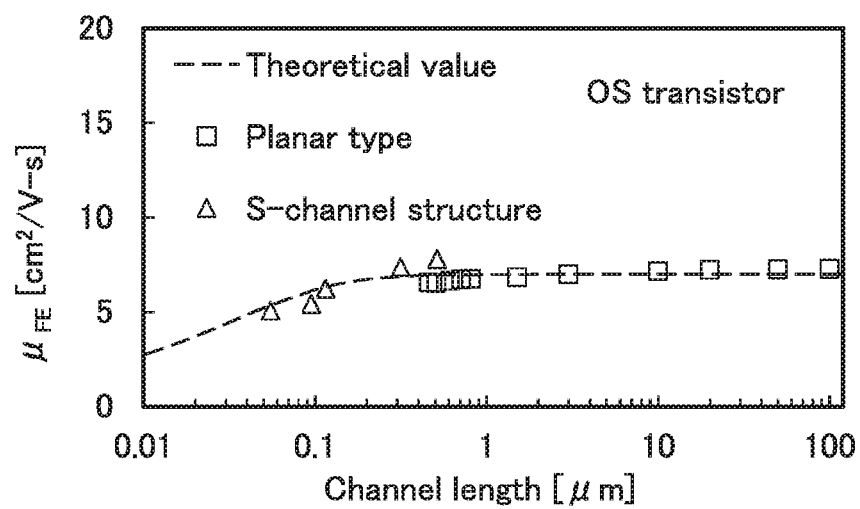
FIG. 44 Views showing channel length dependence of $\mu_{FE}$ of transistors.
Figure 44B:
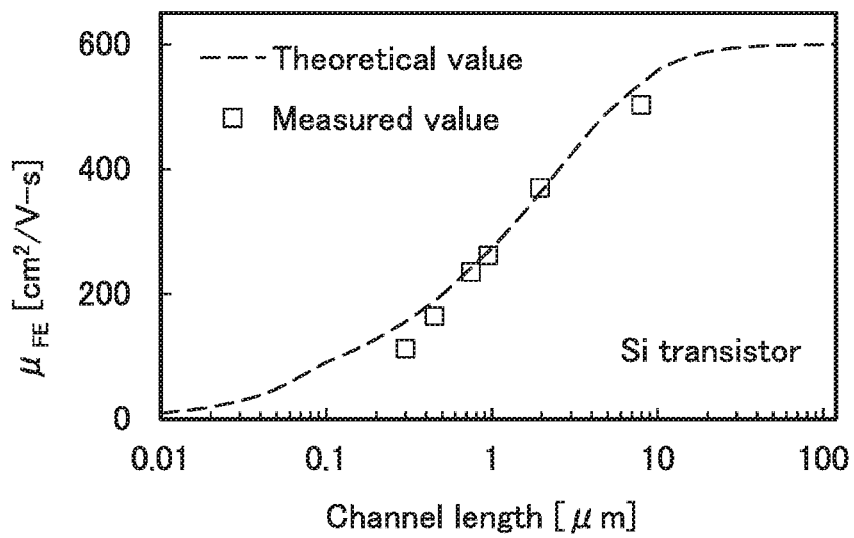

FIGS. 44(A) and 44(B) show the channel length dependence of the field-effect mobility ($\mu_{FE}$) of transistors (see Non-Patent Document 9). FIG. 44(A) shows the case of OS transistors, and FIG. 44(B) shows the case of a Si transistor.

As shown in FIG. 44, it is found that $\mu_{FE}$ of the OS transistors is lower than $\mu_{FE}$ of the Si transistor; however, as the channel length is decreased, the difference becomes smaller.

Figure 45A:
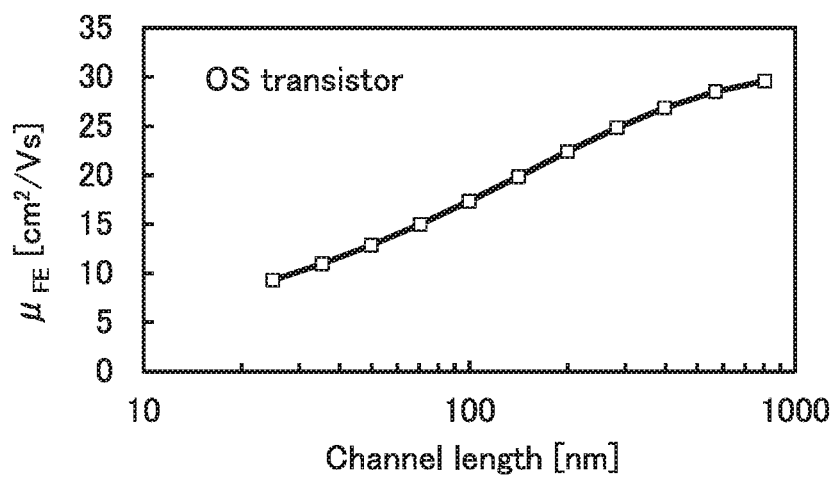
FIG. 45 Views showing channel length dependence of $\mu_{FE}$ of transistors.
Figure 45B:
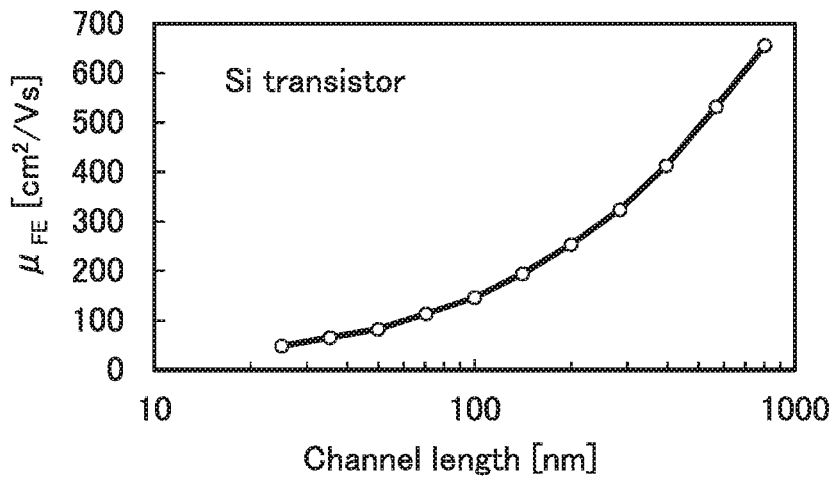

Like FIGS. 44(A) and 44(B), FIGS. 45(A) and 45(B) show the channel length dependence of $\mu_{FE}$ of transistors. FIG. 45(A) shows the case of an OS transistor, and FIG. 45(B) shows the case of a Si transistor.

$\mu_{FE}$ of the OS transistor in FIG. 45(A) was calculated from the following formulae (1) to (5).

[Formula 1]

[Formula 1]

$$\mu_{FE} = \mu_0 E \cdot \sqrt{2} \cdot \left\{ 1 + \left[ 1 + \frac{3\pi}{8}\left(\frac{\mu_0 E}{C_S}\right)^2 \right]^{1/2} \right\}^{-1/2} \quad (1)$$

$$v_d = \sqrt{\frac{8E_P}{3\pi m_0}} \quad (2)$$

$$\mu_0 = 31 [cm^2/Vs] \quad (3)$$

$$C_S = 5.84 \times 10^5 [V/s] \quad (4)$$

$$E_P = 9.42 [eV] \quad (5)$$

The formulae (1) to (5) were obtained by fitting of measured data of an OS transistor. A channel formation region of the OS transistor includes an In—Ga—Zn oxide (an atomic ratio is In:Ga:Zn=4:2:3). The In—Ga—Zn oxide was formed by a sputtering method.

$\mu_{FE}$ of the Si transistor in FIG. 45(B) was obtained by two-dimensional device simulation. A device simulator Atlas (Silvaco, Inc.) was used for the simulation. Monte Carlo methods were used as a simulation model. Monte Carlo methods enable simulation of the ballistic impact in an extremely minute transistor.

Figure 46:
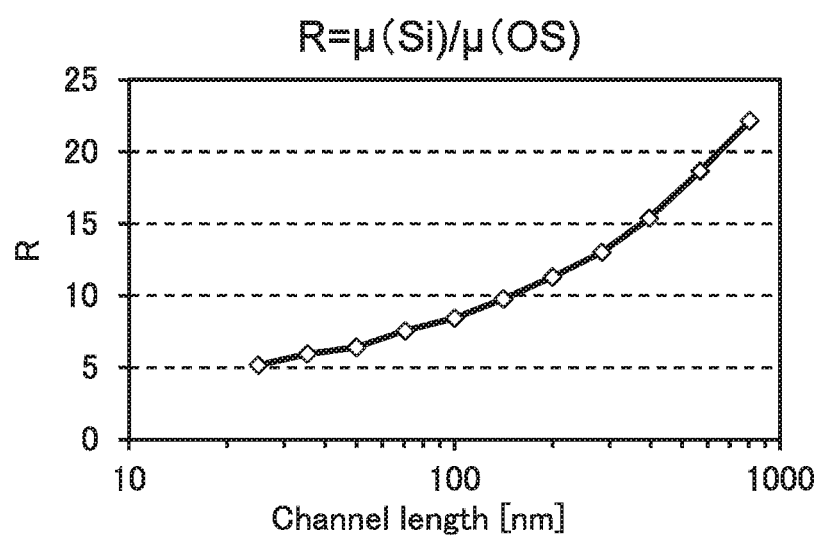
FIG. 46 A view showing channel length dependence of a ratio of $\mu_{FE}$ of a Si transistor to $\mu_{FE}$ of an OS transistor.

FIG. 46 shows the channel length dependence of a ratio (R) of $\mu_{FE}$ of the Si transistor to $\mu_{FE}$ of the OS transistor, which was calculated from FIGS. 45(A) and 45(B). That is, FIG. 46 shows values obtained by dividing the values in FIG. 45(B) by the values in FIG. 45(A).

FIG. 46 shows that the value of R becomes smaller as the channel length becomes shorter. In other words, it is found that the difference between $\mu_{FE}$ of the Si transistor and $\mu_{FE}$ of the OS transistor becomes smaller as the channel length becomes shorter. In the case of the shortest channel length of 25 nm, $\mu_{FE}$ of the Si transistor is approximately five times $\mu_{FE}$ of the OS transistor.

Next, the operation speed of the case where a Si transistor is used in a memory cell and that of the case where an OS transistor is used in a memory cell are compared. Table 1 shows comparison between the memory cells.

In Table 1, the field-effect mobility ($\mu_{FE}$) represents $\mu_{FE}$ of a transistor used in a memory cell, and W/L represents the size of a transistor used in a memory cell. Note that W represents the channel width of a transistor, and L represents the channel length of a transistor. In Table 1, $\mu_{FE} \times$W/L represents the product of $\mu_{FE}$ and W/L, that is, the current drive capability of a transistor, memory cell capacitance represents the capacitance value of a capacitor used in a memory cell, and writing speed represents the speed in writing data to a memory cell. In Table 1, a Si transistor is used in a memory cell of a DRAM, and an OS transistor is used in a memory cell of a DOSRAM.

[Table 1]

TABLE 1

|  | DRAM | DOSRAM |
| --- | --- | --- |
| Field-effect mobility ($\mu_{FE}$) | approx 190 cm$^2$/Vs | 10 cm$^2$/Vs |
| W/L | 25 nm/140 nm | 25 nm/25 nm |
| $\mu_{FE} \times$ W/L | approx 34 cm$^2$/Vs | 10 cm$^2$/Vs |
| Memory cell capacitance | 25 fF | 3.5 fF |
| Writing speed | ×1 | approx × 2 |

In Table 1, $\mu_{FE}$ of the DRAM was assumed to be $\mu_{FE}$ of a Si transistor with a channel length of 25 nm. The memory cell capacitance of the DRAM in Table 1 was obtained from the technology node of the DRAM with a channel length of 25 nm.

In Table 1, $\mu_{FE}$ of the DOSRAM was assumed to be $\mu_{FE}$ of an OS transistor with a channel length of 25 nm. In addition, it was confirmed in another experiment that the memory cell operated with a memory cell capacitance of 3.5 fF in the case where the memory cell was fabricated using an OS transistor with a channel length of 60 nm. The memory cell capacitance of the DOSRAM in Table 1 is derived from the value at that time.

The OS transistor has lower $\mu_{FE}$ than the Si transistor, and the current drive capability $\mu_{FE} \times$W/L) of the OS transistor is approximately one third of that of the Si transistor.

Since the OS transistor has an extremely low off-state current, data can be retained for a long time even when the memory cell capacitance is small. As shown in Table 1, the memory cell capacitance of the DOSRAM can be one seventh of that of the DRAM.

The operation speed of a memory cell depends on the current drive capability of a transistor and the memory cell capacitance. A DOSRAM has a lower current drive capability of a transistor, and a much smaller memory cell capacitance than a DRAM. As a result, the DOSRAM can write data twice as fast as the DRAM.

The composition, structure, method, and the like described above in this embodiment can be used in combination as appropriate with the compositions, structures, methods, and the like described in the other embodiments and the example.

Embodiment 7

In this embodiment, an FPGA (field programmable gate array) is described as an example of a semiconductor device of one embodiment of the present invention in which an OS transistor and a capacitor are used, with reference to FIG. 47 to FIG. 50. In the FPGA of this embodiment, an OS memory is used for a configuration memory and a register. Here, such an FPGA is referred to as an "OS-FPGA".

<<OS-FPGA>>

Figure 47A:
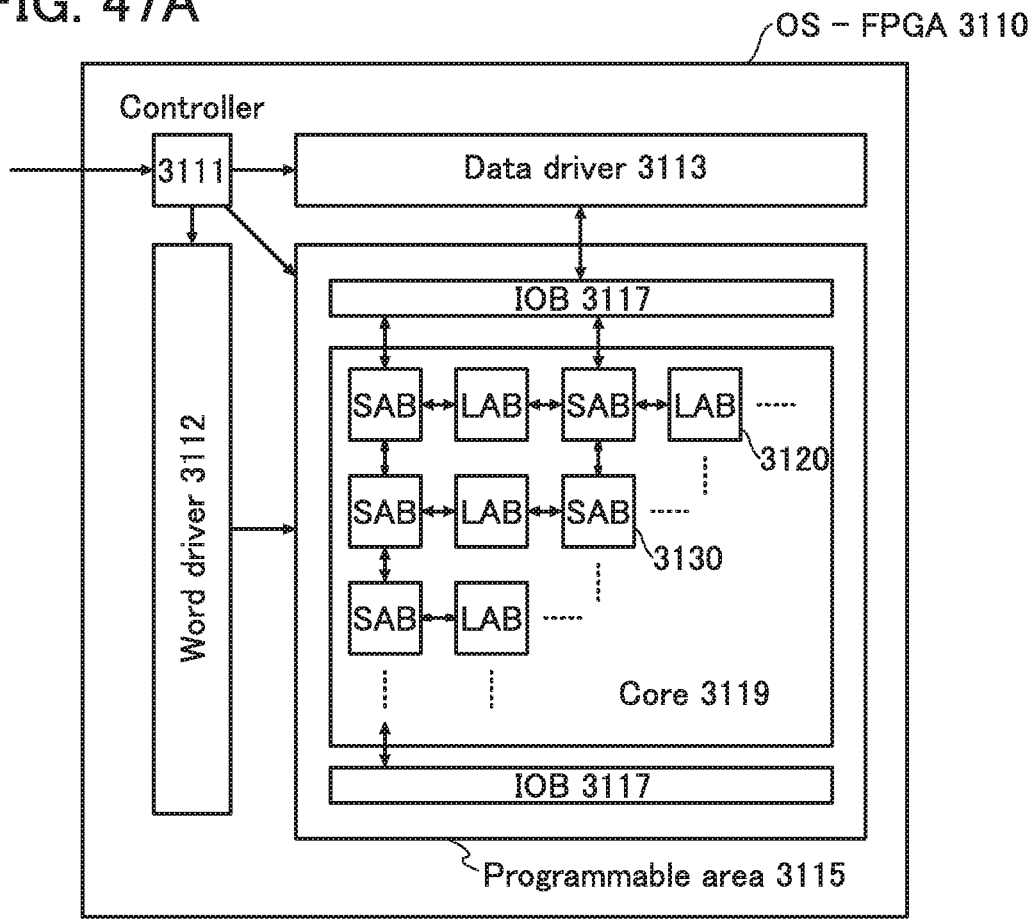
FIG. 47 Block diagrams illustrating a structure example of a semiconductor device of one embodiment of the present invention.

FIG. 47(A) illustrates a configuration example of an OS-FPGA. An OS-FPGA 3110 illustrated in FIG. 47(A) is capable of context switching by a multi-context configuration, fine-grained power gating, and NOFF (normally-off) computing. The OS-FPGA 3110 includes a controller 3111, a word driver 3112, a data driver 3113, and a programmable area 3115.

Figure 47B:
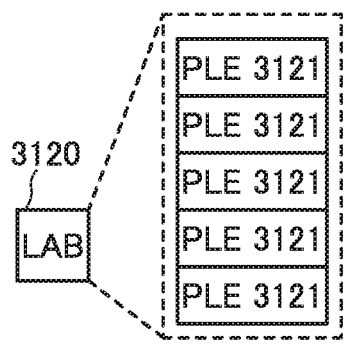
Figure 47C:
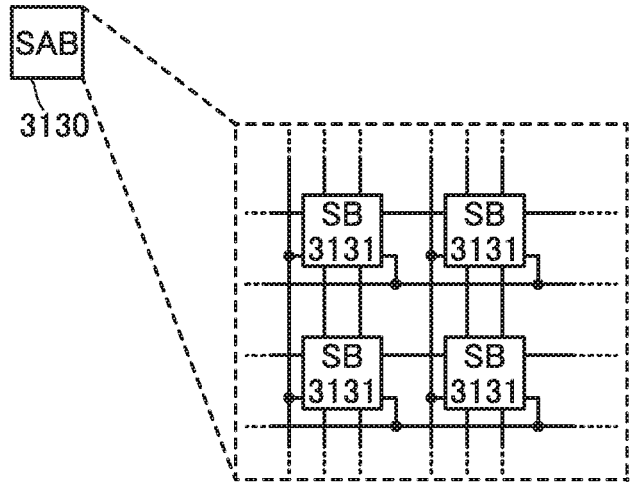

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 47(B) illustrates an example in which the LAB 3120 includes five PLEs 3121. As illustrated in FIG. 47(C), the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 48A:
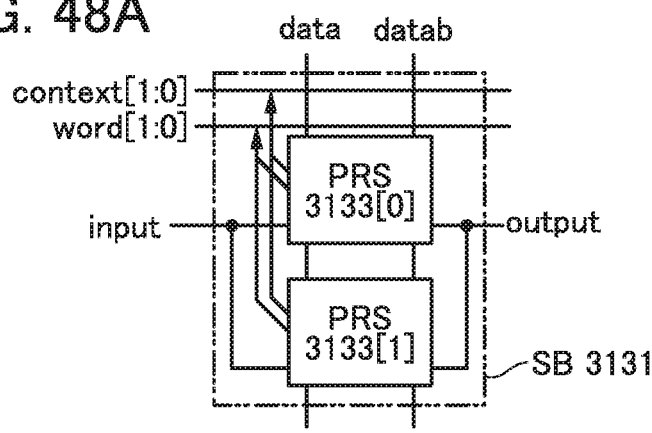
FIG. 48 A block diagram and a circuit diagram illustrating a structure example of a semiconductor device of one embodiment of the present invention, and a timing chart showing an operation example of the semiconductor device.

The SB 3131 is described with reference to FIG. 48(A) to FIG. 48(C). To the SB 3131 illustrated in FIG. 48(A), data, datab, and signals context[1:0] and word[1:0] are input. The data and the datab are configuration data, and the logics of the data and the datab have a complementary relationship. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes PRSs (programmable routing switches) 3133[0] and 3133[1]. The PRSs 3133[0] and 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 48B:
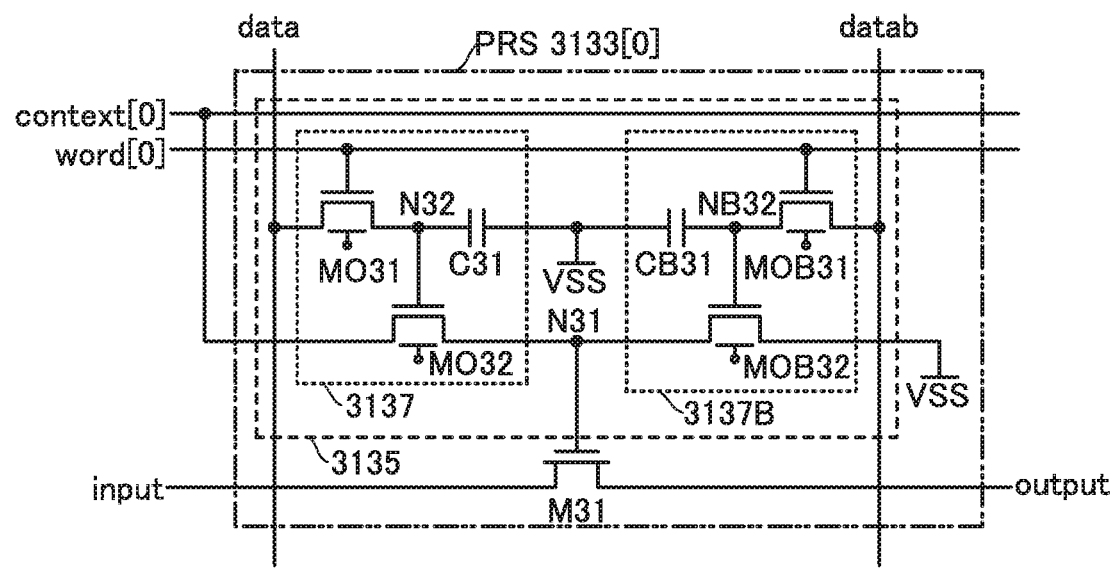
Figure 48C:
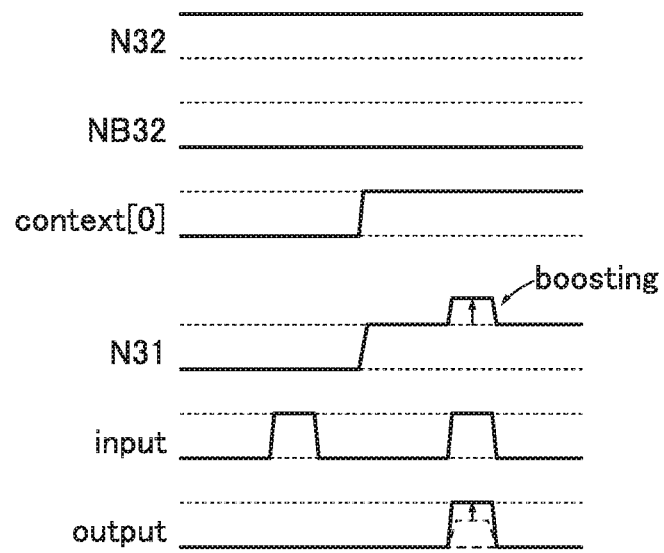

FIG. 48(B) illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signals context[0] and word[0] are input to the PRS 3133[0], and the signals context[1] and word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes memory circuits 3137 and 3137B. The memory circuits 3137 and 3137B have the same circuit configuration. The memory circuit 3137 includes a capacitor C31 and OS transistors MO31 and MO32. The memory circuit 3137B includes a capacitor CB31 and OS transistors MOB31 and MOB32.

In the case where the semiconductor device described in the above embodiment is used in the SAB 3130, the transistors 200 can be used as the OS transistors MO31 and MOB31, and the capacitors 100 can be used as the capacitors C31 and CB31. Thus, the area occupied by one set consisting of one transistor and one capacitor in the top view can be reduced, so that the semiconductor device of this embodiment can be highly integrated.

The OS transistors MO31, MO32, MOB31, and MOB32 include back gates, and each of these back gates is electrically connected to a power supply line that supplies a fixed voltage.

A gate of the Si transistor M31 corresponds to a node N31, a gate of the OS transistor MO32 corresponds to a node N32, and a gate of the OS transistor MOB32 corresponds to a node NB32. The nodes N32 and NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

Data retained in the memory circuits 3137 and 3137B have a complementary relationship. Thus, either of the OS transistors MO32 or MOB32 is turned on.

The operation example of the PRS 3133[0] is described with reference to FIG. 48(C). Configuration data has already been written to the PRS 3133[0], and the node N32 is at "H" and the node NB32 is at "L" in the PRS 3133[0].

The PRS 3133[0] is inactive while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during a period in which the PRS 3133[0] is active, the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also has a function of a multiplexer.

Figure 49:
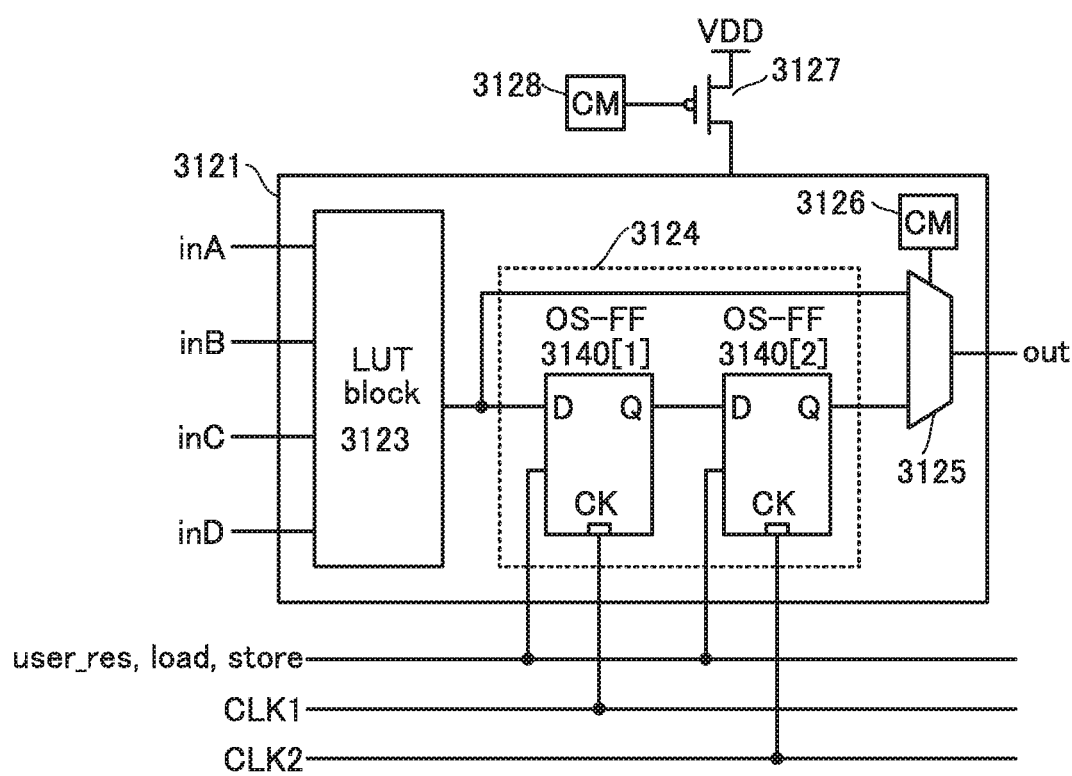
FIG. 49 A block diagram illustrating a structure example of a semiconductor device of one embodiment of the present invention.

FIG. 49 illustrates a configuration example of the PLE 3121. The PLE 3121 includes an LUT (lookup table) block (LUT block) 3123, a register block 3124, a selector 3125, and a CM 3126. The LUT block 3123 is configured to multiplex an output of a pair of 16-bit CMs therein in accordance with inputs inA to inD. The selector 3125 selects an output of the LUT block 3123 or an output of the register block 3124 in accordance with the configuration stored in the CM 3126.

The PLE 3121 is electrically connected to a power supply line for a voltage VDD through a power switch 3127. Whether the power switch 3127 is turned on or off is determined in accordance with configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as [OS-FF]).

Figure 50A:
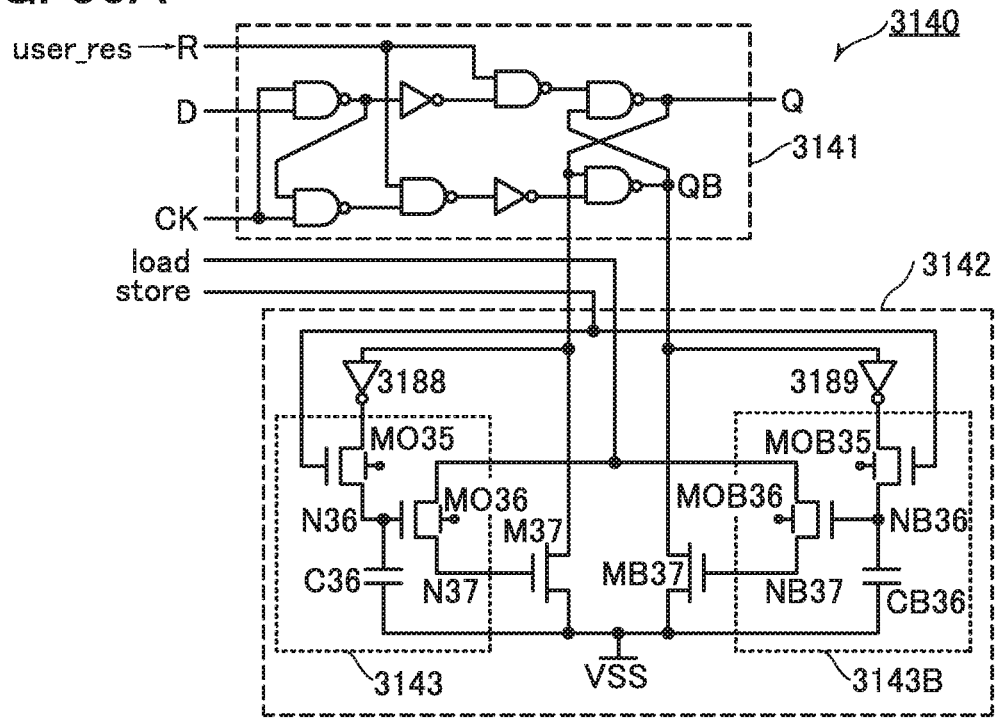
FIG. 50 A circuit diagram illustrating a structure example of a semiconductor device of one embodiment of the present invention and a timing chart showing an operation example of the semiconductor device.

The register block 3124 includes OS-FFs 3140[1] and 3140[2]. Signals user_res, load, and store are input to the OS-FFs 3140[1] and 3140[2]. A clock signal CLK1 is input to the OS-FF 3140[1] and a clock signal CLK2 is input to the OS-FF 3140[2]. FIG. 50(A) illustrates a configuration example of the OS-FF 3140.

The OS-FF 3140 includes an FF 3141 and a shadow register 3142. The FF 3141 includes nodes CK, R, D, Q, and QB. A clock signal is input to the node CK. The signal user_res is input to the node R. The signal user_res is a reset signal. The node D is a data input node, and the node Q is a data output node. The logics of the node Q and the node QB have a complementary relationship.

The shadow register 3142 functions as a backup circuit of the FF 3141. The shadow register 3142 backs up data of the nodes Q and QB in response to the signal store and writes back the backed up data to the nodes Q and QB in response to the signal load.

The shadow register 3142 includes inverter circuits 3188 and 3189, Si transistors M37 and MB37, and memory circuits 3143 and 3143B. The memory circuits 3143 and 3143B each have the same circuit configuration as the memory circuit 3137 of the PRS 3133. The memory circuit 3143 includes a capacitor C36 and OS transistors MO35 and MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in the above embodiment is used in the LAB 3120, the transistors 200 can be used as the OS transistors MO35 and MOB35, and the capacitors 100 can be used as the capacitors C36 and CB36. Thus, the area occupied by one set consisting of one transistor and one capacitor in the top view can be reduced, so that the semiconductor device of this embodiment can be highly integrated.

The OS transistors MO35, MO36, MOB35, and MOB36 include back gates, and each of these back gates is electrically connected to a power supply line that supplies a fixed voltage.

Figure 50B:
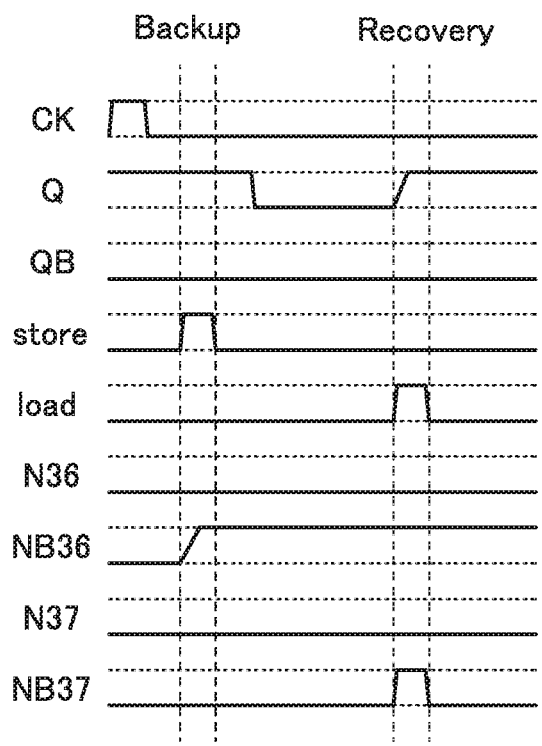

An example of an operation method of the OS-FF 3140 is described with reference to FIG. 50(B).

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the nodes Q and QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is recovered to a state at the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to the entry of radiation is given. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The composition, structure, method, and the like described above in this embodiment can be used in combination as appropriate with the compositions, structures, methods, and the like described in the other embodiments and the example.

Embodiment 8

In this embodiment, application examples of the memory device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable storage devices such as memory cards (e.g., SD cards), USB memories, and SSDs (solid state drives). FIG. 51 schematically illustrates some structural examples of removable storage devices. For example, the semiconductor device described in the above embodiment is processed into a packaged memory chip and used in a variety of memory devices and removable memories.

Figure 51A:
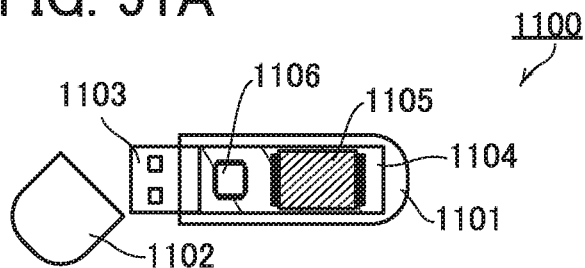
FIG. 51 Schematic views of memory devices of embodiments of the present invention.

FIG. 51(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in any of the above embodiments can be incorporated in the memory chip 1105 or the like on the substrate 1104.

Figure 51B:
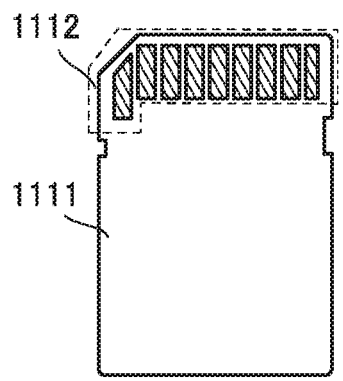
Figure 51C:
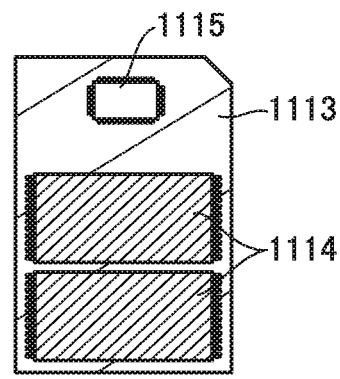

FIG. 51(B) is an external schematic view of an SD card, and FIG. 51(C) is a schematic view of the internal structure of the SD card. An SD card 1110 includes a housing 1111, a connector 1112, and a substrate 1113. The substrate 1113 is held in the housing 1111. The substrate 1113 is provided with memory chips 1114 and a controller chip 1115, for example. When the memory chip 1114 is provided also on a back surface side of the substrate 1113, the capacity of the SD card 1110 can be increased. In addition, a wireless chip with a radio communication function may be provided on the substrate 1113. With such a wireless chip, data can be read from and written in the memory chips 1114 by radio communication between a host device and the SD card 1110. The semiconductor device described in any of the above embodiments can be incorporated in the memory chips 1114 or the like on the substrate 1113.

Figure 51D:
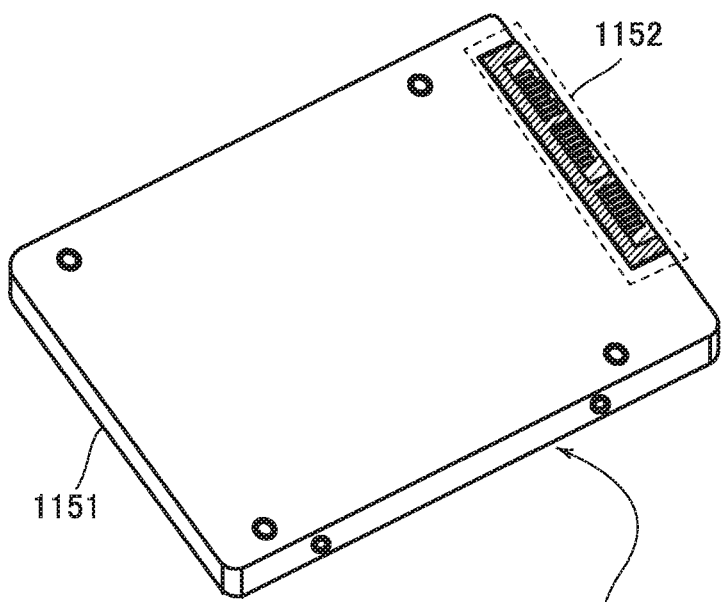
Figure 51E:
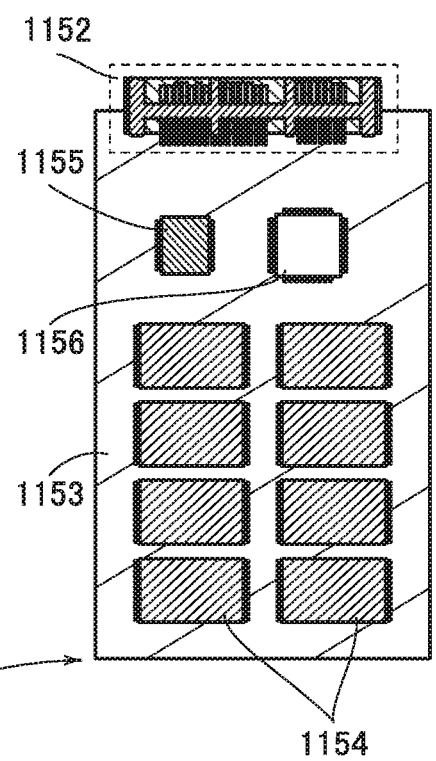

FIG. 51(D) is an external schematic view of an SSD, and FIG. 51(E) is a schematic view of the internal structure of the SDD. An SSD 1150 includes a housing 1151, a connector 1152, and a substrate 1153. The substrate 1153 is held in the housing 1151. The substrate 1153 is provided with memory chips 1154, a memory chip 1155, and a controller chip 1156, for example. The memory chip 1155 is a work memory of the controller chip 1156, and a DRAM chip may be used, for example. When the memory chip 1154 is provided also on a back surface side of the substrate 1153, the capacity of the SSD 1150 can be increased. The semiconductor device described in any of the above embodiments can be incorporated in the memory chips 1154 or the like on the substrate 1153.

Embodiment 9

In this embodiment, an AI system in which the semiconductor device of any of the above embodiments is used is described with reference to FIG. 52.

Figure 52:
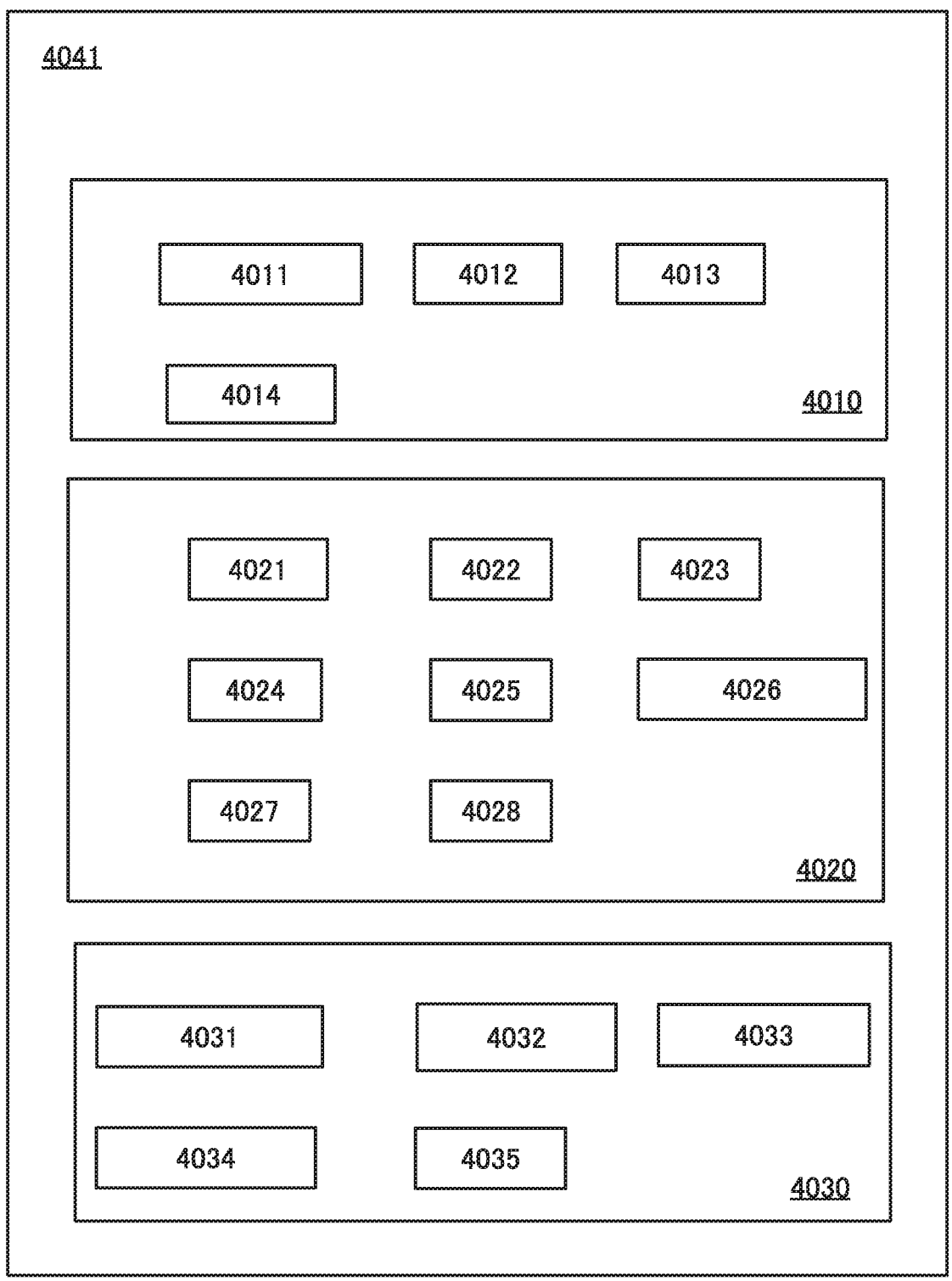
FIG. 52 A block diagram illustrating a structure example of an AI system of one embodiment of the present invention.

FIG. 52 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400, the NOSRAM 1600, and the OS-FPGA 3110 described in the above embodiments can be used as the DOSRAM 4012, the NOSRAM 4013, and the FPGA 4014, respectively.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM in which elements deteriorate by data writing, the NOSRAM has no limitation on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with a hardware. Establishing the connection of the neural network with a hardware enables higher-speed performance.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be manufactured through the same manufacturing process. Therefore, the AI system 4041 can be manufactured at low cost.

Note that the arithmetic portion 4010 does not necessarily include all of the following: the DOSRAM 4012, the NOSRAM 4013, and the FPGA 4014. One or more of the DOSRAM 4012, the NOSRAM 4013, and the FPGA 4014 are selected and provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The composition, structure, method, and the like described above in this embodiment can be used in combination as appropriate with the compositions, structures, methods, and the like described in the other embodiments and the example.

Embodiment 10

<Application Example of AI System>

In this embodiment, application examples of the AI system described in the above embodiment will be described with reference to FIG. 53.

Figure 53A:
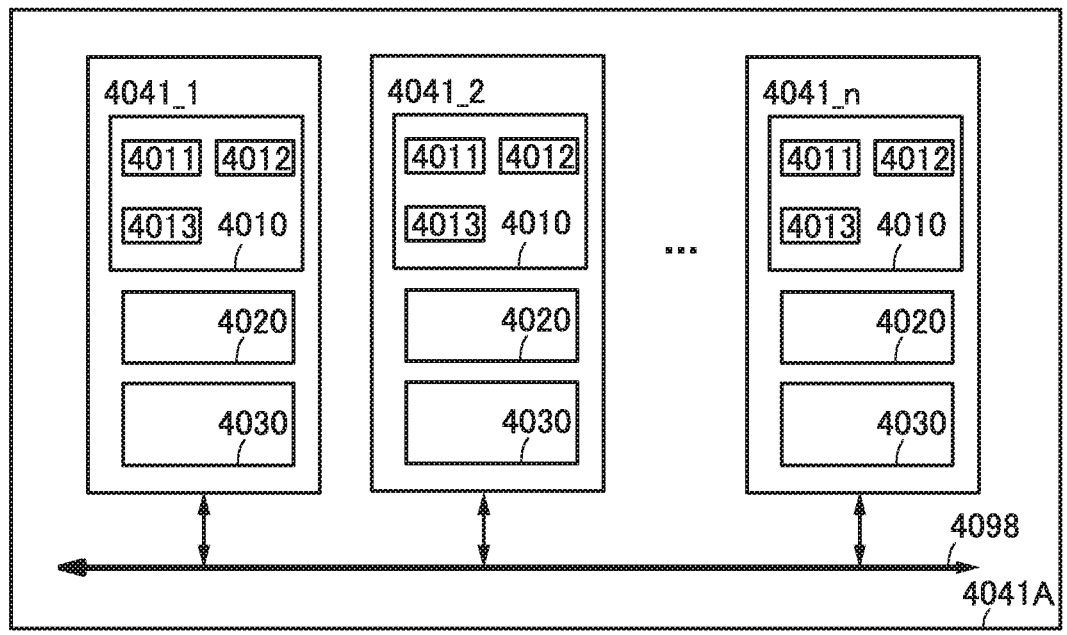
FIG. 53 Block diagrams illustrating application examples of an AI system of one embodiment of the present invention.

FIG. 53(A) illustrates an AI system 4041A in which the AI systems 4041 described with FIG. 52 are arranged in parallel and a signal can be transmitted between the systems via a bus line.

The AI system 4041A illustrated in FIG. 53(A) includes a plurality of AI systems 4041_1 to 4041_*n* (n is a natural number). The AI system 4041_1 to the AI system 4041_*n* are connected to each other via a bus line 4098.

Figure 53B:
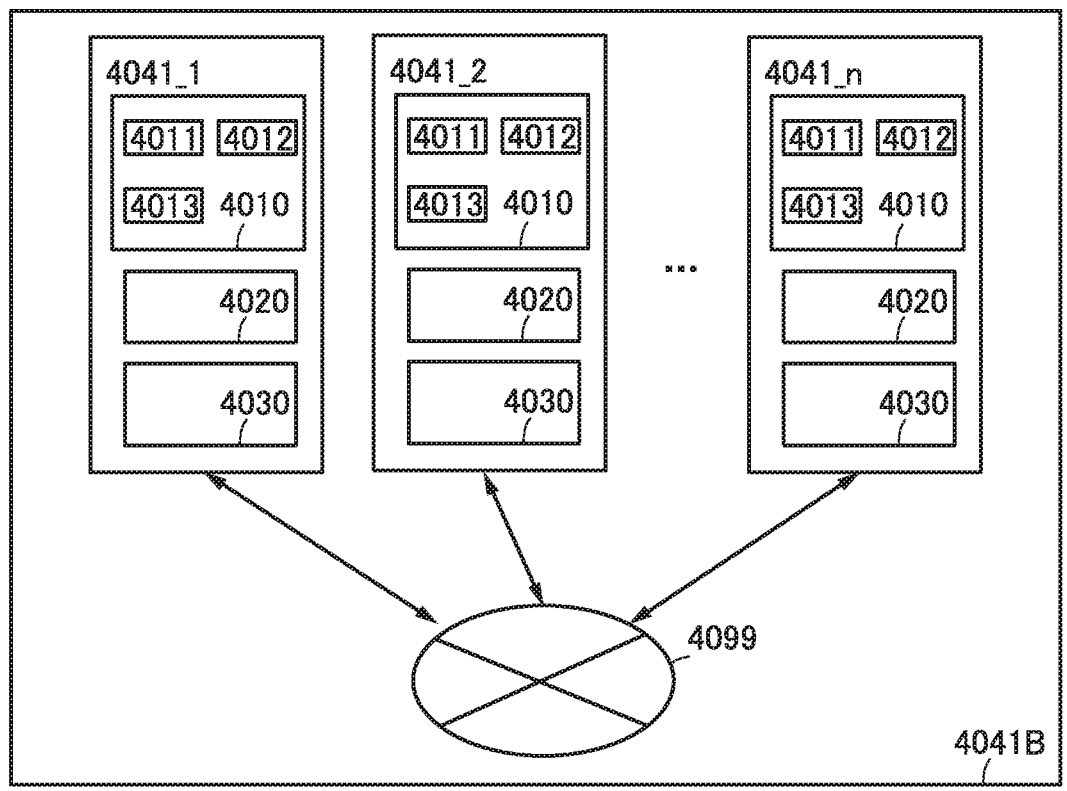

FIG. 53(B) illustrates an AI system 4041B in which the AI systems 4041 described with FIG. 52 are arranged in parallel as in FIG. 53(A) and a signal can be transmitted between the systems via a network.

The AI system 4041B illustrated in FIG. 53(B) includes the plurality of AI systems 4041_1 to 4041_*n*. The AI system 4041_1 to the AI system 4041_*n* are connected to each other via a network 4099.

A communication module is provided in each of the AI systems 4041_1 to 4041_*n*; such a configuration enables wireless or wired communication via the network 4099. A communication module can communicate via an antenna. For example, the communication can be performed in such a manner that an electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the configuration illustrated in FIG. 53(A) or 53(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning can be performed with a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with any of the structures described in the other embodiments.

Embodiment 11

In this embodiment, an example of an IC in which the AI system described in the above embodiment is incorporated is described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 54:
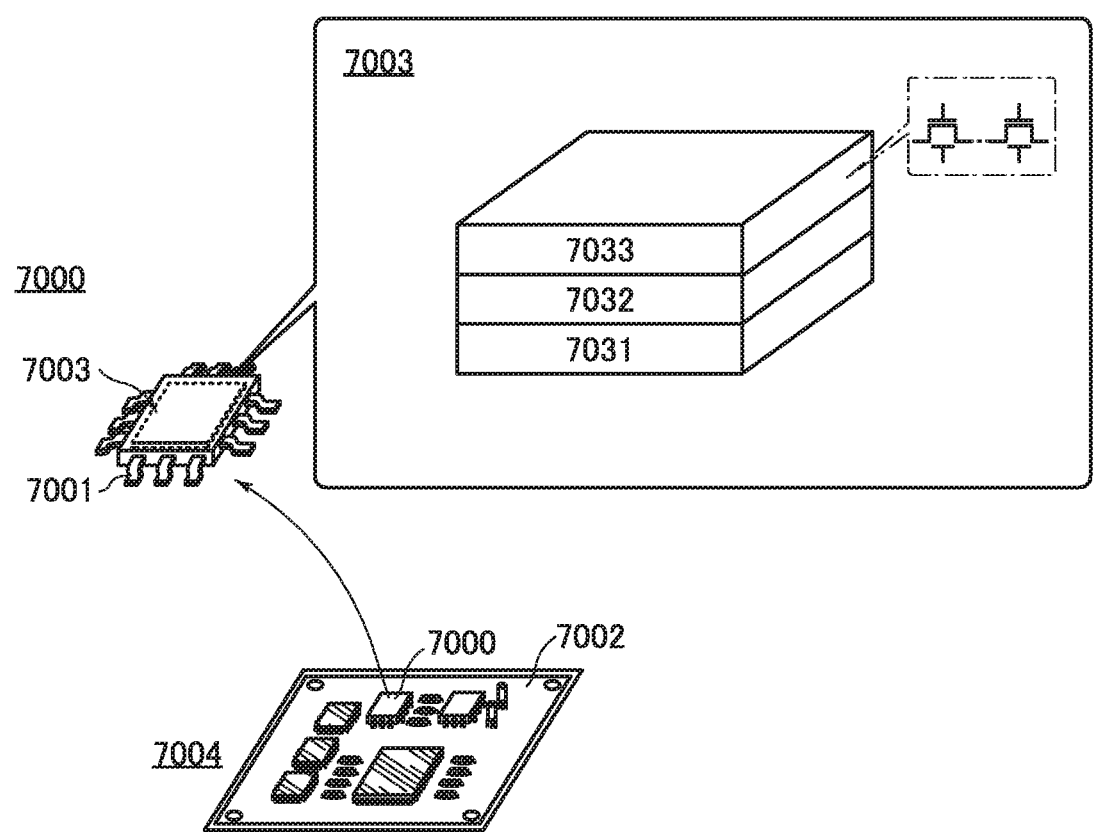
FIG. 54 A schematic perspective view illustrating a structure example of an IC incorporating an AI system of one embodiment of the present invention.

FIG. 54 illustrates the example of the IC in which the AI system is incorporated. An AI system IC 7000 illustrated in FIG. 54 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiments are provided on one die. The circuit portion 7003 has a stacked-layer structure as described in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 54, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly, the AI system can be incorporated in the IC at low cost.

The composition, structure, method, and the like described above in this embodiment can be used in combination as appropriate with the compositions, structures, methods, and the like described in the other embodiments and the example.

Embodiment 12

<Electronic Device>

A semiconductor device of one embodiment of the present invention can be used for a variety of electronic devices. FIG. 55 and FIG. 56 illustrate specific examples of the electronic devices using the semiconductor device of one embodiment of the present invention.

Figure 55A:
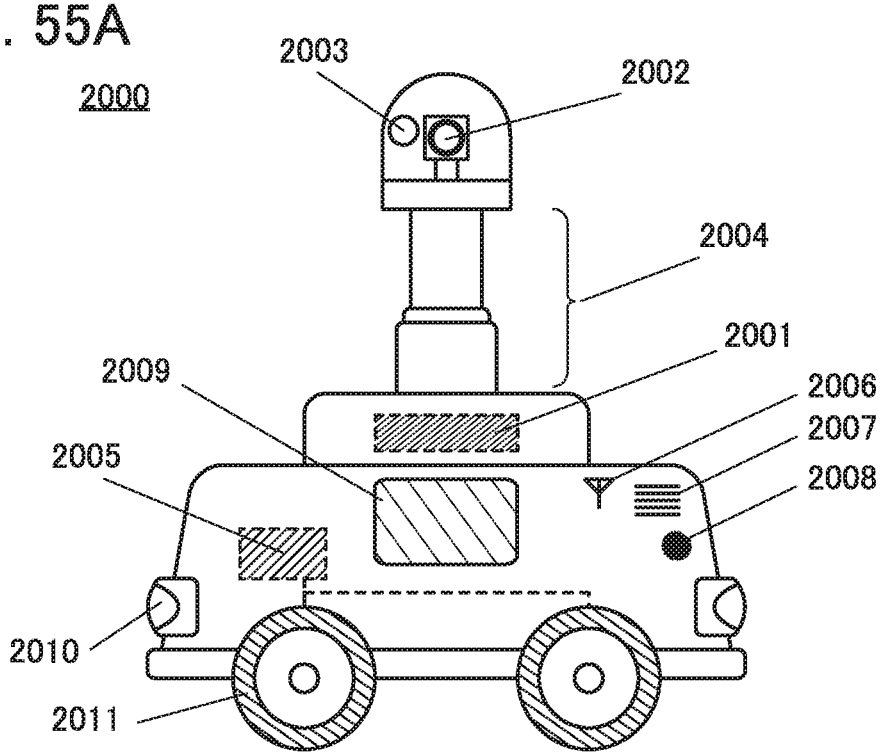
FIG. 55 Diagrams illustrating an electronic device of one embodiment of the present invention.

A robot 2000 illustrated in FIG. 55(A) includes an arithmetic device 2001, a sensor 2002, a light 2003, a lift 2004, a driver portion 2005, and a moving mechanism 2011, and can take a still image and a moving image while moving. Such a robot can be used for a security system or a monitoring system.

The robot 2000 may further include a communication means 2006, a speaker 2007, a microphone 2008, a display portion 2009, a light-emitting portion 2010, and the like.

In the arithmetic device 2001, the semiconductor device of one embodiment of the present invention can be used. As the arithmetic device 2001, an IC in which the AI system of one embodiment of the present invention is incorporated can be used. The sensor 2002 functions as a camera which takes photographs of surroundings of the robot 2000. The light 2003 can be used as light when the photographs of the surroundings of the robot 2000 are taken by the sensor 2002. When a photograph of a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000, which is provided with the driver portion 2005 and the moving mechanism 2011 connected to the driver portion 2005, is preferable because an imaging range of the sensor 2002, that is, a monitoring range, is expanded.

The communication means 2006 can send data taken by the sensor 2002 to a manager or the server owned by the manager. In addition, when the arithmetic device 2001 analyzes the data taken by the sensor 2002 and judges that there is an emergency such as a crime, an accident, or a fire, the communication means 2006 can report to the security company, the police, the fire station, the medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. The use of the communication means 2006 and the speaker 2007 enables the robot 2000 to function as a telephone. A person around the robot 2000 can have a conversation with the manager or a given person. The display portion 2009 can display given data. In emergency, the disaster information and the evacuation route can be displayed. The use in combination with the communication means 2006, the speaker 2007, and the microphone 2008 enables the robot 2000 to function as a videophone. A person around the robot 2000 can have a conversation with the manager or a given person while seeing the display portion 2009.

The light-emitting portion 2010 emits light or displays characters to show the direction of movement and the stopped state of the robot 2000. In addition, emergency may also be shown.

Figure 55B:
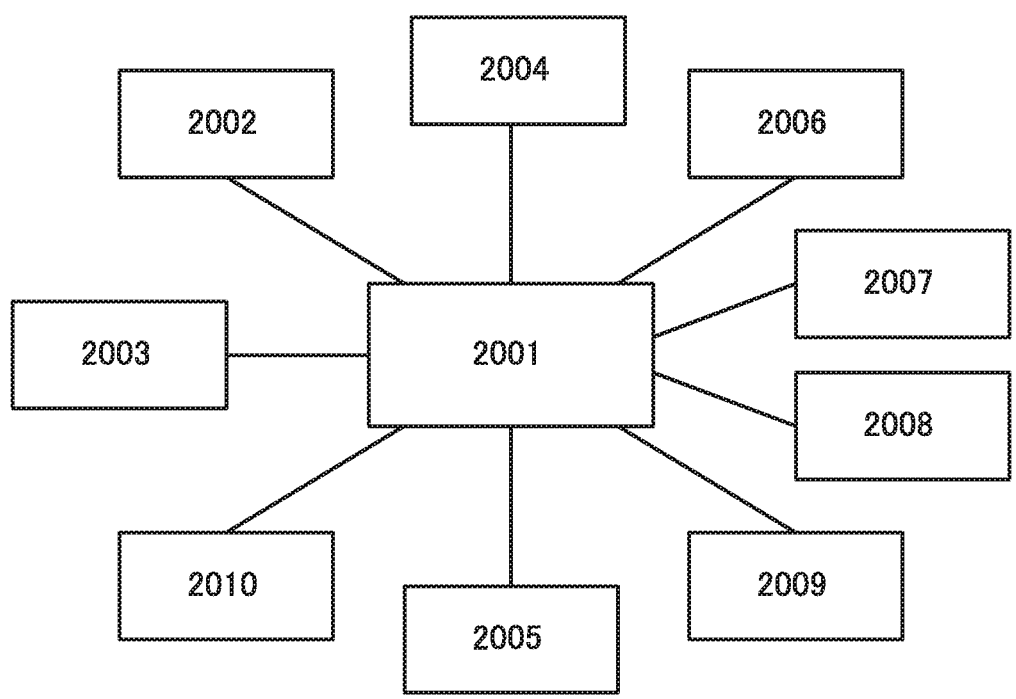

FIG. 55(B) is a block diagram illustrating a configuration of the robot 2000. The arithmetic device 2001 adjusts turning on or off and the brightness of the light 2003 from data such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgment of the arithmetic device 2001 or the manager, information can be sent to the surroundings of the robot 2000 with the speaker 2007 and the display portion 2009.

In the case where a sensor that can take an image even in dark surroundings is used as a sensor used as the sensor 2002, the light 2003 is not necessarily provided. As such a sensor, an image sensor using selenium (Se) in the light receiving portion can be used.

Such a robot 2000 can be used in commercial facilities and for security of the office. Data obtained from the sensor 2002 and the microphone 2008 is stored in the arithmetic device 2001 or the server. The stored data is analyzed by the AI system to check whether there is an anomaly situation such as loss or damage of an object, entry of suspicious individual, or disaster such as a fire. For the data analysis, deep learning may be used. When there is an anomaly situation, the robot 2000 reports to the manager and transmits information to the surroundings, and records the conditions of the surroundings.

The robot 2000 may be used for monitoring the growing conditions of the crops. The robot 2000 placed in a rice field or a field monitors the shapes, the sizes, or the colors of leaves or fruit of the crops by the sensor 2002 to check whether the crops are damaged or not or whether the crops are harmed by pests or not. Since the moving mechanism 2011 is provided for the robot 2000, the growing conditions of the crops can be monitored in a wide range. In addition, since the robot 2000 is provided with the lift 2004, the leaves and fruit at a certain height can be monitored regardless of the kind of crops and the growing conditions. The monitoring results are transmitted to a grower using the communication means 2006, and the grower can determine the kind, the amount, and the spraying timing of fertilizer and agricultural chemicals necessary for the crops. Alternatively, the monitoring results may be analyzed with the AI system using the arithmetic device 2001, and the kind, the amount, and the spraying timing of fertilizer and agricultural chemicals necessary for the crops may be determined and reported to the grower. Deep learning may be used for analysis of the monitoring results.

Figure 56A:
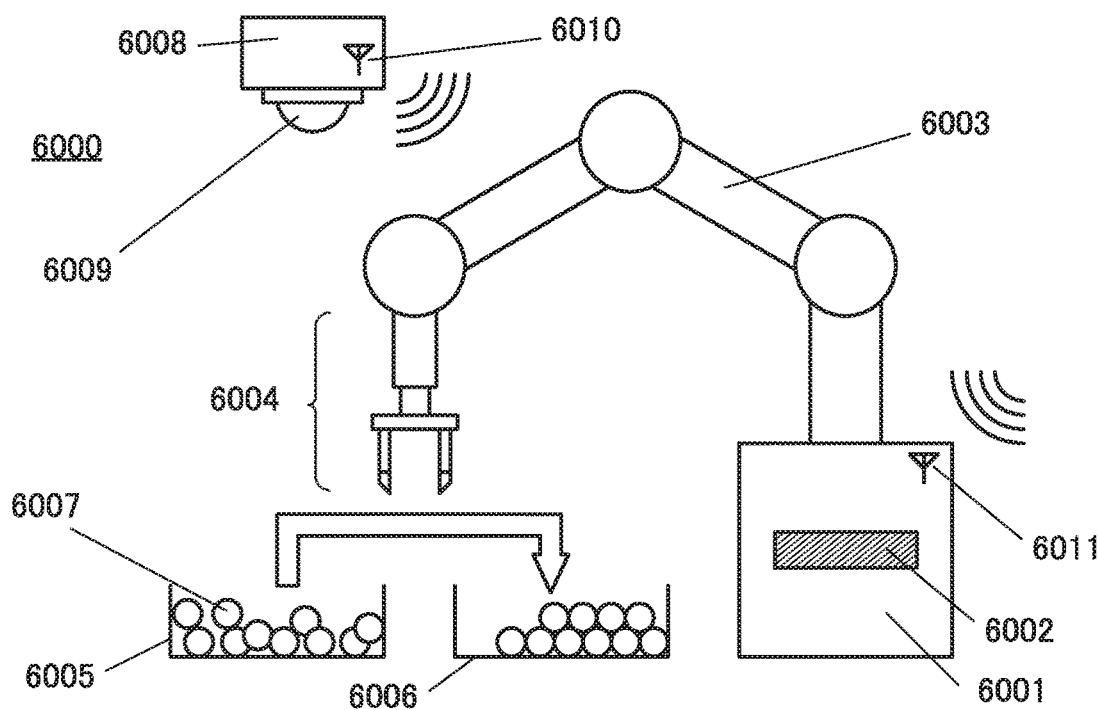
FIG. 56 Diagrams illustrating electronic devices of one embodiment of the present invention.

FIG. 56(A) illustrates a sorting system 6000 using a robot 6001. The robot 6001 includes an arithmetic device 6002, a boom 6003, and an arm 6004. The robot 6001 may further include a wired or wireless communication means 6011. In addition, the sorting system 6000 includes a housing 6008 including a sensor 6009. The housing 6008 includes a communication means 6010. The housing 6008 is provided for a ceiling, a wall, or a beam (not illustrated) of the sorting system 6000 or a sorting operation area. The housing 6008 may be provided in the robot 6001. For example, the housing 6008 may be provided for the boom 6003 or the arm 6004. In the case where the housing 6008 is provided in the robot 6001, data obtained by the sensor 6009 may be transmitted to the arithmetic device 6002 without passing through the communication means 6010 and the communication means 6011, and processed.

The boom 6003 is movable, and the arm 6004 can be placed at a desired position. The arm 6004 may be telescopic. After the arm placed over a desired object 6007 is stretched to grab the desired object 6007 and the arm 6004 is shortened, the arm 6004 may be moved by the boom 6003.

The sorting system 6000 can transfer the object 6007 in a container 6005 to a container 6006. The container 6005 and the container 6006 may have the same shape or different shapes. Furthermore, a plurality of objects 6007 put in one container 6005 may be moved to a plurality of containers 6006 to be sorted.

As the container 6005 and the container 6006, a container, a cardboard box, a box for packing a product, a case, a film, a bag, a tray for storing foods, a lunch box, or the like is used. Furthermore, at least one of the container 6005 and the container 6006 may be cooking utensils such as a pot or a frying pan.

In the arithmetic device 6002, the semiconductor device of one embodiment of the present invention can be used. As the arithmetic device 6002, an IC in which the AI system of one embodiment of the present invention is incorporated can be used.

The sensor 6009 reads the position of the container 6005, the position of the container 6006, the state of the inside of the container 6005, and the state of the object 6007 in the container 6005 and transmits the data to the arithmetic device 6002 using the communication means 6010. Transmission of data is performed with or without a wire. Alternatively, the data may be transmitted through a wire without the communication means 6010. The arithmetic device 6002 analyzes the transmitted data. Here, the state of the object 6007 indicates the shape or the number of objects 6007, the overlap between the objects 6007, or the like. The arithmetic device 6002 performs analyzation on the basis of data from the sensor 6009 and obtains detailed information of the object 6007. The three-dimensional shape and hardness (or softness) of the object 6007 are obtained by comparison with the data stored in the arithmetic device 6002 or the server that can be communicated with the robot 6001. Depending on the three-dimensional shape and hardness (or softness) of the object 6007, the shape of the arm 6004 can be changed.

To obtain the detailed data of the object 6007, analysis using an AI system can be utilized. For the data analysis, deep learning may be used.

Figure 56B:
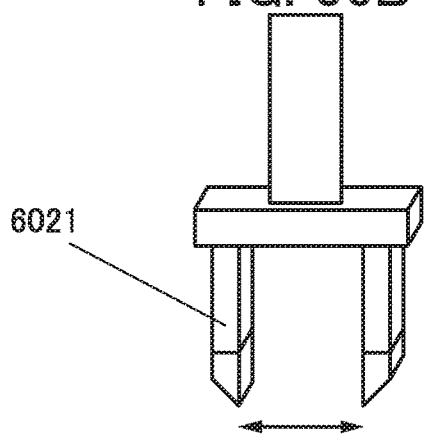
Figure 56C:
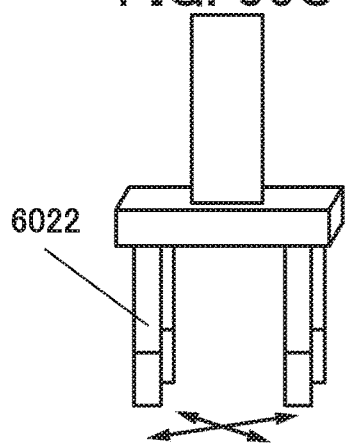
Figure 56D:
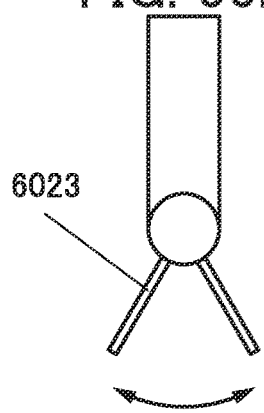
Figure 56E:
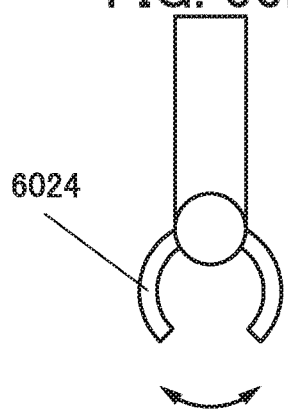
Figure 56F:
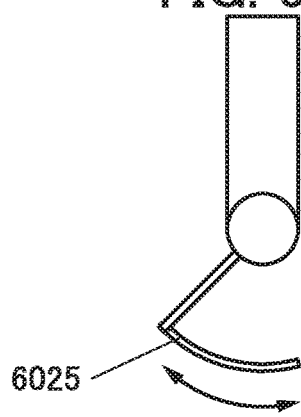

FIG. 56(B) illustrates an arm in which a pair of plates 6021 can move in the horizontal direction to pick up the object 6007. The pair of plates 6021 moves toward the center horizontally, whereby the object 6007 can be picked up. Such an arm can hold the object 6007 by the surfaces, and is suitable for picking up the object 6007 with a columnar shape, such as a cube or a rectangular solid. FIG. 56(C) illustrates an arm in which a plurality of bars 6022 can move in the horizontal direction to pick up the object 6007. The plurality of bars 6022 move toward the center horizontally, whereby the object 6007 can be picked up. Such an arm can pinch the object 6007 by the points, and is suitable for picking up the object 6007 in a spherical shape or in a non-fixed shape, that is, the object 6007 in an irregular shape. Note that although the number of bars 6022 is four in FIG. 56(C), this embodiment is not limited thereto. The number of bars 6022 may be three or five or more. FIG. 56(D) illustrates an arm in which a pair of plates 6023 rotates around the common axis to be closer to each other to pick up the object 6007. Such an arm can hold the object 6007 by the surfaces, and is suitable for picking up the object 6007 with a thin-film shape, such as paper or films. FIG. 56(E) illustrates an arm in which a pair of crook-shaped plates 6024 rotates around the common axis such that the ends of them are closer to each other to pick up the object 6007. Such an arm can pinch the object 6007 by the points or the sides, and is suitable for picking up the object 6007 with a thin-film shape, such as paper or films, or the object 6007 with a finer-grained shape. As illustrated in FIG. 56(F), a spatula 6025 may be attached to the tip of the arm, and the object 6007 with a finer-grained shape may be scooped.

The arms illustrated in FIG. 56(A) to FIG. 56(F) are just examples and one embodiment of the present invention is not limited to these shapes. In addition, the application of the arms is just an example and one embodiment of the present invention is not limited thereto.

The robot 6001 moves the boom 6003 to move the arm 6004 to a position over the desired object 6007 in the container 6005 on the basis of signals from the arithmetic device 6002. In the case of using the telescopic arm 6004, the arm 6004 is stretched, and the tip of the arm 6004 is brought down to a position on the level of the object 6007. The tip of the arm is moved to catch the desired object 6007. The arm is shortened while catching the object 6007. The boom 6003 is moved again to transfer the arm 6004 to the desired position in the container 6006. At this time, the arm 6004 may be rotated to adjust the angle of the object 6007 to the container 6006. The arm 6004 is stretched to place the object 6007 in the container 6006, and the arm 6004 releases the object 6007. The above operation is repeated, so that the robot 6001 can move the objects 6007 from the container 6005 to the container 6006.

Since the positional information on the container 6005 and the container 6006 and the state of the object 6007 are analyzed using the AI system, the object 6007 can be moved surely regardless of the shape or hardness of the object 6007. Examples of the object 6007 include not only an object packed in a box with a shape of a cube or a rectangular solid or a box or a case with a given shape but also eggs, shaped processed foods such as a hamburger steak and a croquette, foods such as vegetables with an irregular shape such as a potato and a tomato, machine parts such as a screw and a nut, and a thin film of paper or a film. Since in the sorting system 6000 described in this embodiment, the shape of the arm can be changed in consideration of the shape and the hardness of the object 6007, the object 6007 given above as examples can be transferred from the container 6005 to the container 6006 regardless of the shape and the hardness.

For example, a memory device using the semiconductor device of one embodiment of the present invention can retain control data, a control program, or the like of the above-described electronic device for a long time. With the use of the semiconductor device of one embodiment of the present invention, a highly reliable electronic device can be achieved.

An IC in which the above AI system is incorporated can be used for the arithmetic device or the like of the above-described electronic device, for example. Accordingly, the electronic device of this embodiment can perform optimal operations depending on circumstances with low power consumption by utilizing the AI system.

This embodiment can be implemented in an appropriate combination with the structures described in the other embodiments, examples, and the like.

Example

In this example, a sample A to a sample F were fabricated and subjected to sheet-resistance evaluation.

A method for fabricating the samples will be described below. First, for the sample A to the sample F, a silicon wafer was used as a substrate, and a thermal oxide film was formed thereover. The thermal oxide film was formed to a thickness of 100 nm at a temperature of 950° C. in an oxygen atmosphere containing HCl at 3 volume %.

Next, for the sample A to the sample F, a first metal oxide film was deposited over the thermal oxide film by a DC sputtering method. The first metal oxide film is an In—Ga—Zn oxide having a thickness of 5 nm. In the deposition of the first metal oxide film, a target with In:Ga:Zn=1:3:4 [atomic ratio] was used; an oxygen gas at 45 sccm was used as the deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

Furthermore, without exposure to the outside air, a second metal oxide film was consecutively deposited over the first metal oxide film by a DC sputtering method. The second metal oxide film is an In—Ga—Zn oxide having a thickness of 50 nm. In the deposition of the second metal oxide film, a target with In:Ga:Zn=4:2:4.1 [atomic ratio] was used; an argon gas at 40 sccm and an oxygen gas at 5 sccm were used as the deposition gas; the deposition pressure was 0.7 Pa (measured with Miniature Gauge MG-2 manufactured by CANON ANELVA CORPORATION); the deposition power was 500 W; the substrate temperature was 130° C.; and the target-substrate distance was 60 mm.

Next, the sample A to the sample F were subjected to heat treatment at 400° C. in a nitrogen atmosphere for an hour and further subjected to heat treatment at 400° C. in an oxygen atmosphere for an hour.

Next, the sample B to the sample F were subjected to reverse sputtering treatment with different flow rate ratios of a nitrogen gas. Note that the sample A was not subjected to reverse sputtering treatment. In the reverse sputtering treatment, an RF power source was used; the pressure was 0.7 Pa (measured with Miniature Gauge MG-2 manufactured by CANON ANELVA CORPORATION); the electric power was 200 W; the substrate temperature was room temperature; the target-substrate distance was 60 mm; and the treatment time was 60 seconds.

The flow rate ratio of a nitrogen gas for the sample B to the sample F was set as follows. For the sample B, a nitrogen gas was 0% (an argon gas was 50 sccm); for the sample C, a nitrogen gas was 20% (an argon gas was 40 sccm and the nitrogen gas was 10 sccm); for the sample D, a nitrogen gas was 50% (an argon gas was 25 sccm and the nitrogen gas was 25 sccm); for the sample E, a nitrogen gas was 80% (an argon gas was 10 sccm and the nitrogen gas was 40 sccm); and for the sample F, a nitrogen gas was 100% (the nitrogen gas was 50 sccm).

Through the above steps, the sample A to the sample F of this example were fabricated.

Figure 57:
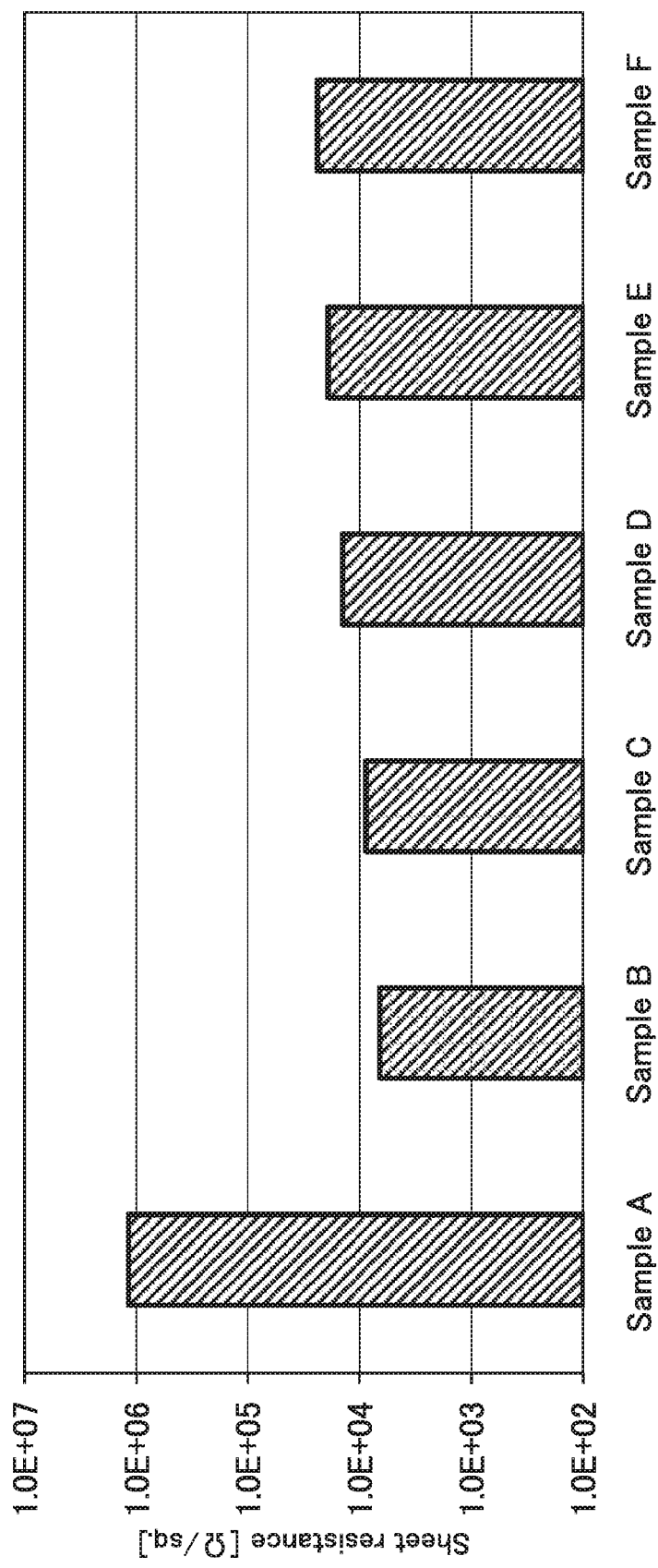
FIG. 57 A diagram showing sheet resistance of samples of Example.

FIG. 57 shows the sheet resistance measurement results of the sample A to the sample F.

As shown in FIG. 57, the sheet resistance of the sample A was $1.2 \times 10^6$ Ω/sq.; the sheet resistance of the sample B was $6.6 \times 10^3$ Ω/sq.; the sheet resistance of the sample C was $8.8 \times 10^3$ Ω/sq.; the sheet resistance of the sample D was $1.4 \times 10^4$ Ω/sq.; the sheet resistance of the sample E was $1.9 \times 10^4$ Ω/sq.; and the sheet resistance of the sample F was $2.4 \times 10^4$ Ω/sq.

Thus, it was found that the sheet resistance of the metal oxide film can be reduced by performing reverse sputtering treatment on the metal oxide film. Furthermore, it was found that the sheet resistance of the metal oxide film can be further reduced when the flow rate ratio of the nitrogen gas in the reverse sputtering treatment is reduced. As described above, it was demonstrated that the low-resistance regions can be formed by performing reverse sputtering treatment on the metal oxide of the semiconductor device of the above embodiment.

The structure described in this example can be used in appropriate combination with any of the structures described in the other embodiments.

REFERENCE NUMERALS

100: capacitor, 100a: capacitor, 100b: capacitor 110: conductor, 112: conductor, 120: conductor, 130: insulator, 150: insulator, 200: transistor, 200a: transistor, 200b: transistor, 203: conductor, 205: conductor, 205a: conductor, 205b: conductor, 207: conductor, 210: insulator, 212: insulator, 214: insulator, 216: insulator, 218: conductor, 220: insulator, 222: insulator, 224: insulator, 224A: insulating film, 230: oxide, 230a: oxide, 230A: oxide film, 230b: oxide, 230B: oxide film, 230c: oxide, 230C: oxide film, 231: region, 231a: region, 231b: region, 232: region, 232a: region, 232b: region, 234: region, 239: region, 240: conductor, 240a: conductor, 240b: conductor, 242a: film, 242A: film, 246: conductor, 248: conductor, 250: insulator, 250A: insulating film, 252: dummy gate insulator, 252A: dummy gate insulating film, 260: conductor, 260a: conductor, 260Aa: conductive film, 260Ab: conductive film, 260b: conductor, 260B: conductor, 260Ba: conductor, 260Bb: conductor, 262: dummy gate, 262A: dummy gate film, 262B: dummy gate layer, 270: insulator, 272: insulator, 272A: insulating film, 272B: insulator, 273: insulator, 273A: insulating film, 275: insulator, 275A: insulating film, 275B: insulator, 276: insulator, 278: insulator, 280: insulator, 282: insulator, 283: insulator, 286: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: transistor, 403: conductor, 405: conductor, 430c: oxide, 431a: oxide, 431b: oxide, 432a: oxide, 432b: oxide, 450: insulator, 460: conductor, 460a: conductor, 460b: conductor, 470: insulator, 472: insulator, 500: opening portion, 600: cell, 600a: cell, 600b: cell, 610: circuit, 620: circuit, 650a: memory cell, 650b: memory cell, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1420: sense amplifier array, 1422: memory cell array, 1423: sense amplifier array, 1425: local memory cell array, 1426: local sense amplifier array, 1444: switch array, 1445: memory cell, 1445a: memory cell, 1445b: memory cell, 1446: sense amplifier, 1447: global sense amplifier, 1600: NOSRAM, 1610: memory cell array, 1611: memory cell, 1611 to 1614: memory cell, 1612: memory cell, 1613: memory cell, 1614: memory cell, 1615: memory cell, 1615a: memory, cell, 1615b: memory cell, 1640: controller, 1650: row driver, 1651: row decoder, 1652: word line driver, 1660: column driver, 1661: column decoder, 1662: driver, 1663: DAC, 1670: output driver, 1671: selector, 1672: ADC, 1673: output buffer, 2000: CDMA, 2000: robot, 2001: arithmetic device, 2002: sensor, 2003: light, 2004: lift, 2005: driving portion, 2006: communication means, 2007: speaker, 2008: microphone, 2009: display portion, 2010: light-emitting portion, 2011: moving mechanism, 3110: OS- FPGA, 3111: controller, 3112: word driver, 3113: data driver, 3115: programmable area, 3117: JOB, 3119: core, 3120: LAB, 3121: PLE, 3123: LUT block, 3123: block, 3124: register block, 3125: selector, 3126: CM, 3127: power switch, 3128: CM, 3130: SAB, 3131: SB, 3133: PRS, 3135: CM, 3137: memory circuit, 3137B: memory circuit, 3140: OS-FF, 3141: FF, 3142: shadow register, 3143: memory circuit, 3143B: memory circuit, 3188: inverter circuit, 3189: inverter circuit, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_n: AI system, 4041_1: AI system, 4041A: AI system, 4041B: AI system, 4098: bus line, 4099: network, 6000: system, 6001: robot, 6002: arithmetic device, 6003: boom, 6004: arm, 6005: container, 6006: container, 6007: object, 6008: housing, 6009: sensor, 6010: communication means, 6011: communication means, 6021: plate, 6022: bar, 6023: plate, 6024: plate, 6025: spatula, 7000: AI system IC, 7001: lead, 7002: printed circuit board, 7003: circuit portion, 7004: circuit board, 7031: Si transistor layer, 7032: wiring layer, 7033: OS transistor layer.

The invention claimed is:

1. A semiconductor device comprising an oxide in a channel formation region, comprising:
    a transistor;
    an interlayer film; and
    a first conductor,
    wherein the transistor comprises:
        the oxide over a first insulator;
        a second conductor over the oxide;
        a second insulator provided between the oxide and the second conductor and in contact with a side surface of the second conductor; and
        a third insulator provided for the side surface of the second conductor with the second insulator therebetween,
    wherein the oxide comprises a first region, a second region, and a third region,
    wherein the first region overlaps with the second conductor,
    wherein the second region is provided between the first region and the third region,
    wherein the third region has a lower resistance than the second region,
    wherein the second region has a lower resistance than the first region,
    wherein the interlayer film is provided over the first insulator and the oxide,
    wherein the first conductor is electrically connected to the third region,
    wherein the third region overlaps with one of the third insulator, the first conductor, and the interlayer film, and
    wherein a top surface of the third insulator is substantially level with a top surface of the interlayer film.

2. The semiconductor device according to claim 1, wherein the oxide comprises In, an element M, and Zn, and
    wherein the element M is Al, Ga, Y, or Sn.

3. The semiconductor device according to claim 2, wherein the oxide comprises the In more than the element M in terms of atomic ratio.

4. The semiconductor device according to claim 1,
    wherein the third region has a higher carrier density than the second region, and
    wherein the second region has a higher carrier density than the first region.

5. The semiconductor device according to claim 1, wherein the third region comprises at least one of aluminum, ruthenium, titanium, tantalum, chromium, and tungsten.

6. The semiconductor device according to claim 1, wherein the third region further comprises nitrogen.

7. The semiconductor device according to claim 1, wherein the second region has a higher argon concentration than the first region.

8. The semiconductor device according to claim 1, wherein the first region has a lower hydrogen concentration than the second region.

9. The semiconductor device according to claim 1, wherein the first region has a lower hydrogen concentration than the second region and the third region.

10. The semiconductor device according to claim 1, wherein the transistor is of a normally-off type.

11. A semiconductor device comprising an oxide in a channel formation region, comprising:
    a transistor;
    a capacitor;
    an interlayer film; and
    a first conductor,
    wherein the transistor comprises:
        the oxide over a first insulator;
        a second conductor over the oxide;
        a second insulator provided between the oxide and the second conductor and in contact with a side surface of the second conductor; and
        a third insulator provided for the side surface of the second conductor with the second insulator therebetween,
    wherein the oxide comprises a first region, a pair of second regions, and a pair of third regions,
    wherein the first region overlaps with the second conductor,
    wherein the first region is provided between the pair of second regions,
    wherein the first region and the pair of second regions are provided between the pair of third regions,
    wherein the third regions have a lower resistance than the second regions,
    wherein the second regions have a lower resistance than the first region,
    wherein the interlayer film is provided over the first insulator and the oxide,
    wherein the first conductor is electrically connected to one of the pair of third regions,
    wherein the capacitor is electrically connected to the other of the pair of third regions, and
    wherein a top surface of the third insulator is substantially level with a top surface of the interlayer film.

12. The semiconductor device according to claim 11, wherein the other of the pair of third regions functions as one electrode of the capacitor.

13. The semiconductor device according to claim 11, wherein the interlayer film comprises an opening exposing at least part of the other of the pair of third regions, wherein the capacitor comprises a fourth insulator over the other of the pair of third regions and a third conductor over the fourth insulator in the opening, wherein the other of the pair of third regions functions as one electrode of the capacitor, wherein the fourth insulator functions as a dielectric of the capacitor, and wherein the third conductor functions as the other electrode of the capacitor.

14. The semiconductor device according to claim 13, wherein the third conductor is formed to be embedded in the opening.

15. The semiconductor device according to claim 11, wherein the pair of third regions comprise at least one of aluminum, ruthenium, titanium, tantalum, chromium, and tungsten.

16. The semiconductor device according to claim 11, wherein the pair of third regions comprise nitrogen.

17. The semiconductor device according to claim 11, wherein the pair of second regions have a higher argon concentration than the first region.

18. The semiconductor device according to claim 11, wherein the first region has a lower hydrogen concentration than the pair of second regions.

19. The semiconductor device according to claim 11, wherein the first region has a lower hydrogen concentration than the pair of second regions and the pair of third regions.

20. The semiconductor device according to claim 11, wherein the transistor is of a normally-off type.

21. A method for manufacturing a semiconductor device, comprising the steps of:

forming a first insulator over a substrate;
forming an oxide layer over the first insulator;
forming a first insulating film and a dummy gate film sequentially over the oxide layer;
forming a second insulator and a dummy gate layer by processing the first insulating film and the dummy gate film;
forming a first film comprising a metal in contact with at least the oxide layer;
performing heat treatment on the first film and the oxide layer in an atmosphere containing nitrogen;
removing the first film;
forming a second insulating film to cover the first insulator, the oxide layer, the second insulator, and the dummy gate layer;
forming a third insulator on a side surface of the second insulator and a side surface of the dummy gate layer by processing the second insulating film;
forming a third insulating film to cover the first insulator, the oxide layer, the dummy gate layer, and the third insulator;
forming a fourth insulator by performing first chemical mechanical polishing (CMP) treatment to remove part of the third insulating film until part of the dummy gate layer is exposed;
exposing the second insulator by etching the dummy gate layer;
exposing the oxide layer by etching the second insulator;
forming a fourth insulating film in contact with the oxide layer and a side surface of the third insulator;
forming a conductor film over the fourth insulating film;
forming a first conductor layer and a fifth insulator covering a side surface and a bottom surface of the first conductor layer by performing second CMP treatment to remove part of the conductor film and part of the fourth insulating film until the fourth insulator is exposed;
forming an opening in the fourth insulator; and
forming a second conductor to be embedded in the opening.

22. The method for manufacturing a semiconductor device, according to claim 21, wherein the first film is formed by a sputtering method using one or a plurality of gases selected from argon, nitrogen, and oxygen.

23. The method for manufacturing a semiconductor device, according to claim 21, wherein the first film comprises at least one of aluminum, ruthenium, titanium, tantalum, chromium, and tungsten.

24. The method for manufacturing a semiconductor device, according to claim 21, wherein the first film comprises aluminum and titanium.

25. The method for manufacturing a semiconductor device, according to claim 21, wherein the first film further comprises one or both of nitrogen and oxygen.

26. The method for manufacturing a semiconductor device, according to claim 21, wherein the thickness of the first film is greater than or equal to 0.5 nm and less than 5 nm.

27. The method for manufacturing a semiconductor device, according to claim 21, wherein oxygen contained in the oxide layer in the vicinity of an interface between the oxide layer and the first film is extracted by the first film by performing the heat treatment.

28. The method for manufacturing a semiconductor device, according to claim 21, wherein the opening is formed so that part of a top surface of the oxide layer and part of a side surface of the oxide layer are exposed.

29. The method for manufacturing a semiconductor device, according to claim 21, wherein the second insulating film is processed by anisotropic etching using a dry etching method.

30. The method for manufacturing a semiconductor device, according to claim 21, wherein an impurity is added to part of the oxide layer overlapping with the dummy gate layer after formation of the dummy gate layer.

31. The method for manufacturing a semiconductor device, according to claim 30, wherein the impurity is argon or nitrogen.

* * * * *